US011993617B2

(12) United States Patent
Dai et al.

(10) Patent No.: US 11,993,617 B2
(45) Date of Patent: May 28, 2024

(54) ORGANIC LUMINESCENT MATERIAL HAVING AN ANCILLARY LIGAND WITH A PARTIALLY FLUORINE-SUBSTITUTED SUBSTITUENT

(71) Applicant: BEIJING SUMMER SPROUT TECHNOLOGY CO., LTD., Beijing (CN)

(72) Inventors: Zhihong Dai, Beijing (CN); Yongjun Wu, Beijing (CN); Jin Qiao, Beijing (CN); Chi Yuen Raymond Kwong, Beijing (CN); Chuanjun Xia, Beijing (CN)

(73) Assignee: BEIJING SUMMER SPROUT TECHNOLOGY CO., LTD., Beijing (CN)

( * ) Notice: Subject to any disclaimer, the term of this patent is extended or adjusted under 35 U.S.C. 154(b) by 463 days.

(21) Appl. No.: 17/071,612

(22) Filed: Oct. 15, 2020

(65) Prior Publication Data

US 2021/0115069 A1 Apr. 22, 2021

(30) Foreign Application Priority Data

Oct. 18, 2019 (CN) ........................ 201910970950.X
Dec. 19, 2019 (CN) ........................ 201911317196.6

(51) Int. Cl.
*H10K 85/30* (2023.01)
*C07F 3/06* (2006.01)
(Continued)

(52) U.S. Cl.
CPC ............ *C07F 3/06* (2013.01); *C07F 15/0033* (2013.01); *H10K 85/342* (2023.02); *H10K 50/11* (2023.02); *H10K 2101/10* (2023.02)

(58) Field of Classification Search
CPC ............. H01L 51/0085; H01L 51/0059; H01L 51/5016; H01L 51/5036; C07F 3/06; C07F 15/0033; H10K 85/342; H10K 50/11
(Continued)

(56) References Cited

U.S. PATENT DOCUMENTS 5,703,436 A 12/1997 Forrest et al.
5,707,745 A 1/1998 Forrest et al.
(Continued)

FOREIGN PATENT DOCUMENTS

CN 103159798 A 6/2013
CN 103204880 A 7/2013
(Continued)

OTHER PUBLICATIONS

Chinese Office Action issued in Chinese Application No. 201911317196.6, dated May 27, 2022, 11 pages.
(Continued)

*Primary Examiner* — Ruiyun Zhang
(74) *Attorney, Agent, or Firm* — Brown Rudnick LLP; Matthew P. York

(57) ABSTRACT

Provided is an organic light-emitting material having an ancillary ligand with partially fluorinated substituents. The organic light-emitting material is a metal complex having a diketone ancillary ligand with partially fluorinated substituents and may be used as a light-emitting material in an organic electroluminescent device. These new types of metal complex can fine-tune the emission wavelength more effectively, reduce voltage, improve efficiency, prolong lifetimes, and provide better device performance. Further provided are an organic electroluminescent device and a compound formulation.

21 Claims, 2 Drawing Sheets

(51) Int. Cl.
*C07F 15/00* (2006.01)
*H10K 50/11* (2023.01)
*H10K 101/10* (2023.01)

(58) Field of Classification Search
USPC ........................................................ 257/4, 40
See application file for complete search history.

(56) References Cited

U.S. PATENT DOCUMENTS

| | | | |
|---|---|---|---|
| 5,844,363 | A | 12/1998 | Gu et al. |
| 6,097,147 | A | 8/2000 | Baldo et al. |
| 6,303,238 | B1 | 10/2001 | Thompson et al. |
| 7,279,704 | B2 | 10/2007 | Walters et al. |
| 7,968,146 | B2 | 6/2011 | Wagner et al. |
| 2003/0072964 | A1 | 4/2003 | Kwong et al. |
| 2003/0096138 | A1 | 5/2003 | Lecloux et al. |
| 2003/0230980 | A1 | 12/2003 | Forrest et al. |
| 2004/0174116 | A1 | 9/2004 | Lu et al. |
| 2004/0241495 | A1 | 12/2004 | Kwong et al. |
| 2006/0008671 | A1 | 1/2006 | Kwong et al. |
| 2006/0008673 | A1 | 1/2006 | Kwong et al. |
| 2007/0259205 | A1 | 11/2007 | Ionkin et al. |
| 2007/0278936 | A1 | 12/2007 | Herron et al. |
| 2008/0001515 | A1 | 1/2008 | Iwanaga et al. |
| 2008/0074033 | A1 | 3/2008 | Ionkin et al. |
| 2008/0194853 | A1 | 8/2008 | Kim et al. |
| 2008/0261076 | A1 | 10/2008 | Kwong et al. |
| 2010/0051869 | A1 | 3/2010 | Chichak et al. |
| 2010/0090591 | A1 | 4/2010 | Alleyne et al. |
| 2010/0270916 | A1 | 10/2010 | Xia et al. |
| 2012/0119190 | A1 | 5/2012 | Alleyne et al. |
| 2012/0181511 | A1 | 7/2012 | Ma et al. |
| 2012/0217868 | A1 | 8/2012 | Ma et al. |
| 2013/0146848 | A1 | 6/2013 | Ma et al. |
| 2013/0299795 | A1 | 11/2013 | Xia et al. |
| 2013/0328019 | A1 | 12/2013 | Xia et al. |
| 2015/0001472 | A1 | 1/2015 | Boudreault et al. |
| 2015/0171348 | A1 | 6/2015 | Stoessel et al. |
| 2015/0188061 | A1 | 7/2015 | Xia et al. |
| 2015/0214494 | A1 | 7/2015 | Xia et al. |
| 2015/0236277 | A1 | 8/2015 | Boudreault et al. |
| 2015/0287933 | A1 | 10/2015 | Kottas et al. |
| 2015/0295187 | A1 | 10/2015 | Boudreault et al. |
| 2015/0315222 | A1 | 11/2015 | Boudreault et al. |
| 2015/0349273 | A1 | 12/2015 | Hung et al. |
| 2015/0357587 | A1 | 12/2015 | Kishino et al. |
| 2015/0364701 | A1 | 12/2015 | Horiuchi et al. |
| 2016/0028023 | A1 | 1/2016 | Boudreault et al. |
| 2016/0093808 | A1 | 3/2016 | Adamovich et al. |
| 2016/0104848 | A1 | 4/2016 | Boudreault et al. |
| 2016/0111661 | A1 | 4/2016 | Boudreault et al. |
| 2016/0190486 | A1 | 6/2016 | Lin et al. |
| 2016/0359122 | A1 | 12/2016 | Boudreault et al. |
| 2017/0018718 | A1 | 1/2017 | Jang et al. |
| 2017/0084849 | A1 | 3/2017 | Tsai et al. |
| 2017/0092880 | A1 | 3/2017 | Boudreault et al. |
| 2017/0098788 | A1 | 4/2017 | Lee et al. |
| 2017/0098789 | A1 | 4/2017 | Boudreault et al. |
| 2017/0229663 | A1 | 8/2017 | Tsai et al. |
| 2017/0288157 | A1 | 10/2017 | Joseph et al. |
| 2017/0365799 | A1 | 12/2017 | Ji et al. |
| 2017/0365800 | A1 | 12/2017 | Tsai et al. |
| 2017/0365801 | A1 | 12/2017 | Margulies et al. |
| 2018/0013077 | A1 | 1/2018 | Boudreault et al. |
| 2018/0051007 | A1 | 2/2018 | Jung et al. |
| 2018/0066180 | A1 | 3/2018 | Huh et al. |
| 2018/0086775 | A1 | 3/2018 | Hong et al. |
| 2018/0134954 | A1 | 5/2018 | Tsai et al. |
| 2018/0190914 | A1 | 7/2018 | Tsai et al. |
| 2018/0190915 | A1 | 7/2018 | Ji et al. |
| 2018/0240988 | A1* | 8/2018 | Boudreault ......... H01L 51/0067 |
| 2018/0277774 | A1 | 9/2018 | Boudreault et al. |
| 2018/0323382 | A1 | 11/2018 | Boudreault et al. |
| 2018/0337348 | A1 | 11/2018 | Jung et al. |
| 2019/0067598 | A1 | 2/2019 | Li et al. |
| 2019/0077818 | A1 | 3/2019 | Xia |
| 2019/0103574 | A1 | 4/2019 | Xia |
| 2019/0127406 | A1 | 5/2019 | Xia |
| 2019/0194234 | A1 | 6/2019 | Xia |
| 2019/0237683 | A1 | 8/2019 | Boudreault et al. |
| 2019/0248818 | A1 | 8/2019 | Boudreault |
| 2019/0251619 | A1 | 8/2019 | Kuchenski et al. |
| 2019/0252627 | A1 | 8/2019 | Joseph et al. |
| 2020/0044166 | A1 | 2/2020 | Cho et al. |
| 2020/0075870 | A1 | 3/2020 | Boudreault et al. |
| 2020/0099000 | A1 | 3/2020 | Zhang et al. |
| 2020/0251666 | A1 | 8/2020 | Cai et al. |
| 2020/0308201 | A1 | 10/2020 | Lee et al. |
| 2020/0354391 | A1 | 11/2020 | Zhang et al. |
| 2020/0358010 | A1 | 11/2020 | Lu et al. |
| 2020/0358011 | A1 | 11/2020 | Lu et al. |
| 2021/0115069 | A1 | 4/2021 | Dai et al. |
| 2021/0242411 | A1 | 8/2021 | Liu et al. |
| 2022/0131093 | A1 | 4/2022 | Zhang et al. |

FOREIGN PATENT DOCUMENTS

| | | | |
|---|---|---|---|
| CN | 104022232 | A | 9/2014 |
| CN | 108191916 | A | 6/2018 |
| CN | 109438521 | A | 3/2019 |
| CN | 109467575 | A | 3/2019 |
| CN | 109575083 | A | 4/2019 |
| CN | 109651444 | A | 4/2019 |
| CN | 109721628 | A | 5/2019 |
| CN | 109956977 | A | 7/2019 |
| CN | 110283216 | A | 9/2019 |
| CN | 112679548 | A | 4/2021 |
| EP | 2907820 | A1 | 8/2015 |
| EP | 2940098 | A1 | 11/2015 |
| EP | 3007244 | A1 | 4/2016 |
| JP | 10158639 | A | 6/1998 |
| JP | 2005508437 | A | 3/2005 |
| JP | 2008532998 | A | 8/2008 |
| JP | 2009539768 | A | 11/2009 |
| JP | 2010516622 | A | 5/2010 |
| JP | 2012525405 | A | 10/2012 |
| JP | 2013121957 | A | 6/2013 |
| JP | 2015010093 | A | 1/2015 |
| JP | 2015530982 | A | 10/2015 |
| JP | 2020186234 | A | 11/2020 |
| JP | 2020186235 | A | 11/2020 |
| JP | 2020186236 | A | 11/2020 |
| KR | 20060097320 | A | 9/2006 |
| KR | 20090039464 | A | 4/2009 |
| KR | 20110077350 | A | 7/2011 |
| KR | 20130110934 | A | 10/2013 |
| KR | 20160041771 | A | 4/2016 |
| KR | 20170142949 | A | 12/2017 |
| KR | 20180065353 | A | 6/2018 |
| KR | 20200115010 | A | 10/2020 |
| KR | 20200130660 | A | 11/2020 |
| KR | 20200130661 | A | 11/2020 |
| KR | 20200130667 | A | 11/2020 |
| WO | 0244189 | A1 | 6/2002 |
| WO | 2006095951 | A1 | 9/2006 |
| WO | 2007143201 | A1 | 12/2007 |
| WO | 2018084189 | A1 | 5/2018 |
| WO | 2018105986 | A1 | 6/2018 |
| WO | 2018124697 | A1 | 7/2018 |

OTHER PUBLICATIONS

Tang, 1987, Organic electroluminescent diodes, Applied Physics Letter, 51(12):913-915.

Uoyama, 2012, Highly efficient organic light-emitting diodes from delayed fluorescence, Nature, 492(7428):234-238.

Kawanishi, 2011, Deuterium Compounds for Electronic Devices, Wako Organic Square 36, 21 pages.

Sugiyama, 2017, Development of Deuterated Phosphorescence Probe, Taiyo Nippon Sanso Technical Report No. 36, 8 pages.

* cited by examiner

Formula 1

ORGANIC LUMINESCENT MATERIAL HAVING AN ANCILLARY LIGAND WITH A PARTIALLY FLUORINE-SUBSTITUTED SUBSTITUENT

CROSS-REFERENCE TO RELATED APPLICATION(S)

Technical Field

The present disclosure relates to compounds for organic electronic devices, for example, organic light-emitting devices. More particularly, the present disclosure relates to a metal complex having an acetylacetone ancillary ligand with partially fluorine-substituted substituents of mono-fluorine or dual-fluorine, which may be used as a light-emitting material in a light-emitting layer of an organic electroluminescent device, and an organic electroluminescent device and a compound formulation including the metal complex.

BACKGROUND

Organic electronic devices include, but are not limited to, the following types: organic light-emitting diodes (OLEDs), organic field-effect transistors (O-FETs), organic light-emitting transistors (OLETs), organic photovoltaic devices (OPVs), dye-sensitized solar cells (DSSCs), organic optical detectors, organic photoreceptors, organic field-quench devices (OFQDs), light-emitting electrochemical cells (LECs), organic laser diodes and organic plasmon emitting devices.

In 1987, Tang and Van Slyke of Eastman Kodak reported a bilayer organic electroluminescent device, which comprises an arylamine hole transporting layer and a tris-8-hydroxyquinolato-aluminum layer as the electron and emitting layer (Applied Physics Letters, 1987, 51 (12): 913-915). Once a bias is applied to the device, green light was emitted from the device. The present disclosure laid the foundation for the development of modern organic light-emitting diodes (OLEDs). State-of-the-art OLEDs may comprise multiple layers such as charge injection and transporting layers, charge and exciton blocking layers, and one or multiple emissive layers between the cathode and anode. Since OLED is a self-emitting solid state device, it offers tremendous potential for display and lighting applications. In addition, the inherent properties of organic materials, such as their flexibility, may make them well suited for particular applications such as fabrication on flexible substrates.

OLED can be categorized as three different types according to its emitting mechanism. The OLED invented by Tang and van Slyke is a fluorescent OLED. It only utilizes singlet emission. The triplets generated in the device are wasted through nonradiative decay channels. Therefore, the internal quantum efficiency (IQE) of a fluorescent OLED is only 25%. This limitation hindered the commercialization of OLED. In 1997, Forrest and Thompson reported phosphorescent OLED, which uses triplet emission from heave metal containing complexes as the emitter. As a result, both singlet and triplets can be harvested, achieving 100% IQE. The discovery and development of phosphorescent OLED contributed directly to the commercialization of active-matrix OLED (AMOLED) due to its high efficiency. Recently, Adachi achieved high efficiency through thermally activated delayed fluorescence (TADF) of organic compounds. These emitters have small singlet-triplet gap that makes the transition from triplet back to singlet possible. In the TADF device, the triplet excitons can go through reverse intersystem crossing to generate singlet excitons, resulting in high IQE.

OLEDs can also be classified as small molecule and polymer OLEDs according to the forms of the materials used. Small molecule refers to any organic or organometallic material that is not a polymer. The molecular weight of a small molecule can be large as long as it has well defined structure. Dendrimers with well-defined structures are considered as small molecules. Polymer OLEDs include conjugated polymers and non-conjugated polymers with pendant emitting groups. Small molecule OLED can become a polymer OLED if post polymerization occurred during the fabrication process.

There are various methods for OLED fabrication. Small molecule OLEDs are generally fabricated by vacuum thermal evaporation. Polymer OLEDs are fabricated by solution process such as spin-coating, inkjet printing, and slit printing. If the material can be dissolved or dispersed in a solvent, the small molecule OLED can also be produced by solution process.

The emitting color of an OLED can be achieved by emitter structural design. An OLED may comprise one emitting layer or a plurality of emitting layers to achieve desired spectrum. In the case of green, yellow, and red OLEDs, phosphorescent emitters have successfully reached commercialization. Blue phosphorescent device still suffers from non-saturated blue color, short device lifetime, and high operating voltage. Commercial full-color OLED displays normally adopt a hybrid strategy, using fluorescent blue and phosphorescent yellow, or red and green. At present, efficiency roll-off of phosphorescent OLEDs at high brightness remains a problem. In addition, it is desirable to have more saturated emitting color, higher efficiency, and longer device lifetime.

Ancillary ligands of phosphorescent materials can be used for fine-tuning the emission wavelength, improving sublimation properties, and increasing the efficiency of the materials. Existing ancillary ligands, such as acetylacetone ligands, have achieved some effects in controlling the properties described above, but the performance of the phosphorescent materials needs to be further improved to meet the increasing requirements on the performance.

US20190077818A1 has disclosed a metal complex having an ancillary ligand with a structure of

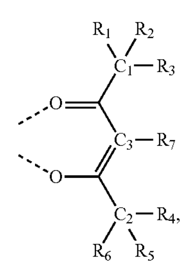

where $R_1$ to $R_7$ includes at least one fluorine atom substitution, and the fluorine atom is no directly linked to $C_1$, $C_2$, or $C_3$. Obviously, it has noticed the unique performance achieved by introducing fluorine substitutions into diketone ancillary ligands. However, the ligand structure disclosed therein either includes trifluoromethyl substitutions in $R_1$ to $R_7$, or a ligand with a difluorocyclohexyl structure such as

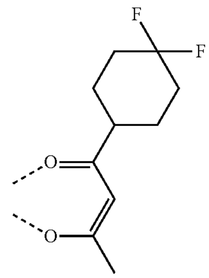

is formed after two of $R_1$ to $R_7$ form a ring. The application of the introduction of monofluorine or difluorine substitutions into a chain alkyl group has not been disclosed or inspired.

US20070259205A1 has disclosed a combination including an iridium complex with a structure of

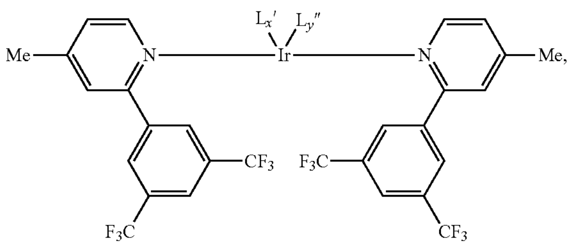

where L' is a bidentate ligand such as a β-enolate ligand, an unfluorinated β-phosphino alkoxide ligand, or a 1,3-diphosphine ligand, L" is a monodentate ligand, x=1 and y=0, or x=0 and y=2. A specific example is

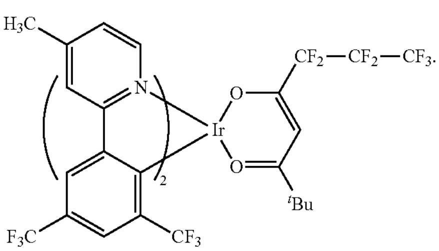

Obviously, it has noticed the unique performance achieved by introducing perfluoroalkyl substitutions into diketone ligands. However, the application of partial fluorine substitutions in diketone ligands has not been disclosed or inspired.

In the prior art, there have been some researches on the introduction of fluorine substitutions into diketone ancillary ligands, but further development is still urgently needed in order to satisfy the increasing requirements of the industry.

SUMMARY

The present disclosure aims to provide a series of metal complexes having a diketone ancillary ligand with a partially fluorine-substituted substituent of mono-fluorine or dual-fluorine to solve at least part of the above-mentioned problems. The metal complexes may be used as light-emitting materials in organic electroluminescent devices. These new types of metal complex can more effectively fine-tune the emission wavelength, reduce voltage, improve efficiency, prolong lifetimes, and provide better device performance.

According to an embodiment of the present disclosure, disclosed is a metal complex having a ligand La with a structure represented by Formula 1:

Formula 1

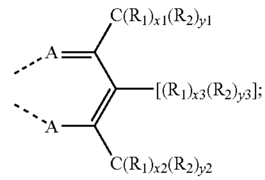

wherein A is, at each occurrence identically or differently, selected from O, S, Se, or $NR_3$;

wherein x1=0, 1, 2, or 3, y1=0, 1, 2, or 3, and x1+y1=3;

wherein x2=0, 1, 2, or 3, y2=0, 1, 2, or 3, and x2+y2=3;

wherein x3=0 or 1, y3=0 or 1, and x3+y3=1;

wherein y1+y2+y3≥1;

wherein $R_1$ and $R_3$ are, at each occurrence identically or differently, selected from the group consisting of hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a sulfanyl group, a sulfinyl group, a sulfonyl group, a phosphino group, and combinations thereof;

wherein $R_2$ is, at each occurrence identically or differently, selected from $\text{-L-C(F)}_m\text{(R)}_n$, and L is, at each occurrence identically or differently, selected from a single bond, substituted or unsubstituted alkylene having 1 to 20 carbon atoms, substituted or unsubstituted cycloalkylene having 3 to 20 ring carbon atoms, substituted or unsubstituted heteroalkylene having 1 to 20 carbon atoms, substituted or unsubstituted arylene having 6 to 30 carbon atoms, or substituted or unsubstituted heteroarylene having 3 to 30 carbon atoms;

wherein m=1 or 2, n=1 or 2, and m+n=3; when n=2, two R may be identical or different;

wherein R is, at each occurrence identically or differently, selected from the group consisting of: hydrogen, deuterium, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a sulfanyl group, a sulfinyl group, a sulfonyl group, a phosphino group, and combinations thereof;

wherein when R is selected from the above substituted groups, the substitution is selected from the group consisting of: unsubstituted alkyl having 1 to 20 carbon atoms, unsubstituted cycloalkyl having 3 to 20 ring carbon atoms, unsubstituted heteroalkyl having 1 to 20 carbon atoms, unsubstituted arylalkyl having 7 to 30 carbon atoms, unsubstituted alkoxy having 1 to 20 carbon atoms, unsubstituted aryloxy having 6 to 30 carbon atoms, unsubstituted alkenyl having 2 to 20 carbon atoms, unsubstituted aryl having 6 to 30 carbon atoms, unsubstituted heteroaryl having 3 to 30 carbon atoms, unsubstituted alkylsilyl having 3 to 20 carbon atoms, and unsubstituted arylsilyl having 6 to 20 carbon atoms;

wherein adjacent substituents $R_1$ can be optionally joined to form a ring.

According to another embodiment of the present disclosure, further disclosed is an electroluminescent device, including an anode, a cathode and an organic layer disposed between the anode and the cathode, wherein the organic layer includes a metal complex having a ligand La with a structure represented by Formula 1:

Formula 1

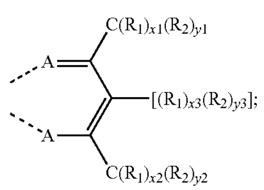

wherein A is, at each occurrence identically or differently, selected from O, S, Se, or $NR_3$;

wherein x1=0, 1, 2, or 3, y1=0, 1, 2, or 3, and x1+y1=3;

wherein x2=0, 1, 2, or 3, y2=0, 1, 2, or 3, and x2+y2=3;

wherein x3=0 or 1, y3=0 or 1, and x3+y3=1;

wherein y1+y2+y3≥1;

wherein $R_1$ and $R_3$ are, at each occurrence identically or differently, selected from the group consisting of hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a sulfanyl group, a sulfinyl group, a sulfonyl group, a phosphino group, and combinations thereof;

wherein $R_2$ is, at each occurrence identically or differently, selected from $-L-C(F)_m(R)_n$, and L is, at each occurrence identically or differently, selected from a single bond, substituted or unsubstituted alkylene having 1 to 20 carbon atoms, substituted or unsubstituted cycloalkylene having 3 to 20 ring carbon atoms, substituted or unsubstituted heteroalkylene having 1 to 20 carbon atoms, substituted or unsubstituted arylene having 6 to 30 carbon atoms, or substituted or unsubstituted heteroarylene having 3 to 30 carbon atoms;

wherein m=1 or 2, n=1 or 2, and m+n=3; when n=2, two R may be identical or different;

wherein R is, at each occurrence identically or differently, selected from the group consisting of: hydrogen, deuterium, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a sulfanyl group, a sulfinyl group, a sulfonyl group, a phosphino group, and combinations thereof;

wherein when R is selected from the above substituted groups, the substitution is selected from the group consisting of: unsubstituted alkyl having 1 to 20 carbon atoms, unsubstituted cycloalkyl having 3 to 20 ring carbon atoms, unsubstituted heteroalkyl having 1 to 20 carbon atoms, unsubstituted arylalkyl having 7 to 30 carbon atoms, unsubstituted alkoxy having 1 to 20 carbon atoms, unsubstituted aryloxy having 6 to 30 carbon atoms, unsubstituted alkenyl having 2 to 20 carbon atoms, unsubstituted aryl having 6 to 30 carbon atoms, unsubstituted heteroaryl having 3 to 30 carbon atoms, unsubstituted alkylsilyl having 3 to 20 carbon atoms, and unsubstituted arylsilyl having 6 to 20 carbon atoms;

wherein adjacent substituents $R_1$ can be optionally joined to form a ring.

According to another embodiment of the present disclosure, further disclosed is a compound formulation including a metal complex having a ligand La with a structure represented by Formula 1.

The inventor has found a new type of ancillary ligand through in-depth researches, and the new type of ancillary ligand can more effectively fine-tune the emission wavelength and improve device performance compared with the ancillary ligands that have been reported. The series of metal complexes having a diketone ancillary ligand with a partially fluorine-substituted substituent of mono-fluorine or dual-fluorine, disclosed by the present disclosure, may be used as light-emitting materials in organic electroluminescent devices. These new types of metal complex can more effectively fine-tune the emission wavelength, reduce voltage, improve efficiency, prolong lifetimes, and provide better device performance.

DETAILED DESCRIPTION

Figure 1:
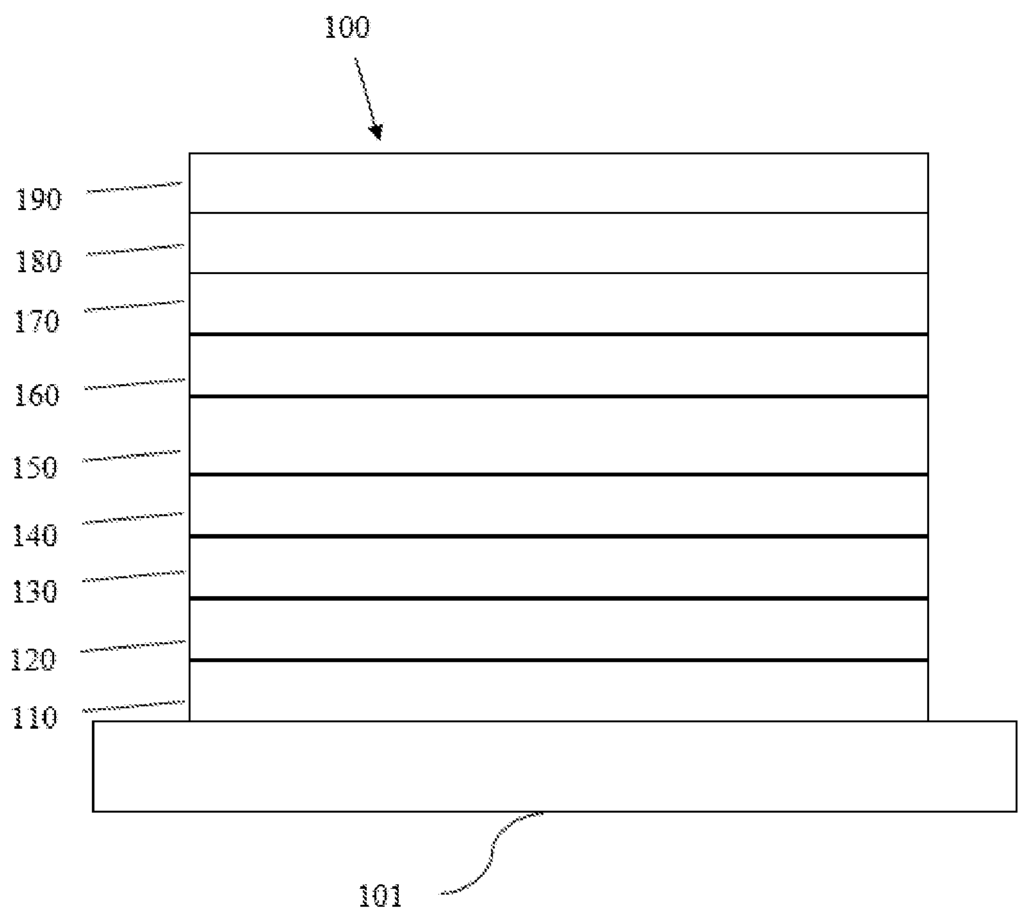
FIG. 1 is a schematic diagram of an organic light-emitting device that may include a metal complex and a compound formulation disclosed herein.

OLEDs can be fabricated on various types of substrates such as glass, plastic, and metal foil. FIG. 1 schematically shows the organic light emitting device 100 without limitation. The figures are not necessarily drawn to scale. Some of the layers in the figures can also be omitted as needed. Device 100 may include a substrate 101, an anode 110, a hole injection layer 120, a hole transport layer 130, an electron blocking layer 140, an emissive layer 150, a hole blocking layer 160, an electron transport layer 170, an electron injection layer 180 and a cathode 190. Device 100 may be fabricated by depositing the layers described in order. The properties and functions of these various layers, as well as example materials, are described in more detail in U.S. Pat. No. 7,279,704 at cols. 6-10, the contents of which are incorporated by reference herein in its entirety.

More examples for each of these layers are available. For example, a flexible and transparent substrate-anode combination is disclosed in U.S. Pat. No. 5,844,363, which is incorporated by reference herein in its entirety. An example of a p-doped hole transport layer is m-MTDATA doped with F4-TCNQ at a molar ratio of 50:1, as disclosed in U.S. Patent Application Publication No. 2003/0230980, which is incorporated by reference herein in its entirety. Examples of host materials are disclosed in U.S. Pat. No. 6,303,238 to Thompson et al., which is incorporated by reference herein in its entirety. An example of an n-doped electron transport layer is BPhen doped with Li at a molar ratio of 1:1, as disclosed in U.S. Patent Application Publication No. 2003/0230980, which is incorporated by reference herein in its entirety. U.S. Pat. Nos. 5,703,436 and 5,707,745, which are incorporated by reference herein in their entireties, disclose examples of cathodes including composite cathodes having a thin layer of metal such as Mg:Ag with an overlying transparent, electrically-conductive, sputter-deposited ITO layer. The theory and use of blocking layers are described in more detail in U.S. Pat. No. 6,097,147 and U.S. Patent Application Publication No. 2003/0230980, which are incorporated by reference herein in their entireties. Examples of injection layers are provided in U.S. Patent Application Publication No. 2004/0174116, which is incorporated by reference herein in its entirety. A description of protective layers may be found in U.S. Patent Application Publication No. 2004/0174116, which is incorporated by reference herein in its entirety.

The layered structure described above is provided by way of non-limiting example. Functional OLEDs may be achieved by combining the various layers described in different ways, or layers may be omitted entirely. It may also include other layers not specifically described. Within each layer, a single material or a mixture of multiple materials can be used to achieve optimum performance. Any functional layer may include several sublayers. For example, the emissive layer may have two layers of different emitting materials to achieve desired emission spectrum.

In one embodiment, an OLED may be described as having an "organic layer" disposed between a cathode and an anode. This organic layer may comprise a single layer or multiple layers.

Figure 2:
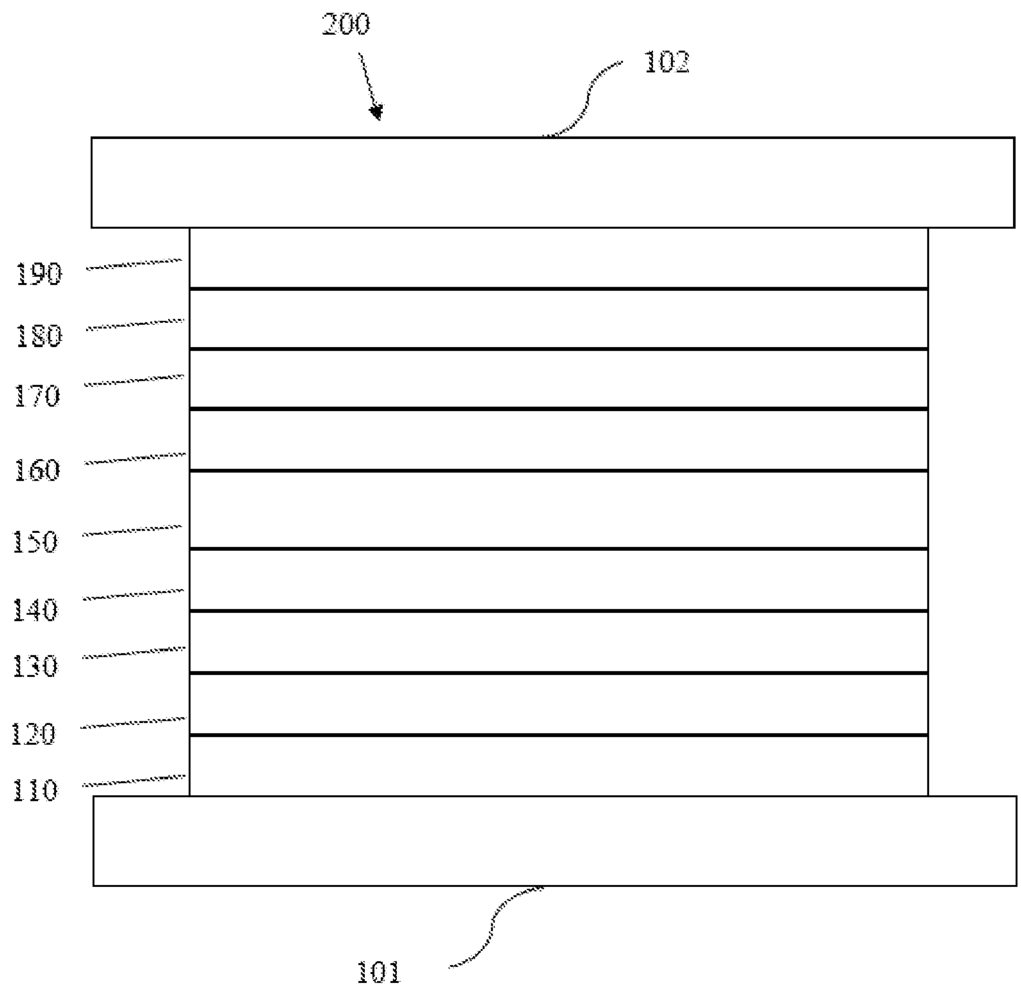
FIG. 2 is a schematic diagram of another organic light-emitting device that may include a metal complex and a compound formulation disclosed herein.
Figure 3:
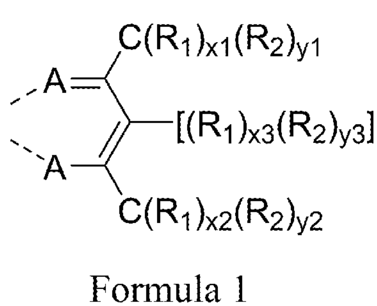
FIG. 3 is a diagram illustrating a structural Formula 1 of a ligand La disclosed herein.

An OLED can be encapsulated by a barrier layer. FIG. 2 schematically shows the organic light emitting device 200 without limitation. FIG. 2 differs from FIG. 1 in that the organic light emitting device include a barrier layer 102, which is above the cathode 190, to protect it from harmful species from the environment such as moisture and oxygen. Any material that can provide the barrier function can be used as the barrier layer such as glass and organic-inorganic hybrid layers. The barrier layer should be placed directly or indirectly outside of the OLED device. Multilayer thin film encapsulation was described in U.S. Pat. No. 7,968,146, which is herein incorporated by reference in its entirety.

Devices fabricated in accordance with embodiments of the present disclosure can be incorporated into a wide variety of consumer products that have one or more of the electronic component modules (or units) incorporated therein. Some examples of such consumer products include flat panel displays, monitors, medical monitors, televisions, billboards, lights for interior or exterior illumination and/or signaling, heads-up displays, fully or partially transparent displays, flexible displays, smart phones, tablets, phablets, wearable devices, smart watches, laptop computers, digital cameras, camcorders, viewfinders, micro-displays, 3-D displays, vehicles displays, and vehicle tail lights.

The materials and structures described herein may be used in other organic electronic devices listed above.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

It is believed that the internal quantum efficiency (IQE) of fluorescent OLEDs can exceed the 25% spin statistics limit through delayed fluorescence. As used herein, there are two types of delayed fluorescence, i.e. P-type delayed fluorescence and E-type delayed fluorescence. P-type delayed fluorescence is generated from triplet-triplet annihilation (TTA).

On the other hand, E-type delayed fluorescence does not rely on the collision of two triplets, but rather on the transition between the triplet states and the singlet excited states. Compounds that are capable of generating E-type delayed fluorescence are required to have very small singlet-triplet gaps to convert between energy states. Thermal energy can activate the transition from the triplet state back to the singlet state. This type of delayed fluorescence is also known as thermally activated delayed fluorescence (TADF). A distinctive feature of TADF is that the delayed component increases as temperature rises. If the reverse intersystem crossing rate is fast enough to minimize the non-radiative decay from the triplet state, the fraction of back populated singlet excited states can potentially reach 75%. The total singlet fraction can be 100%, far exceeding 25% of the spin statistics limit for electrically generated excitons.

E-type delayed fluorescence characteristics can be found in an exciplex system or in a single compound. Without being bound by theory, it is believed that E-type delayed fluorescence requires the luminescent material to have a small singlet-triplet energy gap (AEs-T). Organic, non-metal containing, donor-acceptor luminescent materials may be able to achieve this. The emission in these materials is often characterized as a donor-acceptor charge-transfer (CT) type emission. The spatial separation of the HOMO and LUMO in these donor-acceptor type compounds often results in small AEs-T. These states may involve CT states. Often, donor-acceptor luminescent materials are constructed by connecting an electron donor moiety such as amino- or carbazole-derivatives and an electron acceptor moiety such as N-containing six-membered aromatic rings.

Definition of Terms of Substituents

Halogen or halide—as used herein includes fluorine, chlorine, bromine, and iodine.

Alkyl—contemplates both straight and branched chain alkyl groups. Examples of the alkyl group include methyl group, ethyl group, propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neopentyl group, 1-methylpentyl group, 2-methylpentyl group, 1-pentylhexyl group, 1-butylpentyl group, 1-heptyloctyl group, and 3-methylpentyl group. Additionally, the alkyl group may be optionally substituted. The carbons in the alkyl chain can be replaced by other hetero atoms. Of the above, preferred are methyl group, ethyl group, propyl group, isopropyl group, n-butyl group, s-butyl group, isobutyl group, t-butyl group, n-pentyl group, and neopentyl group.

Cycloalkyl—as used herein contemplates cyclic alkyl groups. Preferred cycloalkyl groups are those containing 4 to 10 ring carbon atoms and includes cyclobutyl, cyclopentyl, cyclohexyl, 4-methylcyclohexyl, 4,4-dimethylcyclohexyl, 1-adamantyl, 2-adamantyl, 1-norbomyl, 2-norbornyl and the like. Additionally, the cycloalkyl group may be optionally substituted. The carbons in the ring can be replaced by other hetero atoms.

Alkenyl—as used herein contemplates both straight and branched chain alkene groups. Preferred alkenyl groups are those containing 2 to 15 carbon atoms. Examples of the alkenyl group include vinyl group, allyl group, 1-butenyl group, 2-butenyl group, 3-butenyl group, 1,3-butandienyl group, 1-methylvinyl group, styryl group, 2,2-diphenylvinyl group, 1,2-diphenylvinyl group, 1-methylallyl group, 1,1-dimethylallyl group, 2-methylallyl group, 1-phenylallyl group, 2-phenylallyl group, 3-phenylallyl group, 3,3-diphenylallyl group, 1,2-dimethylallyl group, 1-phenyl-butenyl group, and 3-phenyl-1-butenyl group. Additionally, the alkenyl group may be optionally substituted.

Alkynyl—as used herein contemplates both straight and branched chain alkyne groups. Preferred alkynyl groups are those containing 2 to 15 carbon atoms. Additionally, the alkynyl group may be optionally substituted.

Aryl or aromatic group—as used herein includes noncondensed and condensed systems. Preferred aryl groups are those containing six to sixty carbon atoms, preferably six to twenty carbon atoms, more preferably six to twelve carbon atoms. Examples of the aryl group include phenyl, biphenyl, terphenyl, triphenylene, tetraphenylene, naphthalene, anthracene, phenalene, phenanthrene, fluorene, pyrene, chrysene, perylene, and azulene, preferably phenyl, biphenyl, terphenyl, triphenylene, fluorene, and naphthalene. Additionally, the aryl group may be optionally substituted. Examples of the non-condensed aryl group include phenyl group, biphenyl-2-yl group, biphenyl-3-yl group, biphenyl-4-yl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 4'-methylbiphenylyl group, 4"-t-butyl p-terphenyl-4-yl group, o-cumenyl group, m-cumenyl group, p-cumenyl group, 2,3-xylyl group, 3,4-xylyl group, 2,5-xylyl group, mesityl group, and m-quarterphenyl group.

Heterocyclic group or heterocycle—as used herein includes aromatic and non-aromatic cyclic groups. Heteroaromatic also means heteroaryl. Preferred non-aromatic heterocyclic groups are those containing 3 to 7 ring atoms which include at least one hetero atom such as nitrogen, oxygen, and sulfur. The heterocyclic group can also be an aromatic heterocyclic group having at least one heteroatom selected from nitrogen atom, oxygen atom, sulfur atom, and selenium atom.

Heteroaryl—as used herein includes noncondensed and condensed hetero-aromatic groups that may include from one to five heteroatoms. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

Alkoxy—it is represented by —O-alkyl. Examples and preferred examples thereof are the same as those described above. Examples of the alkoxy group having 1 to 20 carbon atoms, preferably 1 to 6 carbon atoms include methoxy group, ethoxy group, propoxy group, butoxy group, pentyloxy group, and hexyloxy group. The alkoxy group having 3 or more carbon atoms may be linear, cyclic or branched.

Aryloxy—it is represented by —O-aryl or —O-heteroaryl. Examples and preferred examples thereof are the same as those described above. Examples of the aryloxy group having 6 to 40 carbon atoms include phenoxy group and biphenyloxy group.

Arylalkyl—as used herein contemplates an alkyl group that has an aryl substituent. Additionally, the arylalkyl group may be optionally substituted. Examples of the arylalkyl group include benzyl group, 1-phenylethyl group, 2-phenylethyl group, 1-phenylisopropyl group, 2-phenylisopropyl group, phenyl-t-butyl group, alpha.-naphthylmethyl group, 1-alpha.-naphthylethyl group, 2-alpha-naphthylethyl group, 1-alpha-naphthylisopropyl group, 2-alpha-naphthylisopropyl group, beta-naphthylmethyl group, 1-beta-naphthylethyl group, 2-beta-naphthylethyl group, 1-beta-naphthylisopropyl group, 2-beta-naphthylisopropyl group, p-methylbenzyl group, m-methylbenzyl group, o-methylbenzyl group, p-chlorobenzyl group, m-chlorobenzyl group, o-chlorobenzyl group, p-bromobenzyl group, m-bromobenzyl group, o-bromobenzyl group, p-iodobenzyl group, m-iodobenzyl group, o-iodobenzyl group, p-hydroxybenzyl group, m-hydroxybenzyl group, o-hydroxybenzyl group, p-aminobenzyl group, m-aminobenzyl group, o-aminobenzyl group, p-nitrobenzyl group, m-nitrobenzyl group, o-nitrobenzyl group, p-cyanobenzyl group, m-cyanobenzyl group, o-cyanobenzyl group, 1-hydroxy-2-phenylisopropyl group, and 1-chloro-2-phenylisopropyl group. Of the above, preferred are benzyl group, p-cyanobenzyl group, m-cyanobenzyl group, o-cyanobenzyl group, 1-phenylethyl group, 2-phenylethyl group, 1-phenylisopropyl group, and 2-phenylisopropyl group.

The term "aza" in azadibenzofuran, aza-dibenzothiophene, etc. means that one or more of the C—H groups in the respective aromatic fragment are replaced by a nitrogen atom. For example, azatriphenylene encompasses dibenzo[f,h]quinoxaline, dibenzo[f,h]quinoline and other analogues with two or more nitrogens in the ring system. One of ordinary skill in the art can readily envision other nitrogen analogs of the aza-derivatives described above, and all such analogs are intended to be encompassed by the terms as set forth herein.

In the present disclosure, unless otherwise defined, when any term of the group consisting of substituted alkyl, substituted cycloalkyl, substituted heteroalkyl, substituted aralkyl, substituted alkoxy, substituted aryloxy, substituted alkenyl, substituted aryl, substituted heteroaryl, substituted alkylsilyl, substituted arylsilyl, substituted amine, substituted acyl, substituted carbonyl, substituted carboxylic acid group, substituted ester group, substituted sulfinyl, substituted sulfonyl and substituted phosphino is used, it means that any group of alkyl, cycloalkyl, heteroalkyl, aralkyl, alkoxy, aryloxy, alkenyl, aryl, heteroaryl, alkylsilyl, arylsilyl, amine, acyl, carbonyl, carboxylic acid group, ester group, sulfinyl, sulfonyl and phosphino may be substituted with one or more groups selected from the group consisting of deuterium, an unsubstituted alkyl group having 1 to 20 carbon atoms, an unsubstituted cycloalkyl group having 3 to 20 ring carbon atoms, an unsubstituted heteroalkyl group having 1 to 20 carbon atoms, an unsubstituted aralkyl group having 7 to 30 carbon atoms, an unsubstituted alkoxy group having 1 to 20 carbon atoms, an unsubstituted aryloxy group having 6 to 30 carbon atoms, an unsubstituted alkenyl group having 2 to 20 carbon atoms, an unsubstituted aryl group having 6 to 30 carbon atoms, an unsubstituted heteroaryl group having 3 to 30 carbon atoms, an unsubstituted alkylsilyl group having 3 to 20 carbon atoms, an unsubstituted arylsilyl group having 6 to 20 carbon atoms, an unsubstituted amino group having 0 to 20 carbon atoms, an acyl group, a carbonyl group, a carboxylic acid group, an ester group, a cyano group, an isocyano group, a sulfanyl group, a sulfinyl group, a sulfonyl group and a phosphino group, and combinations thereof.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

In the compounds mentioned in this disclosure, the hydrogen atoms can be partially or fully replaced by deuterium. Other atoms such as carbon and nitrogen, can also be replaced by their other stable isotopes. The replacement by other stable isotopes in the compounds may be preferred due to its enhancements of device efficiency and stability.

In the compounds mentioned in this disclosure, multiple substitutions refer to a range that includes a double substitution, up to the maximum available substitutions. When a substitution in the compounds mentioned in this disclosure represents multiple substitutions (including di, tri, tetra substitutions etc.), that means the substituent may exist at a plurality of available substitution positions on its linking structure, the substituents present at a plurality of available substitution positions may be the same structure or different structures.

In the compounds mentioned in the present disclosure, adjacent substituents in the compounds cannot be joined to form a ring unless otherwise explicitly defined, for example, adjacent substituents can be optionally joined to form a ring. In the compounds mentioned in the present disclosure, adjacent substituents can be optionally joined to form a ring, including the case where adjacent substituents can be connected to form a ring, and the case where adjacent substituents are not connected to form a ring. When adjacent substituents can be optionally joined to form a ring, the ring formed may be monocyclic or polycyclic, as well as alicyclic, heteroalicyclic, aromatic or heteroaromatic. In such expression, adjacent substituents may refer to substituents bonded to the same atom, substituents bonded to carbon atoms which are directly bonded to each other, or substituents bonded to carbon atoms which are more distant from each other. Preferably, adjacent substituents refer to substituents bonded to the same carbon atom and substituents bonded to carbon atoms which are directly bonded to each other.

The expression that adjacent substituents can be optionally joined to form a ring is also intended to mean that two substituents bonded to the same carbon atom are joined to each other via a chemical bond to form a ring, which can be exemplified by the following formula:

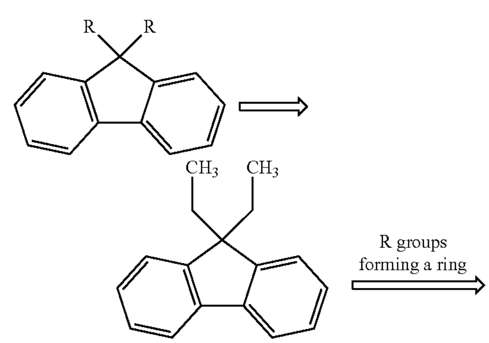

-continued

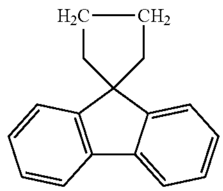

The expression that adjacent substituents can be optionally joined to form a ring is also intended to mean that two substituents bonded to carbon atoms which are directly bonded to each other are joined to each other via a chemical bond to form a ring, which can be exemplified by the following formula:

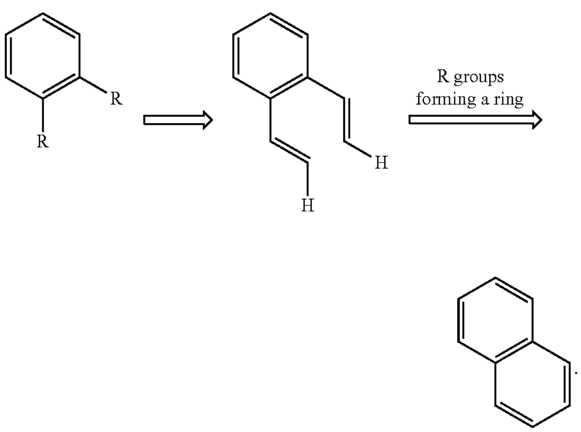

Furthermore, the expression that adjacent substituents can be optionally joined to form a ring is also intended to mean that, in the case where one of the two substituents bonded to carbon atoms which are directly bonded to each other represents hydrogen, the second substituent is bonded at a position at which the hydrogen atom is bonded, thereby forming a ring. This is exemplified by the following formula:

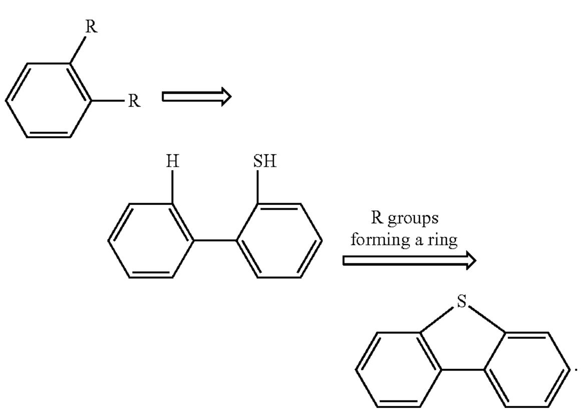

According to an embodiment of the present disclosure, disclosed is a metal complex having a ligand La with a structure represented by Formula 1:

Formula 1

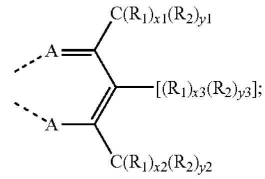

wherein A is, at each occurrence identically or differently, selected from O, S, Se, or $NR_3$;

wherein x1=0, 1, 2, or 3, y1=0, 1, 2, or 3, and x1+y1=3;

wherein x2=0, 1, 2, or 3, y2=0, 1, 2, or 3, and x2+y2=3;

wherein x3=0 or 1, y3=0 or 1, and x3+y3=1;

wherein y1+y2+y3≥1;

wherein $R_1$ and $R_3$ are, at each occurrence identically or differently, selected from the group consisting of hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a sulfanyl group, a sulfinyl group, a sulfonyl group, a phosphino group, and combinations thereof;

wherein $R_2$ is, at each occurrence identically or differently, selected from $-L-C(F)_m(R)_n$, and L is, at each occurrence identically or differently, selected from a single bond, substituted or unsubstituted alkylene having 1 to 20 carbon atoms, substituted or unsubstituted cycloalkylene having 3 to 20 ring carbon atoms, substituted or unsubstituted heteroalkylene having 1 to 20 carbon atoms, substituted or unsubstituted arylene having 6 to 30 carbon atoms, or substituted or unsubstituted heteroarylene having 3 to 30 carbon atoms;

wherein m=1 or 2, n=1 or 2, and m+n=3; when n=2, two R may be identical or different;

wherein R is, at each occurrence identically or differently, selected from the group consisting of: hydrogen, deuterium, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a sulfanyl group, a sulfinyl group, a sulfonyl group, a phosphino group, and combinations thereof;

wherein when R is selected from the above substituted groups, the substitution is selected from the group consisting of: unsubstituted alkyl having 1 to 20 carbon atoms, unsubstituted cycloalkyl having 3 to 20 ring carbon atoms, unsubstituted heteroalkyl having 1 to 20 carbon atoms, unsubstituted arylalkyl having 7 to 30 carbon atoms, unsubstituted alkoxy having 1 to 20 carbon atoms, unsubstituted aryloxy having 6 to 30 carbon atoms, unsubstituted alkenyl having 2 to 20 carbon atoms, unsubstituted aryl having 6 to 30 carbon atoms, unsubstituted heteroaryl having 3 to 30 carbon atoms, unsubstituted alkylsilyl having 3 to 20 carbon atoms, and unsubstituted arylsilyl having 6 to 20 carbon atoms;

wherein adjacent substituents $R_1$ can be optionally joined to form a ring.

In this embodiment, the expression that adjacent substituents $R_1$ can be optionally joined to form a ring is intended to mean that in the structure represented by Formula 1, only adjacent substituents $R_1$ can be optionally joined to form a ring, and none of substituents L, R, and $R_3$ are joined to form a ring. It is obvious for those skilled in the art that adjacent substituents $R_1$ may be optionally joined to form a ring or may not be joined to form a ring.

According to an embodiment of the present disclosure, wherein the $R_2$ is, at each occurrence identically or differently, selected from -L-C(F)$_m$(R)$_n$, wherein R is hydrogen.

According to an embodiment of the present disclosure, wherein the $R_2$ is, at each occurrence identically or differently, selected from -L-C(F)$_m$(R)$_n$, wherein R is hydrogen, deuterium, methyl, ethyl, or propyl.

According to an embodiment of the present disclosure, wherein two A in Formula 1 are identically O.

According to an embodiment of the present disclosure, wherein the metal is selected from the group consisting of Cu, Ag, Au, Ru, Rh, Pd, Os, Ir, and Pt.

According to an embodiment of the present disclosure, wherein the metal is selected from Ir, Pt, or Os.

According to an embodiment of the present disclosure, wherein the metal is Ir.

According to an embodiment of the present disclosure, wherein the metal complex has a structure represented by Formula $M(L_a)_u(L_b)_v(L_c)_w$;

wherein the metal M is selected from the group consisting of: Cu, Ag, Au, Ru, Rh, Pd, Os, Ir, and Pt; preferably, the metal M is selected from Ir, Pt, or Os; more preferably, the metal M is Ir;

wherein $L_a$, $L_b$, and L, may be optionally joined to form a multi-dentate ligand, such as a tetradentate ligand or a hexadentate ligand;

wherein u=1 or 2, v=1 or 2, w=0 or 1, and u+v+w=3; when u=2, two $L_a$ may be identical or different; when v=2, two $L_b$ may be identical or different;

wherein $L_b$ and $L_c$ are, at each occurrence identically or differently, selected from the group consisting of the following structures:

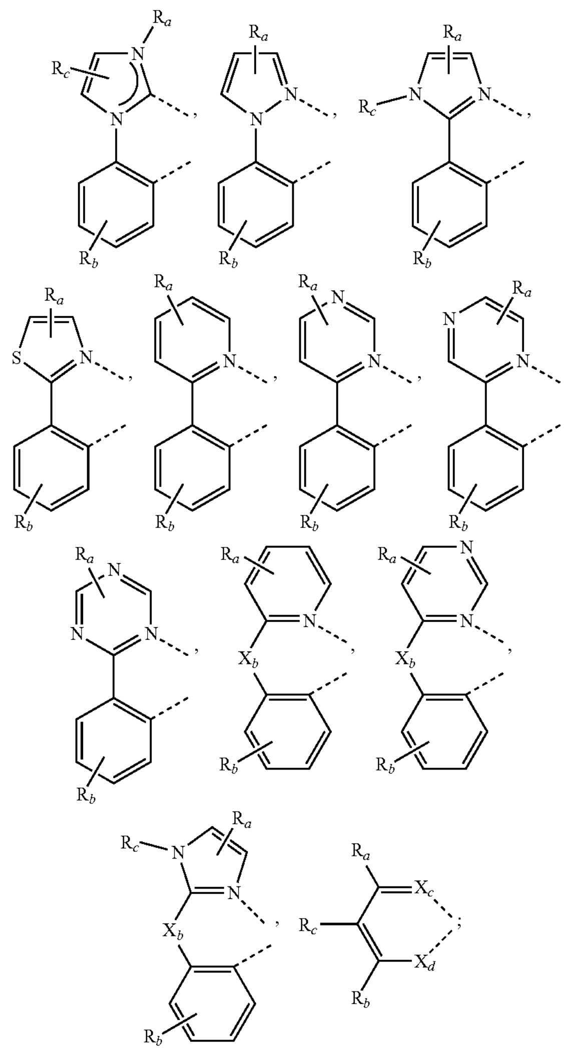

wherein $R_a$, $R_b$, and $R_c$ may represent mono-substitution, multiple-substitutions, or non-substitution;

$R_a$, $R_b$, and $R_c$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a sulfanyl group, a sulfinyl group, a sulfonyl group, a phosphino group, and combinations thereof;

$X_b$ is selected from the group consisting of: O, S, Se, $NR_{N1}$, and $CR_{C1}R_{C2}$;

$X_c$ and $X_d$ are, at each occurrence identically or differently, selected from the group consisting of: O, S, Se, and $NR_{N2}$;

$R_{N1}$, $R_{N2}$, $R_{C1}$, and $R_{C2}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a sulfanyl group, a sulfinyl group, a sulfonyl group, a phosphino group, and combinations thereof;

adjacent substituents can be optionally joined to form a ring.

In this embodiment, the expression that adjacent substituents can be optionally joined to form a ring is intended to mean that in the ligand, multiple present substituents $R_a$, multiple present substituents $R_b$, multiple present substituents Re, adjacent substituents $R_{C1}$ and $R_{C2}$, adjacent substituents $R_a$ and $R_b$, adjacent substituents $R_a$ and Re, and adjacent substituents $R_b$ and $R_c$ can be optionally joined to form a ring. It is obvious for those skilled in the art that multiple present substituents $R_a$, multiple present substituents $R_b$, multiple present substituents Re, adjacent substituents $R_{C1}$ and $R_{C2}$, adjacent substituents $R_a$ and $R_b$, adjacent substituents $R_a$ and Re, and adjacent substituents $R_b$ and $R_c$ may be joined to form a ring, or may not be joined to form a ring.

In this embodiment, the expression that when v=2, two $L_b$ may be identical or different refers to that two $L_b$ may be selected from an identical ligand structure or different ligand structures. It is obvious for those skilled in the art that when two $L_b$ are selected from different ligand structures, the two $L_b$ may be selected from two ligands with different skeleton structures (for example, the ligands with different skeleton structures,

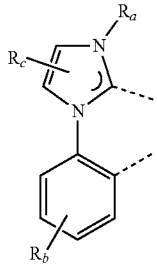

and

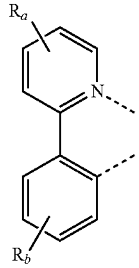

), or two ligands with the same skeleton structure but different substituents (for example, the ligands with the same skeleton structure

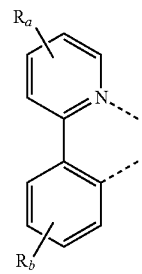

but different substituents $R_a$ and/or $R_b$).

According to an embodiment of the present disclosure, wherein the L is, at each occurrence identically or differently, selected from a single bond, substituted or unsubstituted alkylene having 1 to 20 carbon atoms, or substituted or unsubstituted cycloalkylene having 3 to 20 ring carbon atoms.

According to an embodiment of the present disclosure, wherein the L is, at each occurrence identically or differently, selected from the group consisting of: a single bond, methylene, and ethylene.

According to an embodiment of the present disclosure, wherein the R is, at each occurrence identically or differently, selected from hydrogen, deuterium, substituted or unsubstituted alkyl having 1 to 20 carbon atoms, or substituted or unsubstituted cycloalkyl having 3 to 20 ring carbon atoms.

According to an embodiment of the present disclosure, wherein the R is, at each occurrence identically or differently, selected from the group consisting of: hydrogen, deuterium, methyl, ethyl, and propyl.

According to an embodiment of the present disclosure, wherein the $R_2$ is, at each occurrence identically or differently, selected from $-L-C(F)_m(R)_n$, wherein m is 1.

According to an embodiment of the present disclosure, wherein the $R_2$ is, at each occurrence identically or differently, selected from $-L-C(F)_m(R)_n$, wherein m is 2.

According to an embodiment of the present disclosure, wherein $R_1$ and $R_3$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted alkylsilyl having 3 to 20 carbon atoms, and combinations thereof; and adjacent substituents $R_1$ can be optionally joined to form a ring.

According to an embodiment of the present disclosure, wherein $R_1$ and $R_3$ are, at each occurrence identically or differently, selected from the group consisting of: hydrogen, deuterium, fluorine, methyl, ethyl, propyl, butyl, cyclopropyl, 3-methylbutyl, 3-ethylpentyl, trifluoromethyl, 2,2,2-trifluoroethyl, trimethylsilyl, dimethylisopropylsilyl, and combinations thereof, and adjacent substituents $R_1$ can be optionally joined to form a ring.

According to an embodiment of the present disclosure, wherein y1 is 1, y2 is 0, and y3 is 0; y1 is 1, y2 is 1, and y3 is 0; y1 is 0, y2 is 0, and y3 is 1; y1 is 2, y2 is 0, and y3 is 0; y1 is 2, y2 is 1, and y3 is 0; or y1 is 2, y2 is 2, and y3 is 0.

According to an embodiment of the present disclosure, wherein the ligand $L_a$ is selected from the group consisting of $L_{a1}$ to $L_{a1129}$, the specific structures of $L_{a1}$ to $L_{a1129}$ are referred to claim 9.

According to an embodiment of the present disclosure, wherein the ligand $L_b$ is, at each occurrence identically or differently, selected from the group consisting of: $L_{b1}$ to $L_{b208}$ and deuterides of $L_{b1}$ to $L_{b208}$, the specific structures of $L_{b1}$ to $L_{b208}$ are referred to claim 10.

In this embodiment, in the expression that the ligand $L_b$ is, at each occurrence identically or differently, selected from the group consisting of: $L_{b1}$ to $L_{b208}$ and deuterides of $L_{b1}$ to $L_{b208}$, the deuterides of $L_{b1}$ to $L_{b208}$ refer to ligands formed after hydrogens in the structure of any one of $L_{b1}$ to $L_{b208}$ are partially or fully deuterated, for example, a deuterated ligand $L_{b1}$ formed after hydrogens in the ligand $L_{b1}$ are partially or fully deuterated and the ligand $L_{b1}$ both belong to the group. For those skilled in the art, when the metal complex in this embodiment includes two ligands $L_b$, it is obvious that the two ligands $L_b$ may be a same ligand or two different ligands selected from the group consisting of: $L_{b1}$ to $L_{b208}$ and deuterides of $L_{b1}$ to $L_{b208}$. For example, the two ligands $L_b$ may be identically selected from $L_{b1}$, or differently selected from $L_{b1}$ and deuterated $L_{b1}$, or may be differently selected from $L_{b1}$ and $L_{b2}$, or may also be differently selected from deuterated $L_{b1}$ and deuterated $L_{b2}$.

According to an embodiment of the present disclosure, wherein hydrogens in the ligands $L_a$, $L_b$ and $L_c$ may be partially or fully deuterated.

According to an embodiment of the present disclosure, wherein the metal complex has a structure of $Ir(L_a)(L_b)_2$, wherein $L_a$ is selected from the group consisting of $L_{a1}$ to $L_{a1129}$, and $L_b$ are, at each occurrence identically or differently, selected from the group consisting of $L_{b1}$ to $L_{b208}$ and deuterides of $L_{b1}$ to $L_{b208}$.

According to an embodiment of the present disclosure, wherein the metal complex is selected from the group consisting of Compound 1 to Compound 200, the specific structures of Compound 1 to Compound 200 are referred to claim 13.

According to an embodiment of the present disclosure, further disclosed is an electroluminescent device, including:

an anode, a cathode, and an organic layer disposed between the anode and the cathode, the organic layer includes a metal complex having a ligand $L_a$ represented by Formula 1:

Formula 1

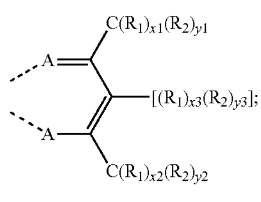

wherein A is, at each occurrence identically or differently, selected from O, S, Se, or $NR_3$;

wherein x1=0, 1, 2, or 3, y1=0, 1, 2, or 3, and x1+y1=3;

wherein x2=0, 1, 2, or 3, y2=0, 1, 2, or 3, and x2+y2=3;

wherein x3=0 or 1, y3=0 or 1, and x3+y3=1;

wherein y1+y2+y3≥1;

wherein $R_1$ and $R_3$ are, at each occurrence identically or differently, selected from the group consisting of hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a sulfanyl group, a sulfinyl group, a sulfonyl group, a phosphino group, and combinations thereof;

wherein $R_2$ is, at each occurrence identically or differently, selected from $-L-C(F)_m(R)_n$, and L is, at each occurrence identically or differently, selected from a single bond, substituted or unsubstituted alkylene having 1 to 20 carbon atoms, substituted or unsubstituted cycloalkylene having 3 to 20 ring carbon atoms, substituted or unsubstituted heteroalkylene having 1 to 20 carbon atoms, substituted or unsubstituted arylene having 6 to 30 carbon atoms, or substituted or unsubstituted heteroarylene having 3 to 30 carbon atoms;

wherein m=1 or 2, n=1 or 2, and m+n=3; when n=2, two R may be identical or different;

wherein R is, at each occurrence identically or differently, selected from the group consisting of: hydrogen, deuterium, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a sulfanyl group, a sulfinyl group, a sulfonyl group, a phosphino group, and combinations thereof;

wherein when R is selected from the above substituted groups, the substitution is selected from the group consisting of: unsubstituted alkyl having 1 to 20 carbon atoms, unsubstituted cycloalkyl having 3 to 20 ring carbon atoms, unsubstituted heteroalkyl having 1 to 20 carbon atoms, unsubstituted arylalkyl having 7 to 30 carbon atoms, unsubstituted alkoxy having 1 to 20 carbon atoms, unsubstituted aryloxy having 6 to 30 carbon atoms, unsubstituted alkenyl having 2 to 20 carbon atoms, unsubstituted aryl having 6 to 30 carbon atoms, unsubstituted heteroaryl having 3 to 30 carbon atoms, unsubstituted alkylsilyl having 3 to 20 carbon atoms, and unsubstituted arylsilyl having 6 to 20 carbon atoms;

wherein adjacent substituents $R_1$ can be optionally joined to form a ring.

According to an embodiment of the present disclosure, in the device, the organic layer is a light-emitting layer, and the metal complex is a light-emitting material.

According to an embodiment of the present disclosure, the device emits red light.

According to an embodiment of the present disclosure, the device emits white light.

According to an embodiment of the present disclosure, in the device, the organic layer further includes at least one host material, and wherein the host material includes at least one chemical group selected from the group consisting of: benzene, pyridine, pyrimidine, triazine, carbazole, azacarbazole, indolocarbazole, dibenzothiophene, aza-dibenzothiophene, dibenzofuran, azadibenzofuran, dibenzoselenophene, triphenylene, azatriphenylene, fluorene, silafluorene, naphthalene, quinoline, isoquinoline, quinazoline, quinoxaline, phenanthrene, azaphenanthrene, and combinations thereof.

According to another embodiment of the present disclosure, further disclosed is a compound formulation which includes a metal complex having a ligand $L_a$ represented by Formula 1, wherein the specific structure of the metal complex is as shown in any one of the embodiments described above.

Combination with Other Materials

The materials described in the present disclosure for a particular layer in an organic light emitting device can be used in combination with various other materials present in the device. The combinations of these materials are described in more detail in U.S. Pat. App. No. 20160359122 at paragraphs 0132-0161, which is incorporated by reference herein in its entirety. The materials described or referred to the disclosure are non-limiting examples of materials that may be useful in combination with the compounds disclosed herein, and one of skill in the art can readily consult the literature to identify other materials that may be useful in combination.

The materials described herein as useful for a particular layer in an organic light emitting device may be used in combination with a variety of other materials present in the device. For example, emissive dopants disclosed herein may be used in combination with a wide variety of hosts, transport layers, blocking layers, injection layers, electrodes and other layers that may be present. The combination of these materials is described in detail in paragraphs 0080-0101 of U.S. Pat. App. No. 20150349273, which is incorporated by reference herein in its entirety. The materials described or referred to the disclosure are non-limiting examples of materials that may be useful in combination with the compounds disclosed herein, and one of skill in the art can readily consult the literature to identify other materials that may be useful in combination.

In the embodiments of material synthesis, all reactions were performed under nitrogen protection unless otherwise stated. All reaction solvents were anhydrous and used as received from commercial sources. Synthetic products were structurally confirmed and tested for properties using one or more conventional equipment in the art (including, but not limited to, nuclear magnetic resonance instrument produced by BRUKER, liquid chromatograph produced by SHIMADZU, liquid chromatograph-mass spectrometry produced by SHIMADZU, gas chromatograph-mass spectrometry produced by SHIMADZU, differential Scanning calorimeters produced by SHIMADZU, fluorescence spectrophotometer produced by SHANGHAI LENGGUANG TECH., electrochemical workstation produced by WUHAN CORRTEST, and sublimation apparatus produced by ANHUI BEQ, etc.) by methods well known to the persons skilled in the art. In the embodiments of the device, the characteristics of the device were also tested using conventional equipment in the art (including, but not limited to, evaporator produced by ANGSTROM ENGINEERING, optical testing system produced by SUZHOU FATAR, life testing system produced by SUZHOU FATAR, and ellipsometer produced by BEIJING ELLITOP, etc.) by methods well known to the persons skilled in the art. As the persons skilled in the art are aware of the above-mentioned equipment use, test methods and other related contents, the inherent data of the sample can be obtained with certainty and without influence, so the above related contents are not further described in this patent.

Material Synthesis Example

The method for preparing a metal complex of the present disclosure is not limited herein. Typically, the following compounds are taken as examples without limitations, and synthesis routes and preparation methods thereof are described below.

Synthesis Example 1: Synthesis of Compound 105

Step 1: synthesis of di-t-butyl-2-ethylmalonate

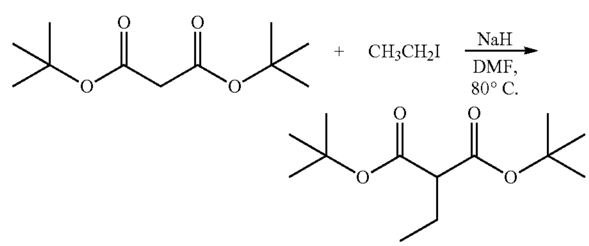

Di-t-butyl malonate (intermediate 1) (99 g, 457.76 mmol) was dissolved in DMF (763 mL), and NaH (18.3 g, 457.76 mmol, 60%) was added in portions thereto and reacted at room temperature for 30 min until no gas was generated. $CH_3CH_2I$ (59.5 g, 381.47 mmol) was added dropwise, heated to 80° C., and reacted overnight. The reaction system was cooled to room temperature, and a saturated aqueous $NH_4Cl$ solution was added thereto to quench the reaction until the system was clear. The system was extracted twice with PE. The organic phase was washed with saturated brine, dried, concentrated and purified through column chromatography (PE:EA=100:1) to obtain di-t-butyl-2-ethylmalonate (intermediate 2) (72.5 g of colorless liquid with a yield of 77.8%).

Step 2: synthesis of di-t-butyl-2-ethyl-2-(2-fluoroethyl)malonate

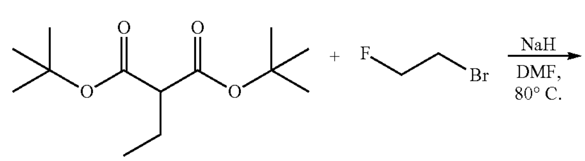

-continued

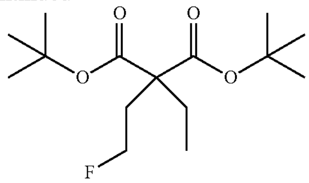

The above di-t-butyl-2-ethylmalonate (21.2 g, 86.8 mmol) was dissolved in DMF (174 mL), and NaH (4.17 g, 104.16 mmol, 60%) was added in portions thereto and reacted at room temperature for 30 min until no gas was generated. 1-Bromo-2-fluoroethane (14.33 g, 112.84 mmol) was added dropwise, heated to 80° C., and reacted overnight. The reaction system was cooled to room temperature, and a saturated aqueous $NH_4Cl$ solution was added thereto to quench the reaction until the system was clear. The system was extracted twice with PE. The organic phase was washed with saturated brine, dried with anhydrous $Na_2SO_4$, and concentrated to obtain the product di-t-butyl-2-ethyl-2-(2-fluoroethyl)malonate (intermediate 3) (25 g of white solids with a yield of 99.2%).

Step 3: synthesis of 2-ethyl-2-(2-fluoroethyl)malonic acid

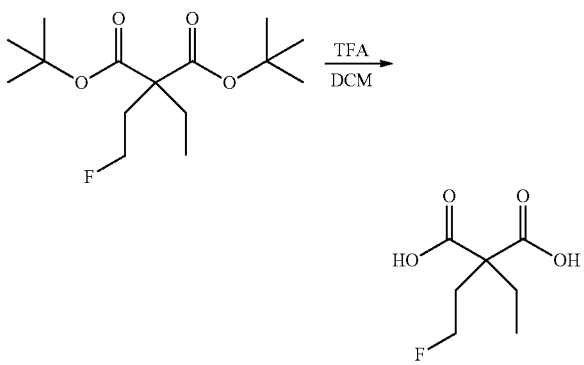

The above intermediate 3 (49 g, 169.1 mmol) was dissolved in DCM (335 mL) and cooled at 0° C., trifluoroacetic acid (TFA) (75.4 mL, 1014.6 mmol) was added dropwise thereto, and the system was naturally warmed to room temperature and reacted overnight. After TLC detected that the reaction was complete, the system was concentrated to remove DCM and TFA, added with n-hexane, and concentrated (twice). The precipitated product was filtered, washed with n-hexane, and dried to obtain 2-ethyl-2-(2-fluoroethyl) malonic acid (intermediate 4) (26.76 g of white solids with a yield of 88.8%).

Step 4: synthesis of t-butyl-2-ethyl-4-fluorobutyrate

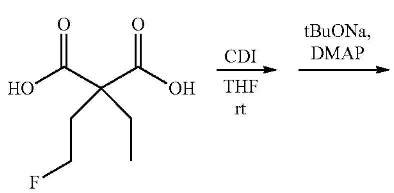

-continued

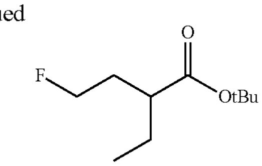

The above intermediate 4 (22 g, 123.5 mmol) was dissolved in THF (330 mL), N,N'-carbonyldiimidazole (CDI) (22.03 g, 135.85 mmol) was added in portions thereto and reacted at room temperature for 1 h, tBuONa (33.83 g, 352 mmol) was added in portions thereto, and then 4-dimethylaminopyridine (DMAP) (1.5 g, 12.35 mmol) was added and reacted for 2 h. After TLC detected that the reaction was complete, the reaction was quenched with water until the system was clear. The aqueous phase was extracted twice with methyl t-butyl ether, and the organic phase was washed successively with 200 mL of citric acid aqueous solution (1 equiv), 200 mL of saturated $NaHCO_3$ solution and saturated brine, dried with anhydrous $Na_2SO_4$, and concentrated. The organic phase was distilled under reduced pressure to obtain the product t-butyl-2-ethyl-4-fluorobutyrate (intermediate 5) (18.1 g of colorless liquid with a yield of 77%).

Step 5: synthesis of 2-ethyl-4-fluorobutyric acid

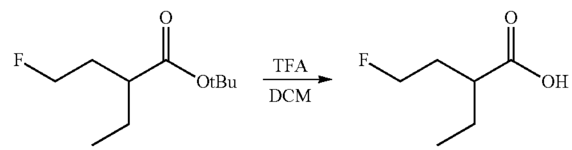

The above intermediate 5 (18.1 g, 95.13 mmol) was dissolved in DCM (380 mL) and cooled at 0° C., trifluoroacetic acid (TFA) (95 mL) was added dropwise thereto, and the system was naturally warmed to room temperature and reacted overnight. After TLC detected that the reaction was complete, the system was concentrated and distilled under reduced pressure to obtain 2-ethyl-4-fluorobutyric acid (intermediate 6) (9.6 g of colorless liquid with a yield of 75.2%).

Step 6: synthesis of 3,7-diethyl-1-fluorononane-4,6-dione

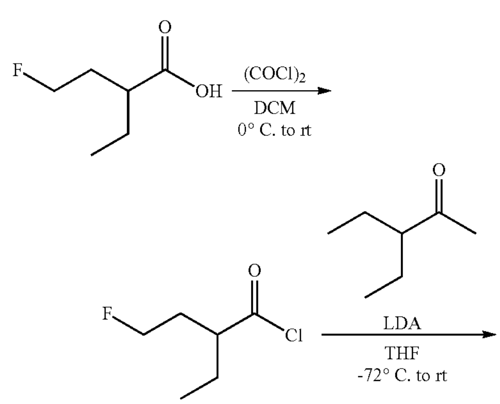

-continued

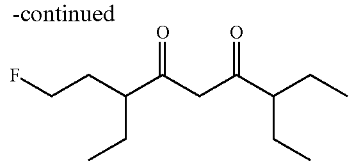

The above acid intermediate 6 (9.6 g, 71.64 mmol) was dissolved in DCM (72 mL), two drops of DMF was added to catalyze the reaction and cooled at 0° C., nitrogen was bubbled for 5 min, and oxalyl chloride (6 mL, 71.64 mmol) was added dropwise thereto. After the dropwise addition, the system was reacted at room temperature until there were no obvious bubbles and then concentrated to obtain an acyl chloride, 2-ethyl-4-fluorobutyryl chloride (intermediate 7) for later use. A solution of 3-ethylpentan-2-one (8.17 g, 71.64 mmol) in THF (200 mL) was cooled at −72° C., nitrogen was bubbled, and then lithium diisopropylamide (LDA) (35.8 mL, 71.64 mmol) was added dropwise thereto. After the dropwise addition, the reaction was continued for 30 min. The prepared acyl chloride intermediate 7 was dissolved in THF (20 mL) and added dropwise thereto, and the system was naturally warmed to room temperature and reacted overnight. After TLC detected that the reaction was complete, the reaction was quenched with saturated aqueous $NH_4Cl$ solution, the organic phase was separated, and the aqueous phase was extracted once with DCM. The organic phases were combined, dried with anhydrous $MgSO_4$, concentrated, and purified through column chromatography (PE) to obtain the target product 3,7-diethyl-1-fluorononane-4,6-dione (intermediate 8) (2 g) which was then distilled under reduced pressure to obtain the final product (1.3 g of colorless liquid with a yield of 7.9%).

Step 7: Synthesis of Compound 105

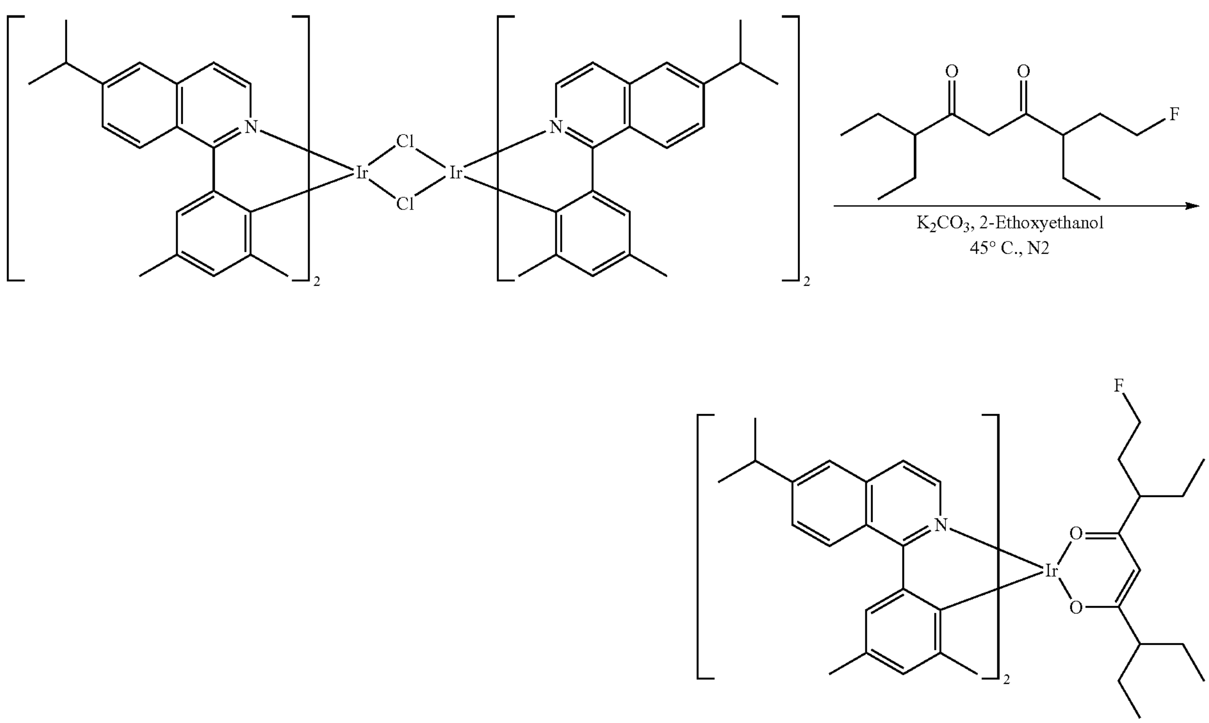

The iridium dimer (1.21 g, 0.78 mmol) was added in a 100 mL single-neck flask, and 3,7-diethyl-1-fluorononane-4,6-dione (539 mg, 2.34 mmol), $K_2CO_3$ (1.08 g, 7.8 mmol), and 2-ethoxyethanol (26 mL) were added thereto. After purged with nitrogen, the system was reacted overnight at 45° C. After TLC detected that the reaction was complete, the reaction solution was cooled to room temperature. The reaction solution was filtered through Celite, the filter cake was washed with an appropriate amount of EtOH, and the crude product was washed with DCM into a 250 mL eggplant-shaped flask. EtOH (about 30 mL) was added to the crude product, and DCM was removed through rotary evaporation at normal temperature until solids were precipitated. The solids were filtered and washed with an appropriate amount of EtOH to obtain 1 g of crude product. The crude product was repeatedly subjected to the above DCM/EtOH treatment steps, and the precipitated product was purified and separated by an basified silica gel column (PE:EA=100:1) to obtain the product, Compound 105 (550 mg with a yield of 60.4%). The product was confirmed as the target product with a molecular weight of 970.

Synthesis Example 2: Synthesis of Compound 107

Step 1: synthesis of di-t-butyl-2-(2,2-difluoroethyl)-2-ethylmalonate

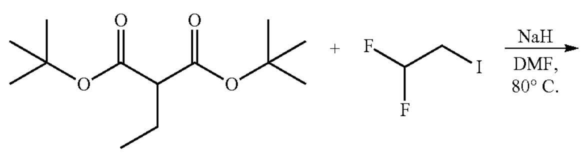

-continued

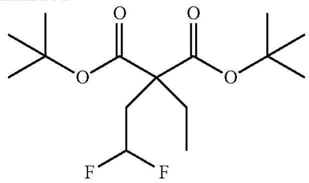

The above intermediate 2 (50 g, 204.7 mmol) was dissolved in DMF (174 mL), and NaH (9.83 g, 245.64 mmol, 60%) was added in portions thereto and reacted at room temperature for 30 min until no gas was generated. 1,1-Difluoro-2-iodoethane (51.08 g, 266.11 mmol) was added dropwise, heated to 80° C., and reacted overnight. The reaction was cooled to room temperature, and a saturated aqueous $NH_4Cl$ solution was added thereto to quench the reaction until the system was clear. The system was extracted twice with PE. The organic phase was washed with saturated brine, dried with anhydrous $Na_2SO_4$, and concentrated to obtain di-t-butyl-2-(2,2-difluoroethyl)-2-ethylmalonate (intermediate 9) (63 g of white solids directly used for the reaction in the next step).

Step 2: synthesis of 2-(2,2-difluoroethyl)-2-ethylmalonic acid

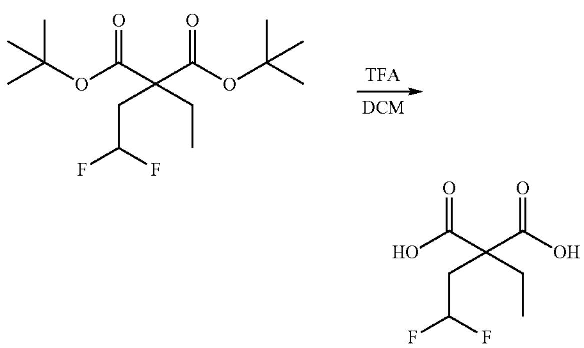

Intermediate 9 was dissolved in DCM (400 mL) and cooled at 0° C., trifluoroacetic acid (TFA) (91.23 mL, 1228.2 mmol) was added dropwise thereto, and the system was naturally warmed and reacted overnight. After TLC detected that the reaction was complete, the system was concentrated to remove DCM and TFA, added with n-hexane and concentrated (twice). The precipitated product was filtered, washed with n-hexane, and dried to obtain 2-(2,2-difluoroethyl)-2-ethylmalonic acid (intermediate 10) (36.3 g of white solids with a two-step yield of 90.4%).

Step 3: synthesis of t-butyl-2-ethyl-4,4-difluorobutyrate

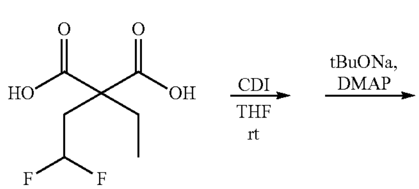

-continued

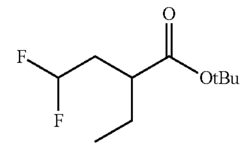

The above intermediate 10 (35.4 g, 180.47 mmol) was dissolved in THF (530 mL), N,N'-carbonyldiimidazole (CDI) (32.2 g, 198.52 mmol) was added in portions thereto and reacted at room temperature for 30 min, tBuONa (49.42 g, 514.34 mmol) was added in portions thereto, and then 4-dimethylaminopyridine (DMAP) (2.2 g, 18 mmol) was added and reacted for 2 h. After TLC detected that the reaction was complete, the reaction was quenched with water until the system was clear. The aqueous phase was extracted twice with methyl t-butyl ether, and the organic phase was washed successively with a citric acid aqueous solution (1 equiv.), a saturated $Na_2CO_3$ solution and saturated brine, dried with anhydrous $Na_2SO_4$, and concentrated. The organic phase was distilled under reduced pressure to obtain the product t-butyl-2-ethyl-4,4-difluorobutyrate (intermediate 11) (21.3 g of colorless liquid with a yield of 56.7%).

Step 4: synthesis of 2-ethyl-4,4-difluorobutyric acid

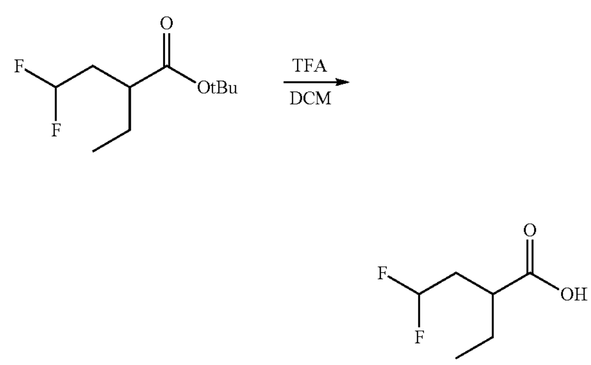

The above intermediate 11 was dissolved in DCM (410 mL) and cooled at 0° C., trifluoroacetic acid (TFA) (102.5 mL) was added dropwise thereto, and the system was naturally warmed and reacted overnight. After TLC detected that the reaction was complete, the reaction solution was concentrated and distilled under reduced pressure to obtain 2-ethyl-4,4-difluorobutyric acid (intermediate 12) (13.46 g of colorless liquid with a yield of 86.5%).

Step 5: synthesis of 3,7-diethyl-1,1-difluorononane-4,6-dione

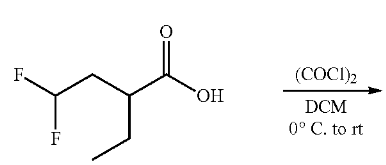

-continued

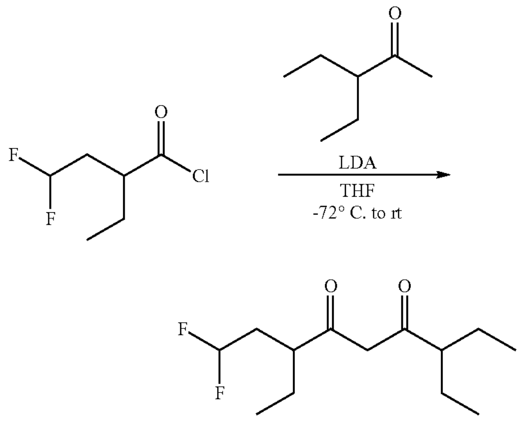

The above acid intermediate 12 (6.3 g, 41.4 mmol) was dissolved in DCM (42 mL), two drops of DMF was added to catalyze the reaction and cooled at 0° C., nitrogen was bubbled for 5 min, and oxalyl chloride (3.5 mL, 41.4 mmol) was added dropwise thereto. After the dropwise addition, the system was reacted at room temperature until there were no obvious bubbles and then concentrated to obtain an acyl chloride, 2-ethyl-4,4-difluorobutyryl chloride (intermediate 13) for later use. A solution of 3-ethylpentan-2-one (6.55 g, 45.54 mmol) in THF (150 mL) was cooled at −72° C., nitrogen was bubbled, and then lithium diisopropylamide (LDA) (25 mL, 50 mmol) was added dropwise thereto. After the dropwise addition, the reaction was continued for 30 min. The prepared acyl chloride intermediate 13 was dissolved in THF (20 mL) and added dropwise thereto, and the system was naturally warmed to room temperature and reacted overnight. After TLC detected that the reaction was complete, the reaction was quenched with saturated aqueous $NH_4Cl$ solution, the organic phase was separated, and the aqueous phase was extracted once with DCM. The organic phases were combined, dried with anhydrous $MgSO_4$, concentrated, and purified through column chromatography (PE) to obtain the crude product diethyl-1,1-difluorononane-4,6-dione (intermediate 14) (3 g) which was then distilled under reduced pressure to obtain 3,7-diethyl-1,1-difluorononane-4,6-dione (intermediate 14) (1 g of colorless liquid with a yield of 9.7%).

Step 6: Synthesis of Compound 107

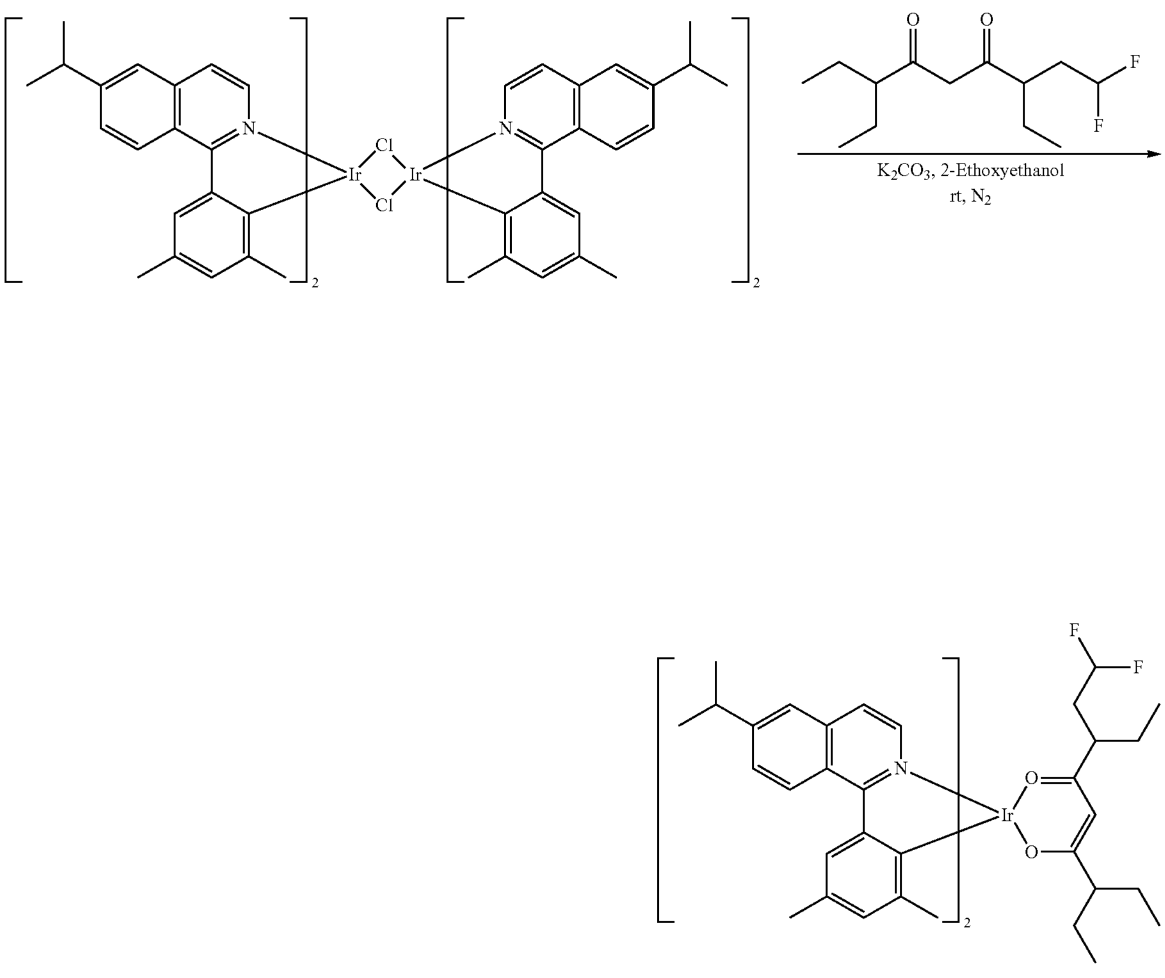

The iridium dimer (1.32 g, 0.85 mmol) was added in a 100 mL single-neck flask, and 3,7-diethyl-1,1-difluorononane-4,6-dione (intermediate 14) (633 mg, 2.55 mmol), $K_2CO_3$ (1.17 g, 8.5 mmol) and 2-ethoxyethanol (28 mL) were added. After purged with nitrogen, the system was reacted at room temperature for two days. After TLC monitored that the iridium dimer was consumed completely, the reaction solution was filtered through Celite, the filter cake was washed with an appropriate amount of EtOH, and the crude product was washed with DCM into a 250 mL eggplant-shaped flask. EtOH (about 30 mL) was added to the crude product, and DCM was removed through rotary evaporation at normal temperature until solids were precipitated. The solids were filtered and washed with an appropriate amount of EtOH to obtain 1.3 g of crude product. The crude product was repeatedly subjected to the above DCM/EtOH treatment steps, and the precipitated solids were purified through basified silica gel column chromatography (PE:EA=100:1) to obtain the product, Compound 107 (1.1 g with a yield of 65.5%). The product was confirmed as the target product with a molecular weight of 988.

Those skilled in the art will appreciate that the above preparation methods are merely illustrative. Those skilled in the art can obtain other compound structures of the present disclosure through the modifications of the preparation methods.

DEVICE EXAMPLE

Device Example 1.1

First, a glass substrate having an Indium Tin Oxide (ITO) anode with a thickness of 120 nm was cleaned and then treated with oxygen plasma and UV ozone. After the treatment, the substrate was dried in a glovebox to remove water. The substrate was then mounted on a substrate holder and placed in a vacuum chamber. Organic layers specified below were sequentially deposited through vacuum thermal evaporation on the ITO anode at a rate of 0.2 to 2 Angstroms per second at a vacuum degree of about $10^{-8}$ torr. The Compound HI was used as a hole injection layer (HIL) (100 Å). The Compound HT was used as a hole transporting layer (HTL) (400 Å). The Compound EB1 was used as an electron blocking layer (EBL) (50 Å). The Compound 105 of the present disclosure was doped in the Compound RH and co-deposited at a ratio of 3:97 for use as an emissive layer (EML) (400 Å). The Compound HB was used as a hole blocking layer (HBL) (50 Å). On the HBL, the Compound ET and 8-hydroxyquinolinolato-lithium (Liq) were co-deposited as an electron transporting layer (ETL) (350 Å). Finally, 8-hydroxyquinolinolato-lithium (Liq) with a thickness of 1 nm was deposited as an electron injection layer, and Al with a thickness of 120 nm was deposited as a cathode. The device was transferred back to the glovebox and encapsulated with a glass lid and a moisture getter to complete the device.

Device Comparative Example 1.1

The implementation mode in Device Comparative Example 1.1 was the same as that in Device Example 1.1, except that the Compound 105 of the present disclosure was replaced with the comparative Compound RD1 in the EML.

Device Comparative Example 1.2

The implementation mode in Device Comparative Example 1.2 was the same as that in Device Example 1.1, except that the compound 105 of the present disclosure was replaced with the comparative Compound RD2 in the EML.

Device Example 2.1

The implementation mode in Device Example 2.1 was the same as that in Device Example 1.1, except that the Compound 105 of the present disclosure was replaced with the Compound 107 of the present disclosure in the EML, and the Compound EB1 was replaced with the Compound EB2 in the EBL.

Device Comparative Example 2.1

The implementation mode in Device Comparative Example 2.1 was the same as that in Device Example 2.1, except that the Compound 107 of the present disclosure was replaced with the comparative Compound RD1 in the EML.

Device Comparative Example 2.2

The implementation mode in Device Comparative Example 2.2 was the same as that in Device Example 2.1, except that the Compound 107 of the present disclosure was replaced with the comparative Compound RD2 in the EML.

Detailed structures and thicknesses of layers of the devices are shown in the following table. A layer using more than one material is obtained by doping different compounds at their weight ratios as described.

TABLE 1

Device structures in device examples and comparative examples

| Device No. | HIL | HTL | EBL | EML | HBL | ETL |
|---|---|---|---|---|---|---|
| Example 1.1 | Compound HI (100 Å) | Compound HT (400 Å) | Compound EB1 (50 Å) | Compound RH: Compound 105 (97: 3) (400 Å) | Compound HB (50 Å) | Compound ET: Liq (40: 60) (350 Å) |
| Comparative Example 1.1 | Compound HI (100 Å) | Compound HT (400 Å) | Compound EB1 (50 Å) | Compound RH: Compound RD1 (97: 3) (400 Å) | Compound HB (50 Å) | Compound ET: Liq (40: 60) (350 Å) |
| Comparative Example 1.2 | Compound HI (100 Å) | Compound HT (400 Å) | Compound EB1 (50 Å) | Compound RH: Compound RD2 (97: 3) (400 Å) | Compound HB (50 Å) | Compound ET: Liq (40: 60) (350 Å) |

TABLE 1-continued

Device structures in device examples and comparative examples

| Device No. | HIL | HTL | EBL | EML | HBL | ETL |
|---|---|---|---|---|---|---|
| Example 2.1 | Compound HI (100 Å) | Compound HT (400 Å) | Compound EB2 (50 Å) | Compound RH: Compound 107 (97: 3) (400 Å) | Compound HB (50 Å) | Compound ET: Liq (40: 60) (350 Å) |
| Example 2.1 | Compound HI (100 Å) | Compound HT (400 Å) | Compound EB2 (50 Å) | Compound RH: Compound RD1 (97: 3) (400 Å) | Compound HB (50 Å) | Compound ET: Liq (40: 60) (350 Å) |
| Example 2.2 | Compound HI (100 Å) | Compound HT (400 Å) | Compound EB2 (50 Å) | Compound RH: Compound RD2 (97: 3) (400 Å) | Compound HB (50 Å) | Compound ET: Liq (40: 60) (350 Å) |

Structures of the materials used in the devices are shown as follows:

Compound HI

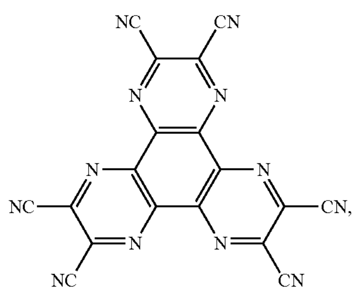

Compound HT

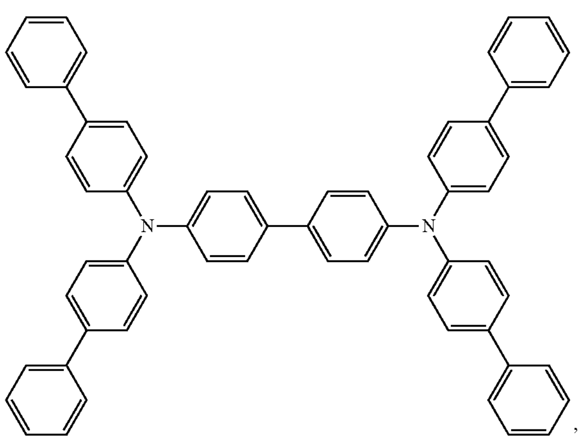

Compound EB1

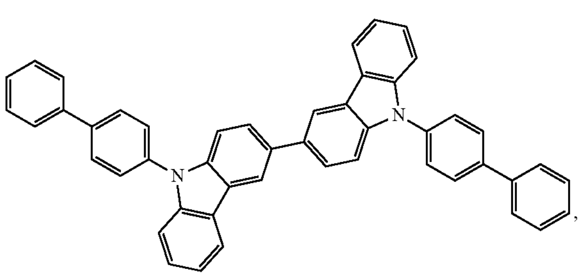

-continued

Compound RH

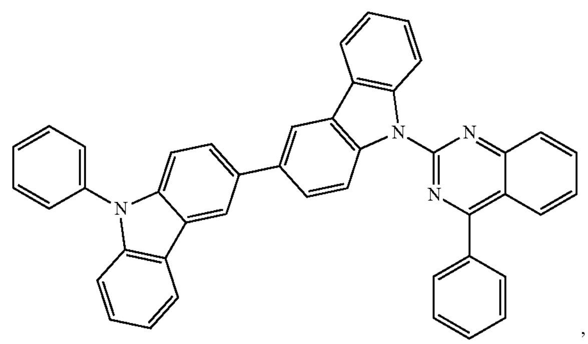

Compound EB2

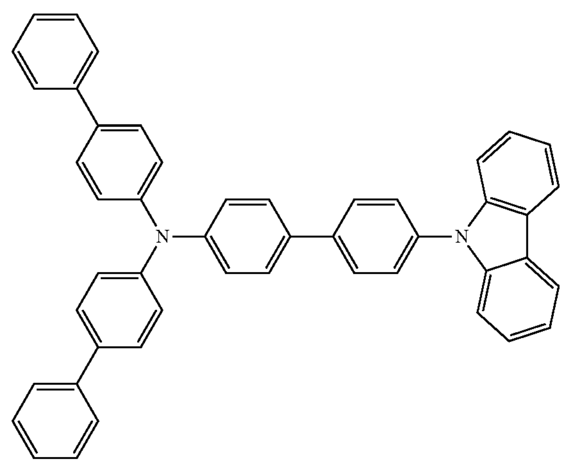

-continued

Compound ET

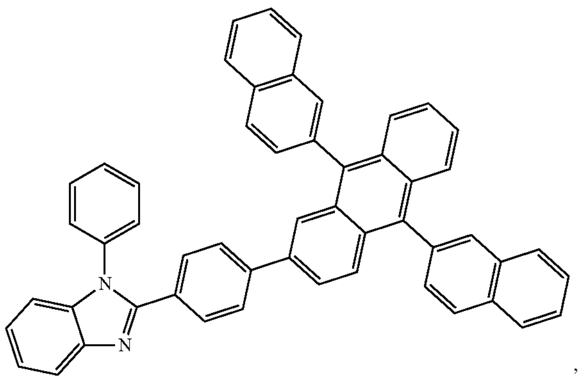

Compound Liq

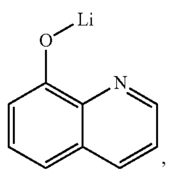

Compound HB

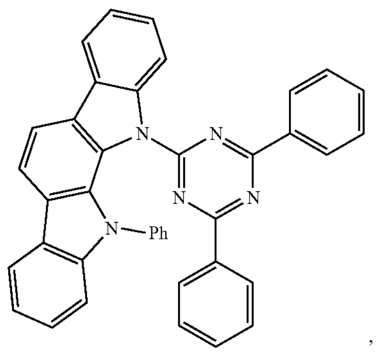

Compound 107

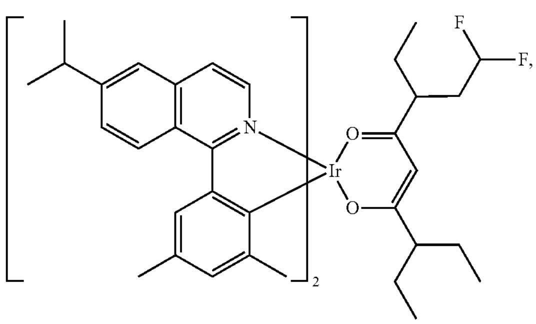

-continued

Compound 105

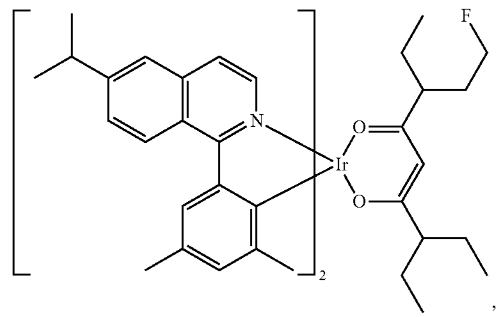

Compound RD1

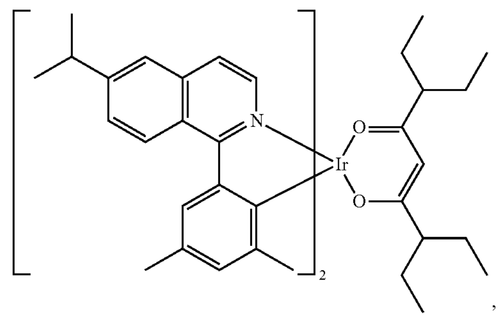

Compound RD2

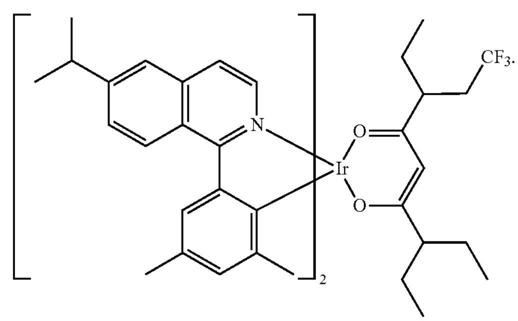

Current-voltage-luminance (IVL) characteristics of the devices were measured. Table 2 shows CIE data and maximum emission wavelength $\lambda_{max}$ measured at 1000 nits, and voltage (V), external quantum efficiency (EQE), and lifetime (LT97) measured at a current density of 15 mA/cm$^2$.

TABLE 2

Device data

| Device No. | CIE (x, y) | $\lambda_{max}$ (nm) | Voltage (V) | EQE (%) | LT97 (h) |
|---|---|---|---|---|---|
| Example 1.1 | (0.682, 0.317) | 625 | 4.55 | 23.97 | 1942 |
| Comparative Example 1.1 | (0.683, 0.316) | 625 | 4.76 | 22.68 | 1511 |
| Comparative Example 1.2 | (0.677, 0.322) | 621 | 4.66 | 23.05 | 1727 |

TABLE 2-continued

| Device data | | | | | |
|---|---|---|---|---|---|
| Device No. | CIE (x, y) | $\lambda_{max}$ (nm) | Voltage (V) | EQE (%) | LT97 (h) |
| Example 2.1 | (0.679, 0.320) | 623 | 4.56 | 23.33 | 2143 |
| Comparative Example 2.1 | (0.684, 0.315) | 625 | 4.81 | 22.41 | 1942 |
| Comparative Example 2.2 | (0.678, 0.321) | 621 | 4.50 | 23.21 | 1763 |

Discussion

It can be seen from Table 2 that by adjusting the number of fluorine atoms joined to the ancillary ligand in the complex, the color of the complex can be fine-tuned, and at the same time, the complex has better performance than the comparative compound in terms of voltage, efficiency, and lifetime. Example 1.1 that uses the complex with one fluorine atom on the chain alkyl group joined to the ancillary ligand has a CIE coordinate (0.682, 0.317) which varies slightly relative to the CIE coordinate (0.683, 0.316) of Comparative Example 1.1 without fluorine substitution. Example 1.1 and Comparative Example 1.1 have basically the same color and a maximum emission wavelength of nearly 625 nm. However, Example 1.1 has a lower driving voltage (4.55 V vs 4.76 V), external quantum efficiency increased by more than 5% (23.97% vs 22.68%), and a lifetime increased by 28% (1942 h vs 1511 h). Compared with Comparative Example 1.2 in which the same carbon of the ancillary ligand of the comparative complex is fully substituted by fluorine, Example 1.1 has a significantly redder color (625 nm vs 621 nm) and exhibits better performance such as a lower voltage (4.55 V vs 4.66 V), higher external quantum efficiency (23.97% vs 23.05%), and a longer lifetime (1942 h vs 1727 h), reflecting the advantages of the ancillary ligand with a single fluorine atom substitution.

Compared to the CIE coordinate (0.684, 0.315) of Comparative Example 2.1 without fluorine substitution, the CIE coordinate of Example 2.1 that uses the complex including two fluorine atoms on the chain alkyl group joined to the ancillary ligand is shifted to (0.679, 0.320), and the maximum emission wavelength is correspondingly blue-shifted by 2 nm (623 nm vs 625 nm). However, Example 2.1 has a driving voltage decreased by 5% (4.56 V vs 4.81 V), external quantum efficiency increased by 4% (23.33% vs 22.41%), and a lifetime increased by 10% (2143 h vs 1942 h). After two fluorine atoms are joined, the color of Example 2.1 is closer to that of Comparative Example 2.2 (621 nm). In comparison, Example 2.1 and Comparative Example 2.2 have basically the same driving voltage and efficiency, but the lifetime of Example 2.1 is increased by about 22% (2143 h vs 1763 h).

To conclude, the compound of the present disclosure controls partial fluorine substitutions on the ancillary ligand. From electrochemical analysis experiments, the HOMOs of the comparative Compound RD1, the Compound 105 of the present disclosure, the Compound 107 of the present disclosure, and the comparative Compound RD2 are -5.060 eV, −5.072 eV, -5.079 eV, and -5.081 eV, respectively, that is, the more fluorine atoms on the same chain alkyl carbon in the ancillary ligand, the deeper the HOMO. To fine-tune the emission color through the subtle HOMO energy level difference caused by the number of fluorine atoms is an unprecedented in-depth study. At the same time, the reduced driving voltage, the improved efficiency, and the obvious advantages in lifetime of the device highlight the uniqueness and importance of the compound of the present disclosure.

It should be understood that various embodiments described herein are examples and not intended to limit the scope of the present disclosure. Therefore, it is apparent to those skilled in the art that the present disclosure as claimed may include variations of specific embodiments and preferred embodiments described herein. Many of the materials and structures described herein may be replaced with other materials and structures without departing from the spirit of the present disclosure. It should be understood that various theories as to why the present disclosure works are not intended to be limitative.

What is claimed is:

1. A metal complex, wherein the metal complex has a structure represented by Formula $M(L_a)_u(L_b)_v(L_c)_w$; wherein the metal M is selected from the group consisting of Cu, Ag, Au, Ru, Rh, Pd, Os, Ir, and Pt; wherein $L_a$, $L_b$, and $L_c$ can be optionally joined to form a multi-dentate ligand; wherein u=1 or 2, v=1 or 2, w=0 or 1, and u+v+w=3; when u=2, two $L_a$ may be identical or different; when v=2, two $L_b$ may be identical or different;

wherein $L_a$ with a structure represented by Formula 1:

Formula 1

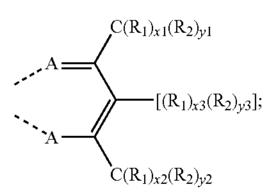

wherein A is, at each occurrence identically or differently, selected from O, S, Se, or $NR_3$;

wherein x1=0, 1, 2, or 3, y1=0, 1, 2, or 3, and x1+y1=3;

wherein x2=0, 1, 2, or 3, y2=0, 1, 2, or 3, and x2+y2=3;

wherein x3=0 or 1, y3=0 or 1, and x3+y3=1;

wherein y1+y2+y3≥1;

wherein $R_1$ and $R_3$ are, at each occurrence identically or differently, selected from the group consisting of hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted alkoxy having 1 to 20 carbon atoms, substituted or unsubstituted alkenyl having 2 to 20 carbon atoms, substituted or unsubstituted alkylsilyl having 3 to 20 carbon atoms, substituted or unsubstituted amino having 0 to 20 carbon atoms, an acyl group, a carbonyl group, a carboxylic acid group, an ester group, a cyano group, an isocyano group, a sulfanyl group, a sulfinyl group, a sulfonyl group, a phosphino group, and combinations thereof;

and when $R_1$ and $R_3$ are selected from the above substituted groups, the substitution is selected from the group consisting of deuterium, unsubstituted alkyl having 1 to 20 carbon atoms, unsubstituted cycloalkyl having 3 to 20 ring carbon atoms, unsubstituted heteroalkyl having 1 to 20 carbon atoms, unsubstituted alkoxy having 1 to 20 carbon atoms, unsubstituted alkenyl having 2 to 20 carbon atoms, unsubstituted alkylsilyl having 3 to 20 carbon atoms, unsubstituted amino having 0 to 20 carbon atoms, a cyano group, an isocyano group, and combinations thereof;

wherein $R_2$ is, at each occurrence identically or differently, selected from -L-C(F)$_m$(R)$_n$, and L is, at each occurrence identically or differently, selected from a single bond, substituted or unsubstituted alkylene having 1 to 20 carbon atoms, substituted or unsubstituted cycloalkylene having 3 to 20 ring carbon atoms;

and when L is selected from the above substituted groups, the substitution is selected from the group consisting of deuterium, unsubstituted alkyl having 1 to 20 carbon atoms, unsubstituted cycloalkyl having 3 to 20 ring carbon atoms, unsubstituted heteroalkyl having 1 to 20 carbon atoms, unsubstituted alkoxy having 1 to 20 carbon atoms, unsubstituted alkenyl having 2 to 20 carbon atoms, unsubstituted alkylsilyl having 3 to 20 carbon atoms, unsubstituted amino having 0 to 20 carbon atoms, a cyano group, an isocyano group, and combinations thereof;

wherein m=1 or 2, n=1 or 2, and m+n=3; when n=2, two R may be identical or different;

wherein R is, at each occurrence identically or differently, selected from the group consisting of hydrogen, deuterium, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted alkoxy having 1 to 20 carbon atoms, substituted or unsubstituted alkenyl having 2 to 20 carbon atoms, substituted or unsubstituted alkylsilyl having 3 to 20 carbon atoms, substituted or unsubstituted amino having 0 to 20 carbon atoms, an acyl group, a carbonyl group, a carboxylic acid group, an ester group, a cyano group, an isocyano group, a sulfanyl group, a sulfinyl group, a sulfonyl group, a phosphino group, and combinations thereof;

and when R is selected from the above substituted groups, the substitution is selected from the group consisting of unsubstituted alkyl having 1 to 20 carbon atoms, unsubstituted cycloalkyl having 3 to 20 ring carbon atoms, unsubstituted heteroalkyl having 1 to 20 carbon atoms, unsubstituted alkoxy having 1 to 20 carbon atoms, unsubstituted alkenyl having 2 to 20 carbon atoms, and unsubstituted alkylsilyl having 3 to 20 carbon atoms;

wherein adjacent substituents $R_1$ can be optionally joined to form a ring;

wherein $L_b$ and $L_c$ are, at each occurrence identically or differently, selected from the group consisting of structures represented by Formula 2, Formula 3, or Formula 4:

Formula 2

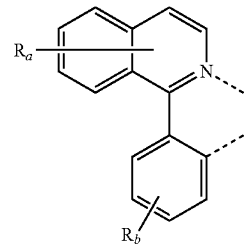

Formula 3

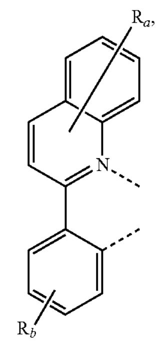

Formula 4

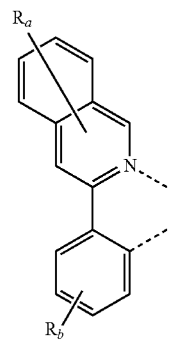

wherein $R_a$ and $R_b$ each represent mono-substitution, multiple-substitutions, or non-substitution;

wherein substituents $R_a$ and $R_b$ are, at each occurrence identically or differently, selected from the group consisting of hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a sulfanyl group, a sulfinyl group, a sulfonyl group, a phosphino group, and combinations thereof, wherein none of adjacent substituents $R_a$ and $R_b$ in Formula 2, Formula 3, and Formula 4 are joined to form a ring.

2. The metal complex of claim 1, wherein the metal is selected from the group consisting of Ir and Pt.

3. The metal complex of claim 1, wherein L is selected from a single bond, substituted or unsubstituted alkylene having 1 to 20 carbon atoms, or substituted or unsubstituted cycloalkylene having 3 to 20 ring carbon atoms.

4. The metal complex of claim 1, wherein R is selected from hydrogen, deuterium, substituted or unsubstituted alkyl having 1 to 20 carbon atoms, or substituted or unsubstituted cycloalkyl having 3 to 20 ring carbon atoms.

5. The metal complex of claim 1, wherein $R_2$ is, at each occurrence identically or differently, selected from -L-C(F)$_m$(R)$_n$, wherein m is 2.

6. The metal complex of claim 1, wherein $R_1$ and $R_3$ are, at each occurrence identically or differently, selected from the group consisting of hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted alkylsilyl having 3 to 20 carbon atoms, and combinations thereof; and adjacent substituents $R_1$ can be optionally joined to form a ring.

7. The metal complex of claim 1, wherein y1 is 1, y2 is 0, and y3 is 0; y1 is 1, y2 is 1, and y3 is 0; y1 is 0, y2 is 0, and y3 is 1; y1 is 2, y2 is 0, and y3 is 0; y1 is 2, y2 is 1, and y3 is 0; or y1 is 2, y2 is 2, and y3 is 0.

8. The metal complex of claim 1, wherein $L_a$ is selected from the group consisting of the following structures:

$L_{a1}$

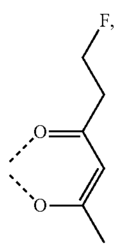

$L_{a2}$

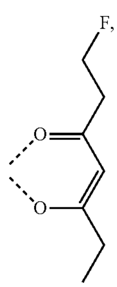

$L_{a3}$

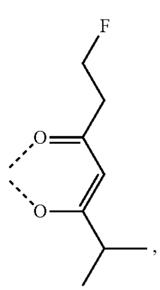

-continued $L_{a4}$

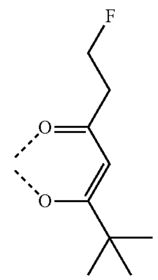

$L_{a5}$

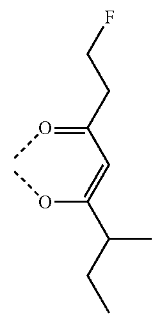

$L_{a6}$

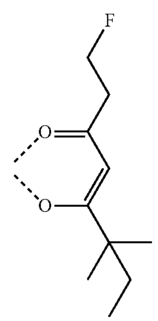

$L_{a7}$

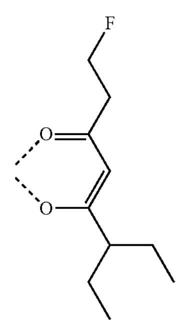

$L_{a8}$

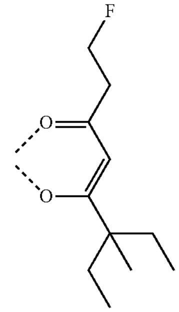

$L_{a9}$
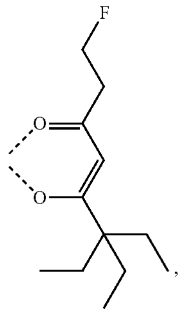
$L_{a10}$
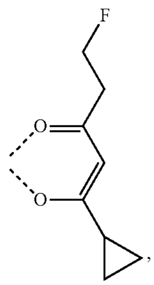
$L_{a11}$
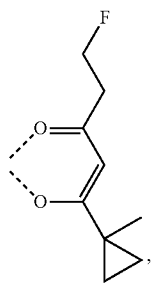
$L_{a12}$
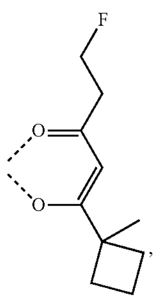
$L_{a13}$
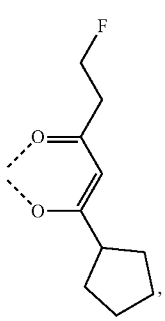
$L_{a14}$
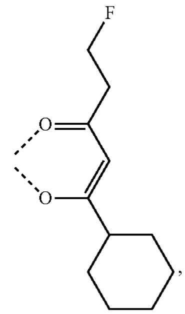
$L_{a15}$
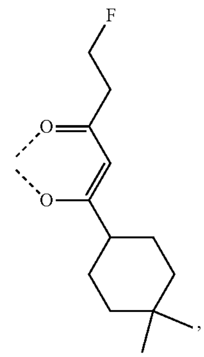
$L_{a16}$
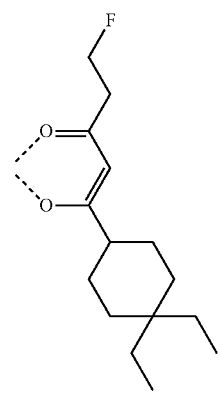
$L_{a17}$
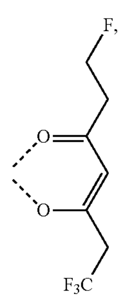

-continued
$L_{a18}$
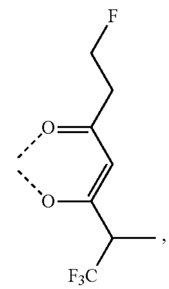
$L_{a19}$
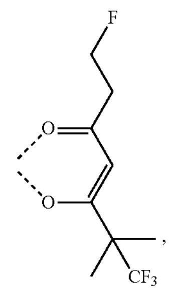
$L_{a20}$
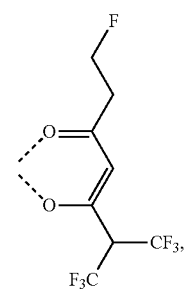
$L_{a21}$
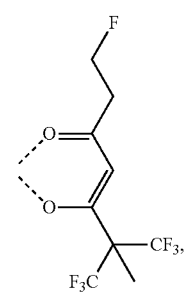
$L_{a22}$
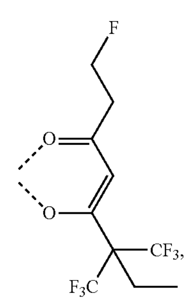
-continued
$L_{a23}$
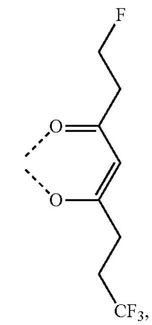
$L_{a24}$
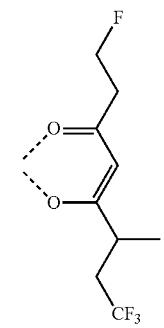
$L_{a25}$
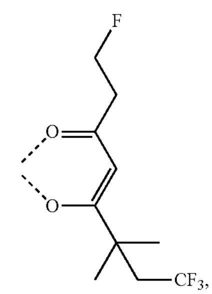
$L_{a26}$
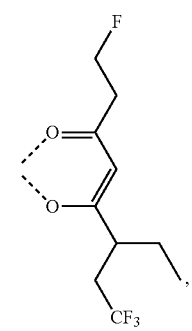
$L_{a27}$
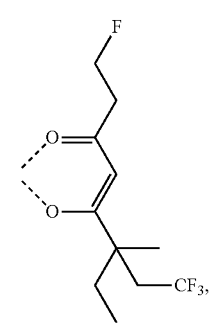

-continued
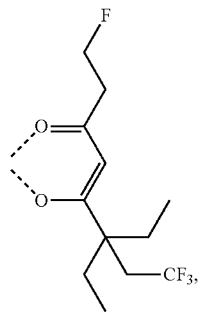
$L_{a28}$
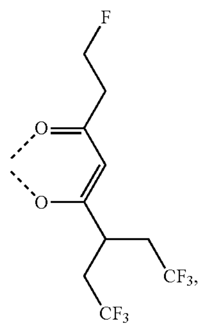
$L_{a29}$
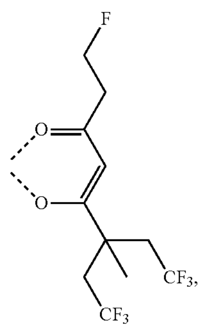
$L_{a30}$
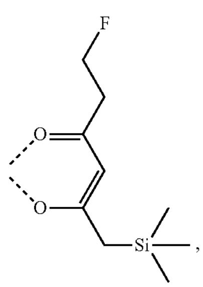
$L_{a31}$
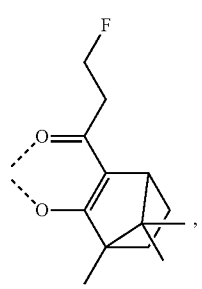
$L_{a32}$
-continued
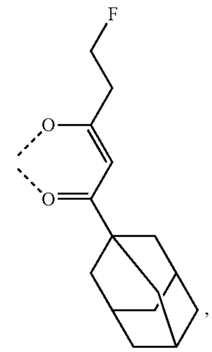
$L_{a33}$
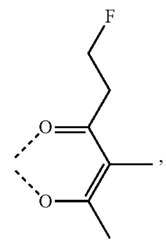
$L_{a34}$
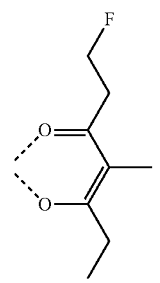
$L_{a35}$
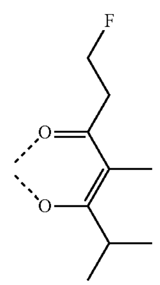
$L_{a36}$
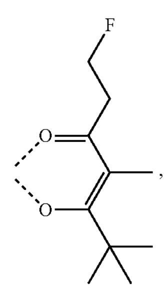
$L_{a37}$ -continued
$L_{a38}$
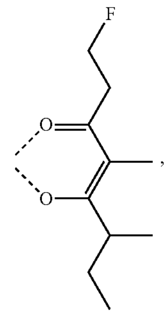
$L_{a39}$
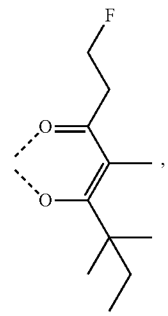
$L_{a40}$
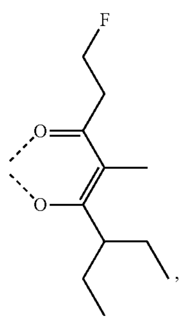
$L_{a41}$
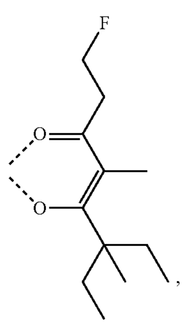
$L_{a42}$
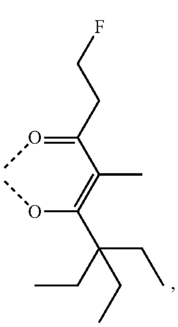
-continued
$L_{a43}$
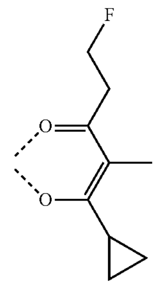
$L_{a44}$
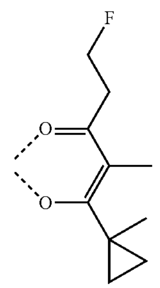
$L_{a45}$
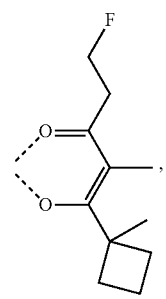
$L_{a46}$
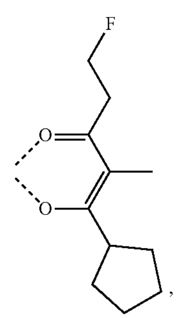
$L_{a47}$
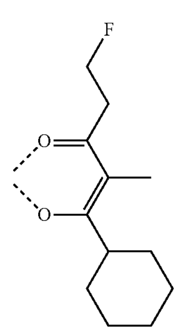

-continued
$L_{a48}$
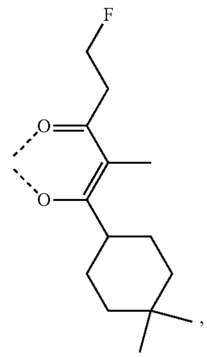
$L_{a49}$
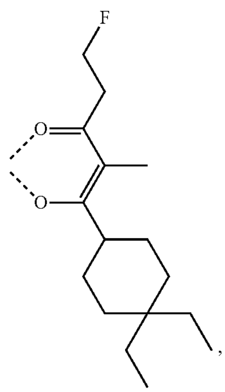
$L_{a50}$
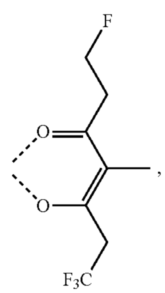
$L_{a51}$
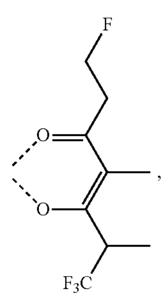
$L_{a52}$
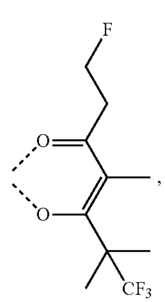
-continued
$L_{a53}$
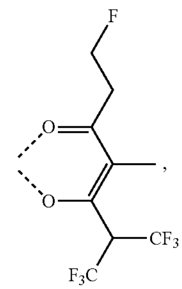
$L_{a54}$
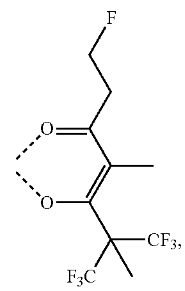
$L_{a55}$
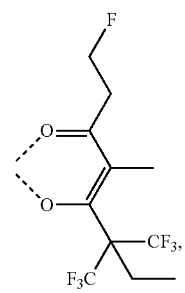
$L_{a56}$
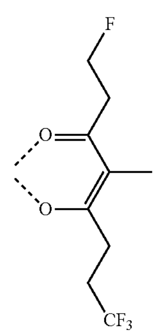
$L_{a57}$
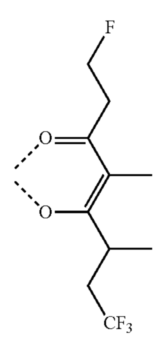

-continued
$L_{a58}$
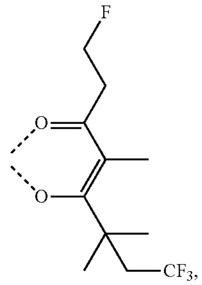
$L_{a59}$
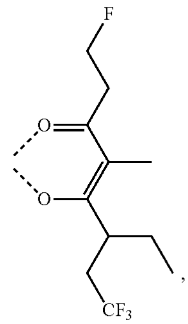
$L_{a60}$
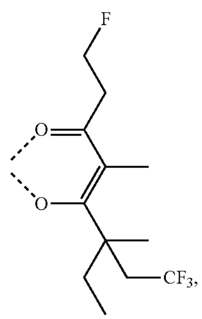
$L_{a61}$
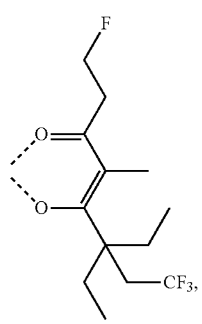
$L_{a62}$
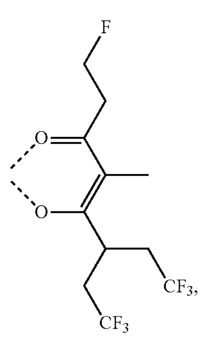
-continued
$L_{a63}$
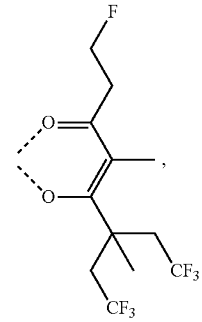
$L_{a64}$
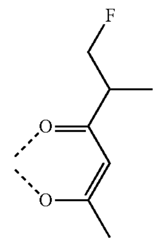
$L_{a65}$
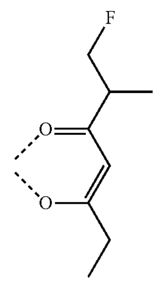
$L_{a66}$
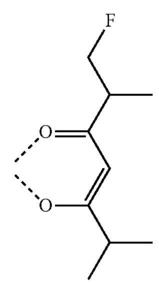
$L_{a67}$
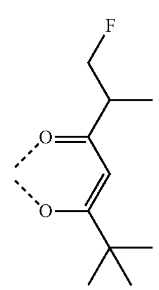

-continued
$L_{a68}$
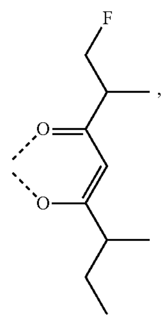
$L_{a69}$
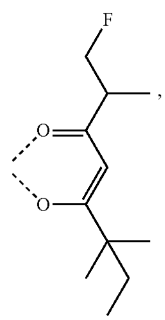
$L_{a70}$
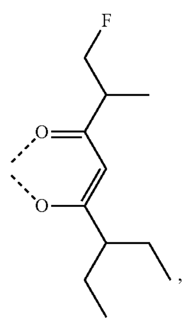
$L_{a71}$
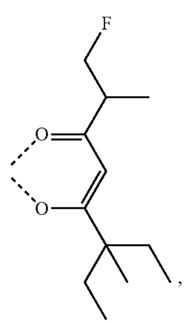
$L_{a72}$
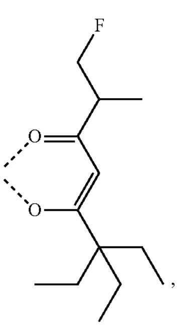
-continued
$L_{a73}$
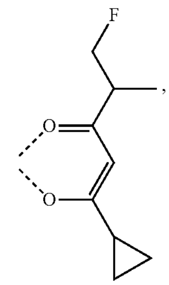
$L_{a74}$
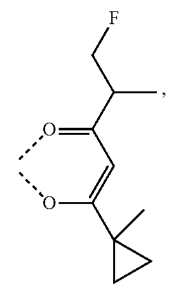
$L_{a75}$
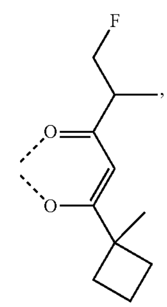
$L_{a76}$
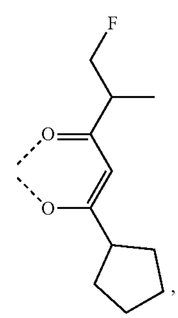
$L_{a77}$
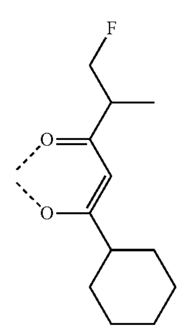

$L_{a78}$
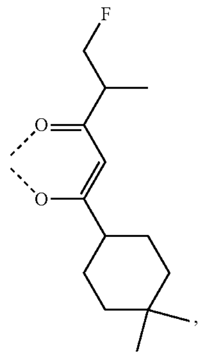
$L_{a79}$
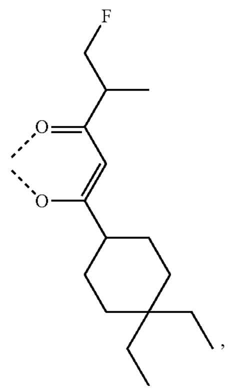
$L_{a80}$
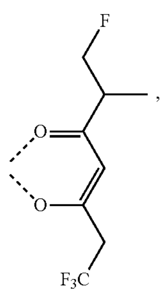
$L_{a81}$
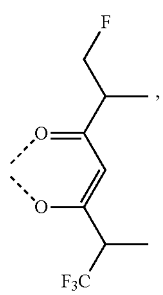
$L_{a82}$
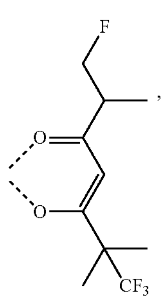
$L_{a83}$
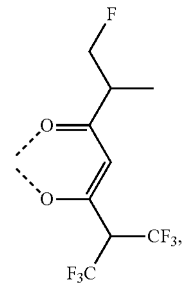
$L_{a84}$
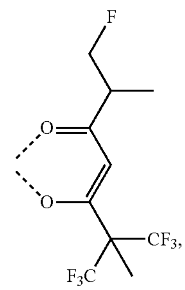
$L_{a85}$
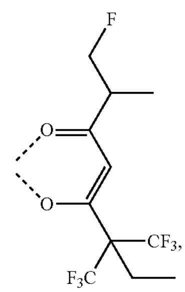
$L_{a86}$
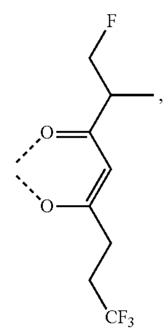
$L_{a87}$
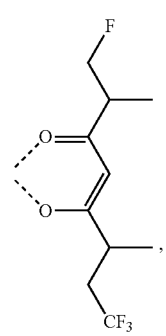

$L_{a88}$
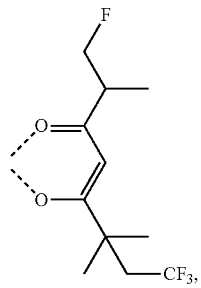
$L_{a89}$
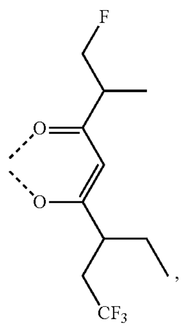
$L_{a90}$
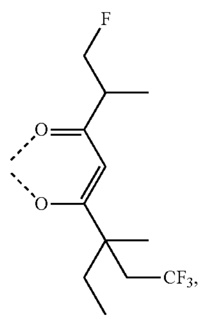
$L_{a91}$
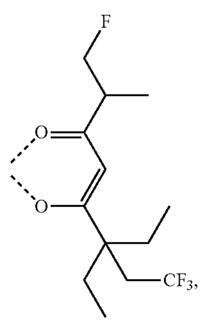
$L_{a92}$
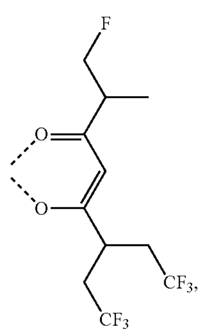
$L_{a93}$
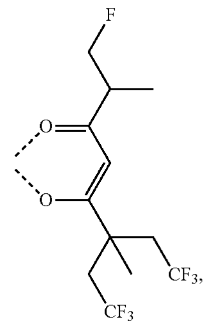
$L_{a94}$
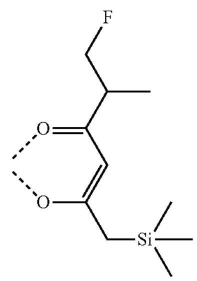
$L_{a95}$
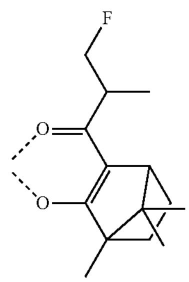
$L_{a96}$
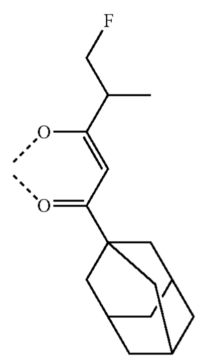
$L_{a97}$
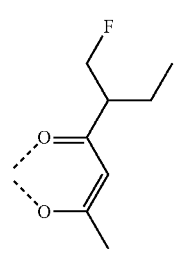

$L_{a98}$
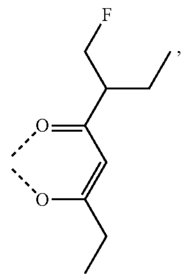
$L_{a99}$
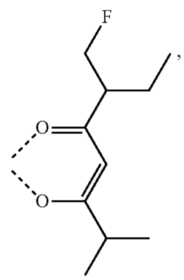
$L_{a100}$
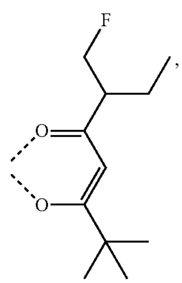
$L_{a101}$
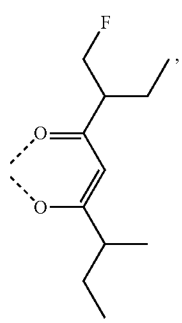
$L_{a102}$
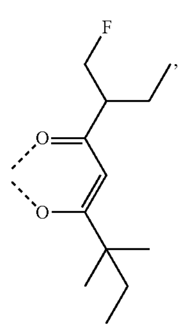
$L_{a103}$
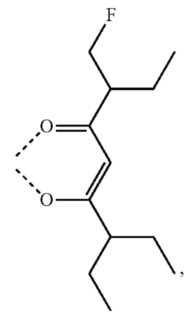
$L_{a104}$
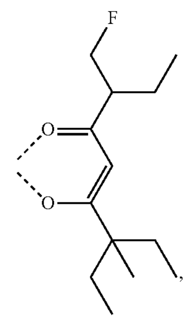
$L_{a105}$
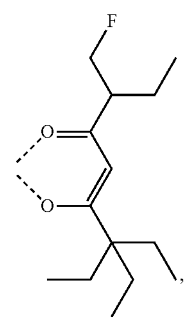
$L_{a106}$
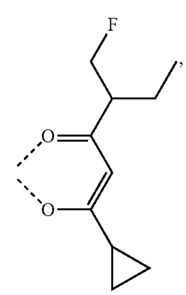
$L_{a107}$
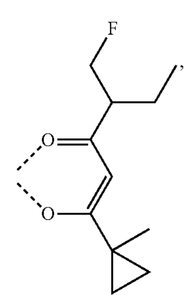

$L_{a108}$
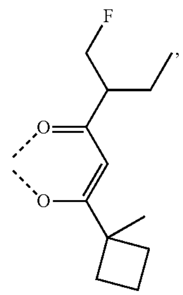
$L_{a109}$
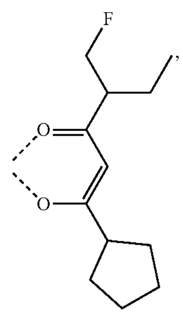
$L_{a110}$
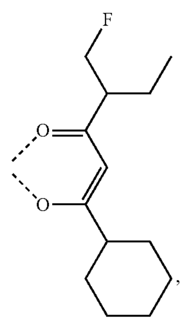
$L_{a111}$
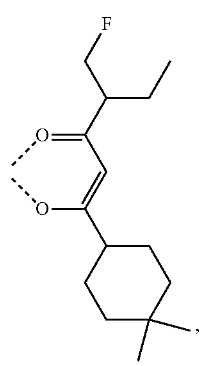
$L_{a112}$
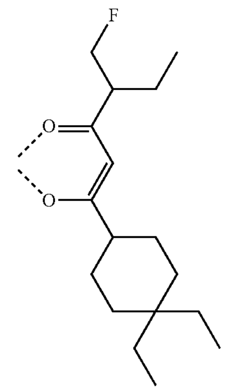
$L_{a113}$
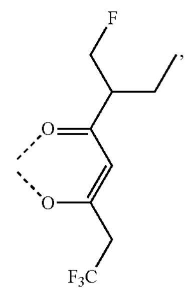
$L_{a114}$
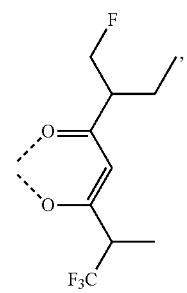
$L_{a115}$
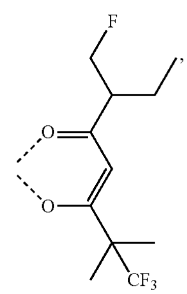
$L_{a116}$
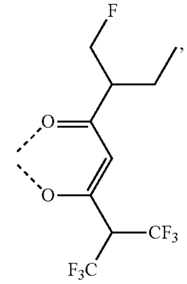

$L_{a117}$
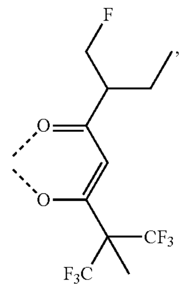
$L_{a118}$
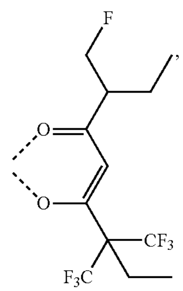
$L_{a119}$
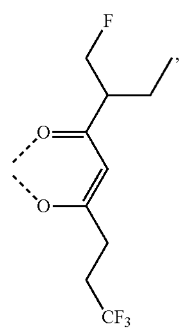
$L_{a120}$
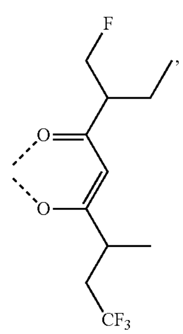
$L_{a121}$
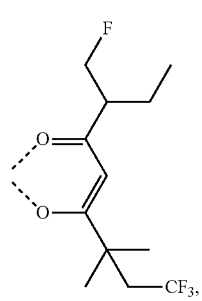
$L_{a122}$
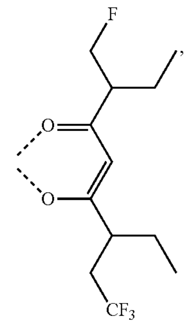
$L_{a123}$
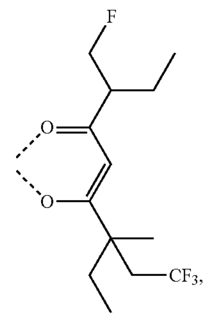
$L_{a124}$
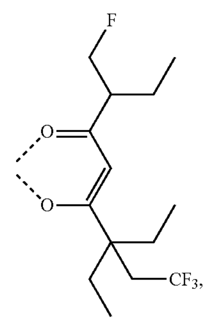
$L_{a125}$
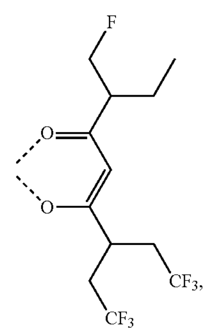
$L_{a126}$
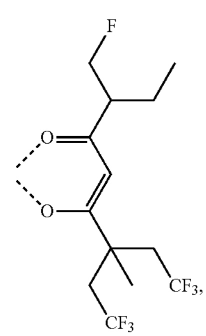

-continued
$L_{a127}$
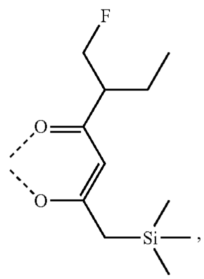
$L_{a128}$
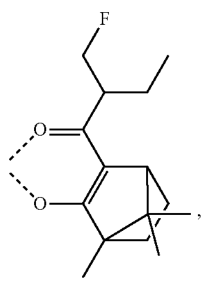
$L_{a129}$
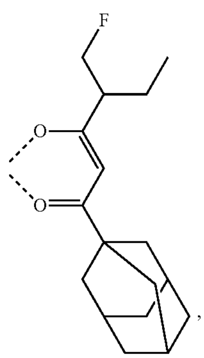
$L_{a130}$
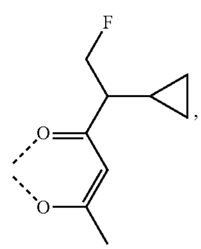
$L_{a131}$
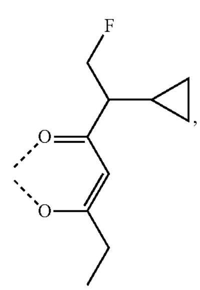
-continued
$L_{a132}$
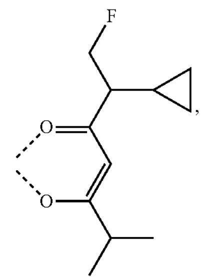
$L_{a133}$
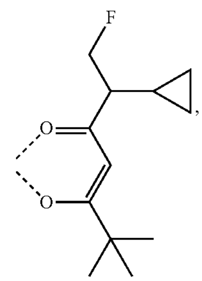
$L_{a134}$
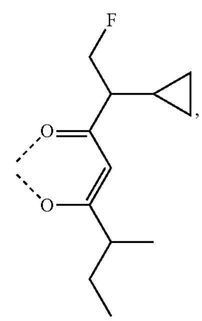
$L_{a135}$
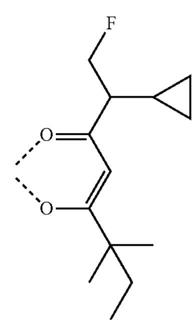
$L_{a136}$
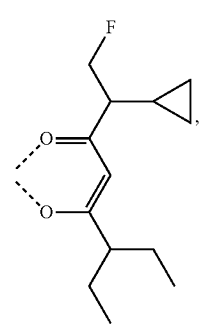

-continued
$L_{a137}$
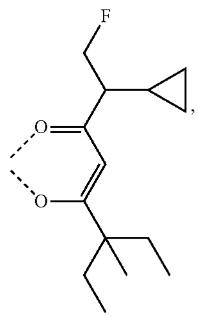
$L_{a138}$
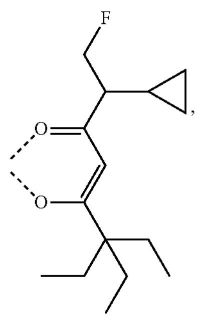
$L_{a139}$
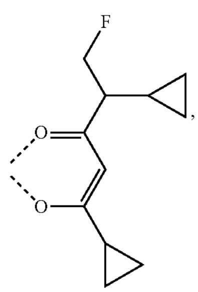
$L_{a140}$
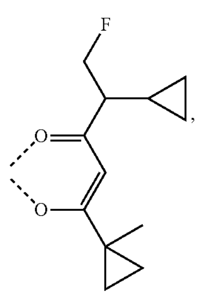
$L_{a141}$
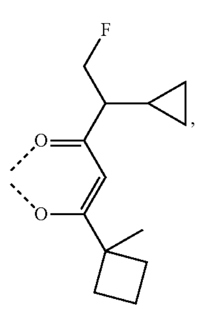
-continued
$L_{a142}$
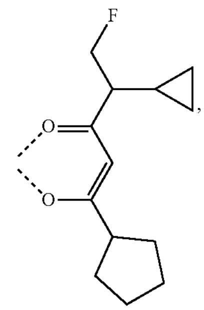
$L_{a143}$
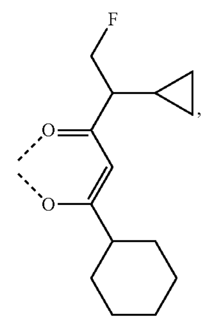
$L_{a144}$
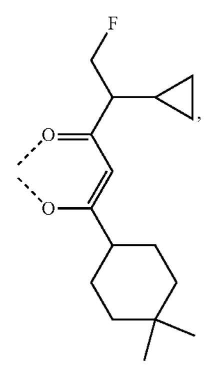
$L_{a145}$
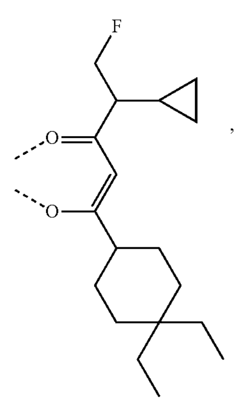

$L_{a146}$
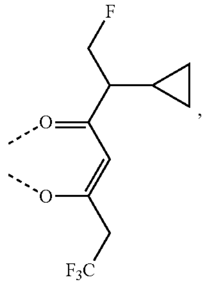
$L_{a147}$
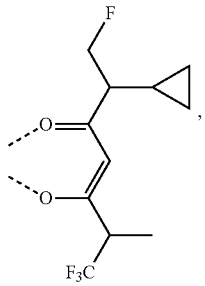
$L_{a148}$
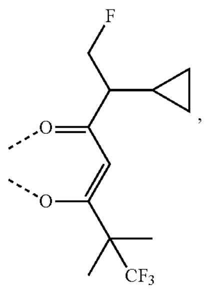
$L_{a149}$
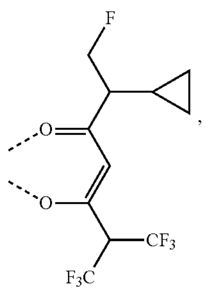
$L_{a150}$
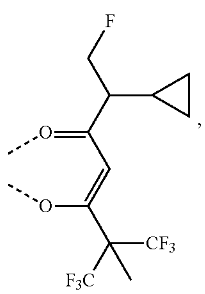
$L_{a151}$
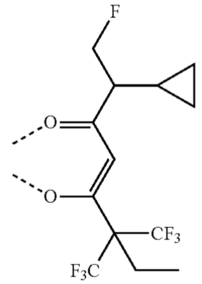
$L_{a152}$
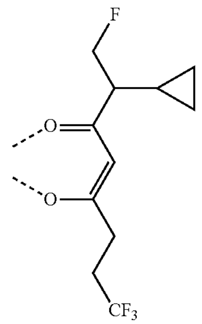
$L_{a153}$
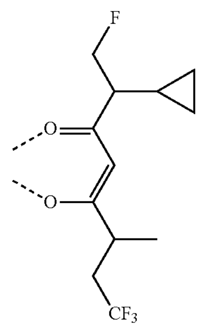
$L_{a154}$
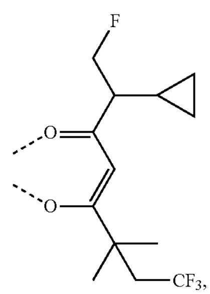
$L_{a155}$
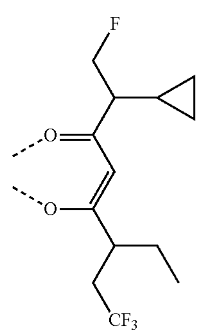

-continued
$L_{a156}$
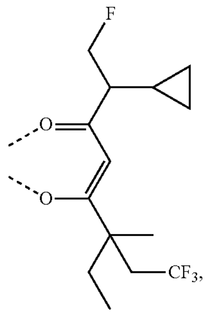
$L_{a157}$
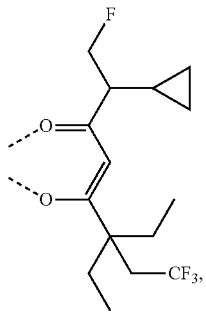
$L_{a158}$
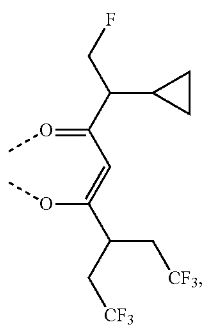
$L_{a159}$
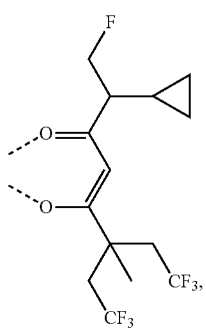
$L_{a160}$
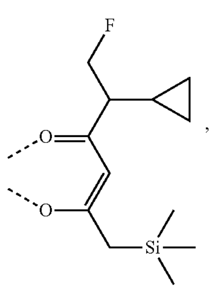
-continued
$L_{a161}$
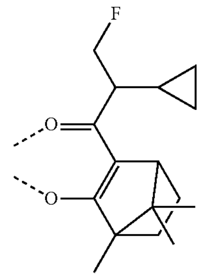
$L_{a162}$
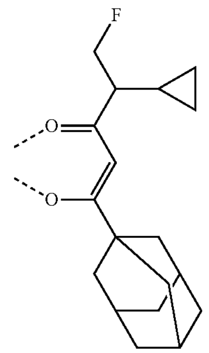
$L_{a163}$
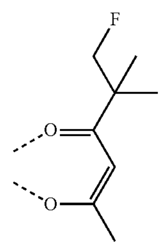
$L_{a164}$
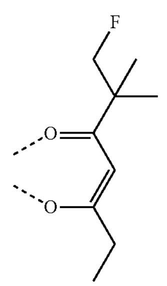
$L_{a165}$
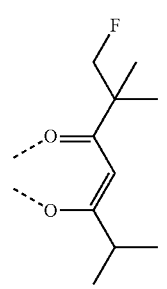

-continued
$L_{a166}$
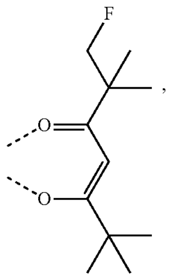
$L_{a167}$
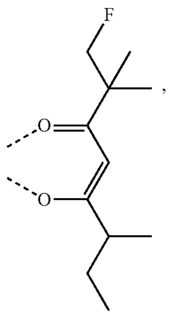
$L_{a168}$
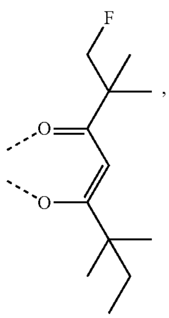
$L_{a169}$
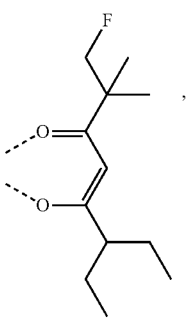
$L_{a170}$
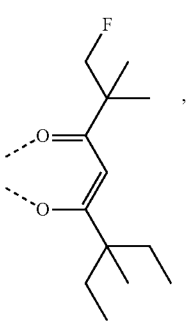
-continued
$L_{a171}$
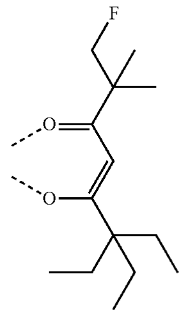
$L_{a172}$
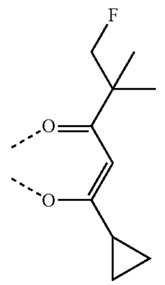
$L_{a173}$
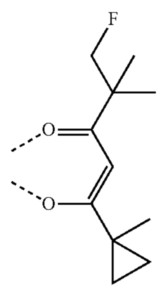
$L_{a174}$
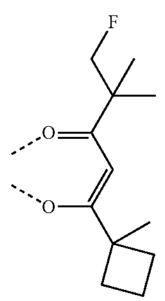
$L_{a175}$
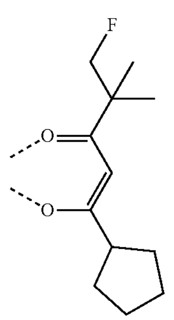

-continued
$L_{a176}$
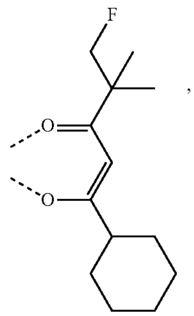
$L_{a177}$
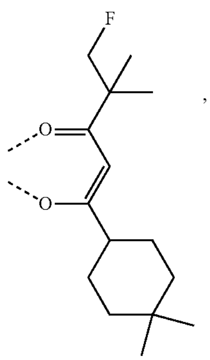
$L_{a178}$
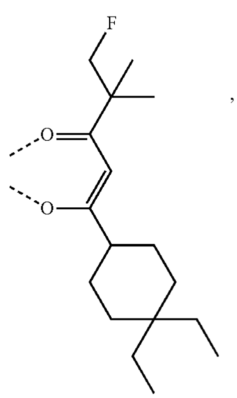
$L_{a179}$
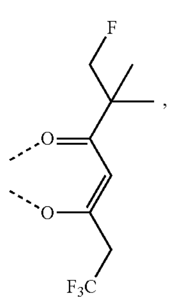
-continued
$L_{a180}$
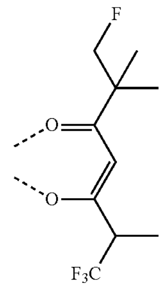
$L_{a181}$
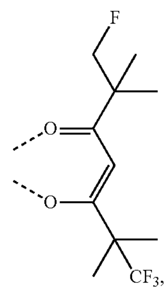
$L_{a182}$
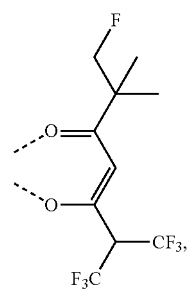
$L_{a183}$
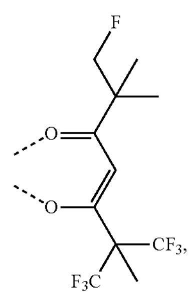
$L_{a184}$
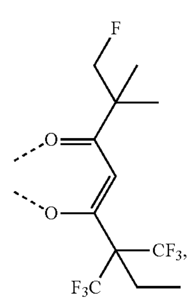

$L_{a185}$
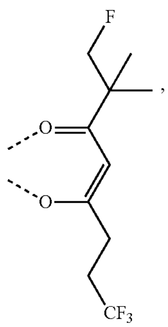
$L_{a186}$
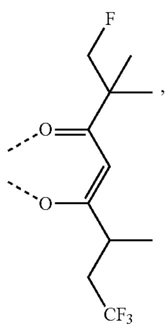
$L_{a187}$
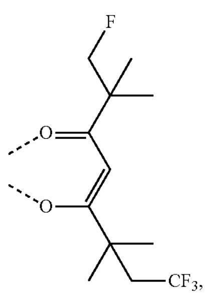
$L_{a188}$
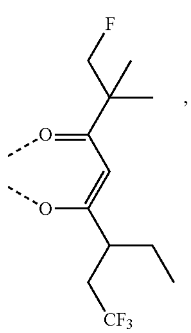
$L_{a189}$
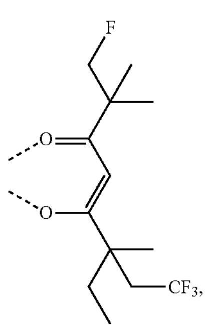
$L_{a190}$
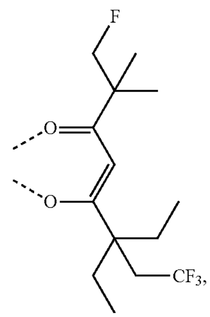
$L_{a191}$
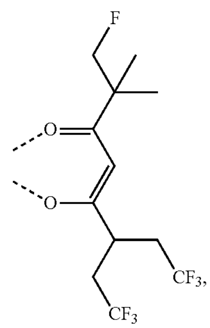
$L_{a192}$
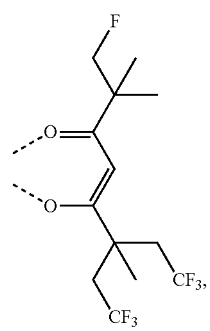
$L_{a193}$
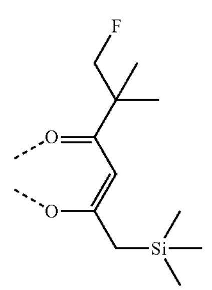
$L_{a194}$
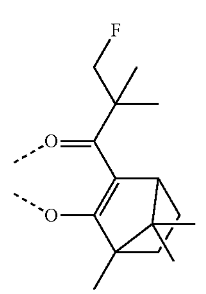

-continued
$L_{a195}$
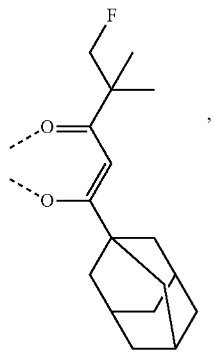
$L_{a196}$
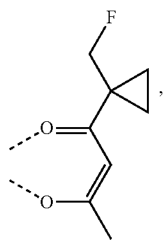
$L_{a197}$
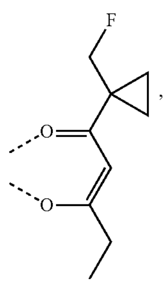
$L_{a198}$
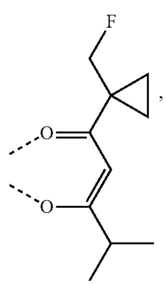
$L_{a199}$
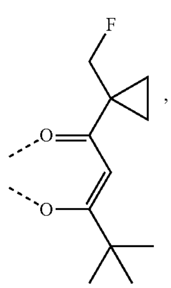
-continued
$L_{a200}$
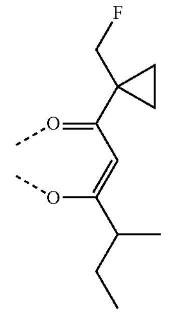
$L_{a201}$
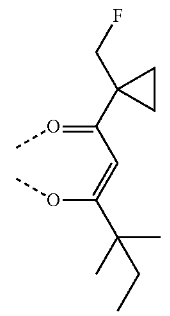
$L_{a202}$
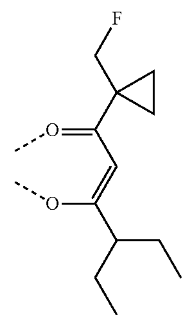
$L_{a203}$
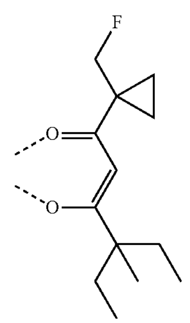
$L_{a204}$
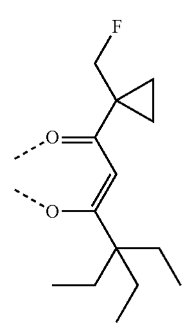

$L_{a205}$
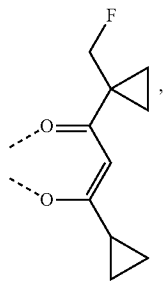
$L_{a206}$
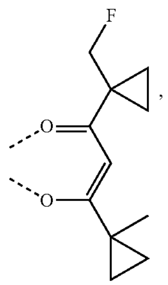
$L_{a207}$
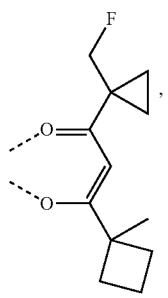
$L_{a208}$
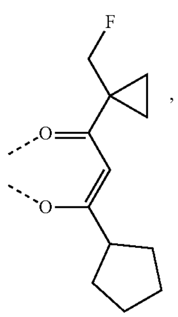
$L_{a209}$
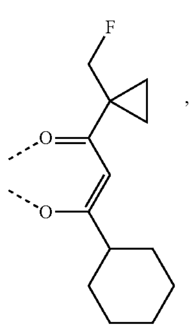
$L_{a210}$
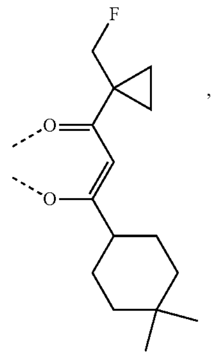
$L_{a211}$
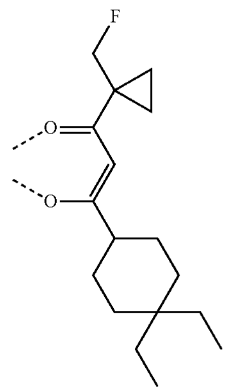
$L_{a212}$
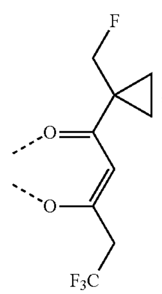
$L_{a213}$
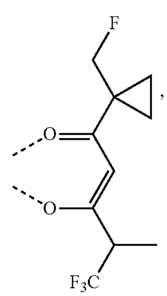
$L_{a214}$
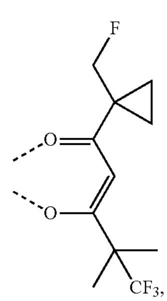

$L_{a215}$
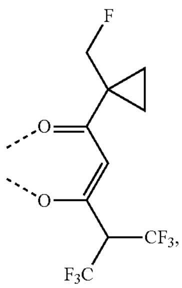
$L_{a216}$
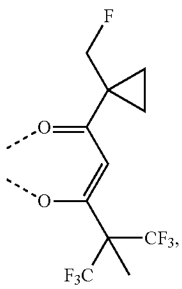
$L_{a217}$
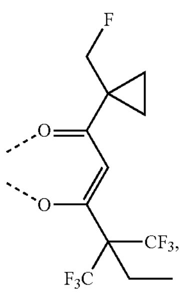
$L_{a218}$
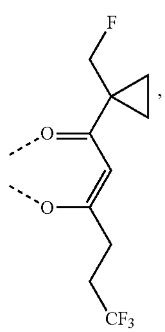
$L_{a219}$
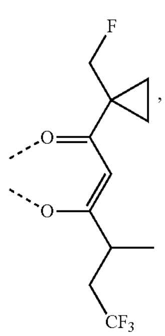
$L_{a220}$
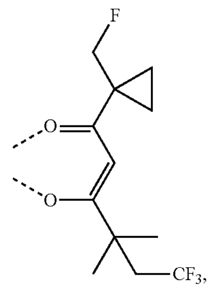
$L_{a221}$
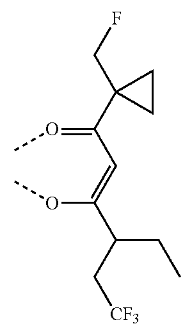
$L_{a222}$
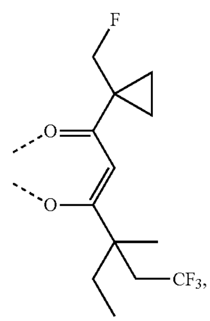
$L_{a223}$
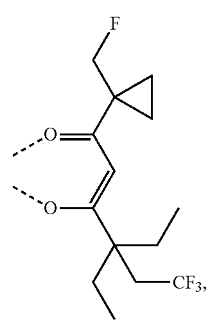
$L_{a224}$
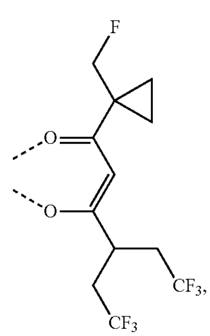

$L_{a225}$
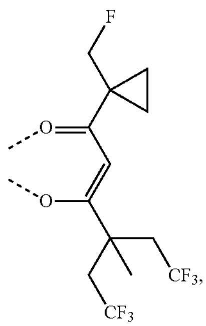
$L_{a226}$
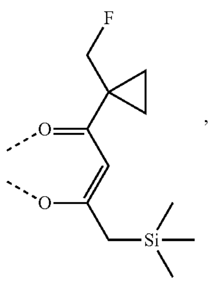
$L_{a227}$
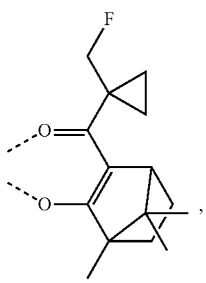
$L_{a228}$
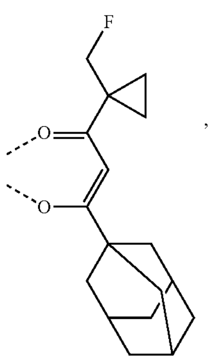
$L_{a229}$
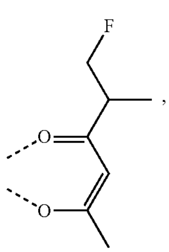
$L_{a230}$
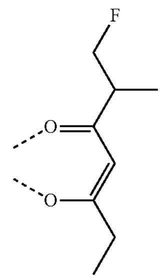
$L_{a231}$
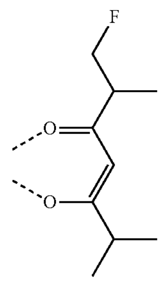
$L_{a232}$
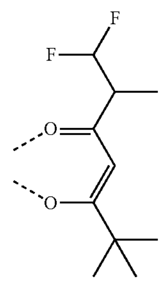
$L_{a233}$
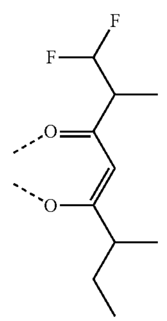
$L_{a234}$
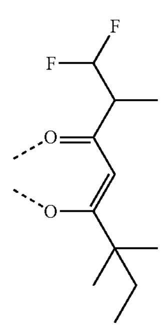

-continued
$L_{a235}$
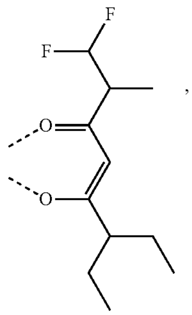
$L_{a236}$
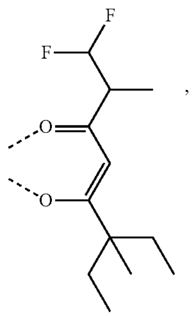
$L_{a237}$
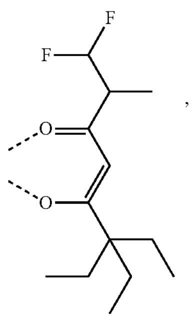
$L_{a238}$
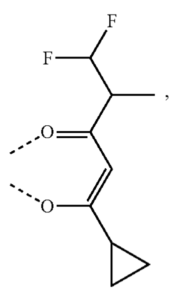
$L_{a239}$
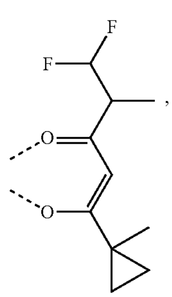
-continued
$L_{a240}$
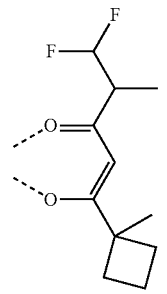
$L_{a241}$
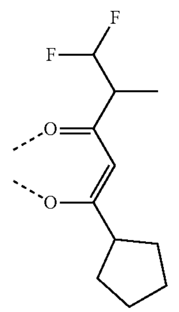
$L_{a242}$
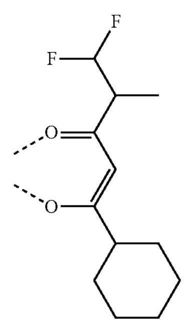
$L_{a243}$
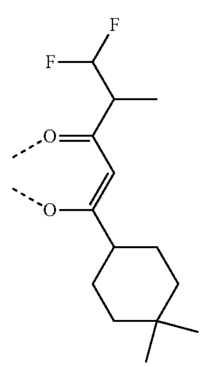

$L_{a244}$
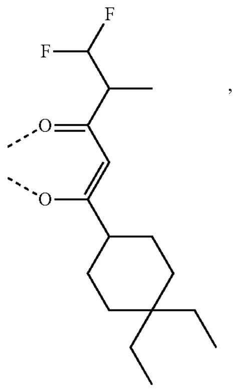
$L_{a245}$
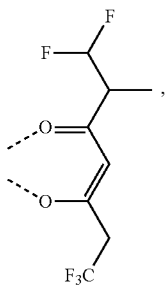
$L_{a246}$
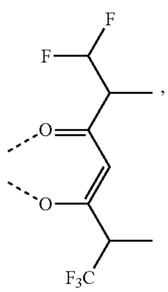
$L_{a247}$
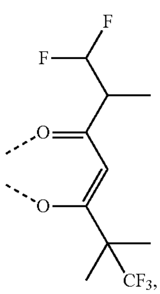
$L_{a248}$
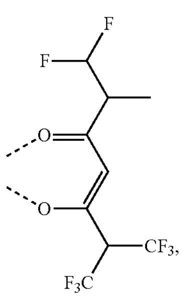
$L_{a249}$
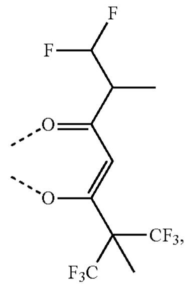
$L_{a250}$
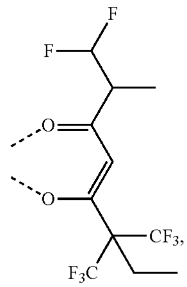
$L_{a251}$
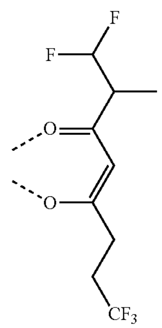
$L_{a252}$
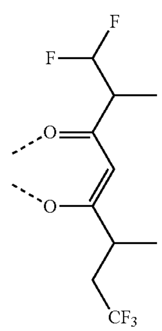
$L_{a253}$
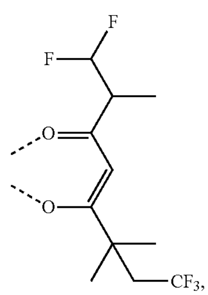

-continued
$L_{a254}$
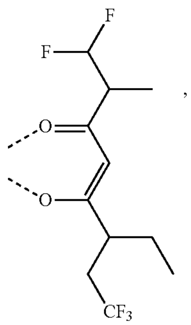
$L_{a255}$
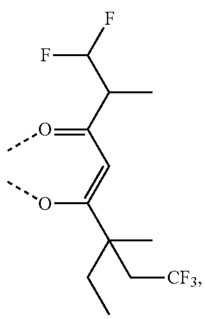
$L_{a256}$
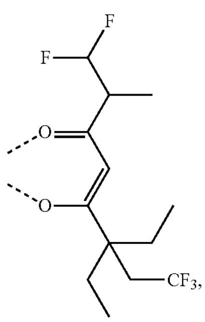
$L_{a257}$
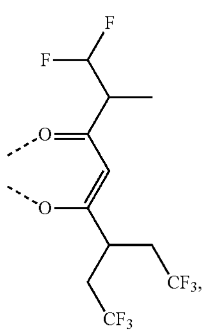
$L_{a258}$
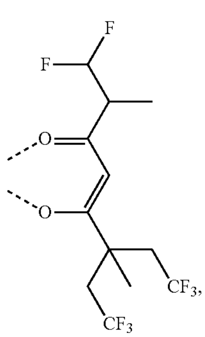
-continued
$L_{a259}$
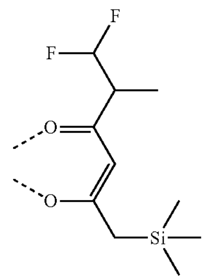
$L_{a260}$
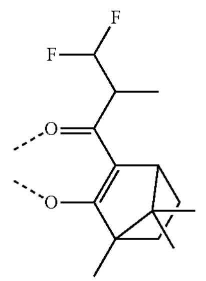
$L_{a261}$
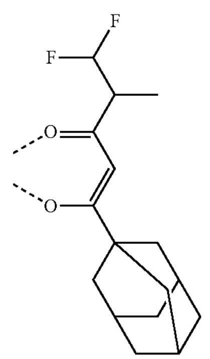
$L_{a262}$
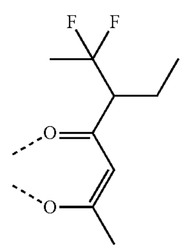
$L_{a263}$
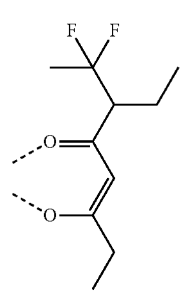

-continued
$L_{a264}$
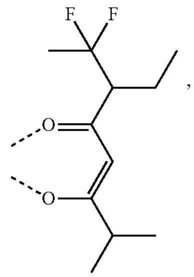
$L_{a265}$
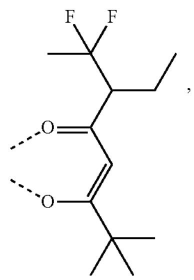
$L_{a266}$
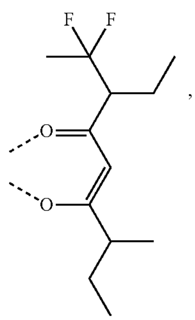
$L_{a267}$
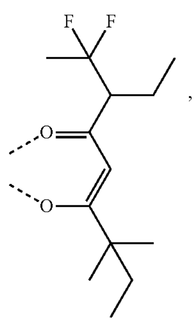
$L_{a268}$
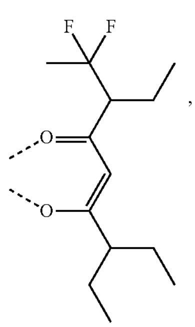
-continued
$L_{a269}$
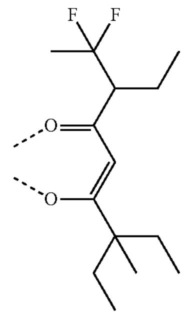
$L_{a270}$
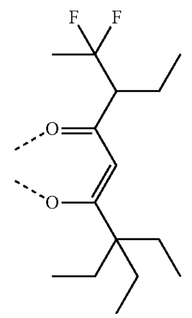
$L_{a271}$
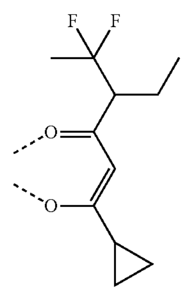
$L_{a272}$
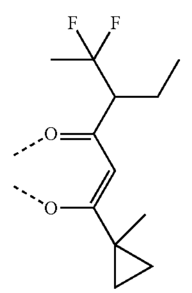
$L_{a273}$
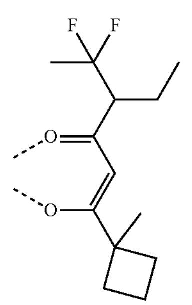

-continued
$L_{a274}$
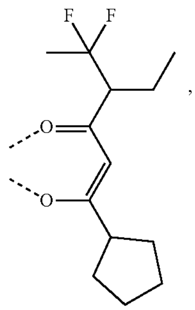
$L_{a275}$
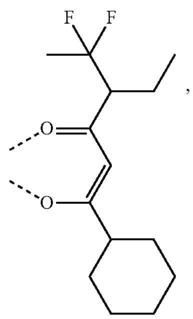
$L_{a276}$
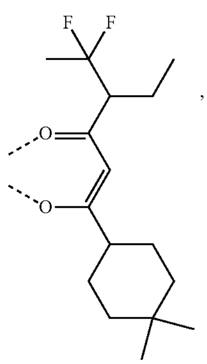
$L_{a277}$
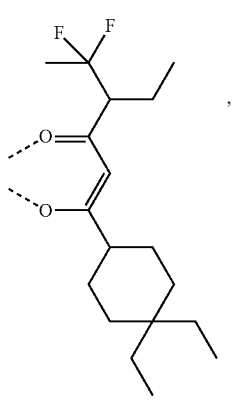
-continued
$L_{a278}$
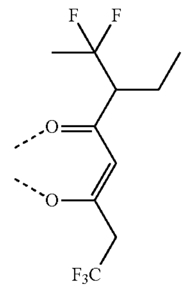
$L_{a279}$
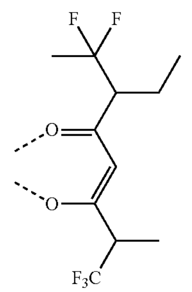
$L_{a280}$
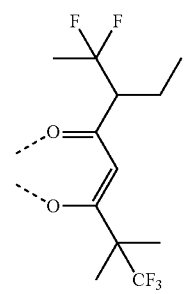
$L_{a281}$
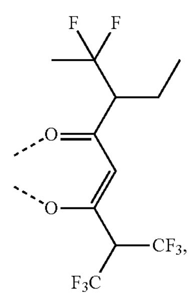
$L_{a282}$
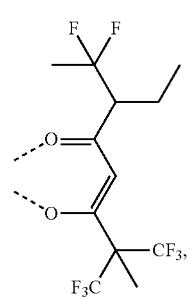

-continued
$L_{a283}$
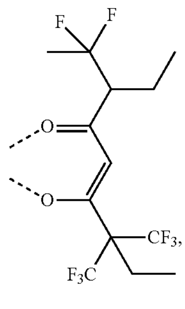
$L_{a284}$
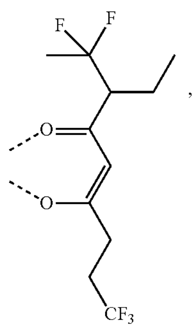
$L_{a285}$
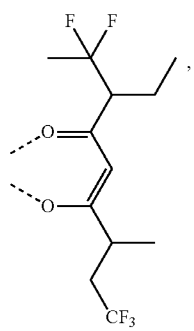
$L_{a286}$
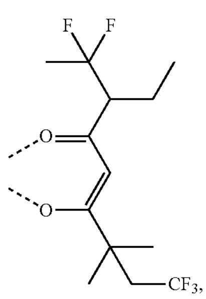
$L_{a287}$
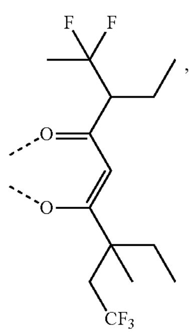
-continued
$L_{a288}$
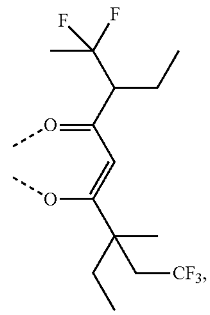
$L_{a289}$
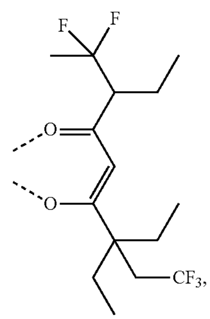
$L_{a290}$
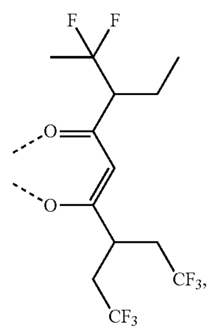
$L_{a291}$
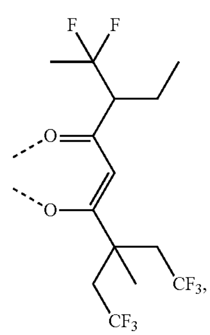
$L_{a292}$
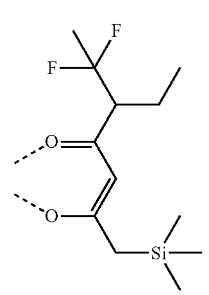

-continued
L$_{a293}$
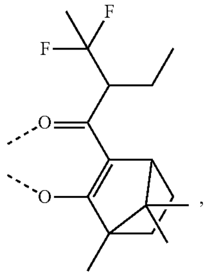
L$_{a294}$
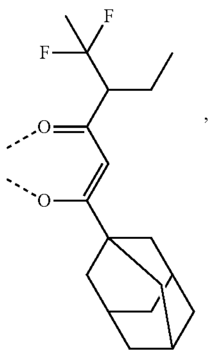
L$_{a295}$
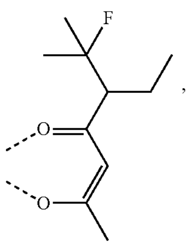
L$_{a296}$
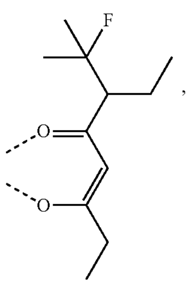
L$_{a297}$
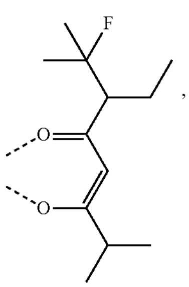
-continued
L$_{a298}$
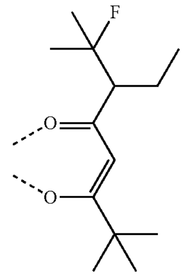
L$_{a299}$
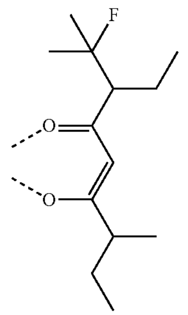
L$_{a300}$
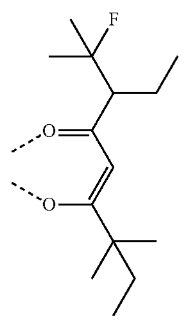
L$_{a301}$
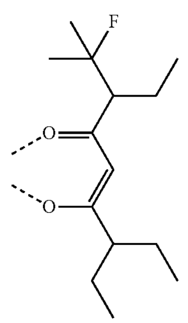
L$_{a302}$
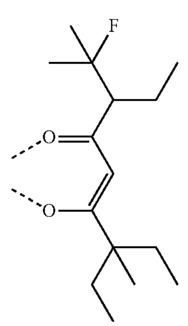

$L_{a303}$
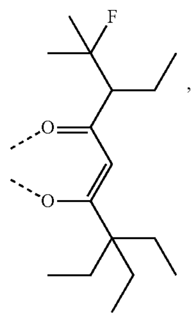
$L_{a304}$
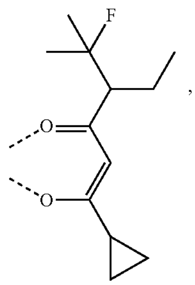
$L_{a305}$
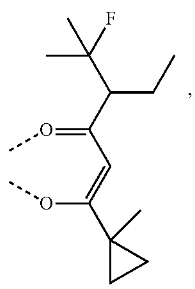
$L_{a306}$
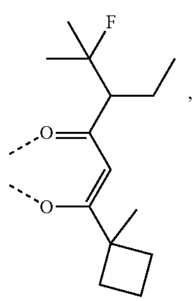
$L_{a307}$
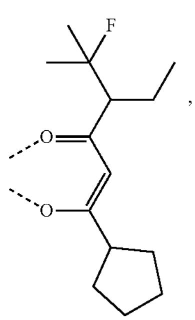
$L_{a308}$
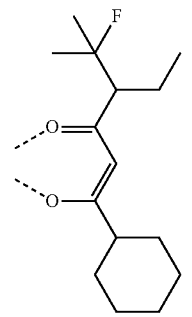
$L_{a309}$
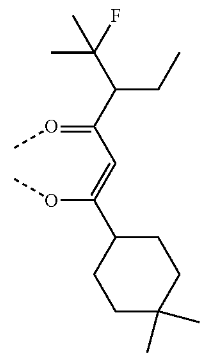
$L_{a310}$
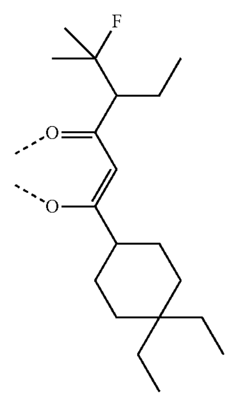
$L_{a311}$
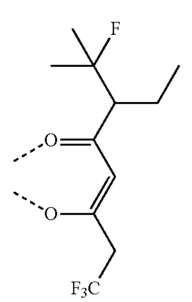

-continued
$L_{a312}$
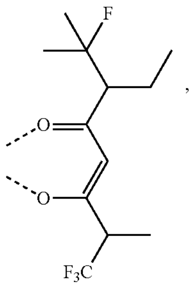
$L_{a313}$
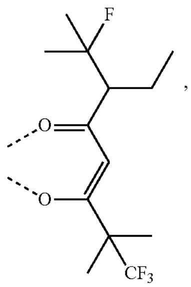
$L_{a314}$
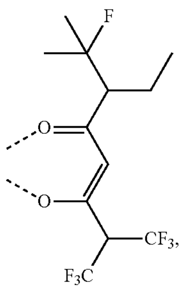
$L_{a315}$
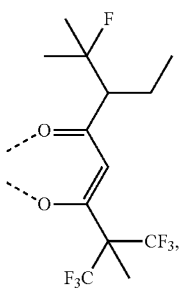
$L_{a316}$
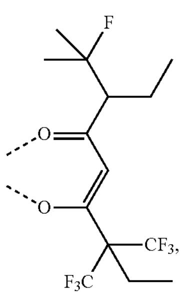
-continued
$L_{a317}$
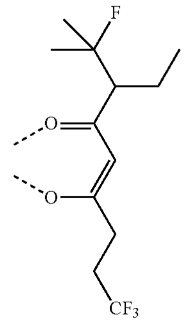
$L_{a318}$
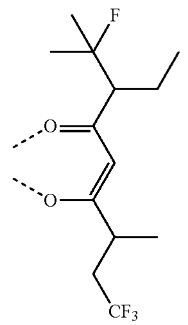
$L_{a319}$
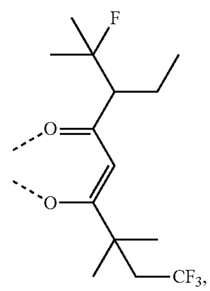
$L_{a320}$
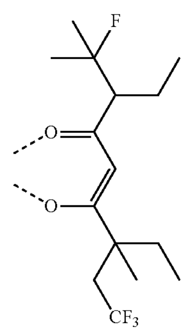
$L_{a321}$
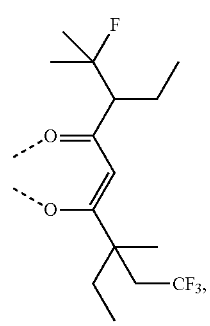

-continued
$L_{a322}$
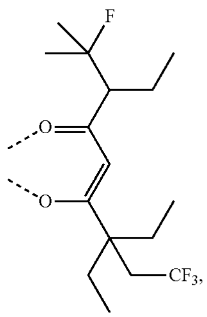
$L_{a323}$
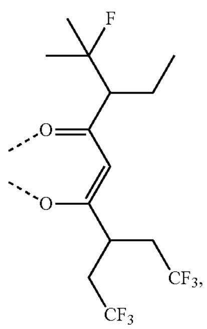
$L_{a324}$
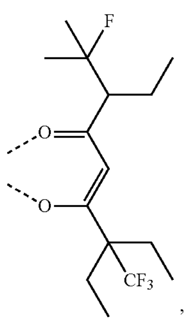
$L_{a325}$
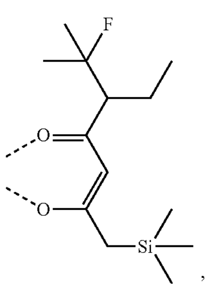
$L_{a326}$
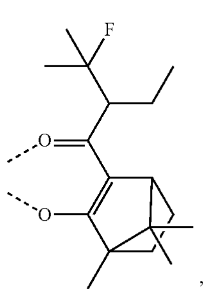
$L_{a327}$
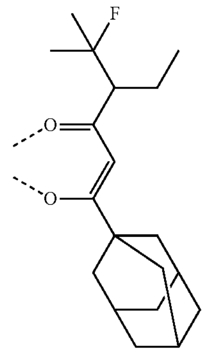
$L_{a328}$
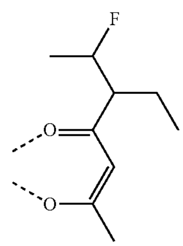
$L_{a329}$
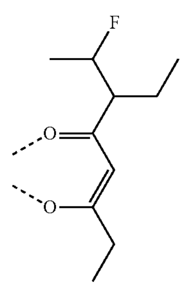
$L_{a330}$
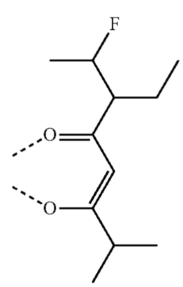
$L_{a331}$
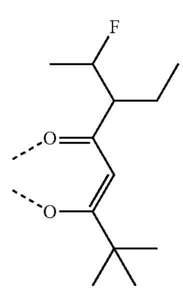

-continued
$L_{a332}$
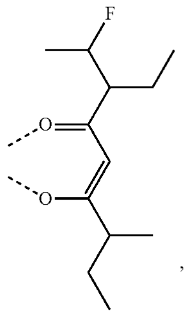
$L_{a333}$
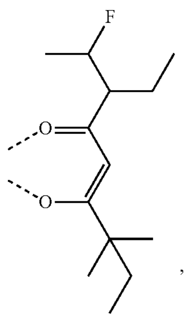
$L_{a334}$
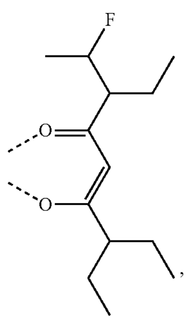
$L_{a335}$
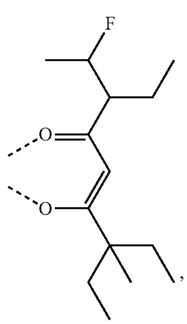
$L_{a336}$
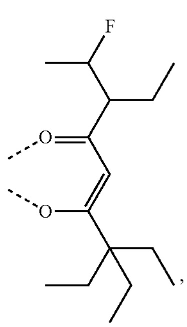
-continued
$L_{a337}$
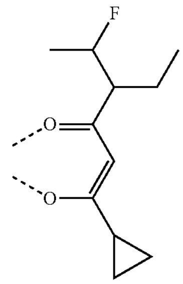
$L_{a338}$
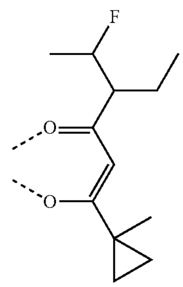
$L_{a339}$
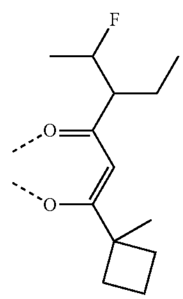
$L_{a340}$
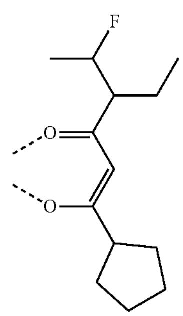
$L_{a341}$
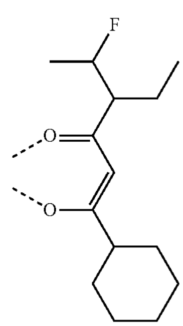

$L_{a342}$
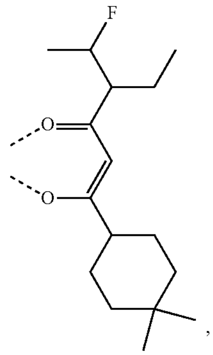
$L_{a343}$
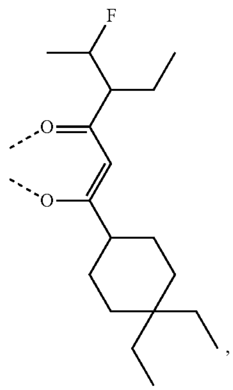
$L_{a344}$
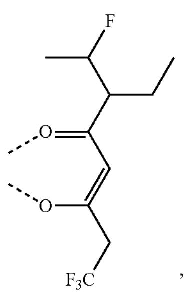
$L_{a345}$
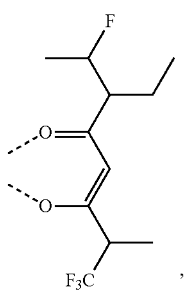
$L_{a346}$
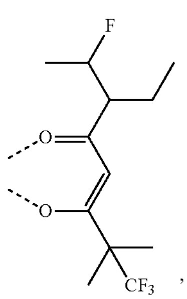
$L_{a347}$
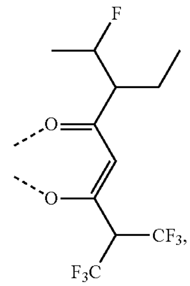
$L_{a348}$
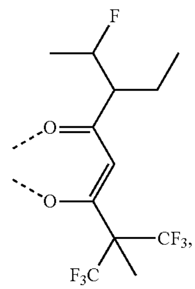
$L_{a349}$
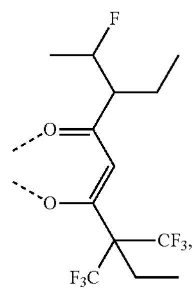
$L_{a350}$
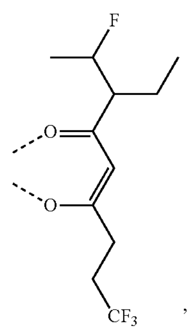
$L_{a351}$
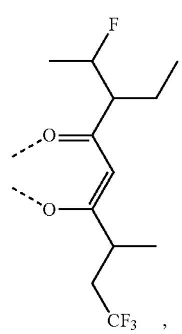

-continued
$L_{a352}$
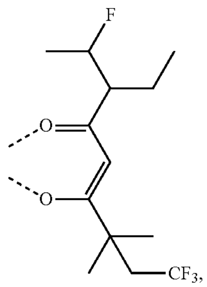
$L_{a353}$
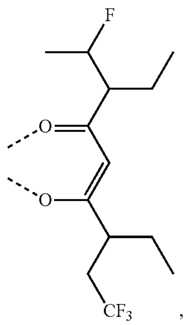
$L_{a354}$
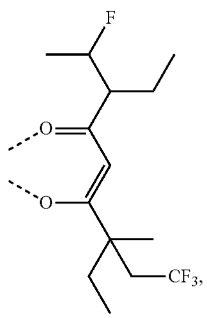
$L_{a355}$
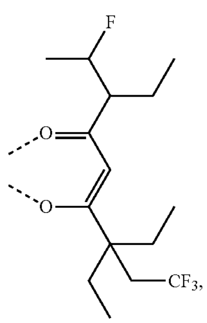
$L_{a356}$
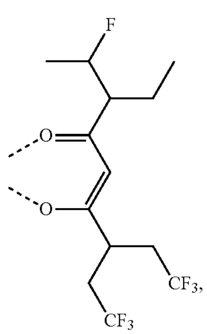
-continued
$L_{a357}$
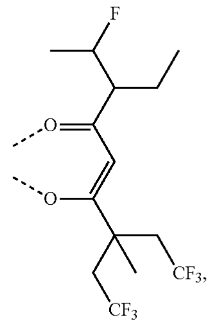
$L_{a358}$
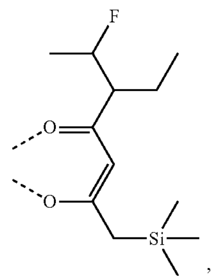
$L_{a359}$
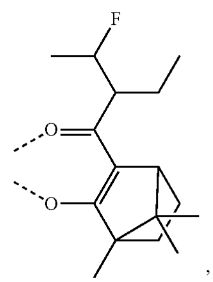
$L_{a360}$
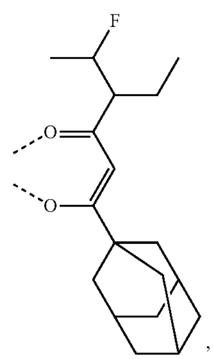
$L_{a361}$
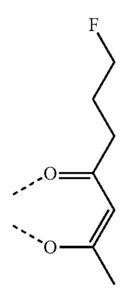

$L_{a362}$
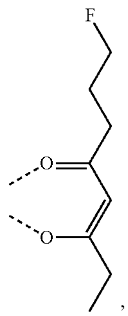
$L_{a363}$
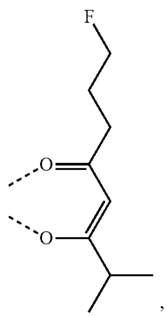
$L_{a364}$
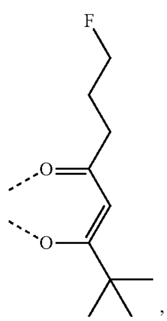
$L_{a365}$
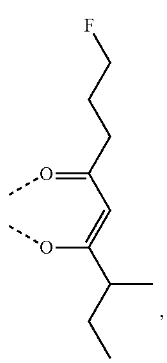
$L_{a366}$
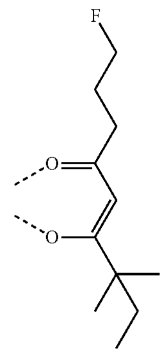
$L_{a367}$
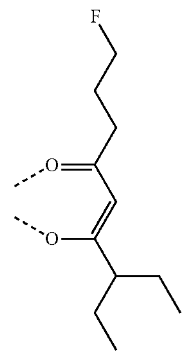
$L_{a368}$
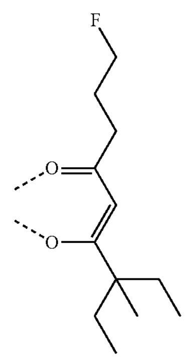
$L_{a369}$
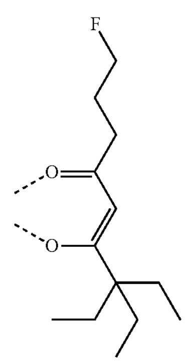

-continued
$L_{a370}$
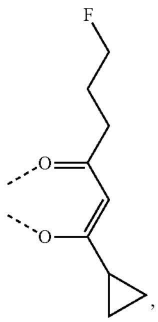
$L_{a371}$
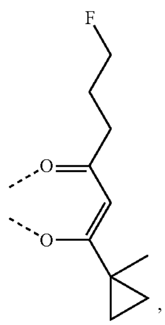
$L_{a372}$
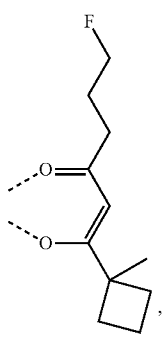
$L_{a373}$
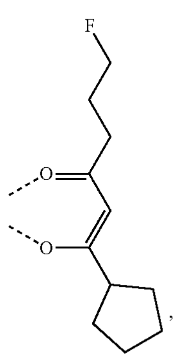
-continued
$L_{a374}$
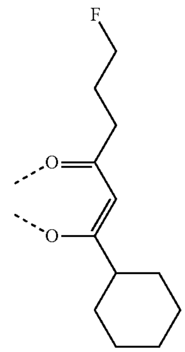
$L_{a375}$
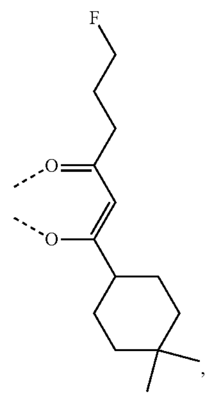
$L_{a376}$
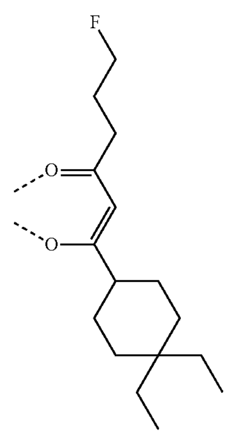
$L_{a377}$
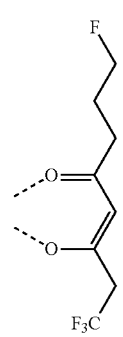

-continued
$L_{a378}$
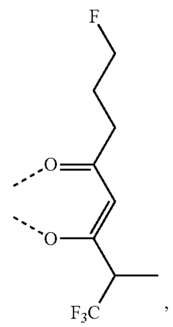
$L_{a379}$
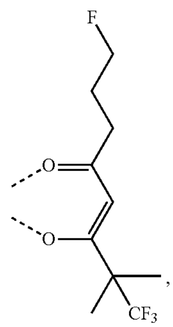
$L_{a380}$
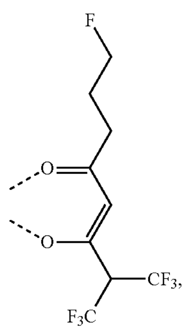
$L_{a381}$
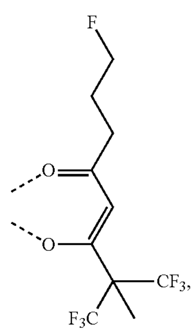
$L_{a382}$
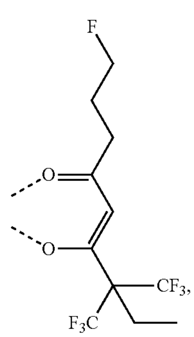
-continued
$L_{a383}$
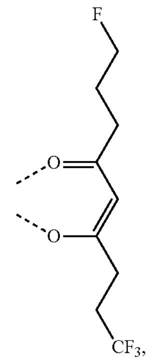
$L_{a384}$
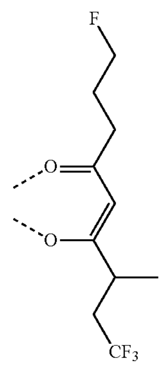
$L_{a385}$
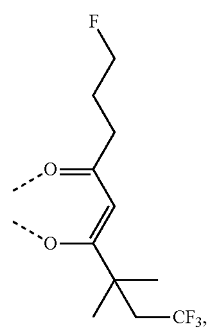
$L_{a386}$
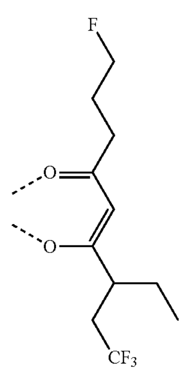

$L_{a387}$
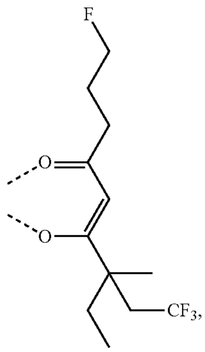
$L_{a388}$
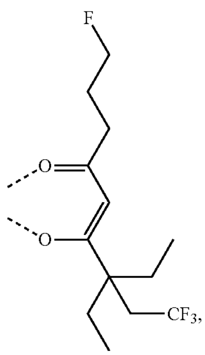
$L_{a389}$
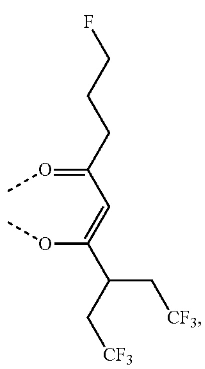
$L_{a390}$
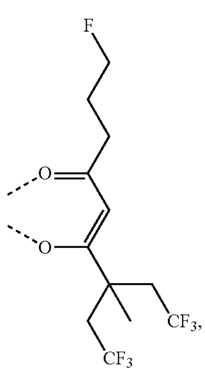
$L_{a391}$
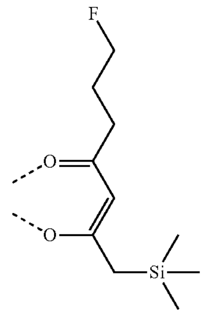
$L_{a392}$
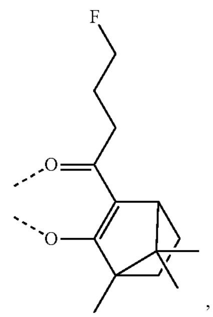
$L_{a393}$
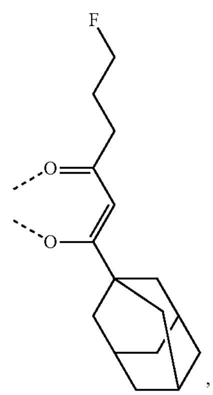
$L_{a394}$
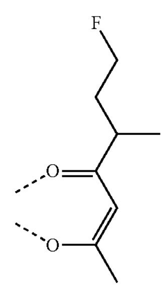
$L_{a395}$
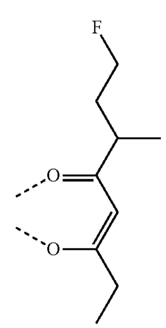

-continued
$L_{a396}$
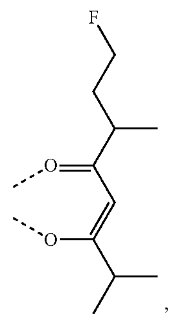
$L_{a397}$
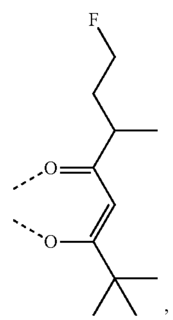
$L_{a398}$
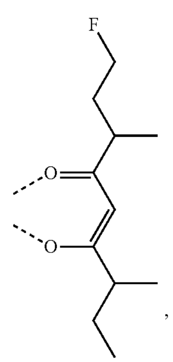
$L_{a399}$
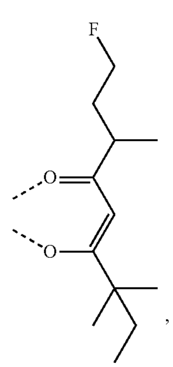
-continued
$L_{a400}$
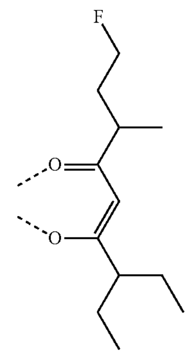
$L_{a401}$
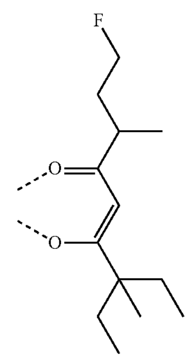
$L_{a402}$
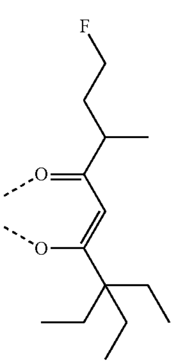
$L_{a403}$
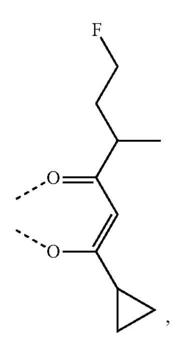

$L_{a404}$
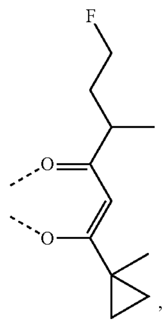
$L_{a405}$
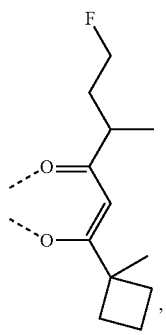
$L_{a406}$
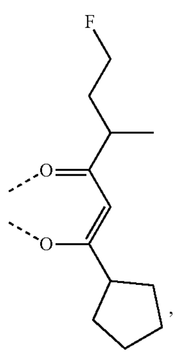
$L_{a407}$
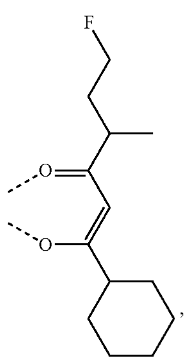
$L_{a408}$
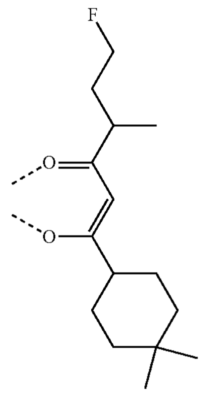
$L_{a409}$
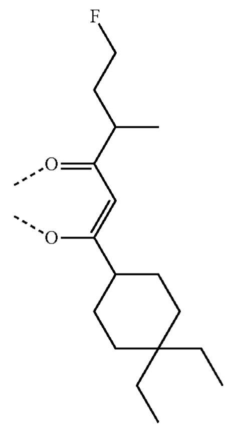
$L_{a410}$
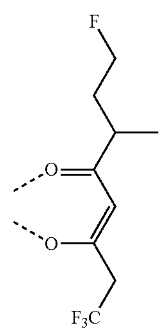
$L_{a411}$
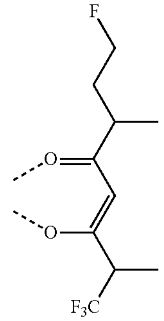

-continued
$L_{a412}$
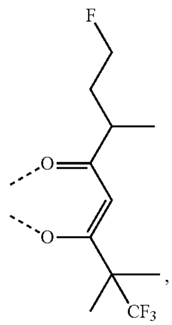
$L_{a413}$
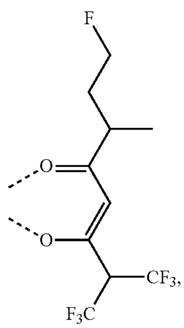
$L_{a414}$
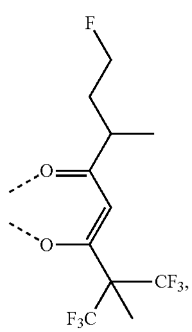
$L_{a415}$
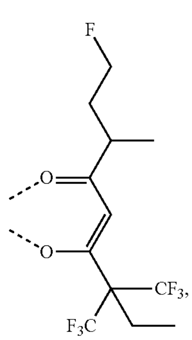
-continued
$L_{a416}$
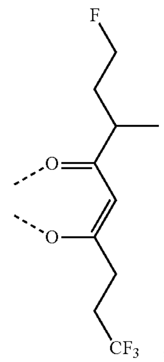
$L_{a417}$
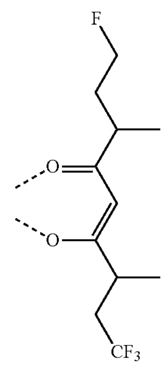
$L_{a418}$
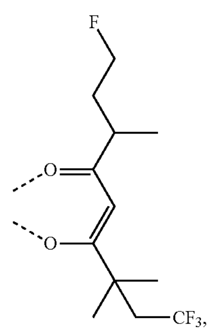
$L_{a419}$
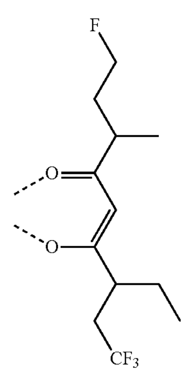

-continued
$L_{a420}$
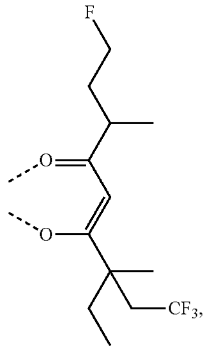
$L_{a421}$
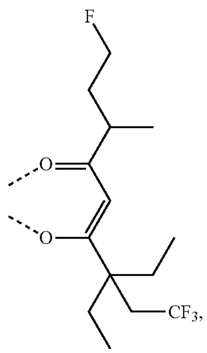
$L_{a422}$
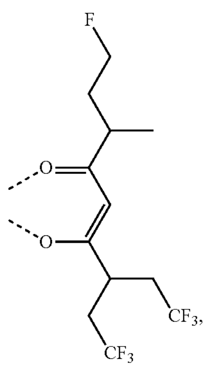
$L_{a423}$
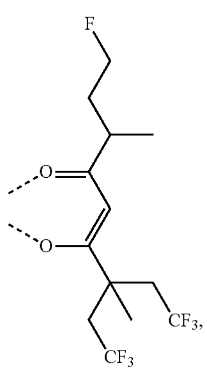
-continued
$L_{a424}$
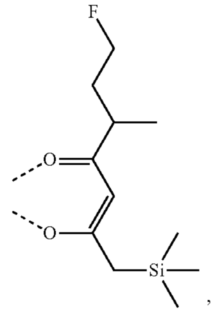
$L_{a425}$
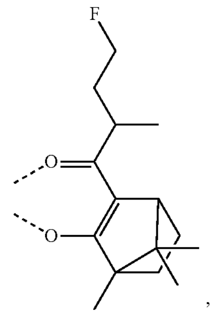
$L_{a426}$
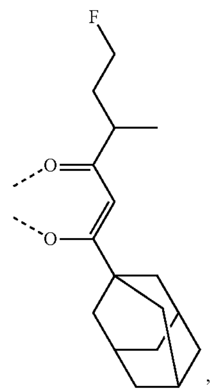
$L_{a427}$
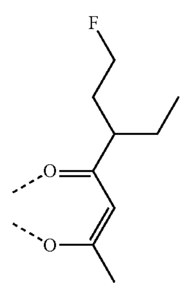
$L_{a428}$
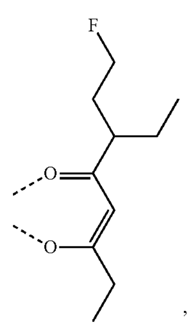

$L_{a429}$
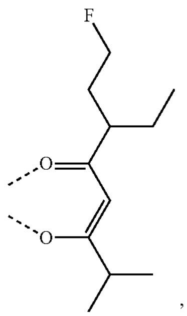
$L_{a430}$
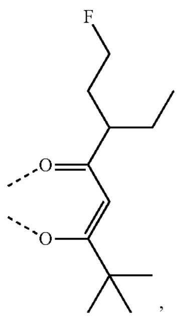
$L_{a431}$
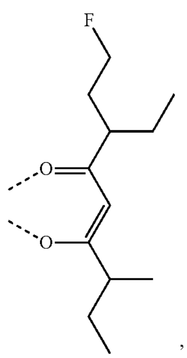
$L_{a432}$
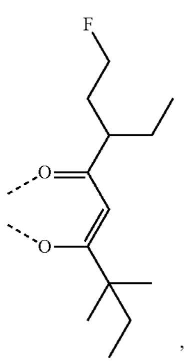
$L_{a433}$
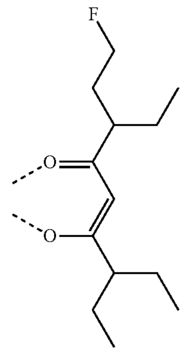
$L_{a434}$
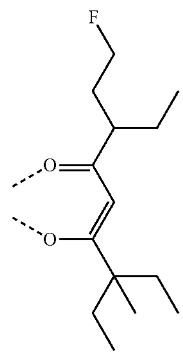
$L_{a435}$
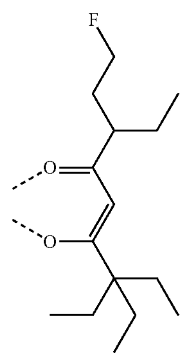
$L_{a436}$
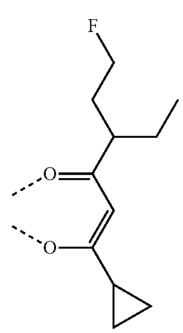

$L_{a437}$
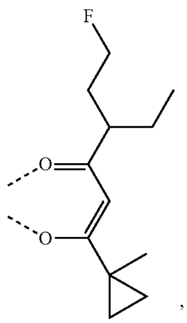
$L_{a438}$
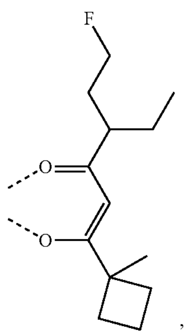
$L_{a439}$
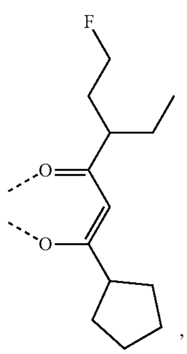
$L_{a440}$
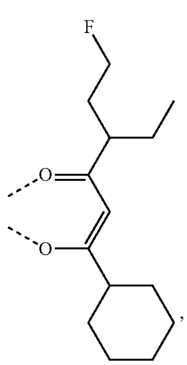
$L_{a441}$
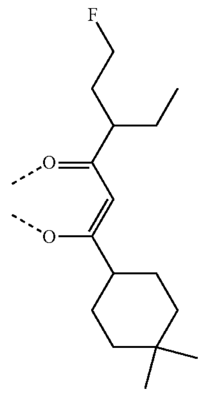
$L_{a442}$
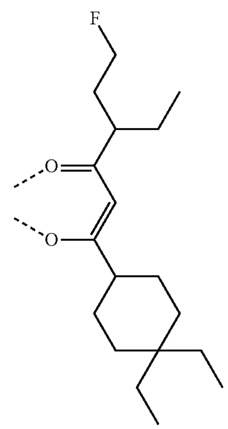
$L_{a443}$
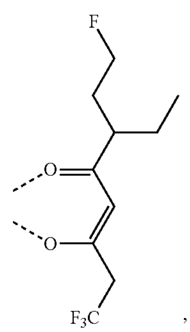
$L_{a444}$
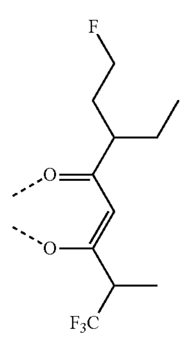

-continued
$L_{a445}$
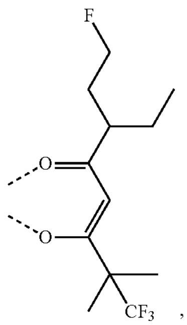
$L_{a446}$
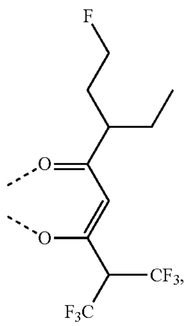
$L_{a447}$
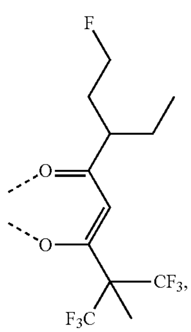
$L_{a448}$
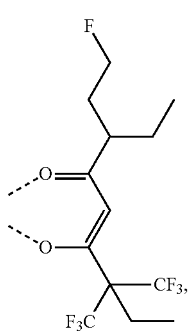
-continued
$L_{a449}$
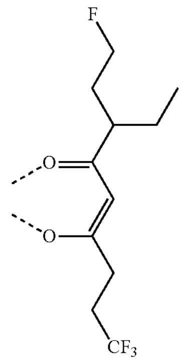
$L_{a450}$
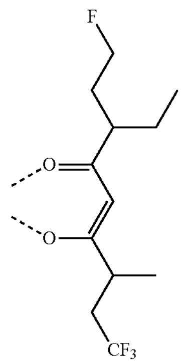
$L_{a451}$
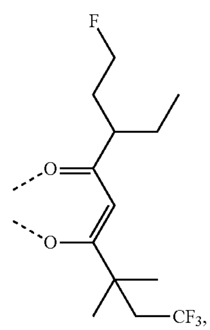
$L_{a452}$
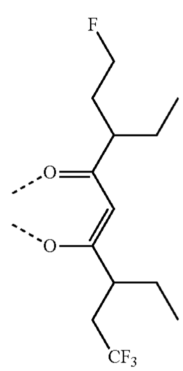

-continued
L$_{a453}$
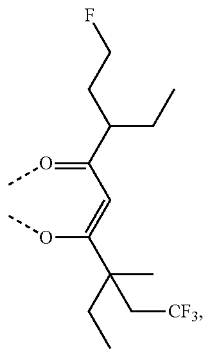
L$_{a454}$
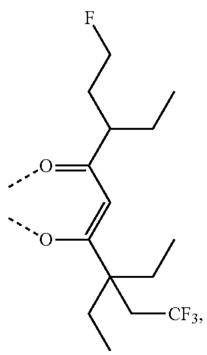
L$_{a455}$
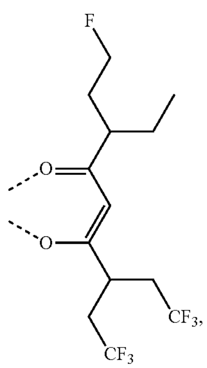
L$_{a456}$
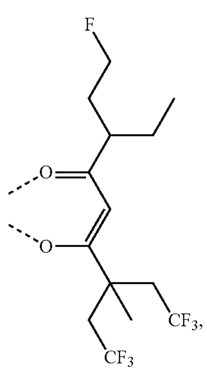
-continued
L$_{a457}$
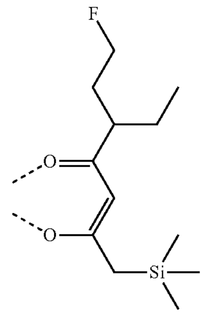
L$_{a458}$
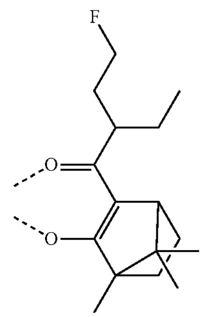
L$_{a459}$
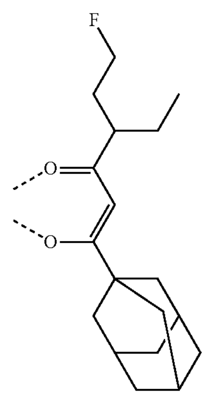
L$_{a460}$
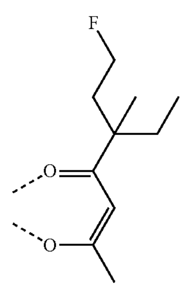
L$_{a461}$
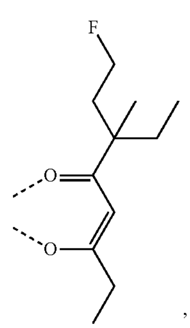

-continued
L$_{a462}$
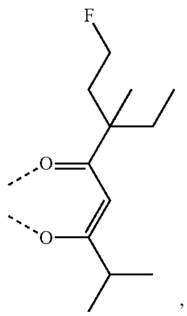
L$_{a463}$
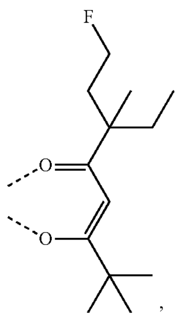
L$_{a464}$
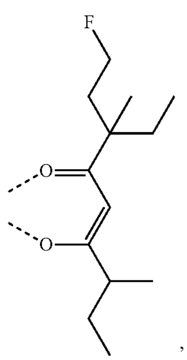
L$_{a465}$
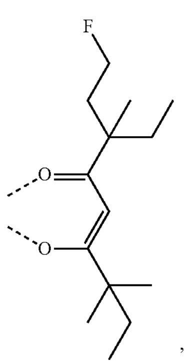
-continued
L$_{a466}$
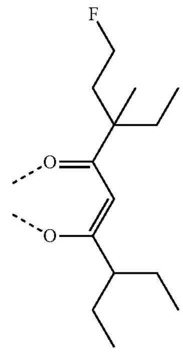
L$_{a467}$
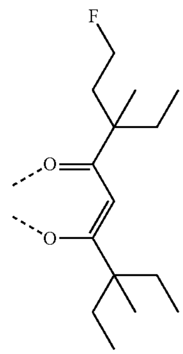
L$_{a468}$
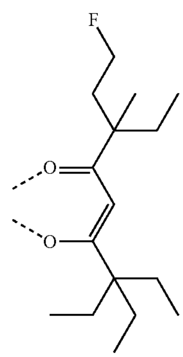
L$_{a469}$
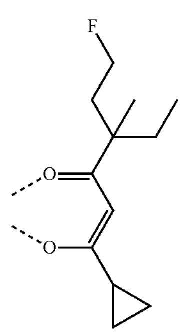

-continued
$L_{a470}$
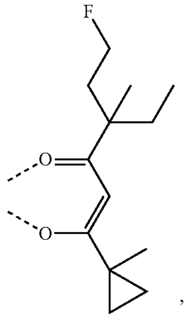
$L_{a471}$
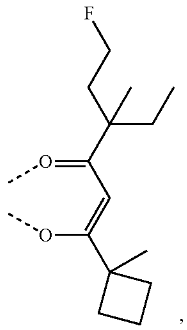
$L_{a472}$
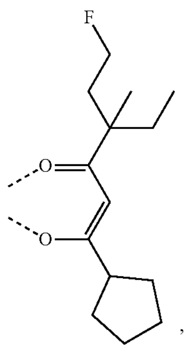
$L_{a473}$
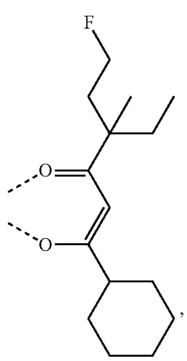
-continued
$L_{a474}$
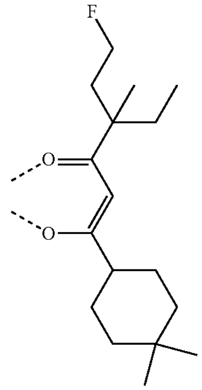
$L_{a475}$
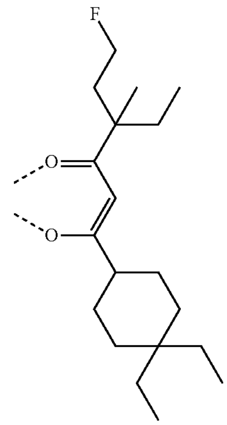
$L_{a476}$
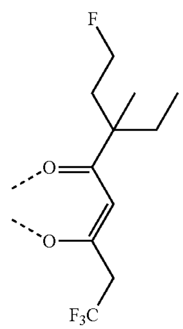
$L_{a477}$
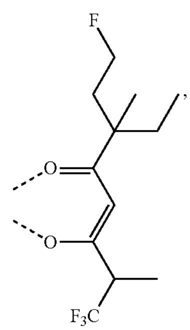

$L_{a478}$
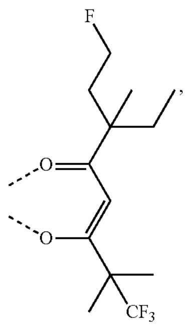
$L_{a479}$
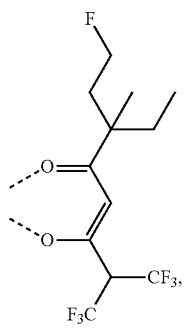
$L_{a480}$
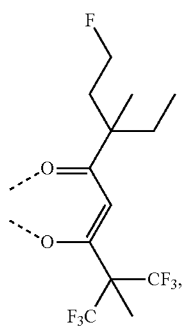
$L_{a481}$
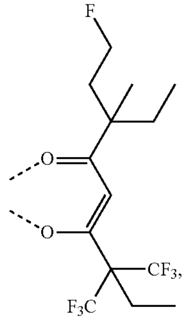
$L_{a482}$
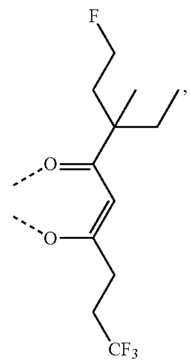
$L_{a483}$
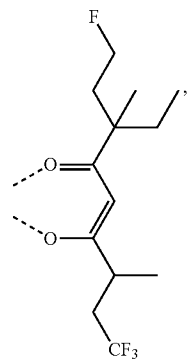
$L_{a484}$
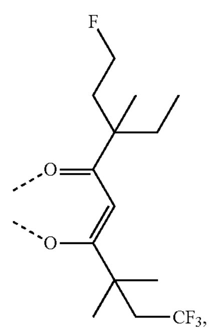
$L_{a485}$
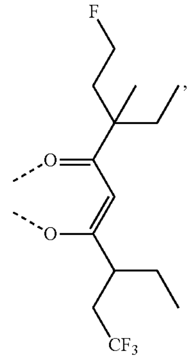

-continued
$L_{a486}$
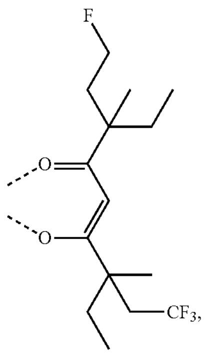
$L_{a487}$
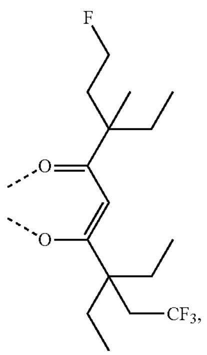
$L_{a488}$
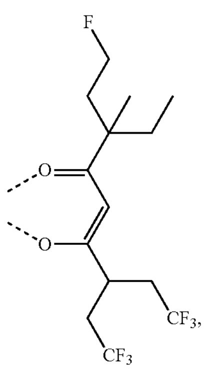
$L_{a489}$
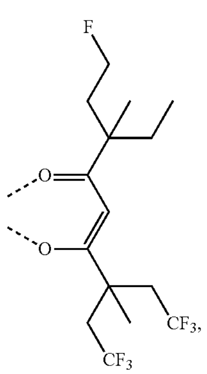
-continued
$L_{a490}$
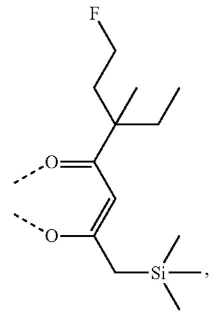
$L_{a491}$
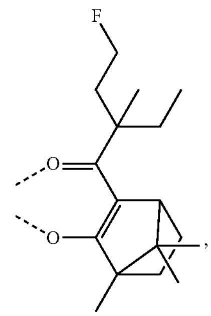
$L_{a492}$
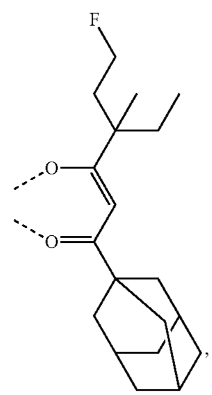
$L_{a493}$
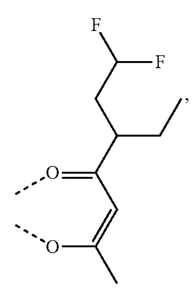
$L_{a494}$
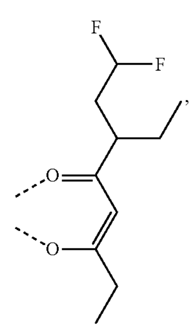

-continued
L$_{a495}$
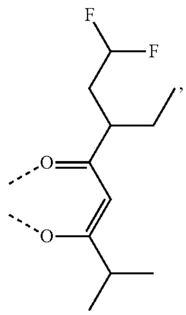
L$_{a496}$
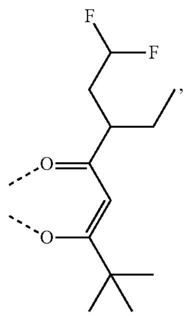
L$_{a497}$
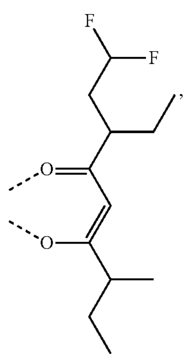
L$_{a498}$
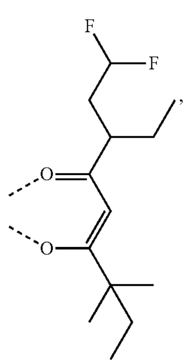
-continued
L$_{a499}$
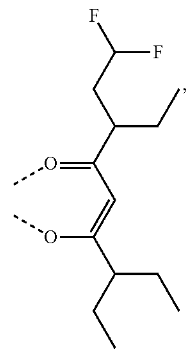
L$_{a500}$
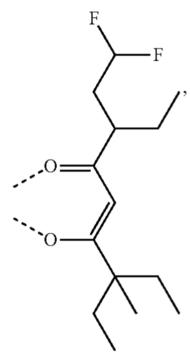
L$_{a501}$
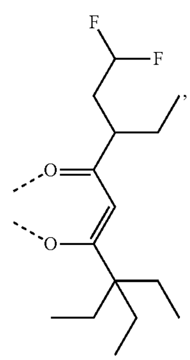
L$_{a502}$
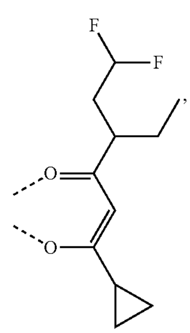

$L_{a503}$
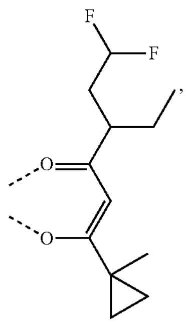
$L_{a504}$
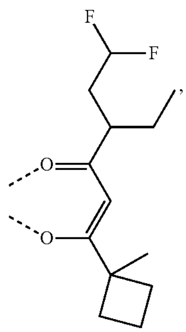
$L_{a505}$
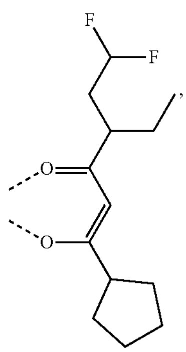
$L_{a506}$
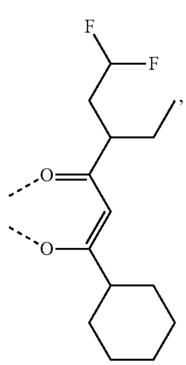
$L_{a507}$
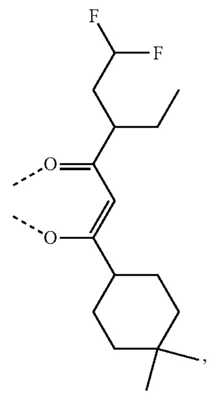
$L_{a508}$
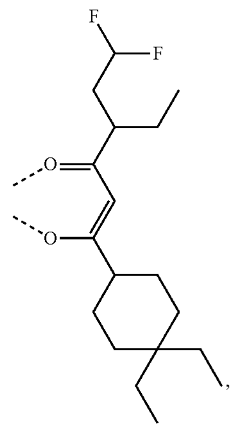
$L_{a509}$
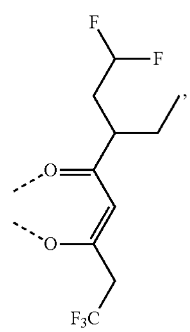
$L_{a510}$
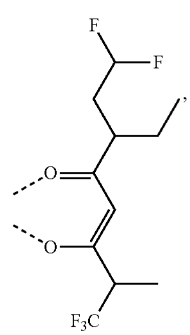

-continued
$L_{a511}$
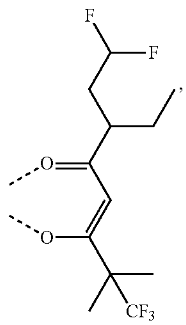
$L_{a512}$
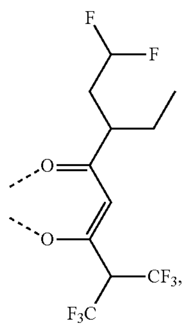
$L_{a513}$
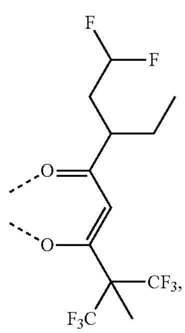
$L_{a514}$
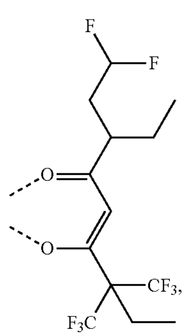
-continued
$L_{a515}$
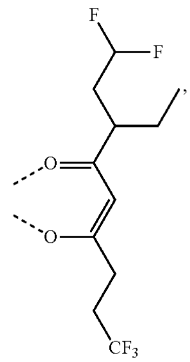
$L_{a516}$
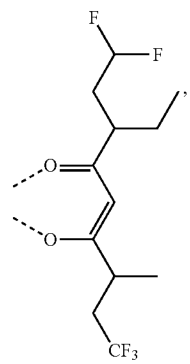
$L_{a517}$
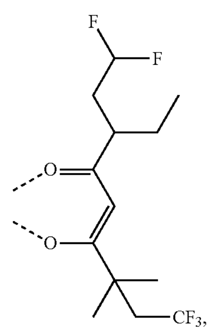
$L_{a518}$
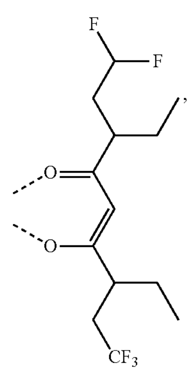

-continued
$L_{a519}$
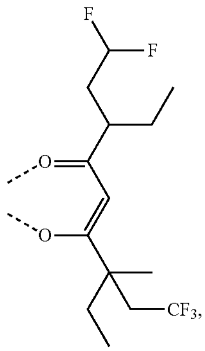
$L_{a520}$
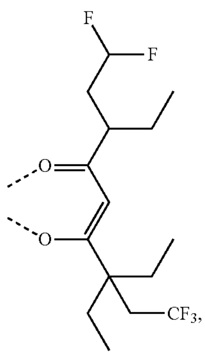
$L_{a521}$
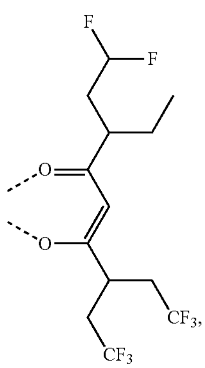
$L_{a522}$
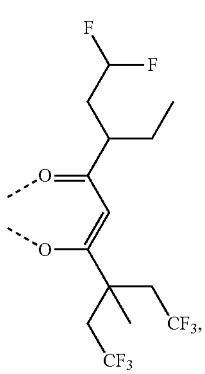
-continued
$L_{a523}$
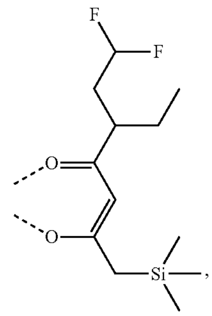
$L_{a524}$
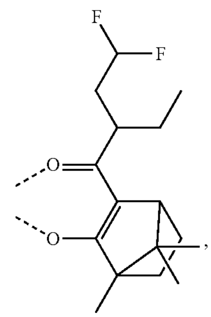
$L_{a525}$
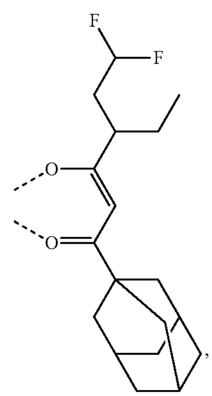
$L_{a526}$
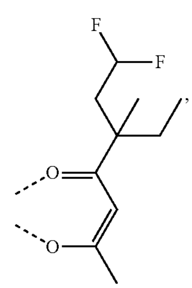
$L_{a527}$
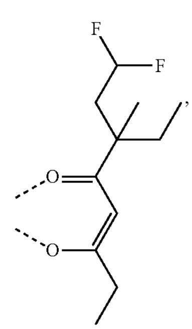

-continued
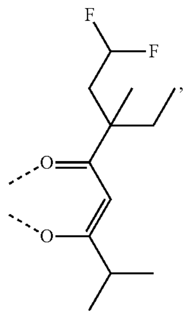
$L_{a528}$
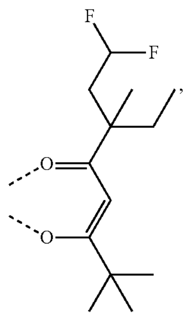
$L_{a529}$
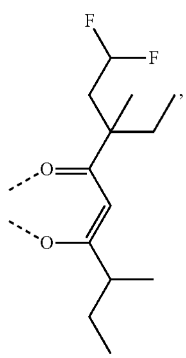
$L_{a530}$
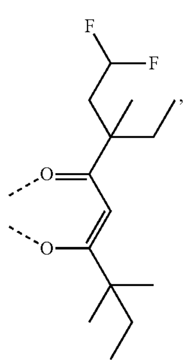
$L_{a531}$
-continued
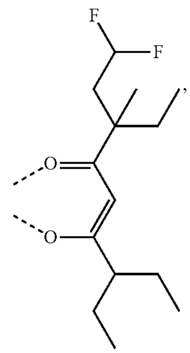
$L_{a532}$
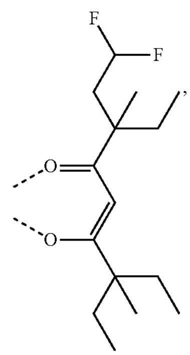
$L_{a533}$
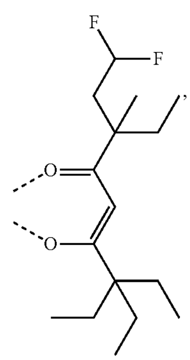
$L_{a534}$
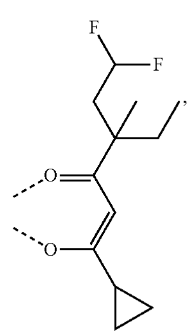
$L_{a535}$ -continued
$L_{a536}$
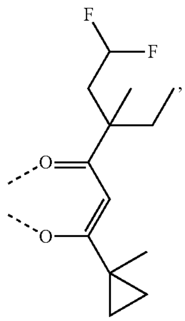
$L_{a537}$
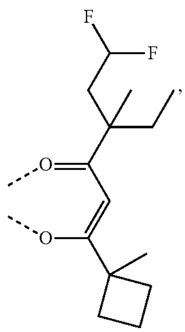
$L_{a538}$
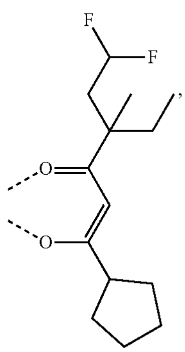
$L_{a539}$
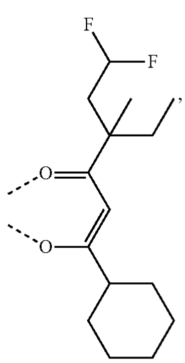
-continued
$L_{a540}$
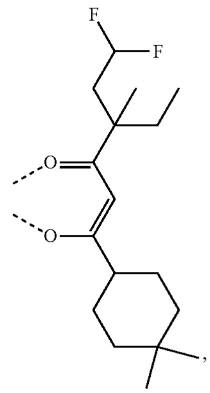
$L_{a541}$
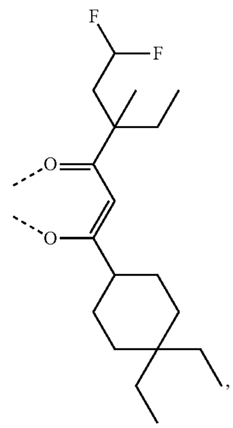
$L_{a542}$
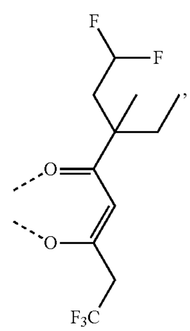
$L_{a543}$
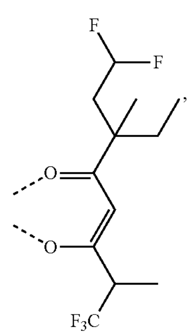

-continued
$L_{a544}$
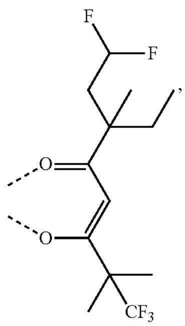
$L_{a545}$
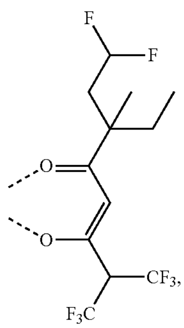
$L_{a546}$
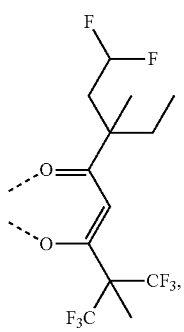
$L_{a547}$
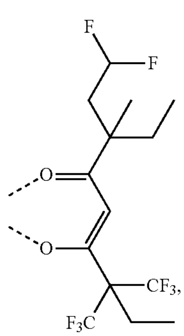
-continued
$L_{a548}$
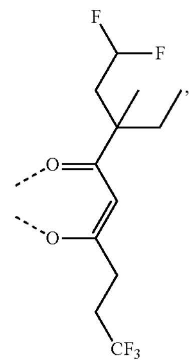
$L_{a549}$
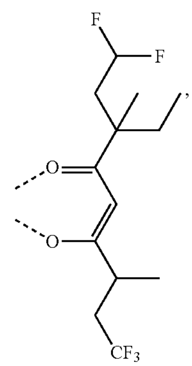
$L_{a550}$
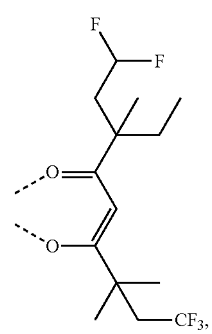
$L_{a551}$
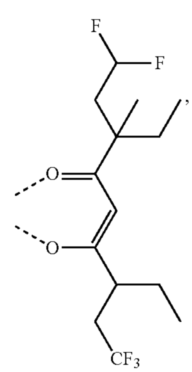

-continued
$L_{a552}$
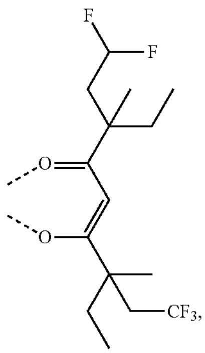
$L_{a553}$
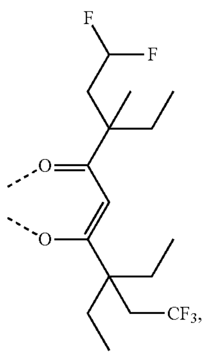
$L_{a554}$
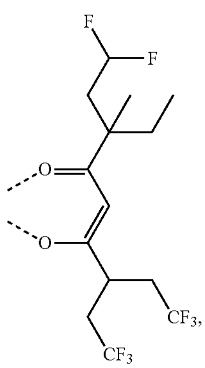
$L_{a555}$
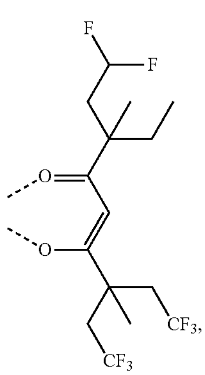
-continued
$L_{a556}$
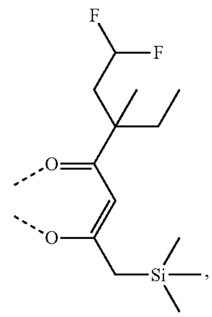
$L_{a557}$
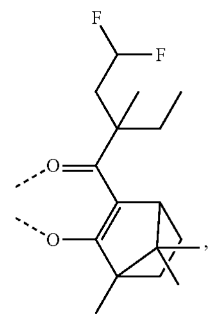
$L_{a558}$
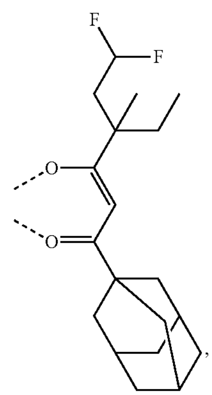
$L_{a559}$
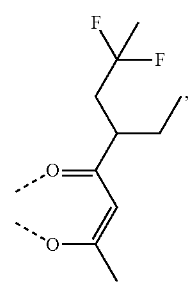
$L_{a560}$
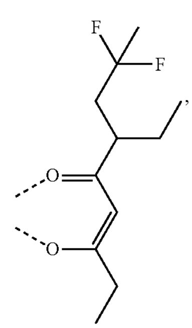

-continued
$L_{a561}$
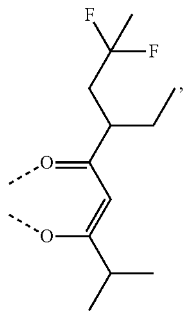
$L_{a562}$
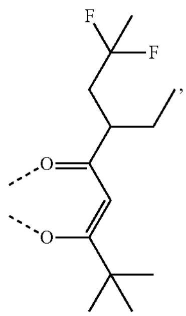
$L_{a563}$
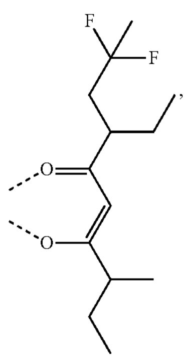
$L_{a564}$
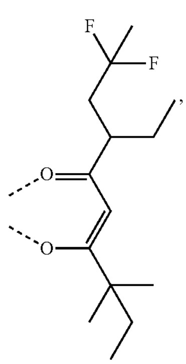
-continued
$L_{a565}$
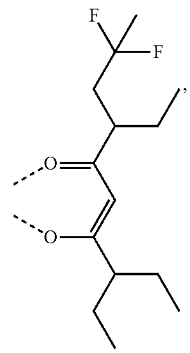
$L_{a566}$
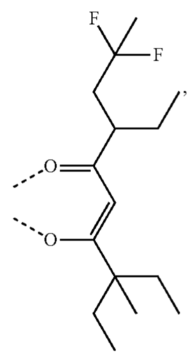
$L_{a567}$
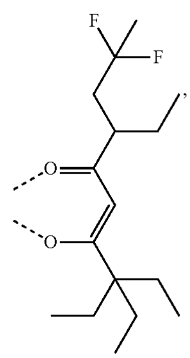
$L_{a568}$
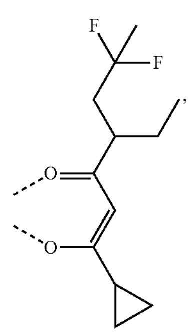

-continued
$L_{a569}$
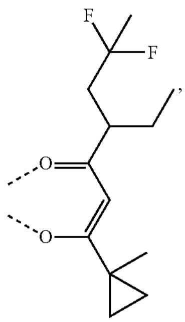
$L_{a570}$
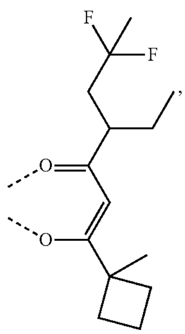
$L_{a571}$
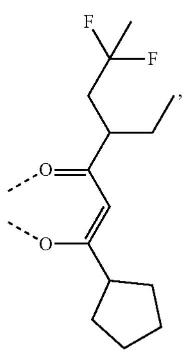
$L_{a572}$
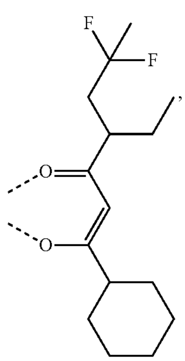
-continued
$L_{a573}$
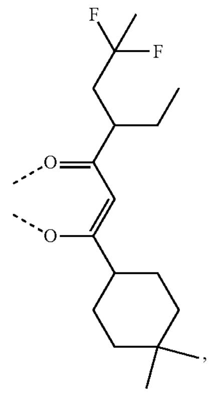
$L_{a574}$
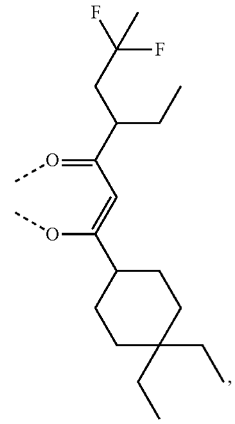
$L_{a575}$
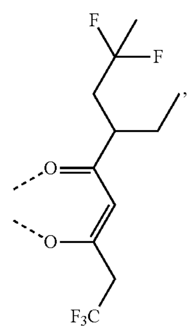
$L_{a576}$
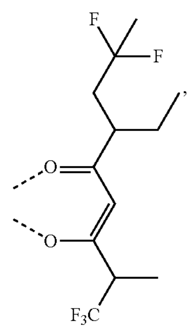

$L_{a577}$
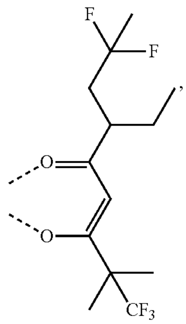
$L_{a578}$
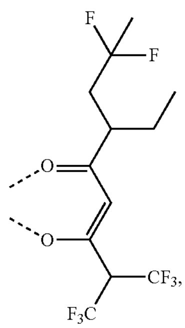
$L_{a579}$
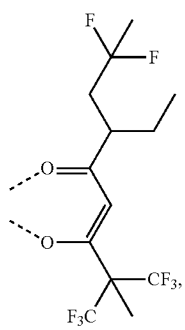
$L_{a580}$
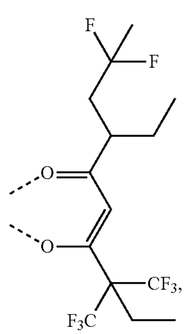
$L_{a581}$
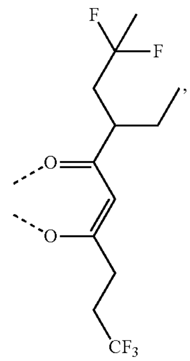
$L_{a582}$
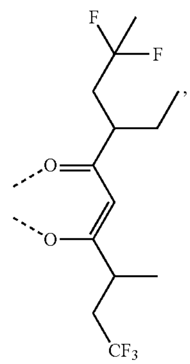
$L_{a583}$
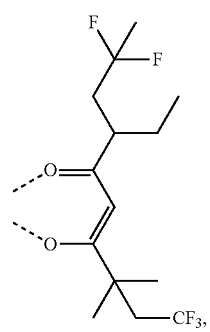
$L_{a584}$
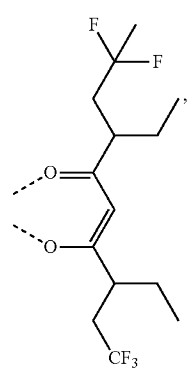

$L_{a585}$
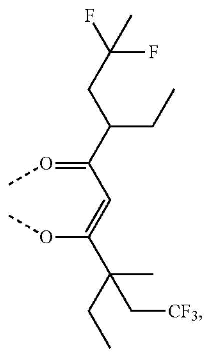
$L_{a586}$
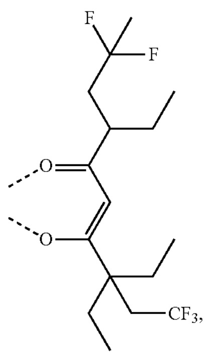
$L_{a587}$
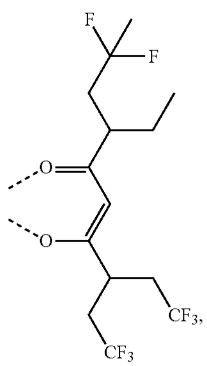
$L_{a588}$
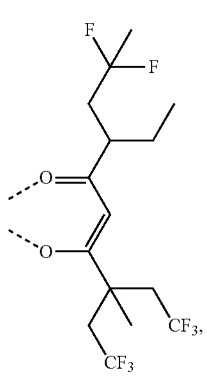
$L_{a589}$
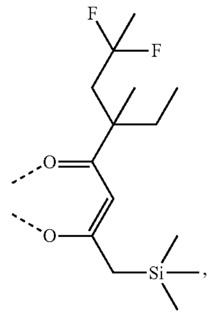
$L_{a590}$
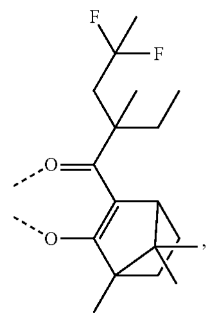
$L_{a591}$
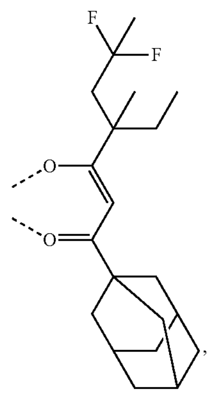
$L_{a592}$
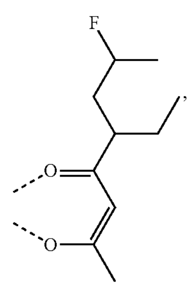
$L_{a593}$
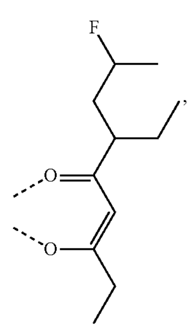

-continued
$L_{a594}$
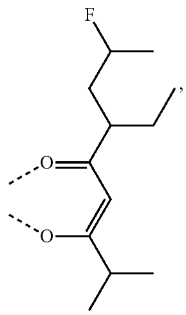
$L_{a595}$
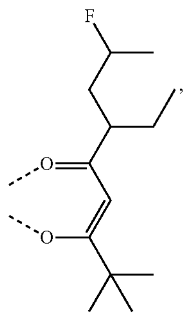
$L_{a596}$
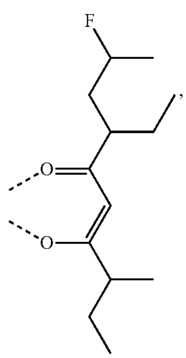
$L_{a597}$
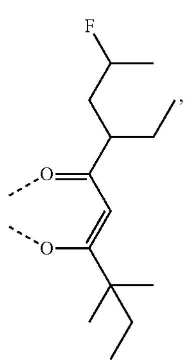
-continued
$L_{a598}$
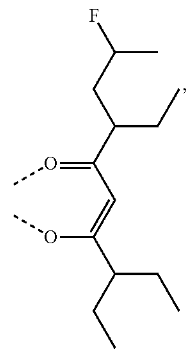
$L_{a599}$
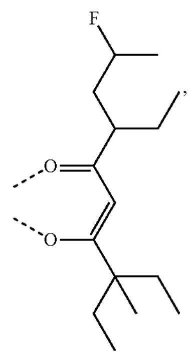
$L_{a600}$
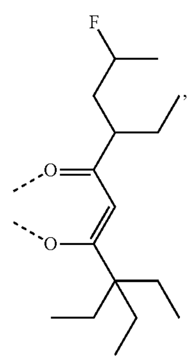
$L_{a601}$
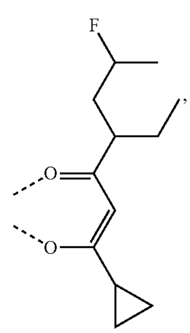

-continued
$L_{a602}$
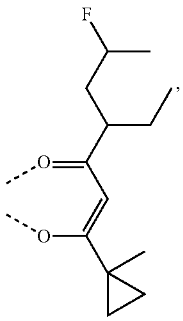
$L_{a603}$
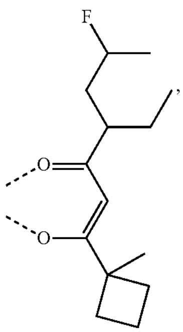
$L_{a604}$
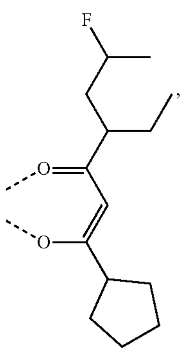
$L_{a605}$
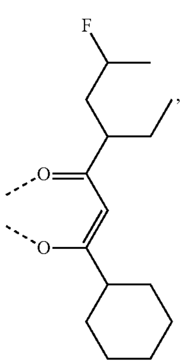
-continued
$L_{a606}$
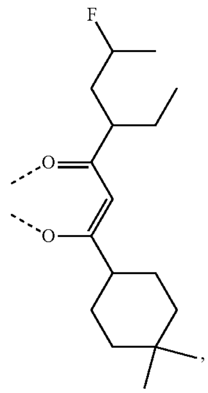
$L_{a607}$
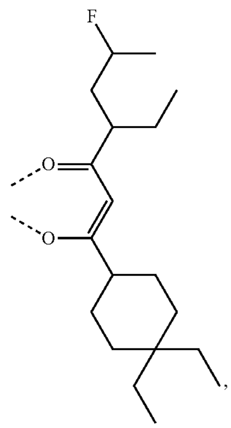
$L_{a608}$
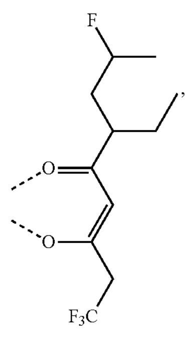
$L_{a609}$
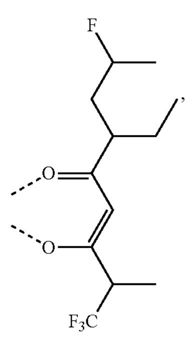

-continued
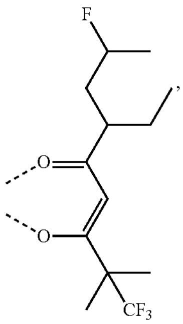
$L_{a610}$
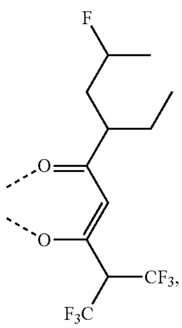
$L_{a611}$
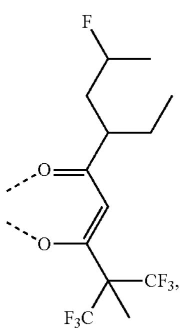
$L_{a612}$
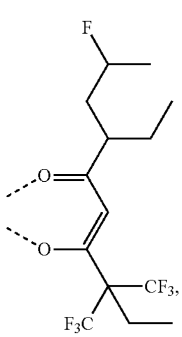
$L_{a613}$
-continued
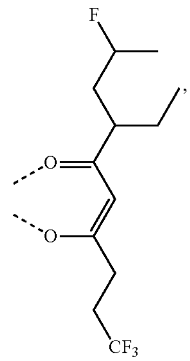
$L_{a614}$
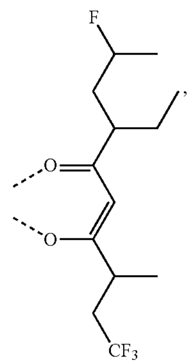
$L_{a615}$
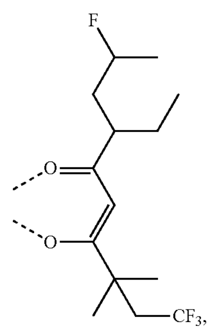
$L_{a616}$
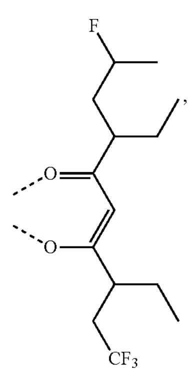
$L_{a617}$ -continued
$L_{a618}$
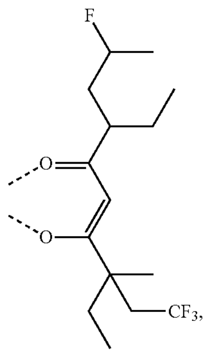
$L_{a619}$
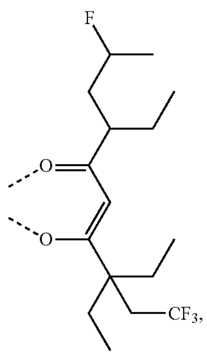
$L_{a620}$
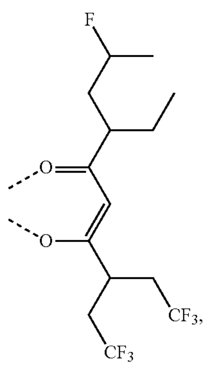
$L_{a621}$
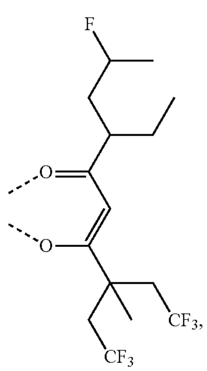
-continued
$L_{a622}$
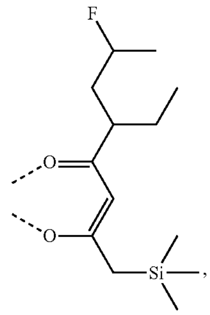
$L_{a623}$
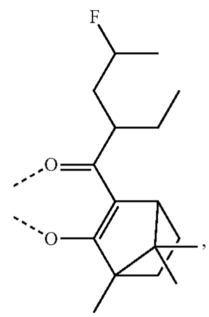
$L_{a624}$
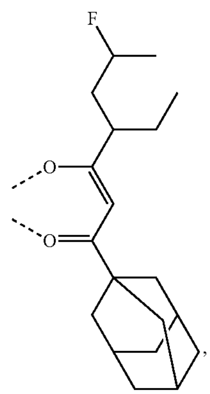
$L_{a625}$
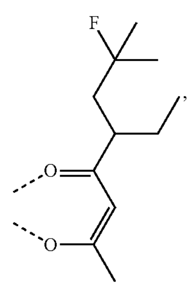
$L_{a626}$
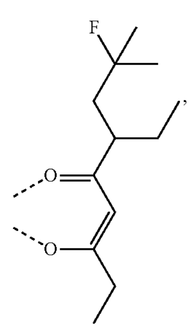

-continued
L$_{a627}$
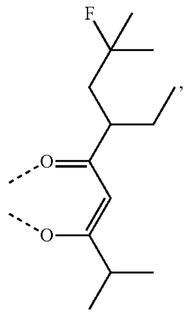
L$_{a628}$
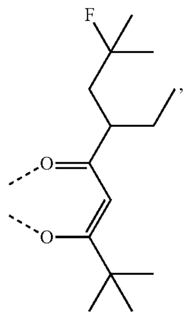
L$_{a629}$
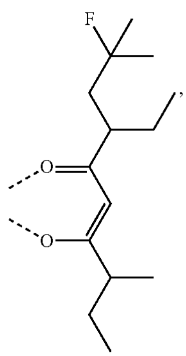
L$_{a630}$
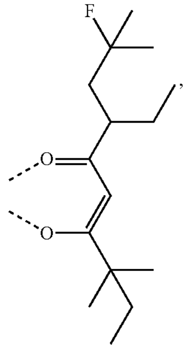
L$_{a631}$
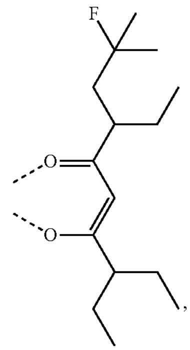
L$_{a632}$
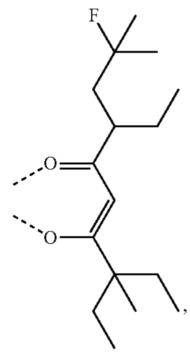
L$_{a633}$
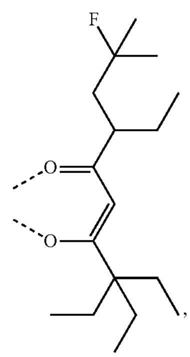
L$_{a634}$
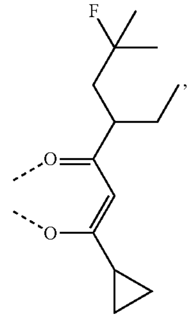

-continued
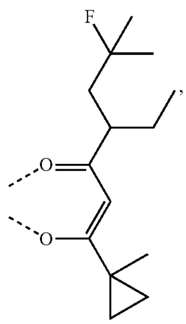
$L_{a635}$
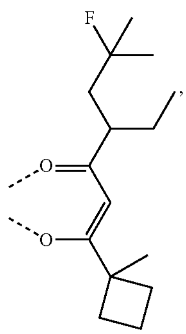
$L_{a636}$
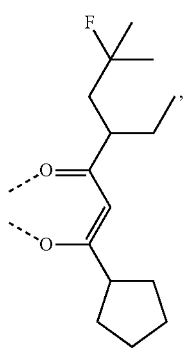
$L_{a637}$
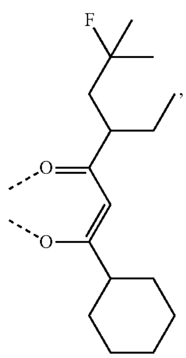
$L_{a638}$
-continued
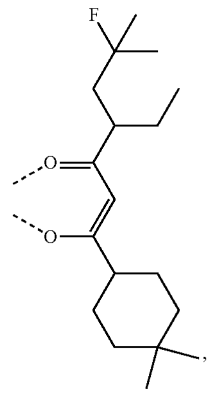
$L_{a639}$
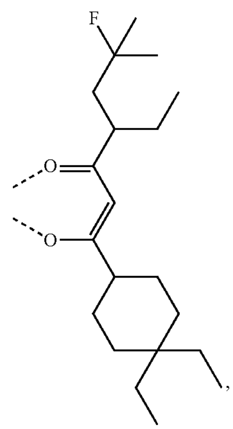
$L_{a640}$
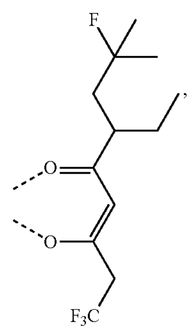
$L_{a641}$
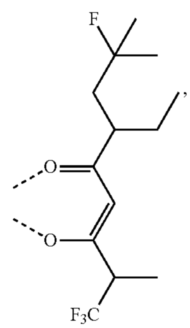
$L_{a642}$ -continued
$L_{a643}$
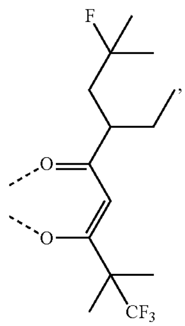
$L_{a644}$
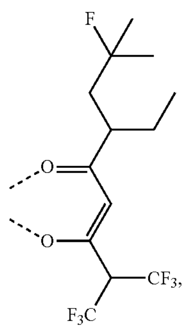
$L_{a645}$
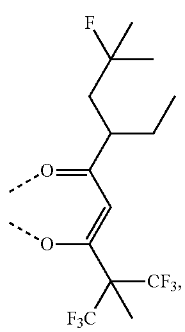
$L_{a646}$
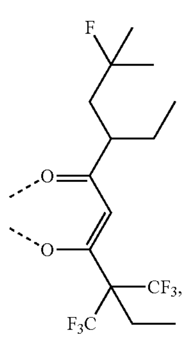
-continued
$L_{a647}$
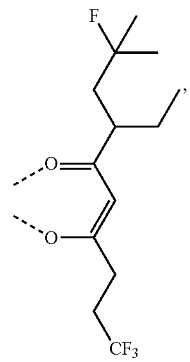
$L_{a648}$
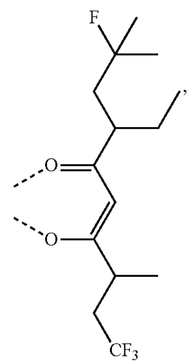
$L_{a649}$
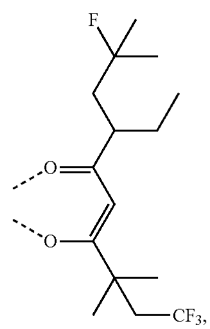
$L_{a650}$
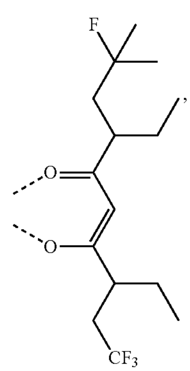

-continued
$L_{a651}$
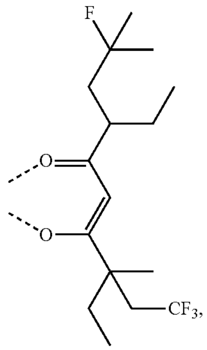
$L_{a652}$
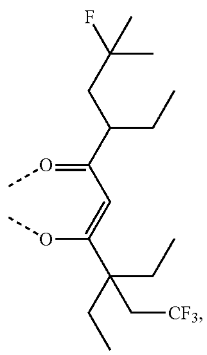
$L_{a653}$
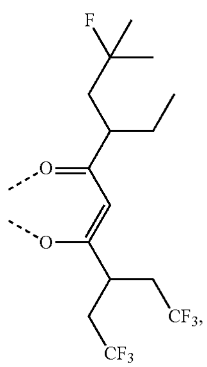
$L_{a654}$
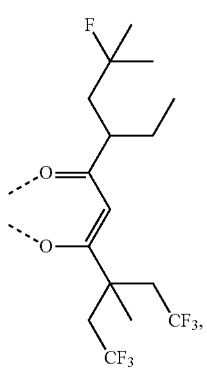
-continued
$L_{a655}$
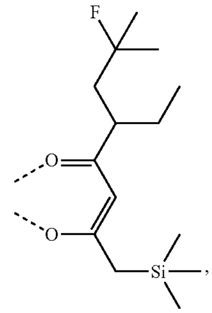
$L_{a656}$
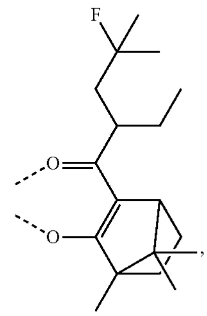
$L_{a657}$
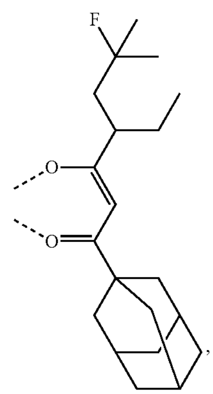
$L_{a658}$
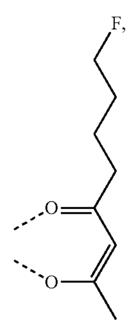

-continued
$L_{a659}$
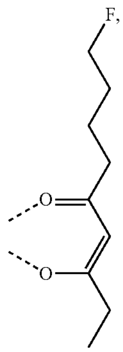
$L_{a660}$
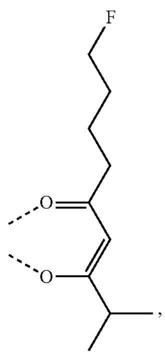
$L_{a661}$
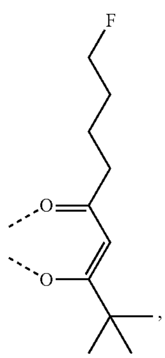
$L_{a662}$
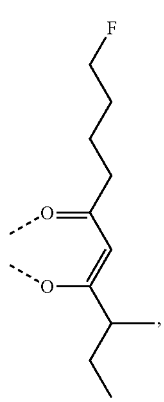
-continued
$L_{a663}$
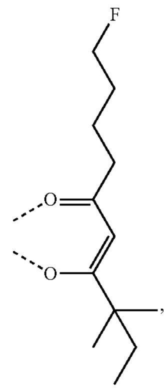
$L_{a664}$
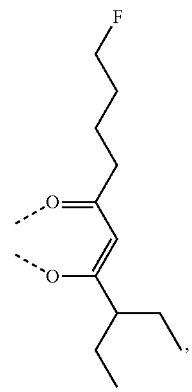
$L_{a665}$
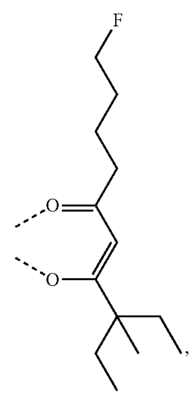
$L_{a666}$
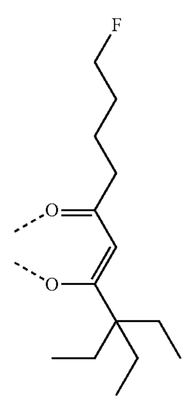

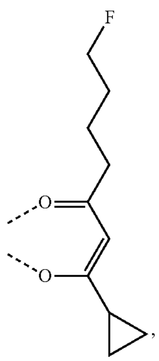
$L_{a667}$
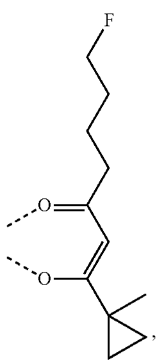
$L_{a668}$
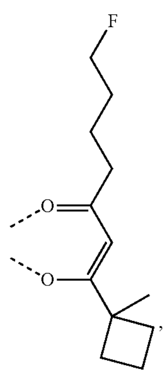
$L_{a669}$
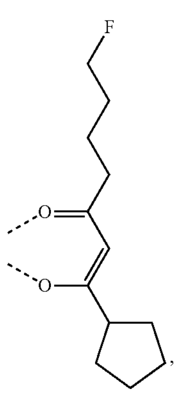
$L_{a670}$
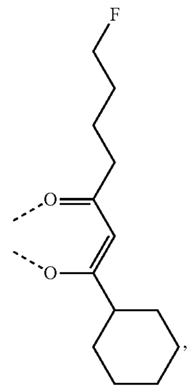
$L_{a671}$
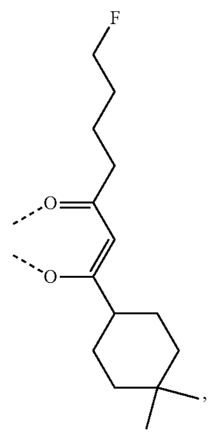
$L_{a672}$
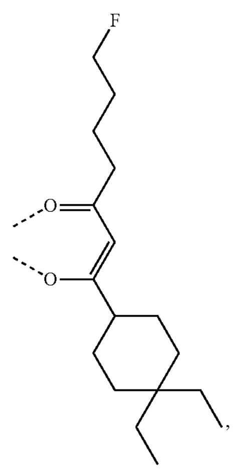
$L_{a673}$
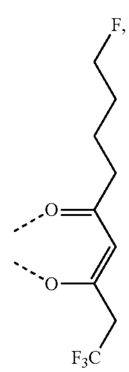
$L_{a674}$ -continued
$L_{a675}$
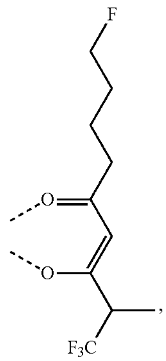
$L_{a676}$
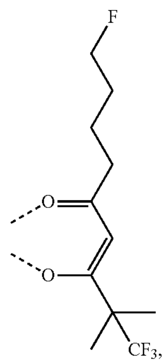
$L_{a677}$
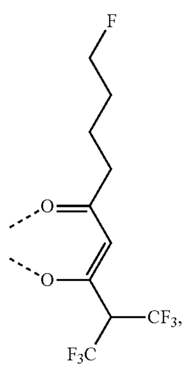
$L_{a678}$
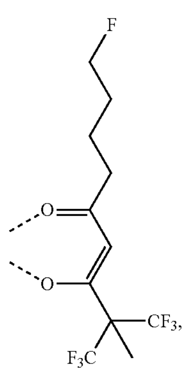
-continued
$L_{a679}$
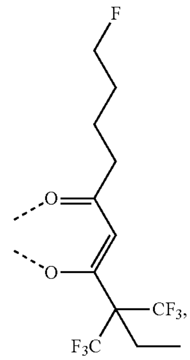
$L_{a680}$
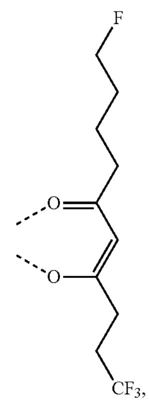
$L_{a681}$
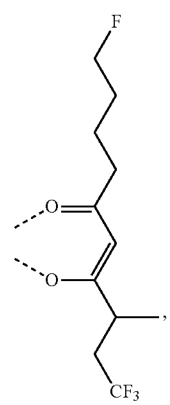
$L_{a682}$
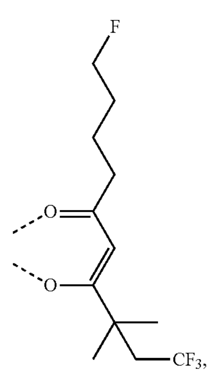

-continued
$L_{a683}$
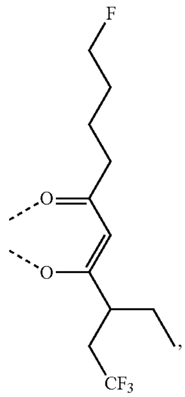
$L_{a684}$
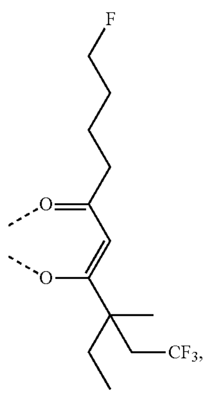
$L_{a685}$
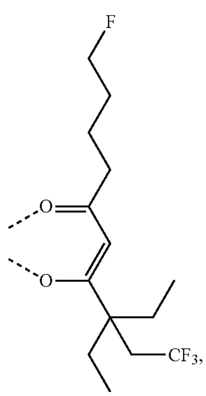
$L_{a686}$
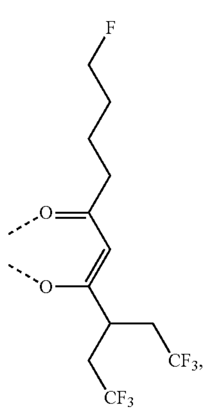
-continued
$L_{a687}$
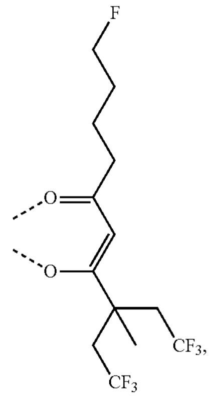
$L_{a688}$
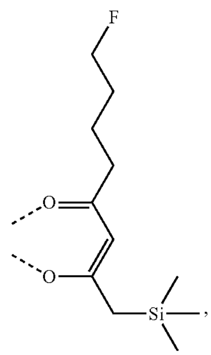
$L_{a689}$
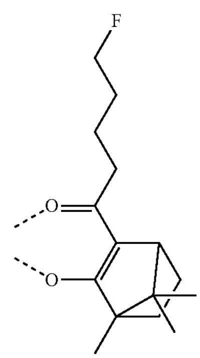
$L_{a690}$
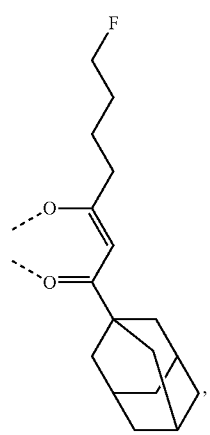

-continued
$L_{a691}$
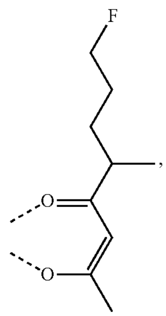
$L_{a692}$
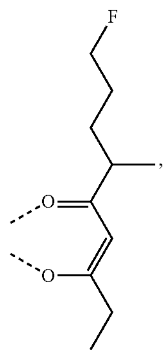
$L_{a693}$
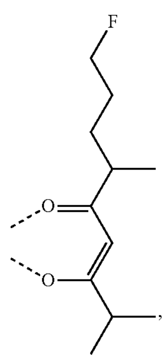
$L_{a694}$
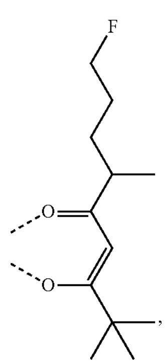
-continued
$L_{a695}$
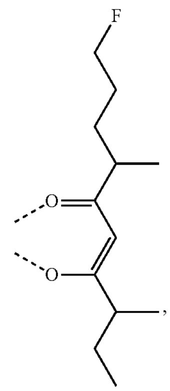
$L_{a696}$
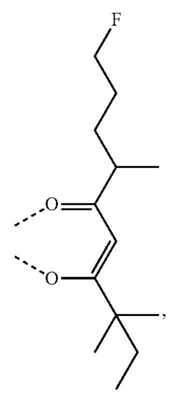
$L_{a697}$
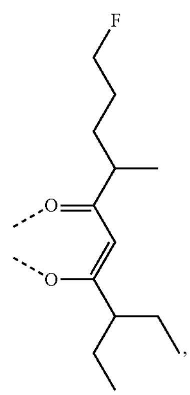
$L_{a698}$
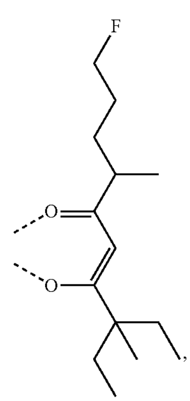

$L_{a699}$
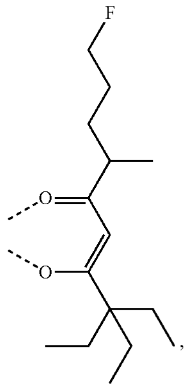
$L_{a700}$
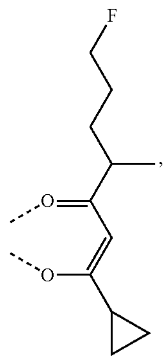
$L_{a701}$
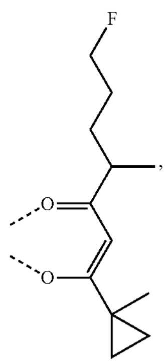
$L_{a702}$
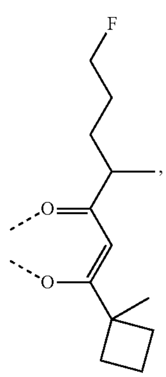
$L_{a703}$
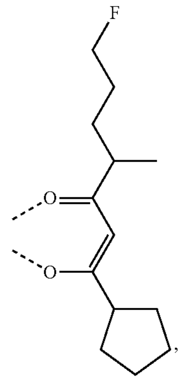
$L_{a704}$
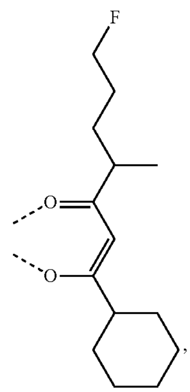
$L_{a705}$
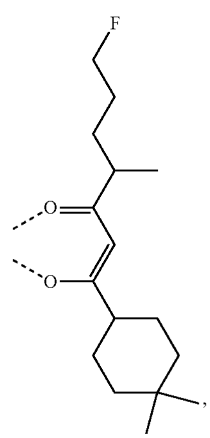

$L_{a706}$
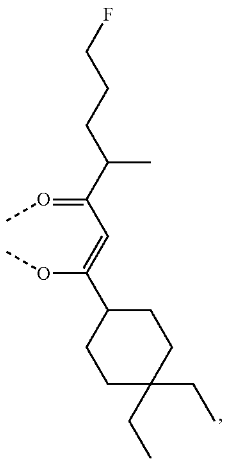
$L_{a707}$
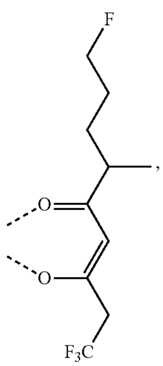
$L_{a708}$
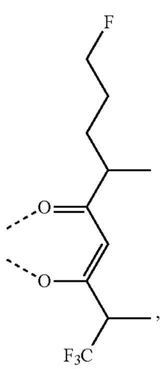
$L_{a709}$
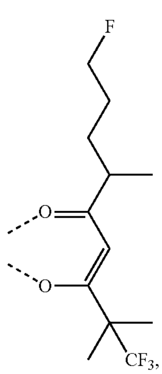
$L_{a710}$
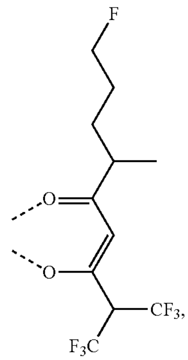
$L_{a711}$
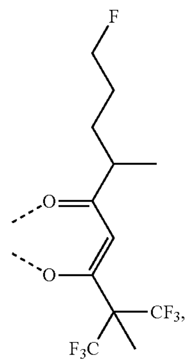
$L_{a712}$
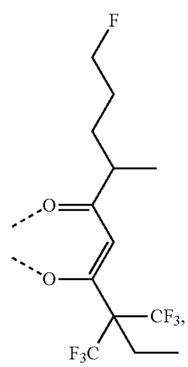
$L_{a713}$
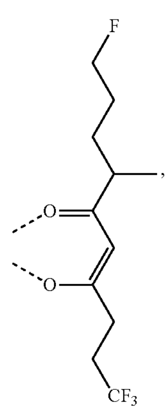

$L_{a714}$
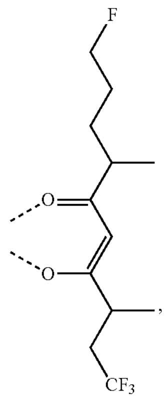
$L_{a715}$
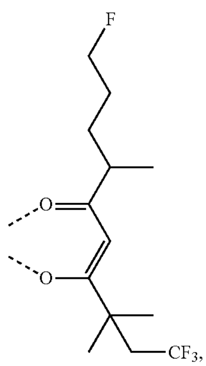
$L_{a716}$
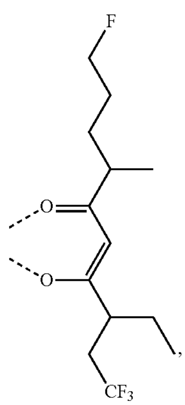
$L_{a717}$
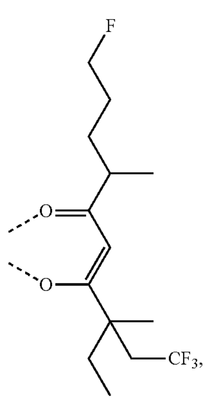
$L_{a718}$
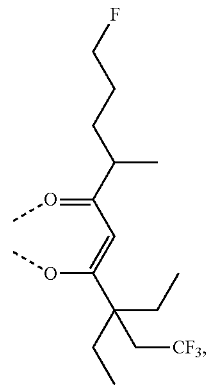
$L_{a719}$
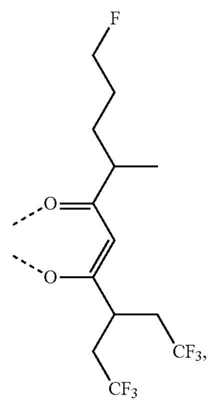
$L_{a720}$
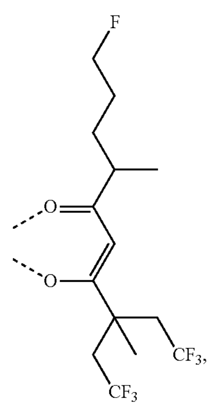
$L_{a721}$
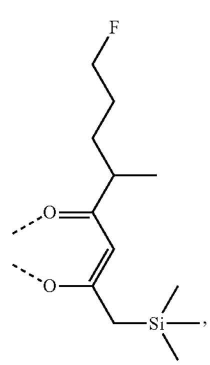

$L_{a722}$
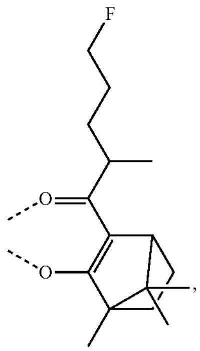
$L_{a723}$
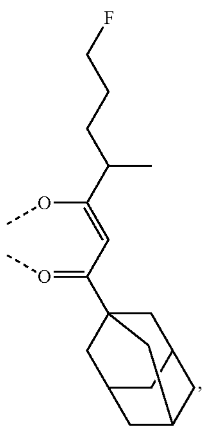
$L_{a724}$
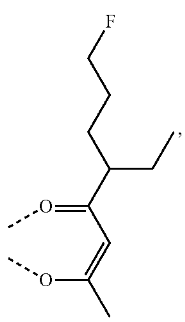
$L_{a725}$
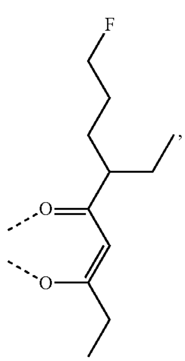
$L_{a726}$
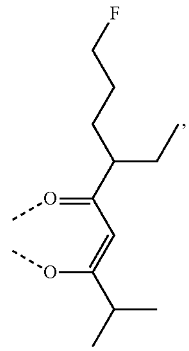
$L_{a727}$
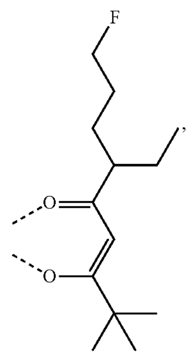
$L_{a728}$
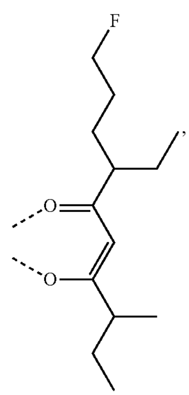
$L_{a729}$
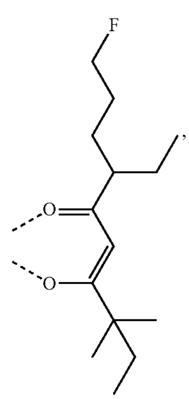

-continued
$L_{a730}$
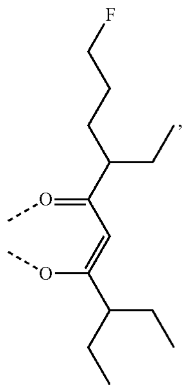
$L_{a731}$
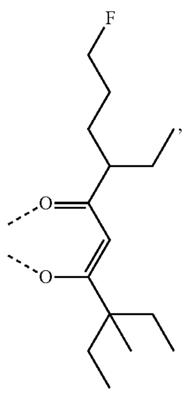
$L_{a732}$
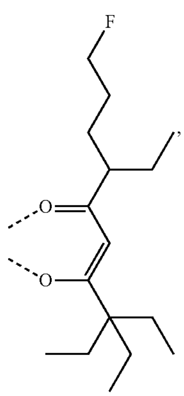
$L_{a733}$
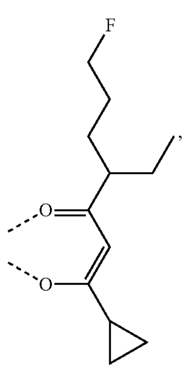
-continued
$L_{a734}$
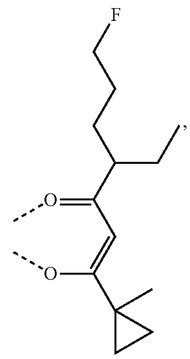
$L_{a735}$
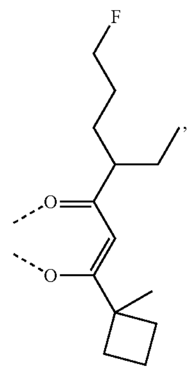
$L_{a736}$
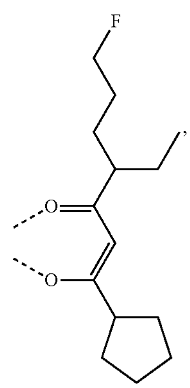
$L_{a737}$
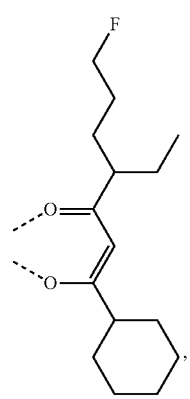

-continued
L$_{a738}$
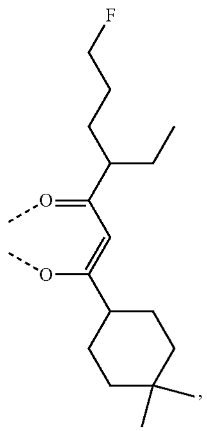
L$_{a739}$
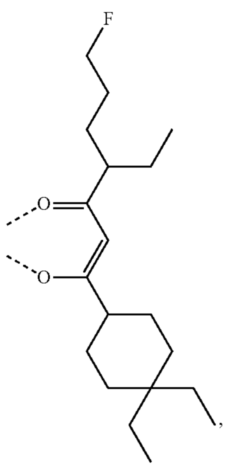
L$_{a740}$
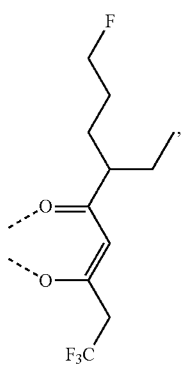
L$_{a741}$
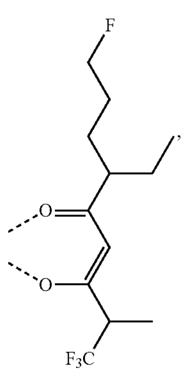
-continued
L$_{a742}$
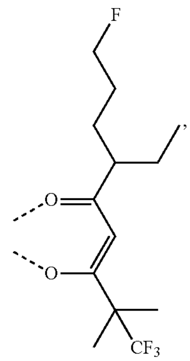
L$_{a743}$
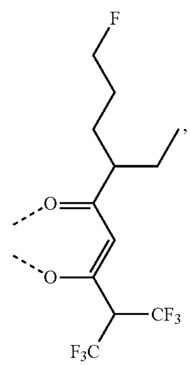
L$_{a744}$
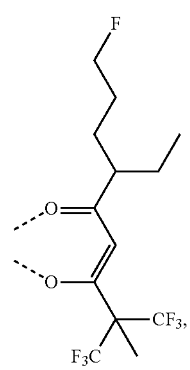
L$_{a745}$
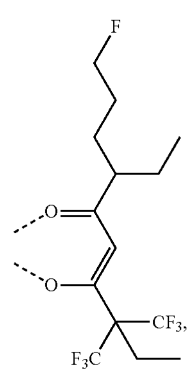

-continued
$L_{a746}$
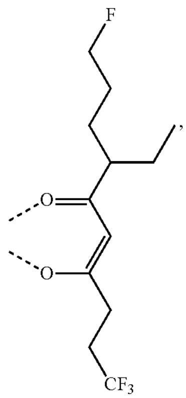
$L_{a747}$
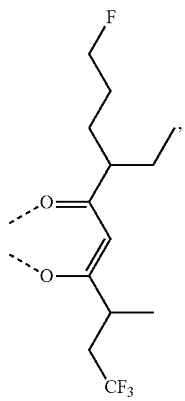
$L_{a748}$
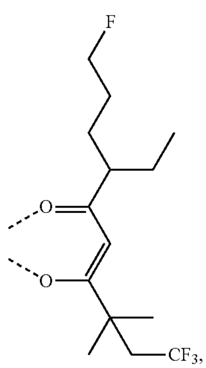
$L_{a749}$
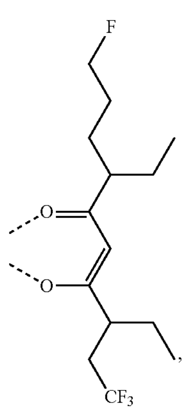
-continued
$L_{a750}$
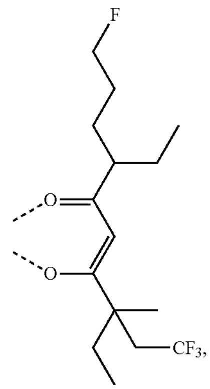
$L_{a751}$
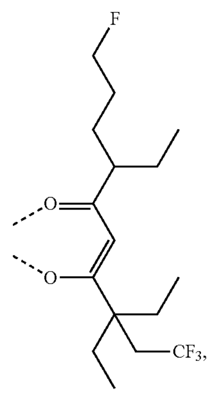
$L_{a752}$
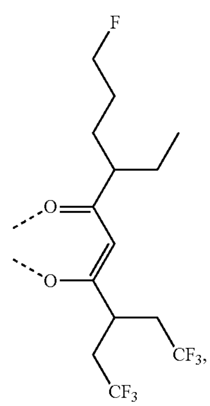
$L_{a753}$
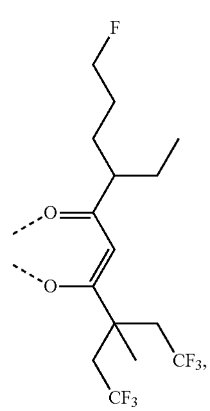

-continued
$L_{a754}$
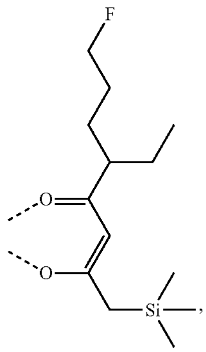
$L_{a755}$
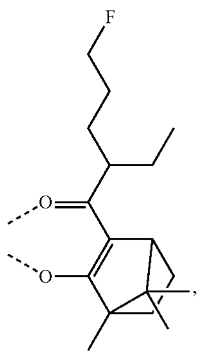
$L_{a756}$
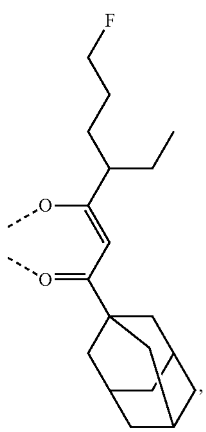
$L_{a757}$
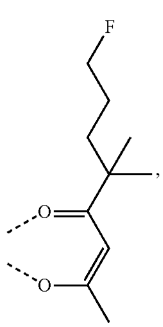
-continued
$L_{a758}$
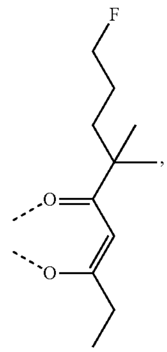
$L_{a759}$
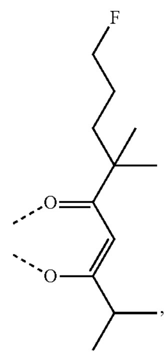
$L_{a760}$
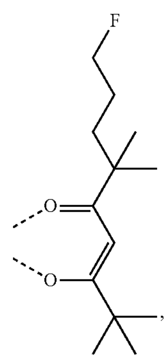
$L_{a761}$
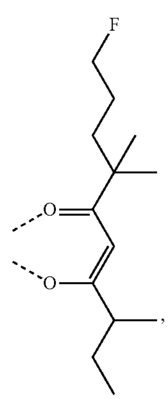

$L_{a762}$
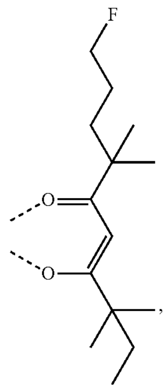
$L_{a763}$
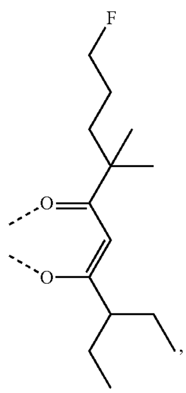
$L_{a764}$
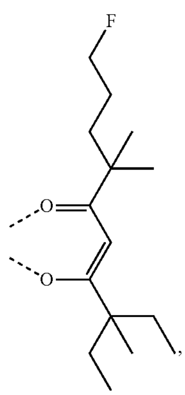
$L_{a765}$
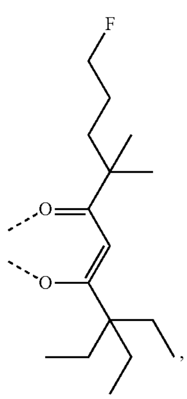
$L_{a766}$
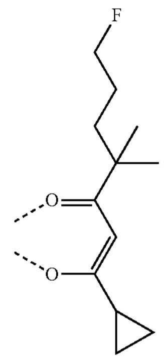
$L_{a767}$
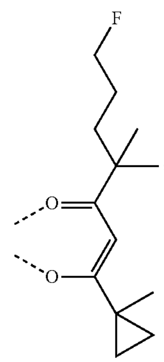
$L_{a768}$
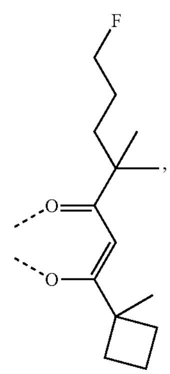
$L_{a769}$
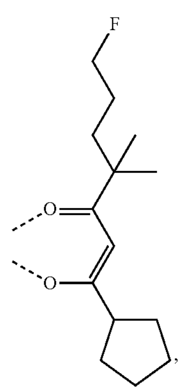

$L_{a770}$
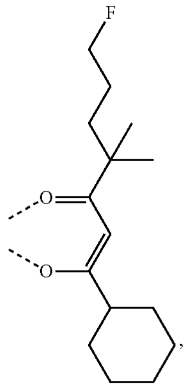
$L_{a771}$
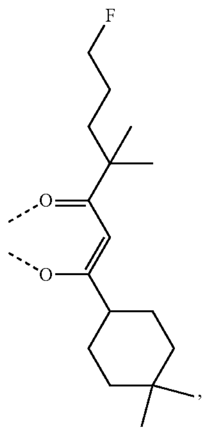
$L_{a772}$
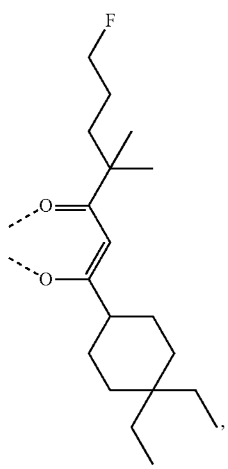
$L_{a773}$
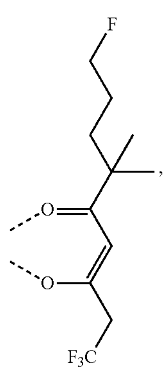
$L_{a774}$
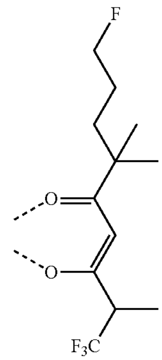
$L_{a775}$
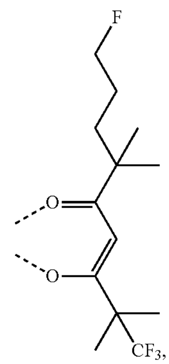
$L_{a776}$
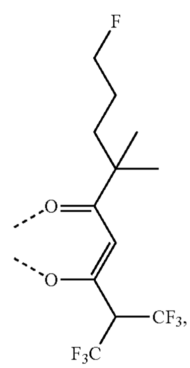
$L_{a777}$
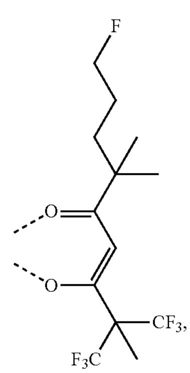

-continued
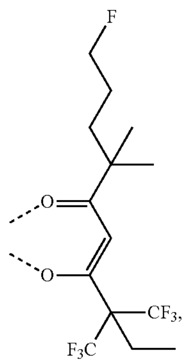
$L_{a778}$
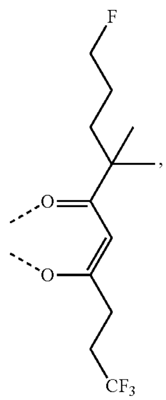
$L_{a779}$
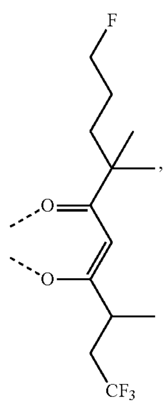
$L_{a780}$
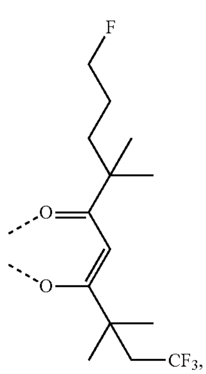
$L_{a781}$
-continued
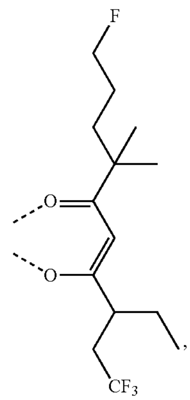
$L_{a782}$
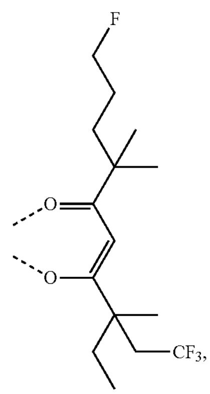
$L_{a783}$
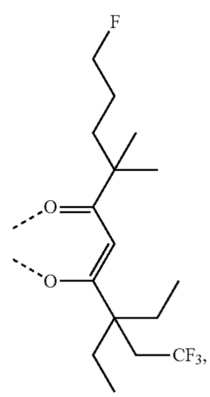
$L_{a784}$
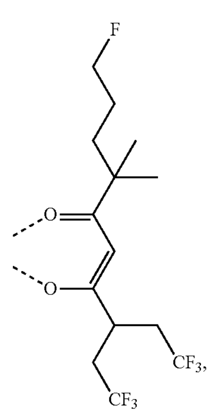
$L_{a785}$ $L_{a786}$
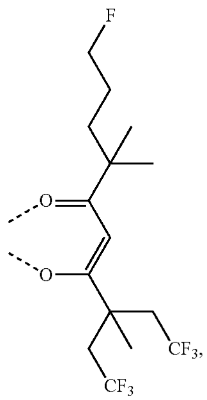
$L_{a787}$
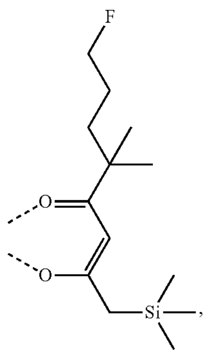
$L_{a788}$
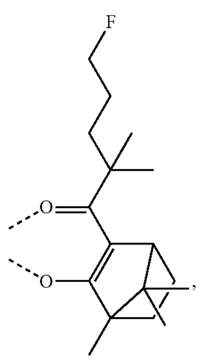
$L_{a789}$
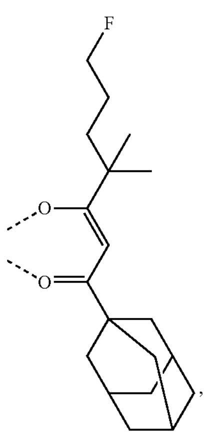
$L_{a790}$
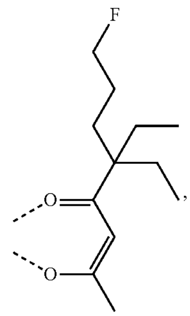
$L_{a791}$
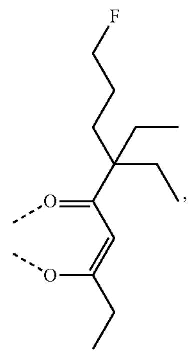
$L_{a792}$
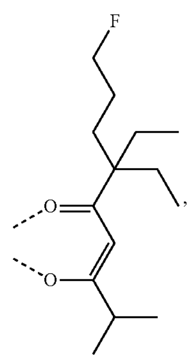
$L_{a793}$
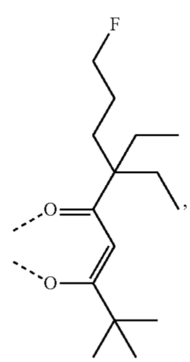

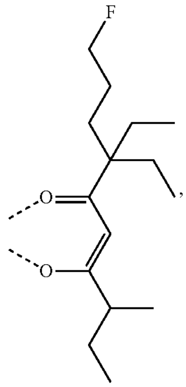
$L_{a794}$
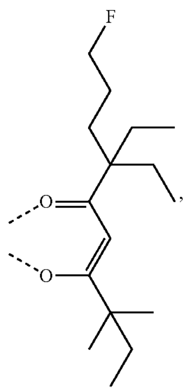
$L_{a795}$
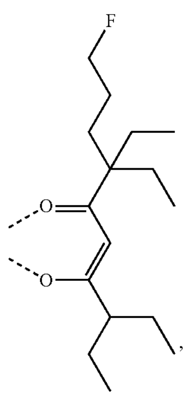
$L_{a796}$
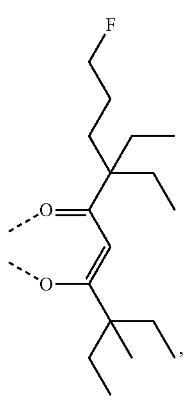
$L_{a797}$
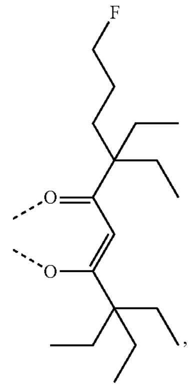
$L_{a798}$
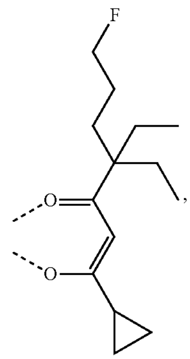
$L_{a799}$
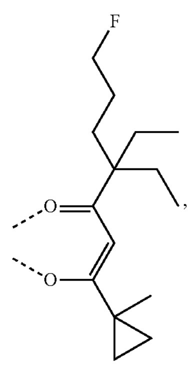
$L_{a800}$
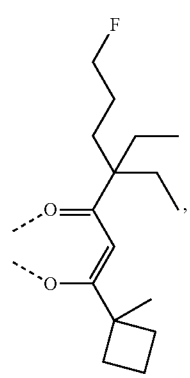
$L_{a801}$ -continued
$L_{a802}$
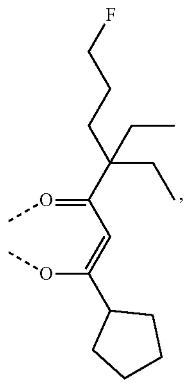
$L_{a803}$
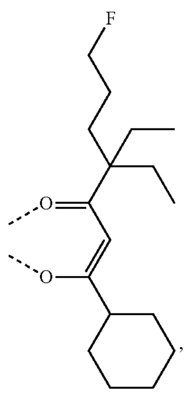
$L_{a804}$
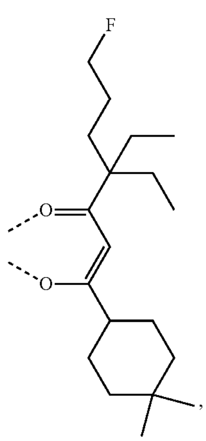
-continued
$L_{a805}$
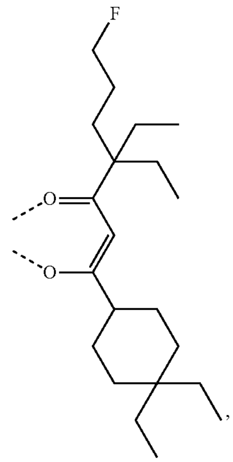
$L_{a806}$
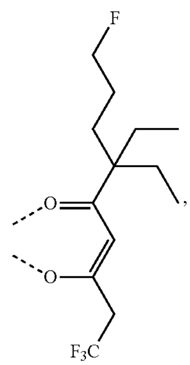
$L_{a807}$
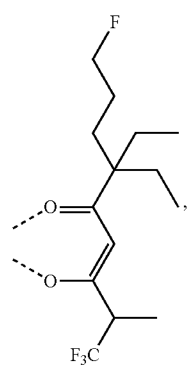
$L_{a808}$
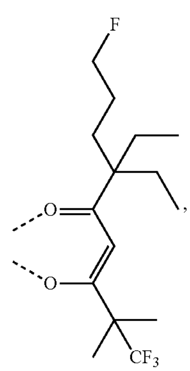

$L_{a809}$
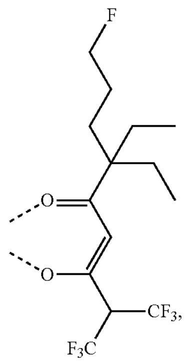
$L_{a810}$
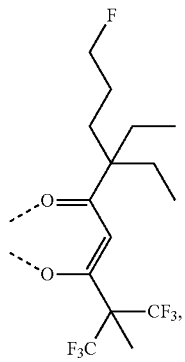
$L_{a811}$
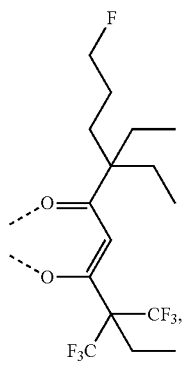
$L_{a812}$
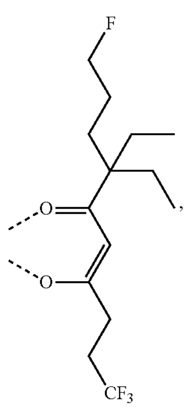
$L_{a813}$
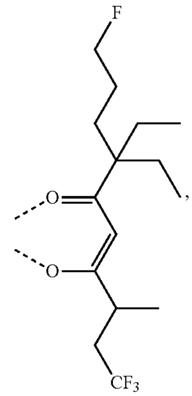
$L_{a814}$
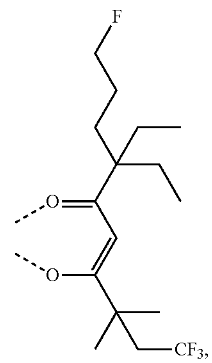
$L_{a815}$
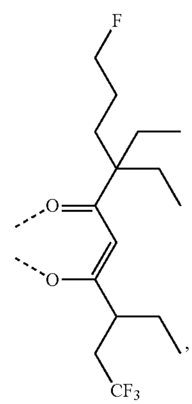
$L_{a816}$
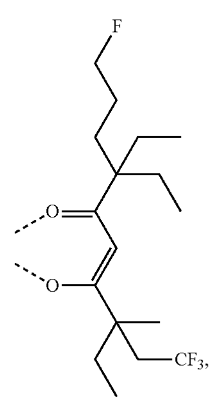

-continued
$L_{a817}$
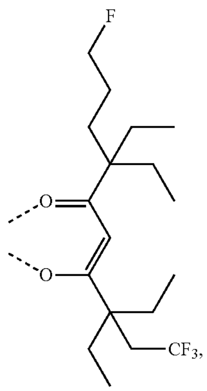
$L_{a818}$
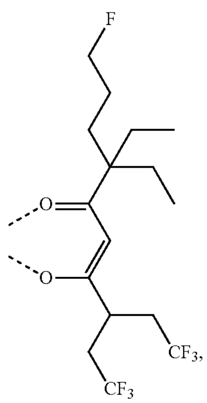
$L_{a819}$
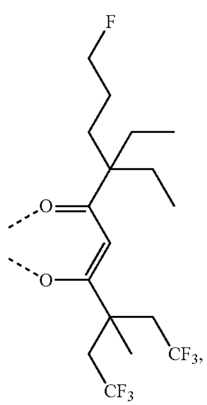
$L_{a820}$
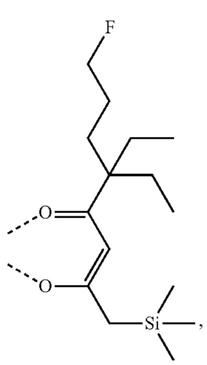
-continued
$L_{a821}$
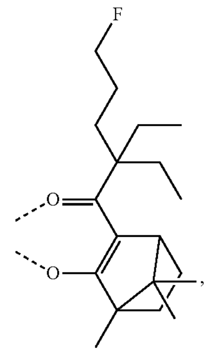
$L_{a822}$
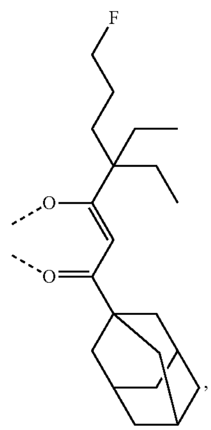
$L_{a823}$
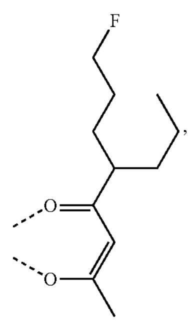
$L_{a824}$
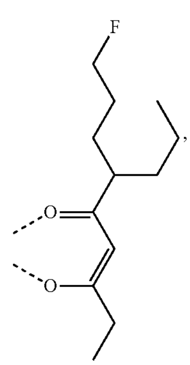

-continued
$L_{a825}$
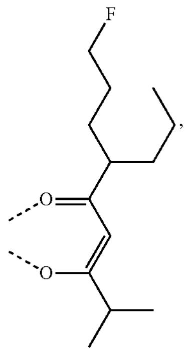
$L_{a826}$
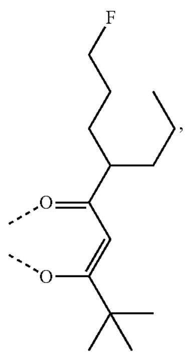
$L_{a827}$
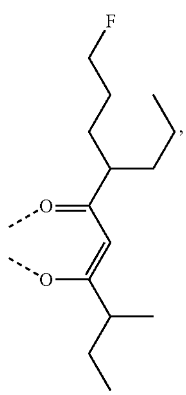
$L_{a828}$
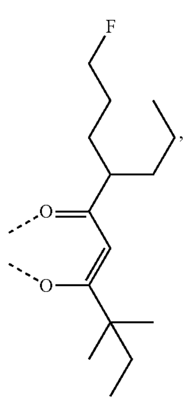
-continued
$L_{a829}$
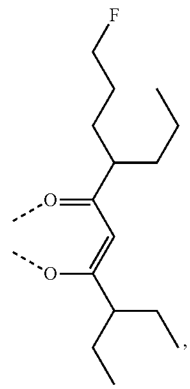
$L_{a830}$
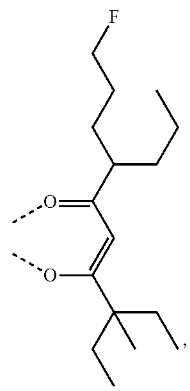
$L_{a831}$
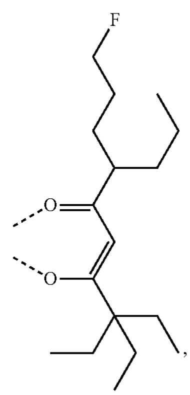
$L_{a832}$
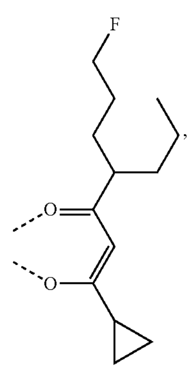

-continued
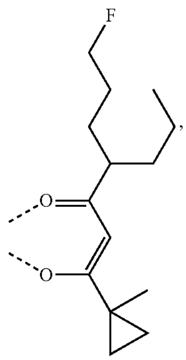
$L_{a833}$
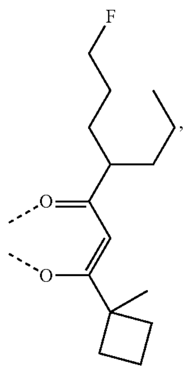
$L_{a834}$
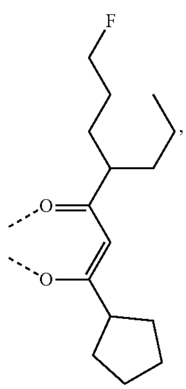
$L_{a835}$
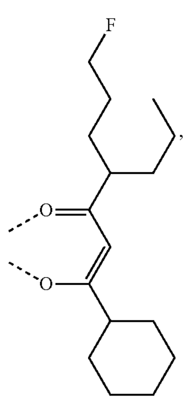
$L_{a836}$
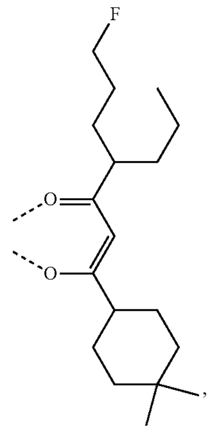
$L_{a837}$
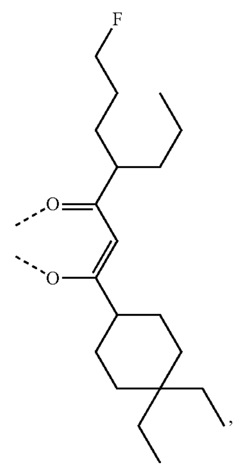
$L_{a838}$
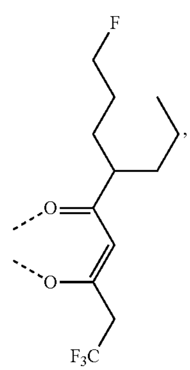
$L_{a839}$
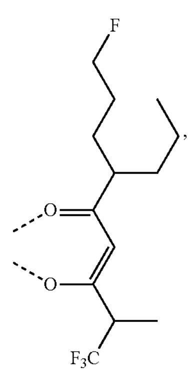
$L_{a840}$ -continued
$L_{a841}$
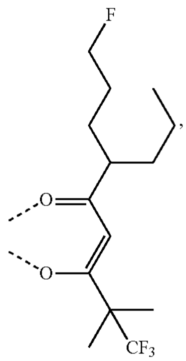
$L_{a842}$
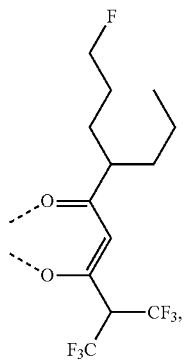
$L_{a843}$
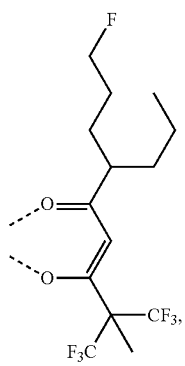
$L_{a844}$
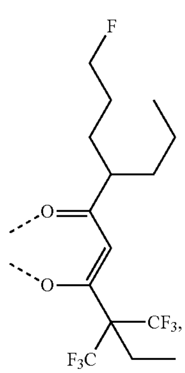
-continued
$L_{a845}$
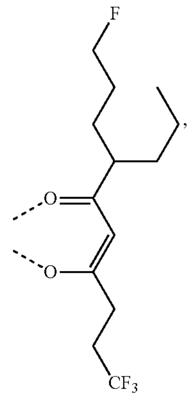
$L_{a846}$
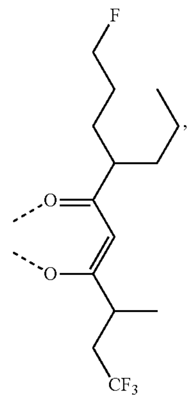
$L_{a847}$
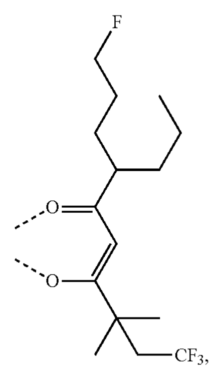
$L_{a848}$
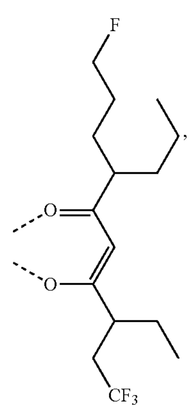

-continued
$L_{a849}$
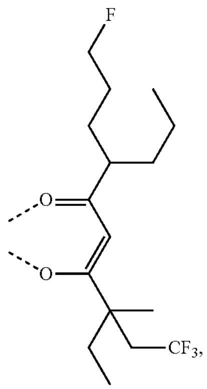
$L_{a850}$
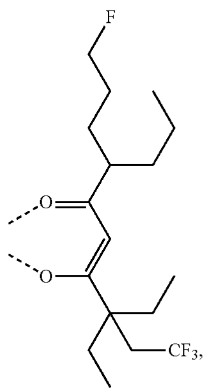
$L_{a851}$
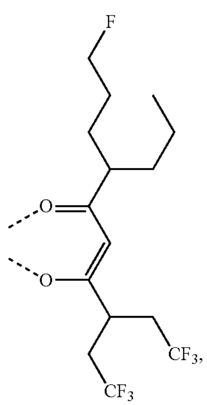
$L_{a852}$
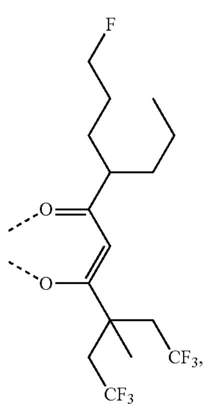
-continued
$L_{a853}$
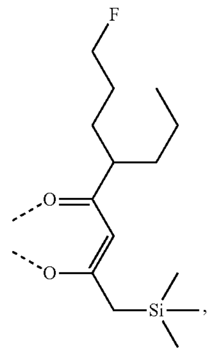
$L_{a854}$
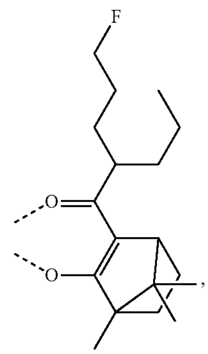
$L_{a855}$
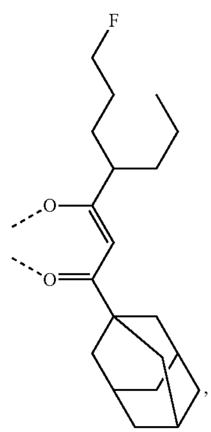
$L_{a856}$
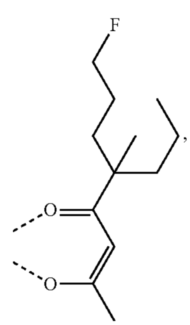

-continued
$L_{a857}$
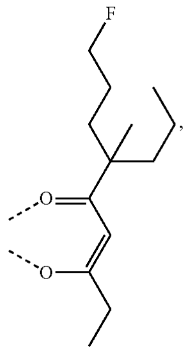
$L_{a858}$
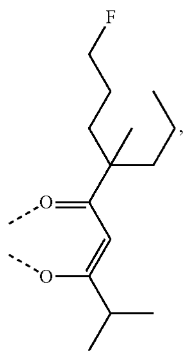
$L_{a859}$
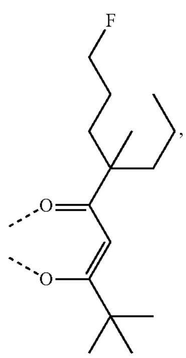
$L_{a860}$
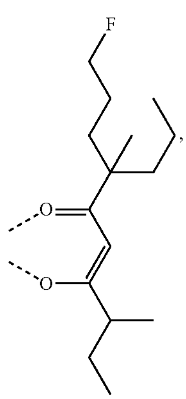
-continued
$L_{a861}$
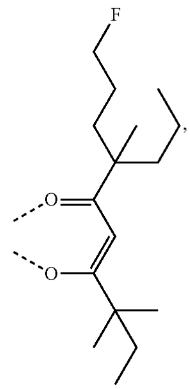
$L_{a862}$
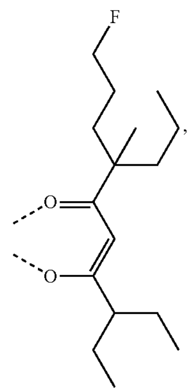
$L_{a863}$
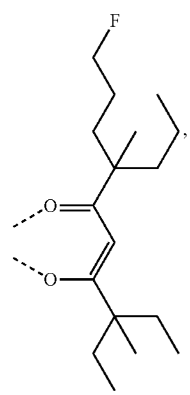
$L_{a864}$
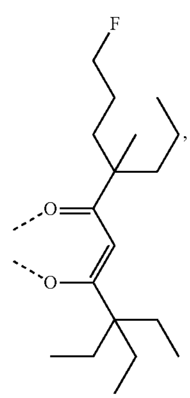

-continued
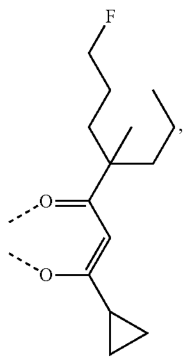
$L_{a865}$
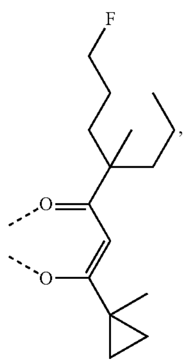
$L_{a866}$
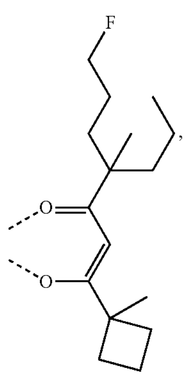
$L_{a867}$
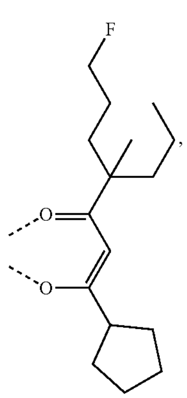
$L_{a868}$
-continued
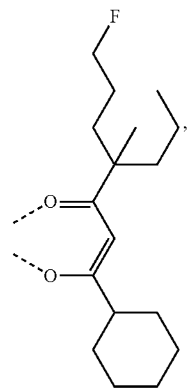
$L_{a869}$
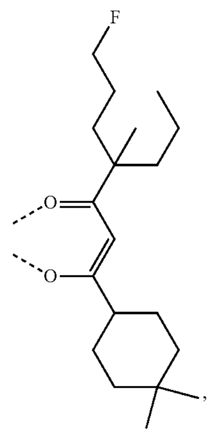
$L_{a870}$
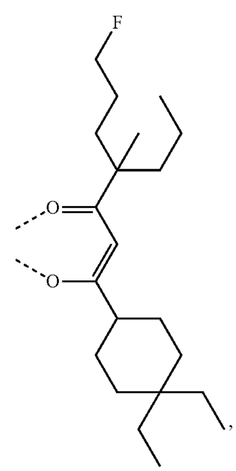
$L_{a871}$
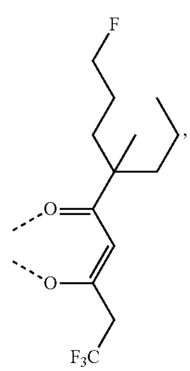
$L_{a872}$ -continued
$L_{a873}$
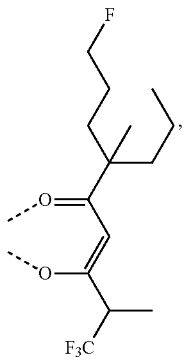
$L_{a874}$
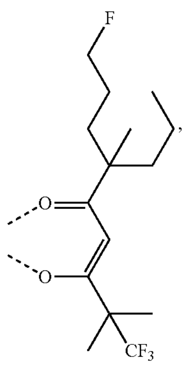
$L_{a875}$
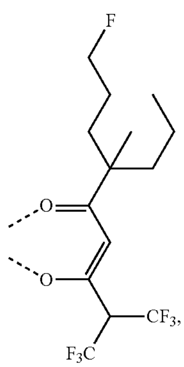
$L_{a876}$
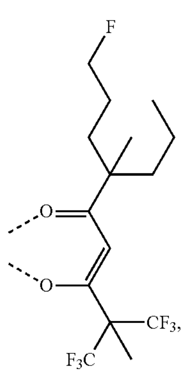
-continued
$L_{a877}$
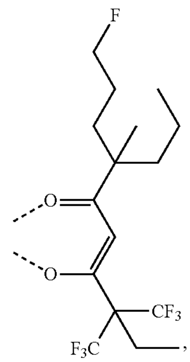
$L_{a878}$
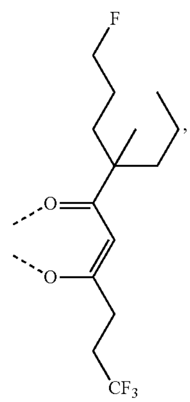
$L_{a879}$
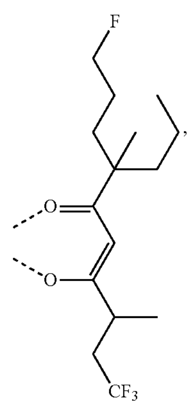
$L_{a880}$
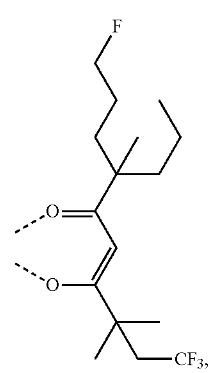

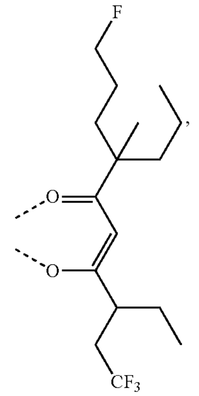
$L_{a881}$
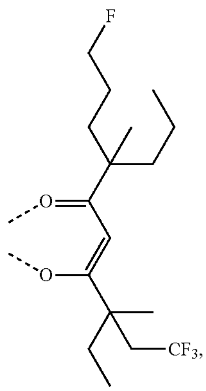
$L_{a882}$
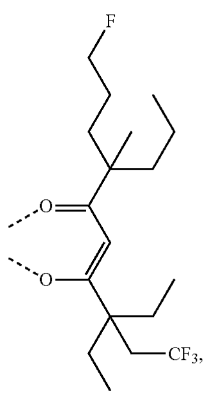
$L_{a883}$
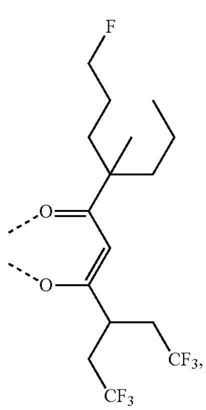
$L_{a884}$
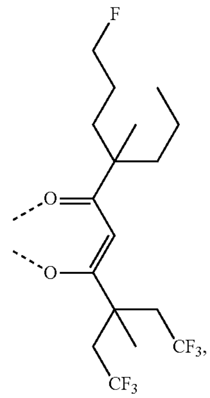
$L_{a885}$
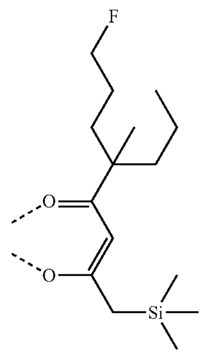
$L_{a886}$
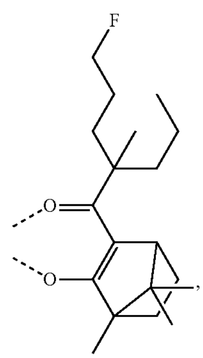
$L_{a887}$
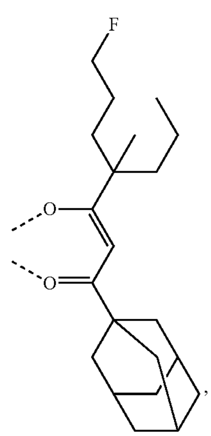
$L_{a888}$ -continued
$L_{a889}$
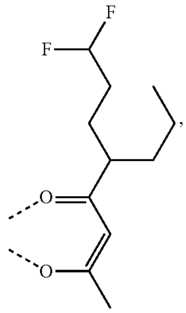
$L_{a890}$
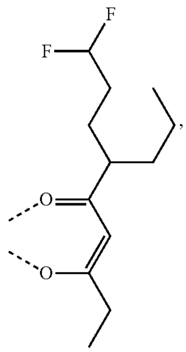
$L_{a891}$
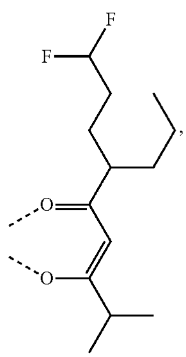
$L_{a892}$
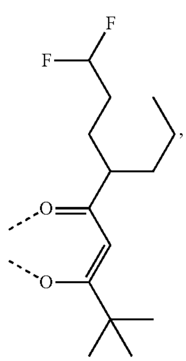
-continued
$L_{a893}$
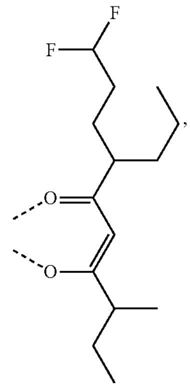
$L_{a894}$
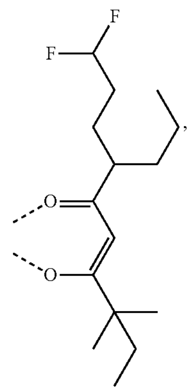
$L_{a895}$
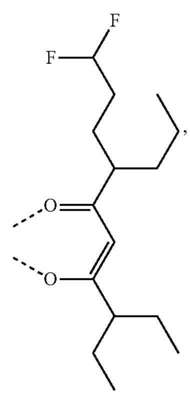
$L_{a896}$
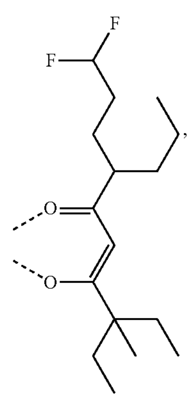

$L_{a897}$
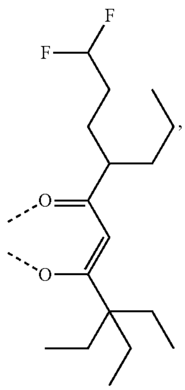
$L_{a898}$
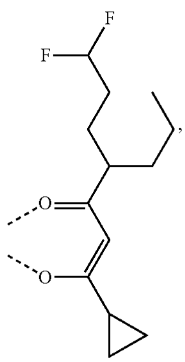
$L_{a899}$
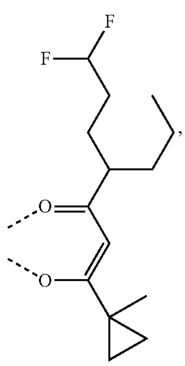
$L_{a900}$
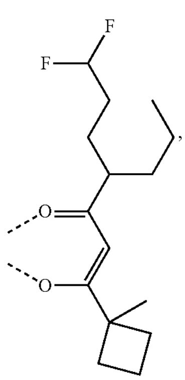
$L_{a901}$
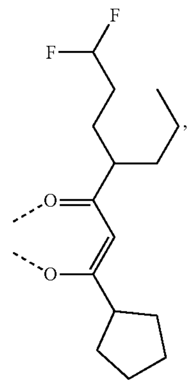
$L_{a902}$
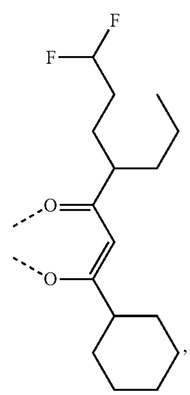
$L_{a903}$
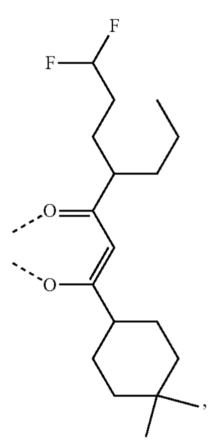

-continued
$L_{a904}$
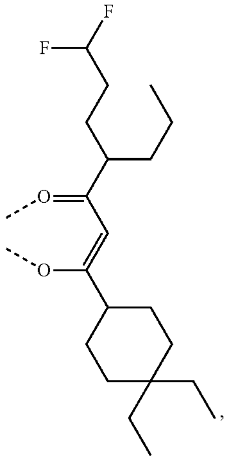
$L_{a905}$
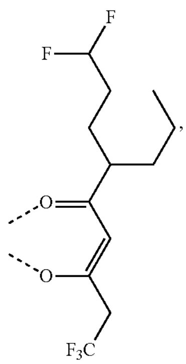
$L_{a906}$
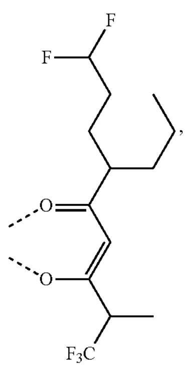
$L_{a907}$
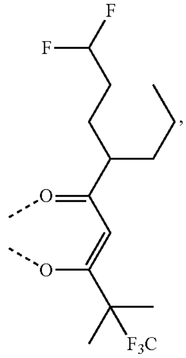
-continued
$L_{a908}$
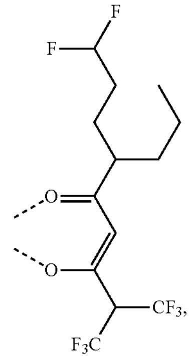
$L_{a909}$
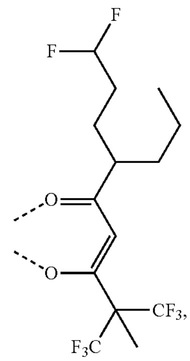
$L_{a910}$
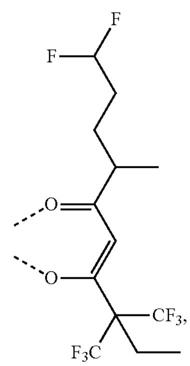
$L_{a911}$
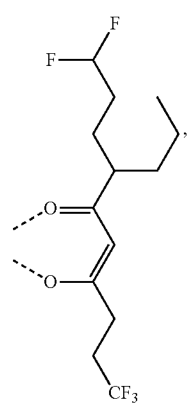

-continued
$L_{a912}$
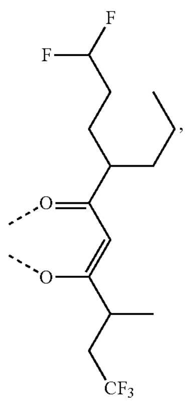
$L_{a913}$
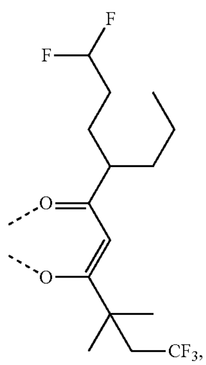
$L_{a914}$
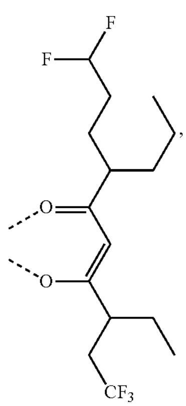
$L_{a915}$
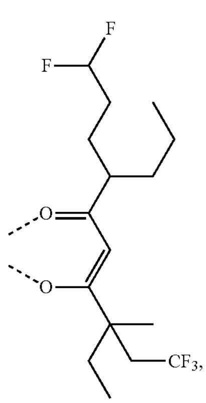
-continued
$L_{a916}$
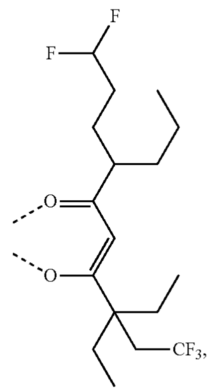
$L_{a917}$
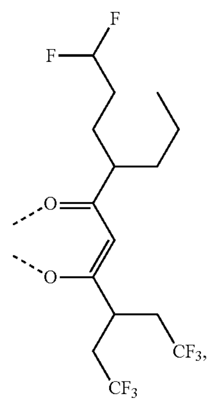
$L_{a918}$
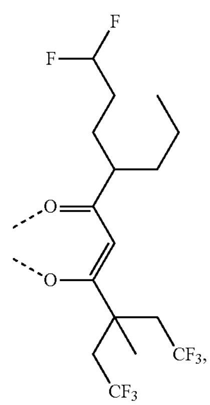
$L_{a919}$
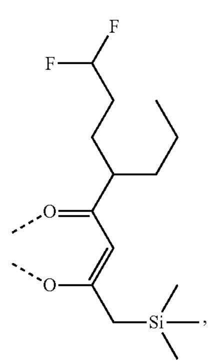

-continued
$L_{a920}$
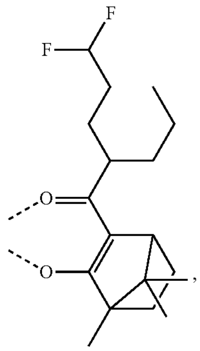
$L_{a921}$
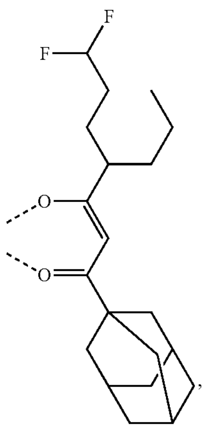
$L_{a922}$
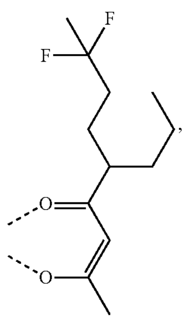
$L_{a923}$
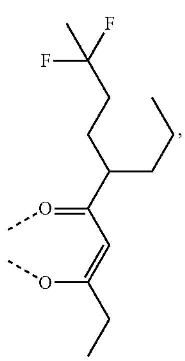
-continued
$L_{a924}$
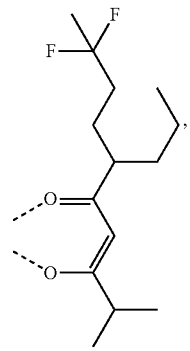
$L_{a925}$
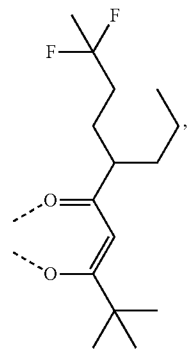
$L_{a926}$
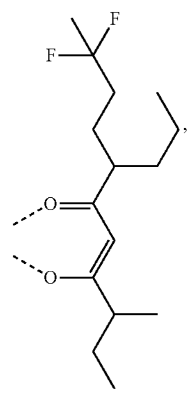
$L_{a927}$
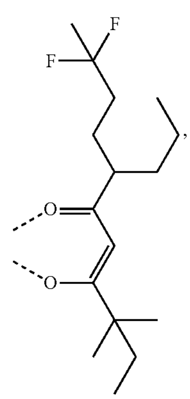

-continued
$L_{a928}$
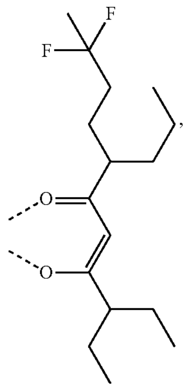
$L_{a929}$
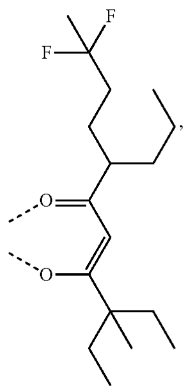
$L_{a930}$
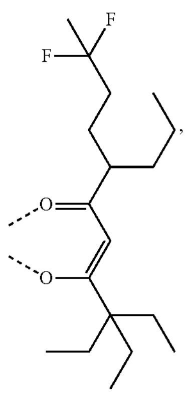
$L_{a931}$
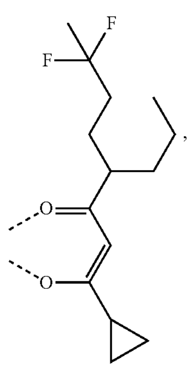
-continued
$L_{a932}$
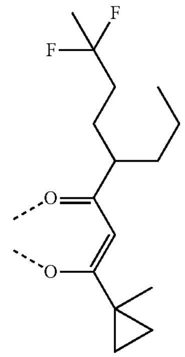
$L_{a933}$
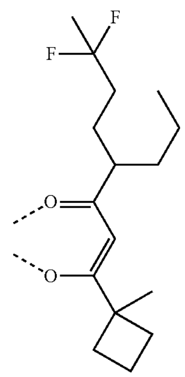
$L_{a934}$
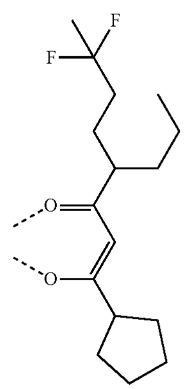
$L_{a935}$
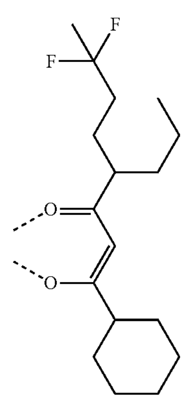

-continued
$L_{a936}$
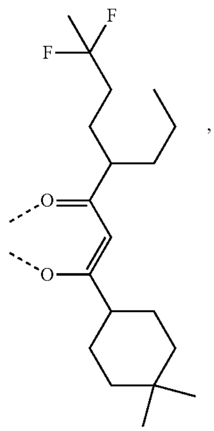
$L_{a937}$
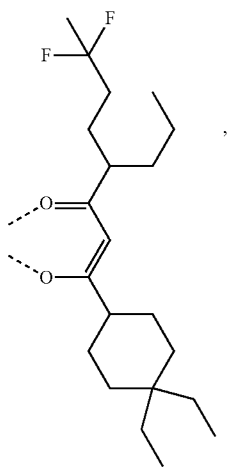
$L_{a938}$
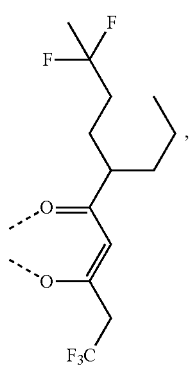
$L_{a939}$
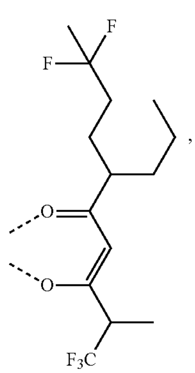
-continued
$L_{a940}$
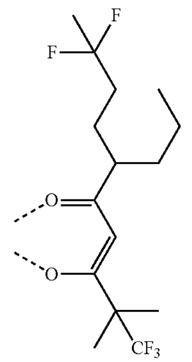
$L_{a941}$
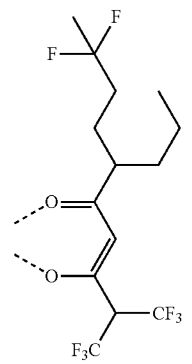
$L_{a942}$
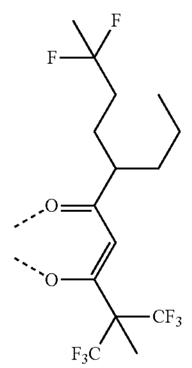
$L_{a943}$
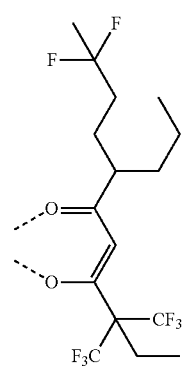

-continued
$L_{a944}$
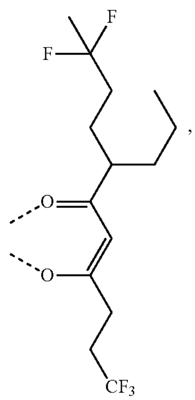
$L_{a945}$
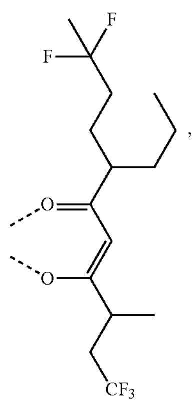
$L_{a946}$
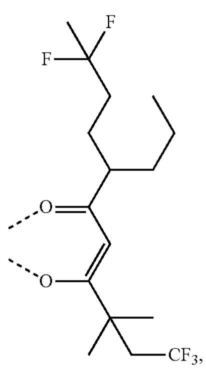
$L_{a947}$
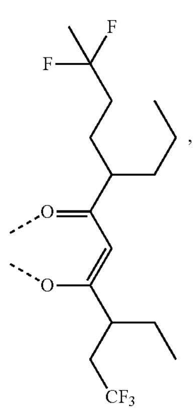
-continued
$L_{a948}$
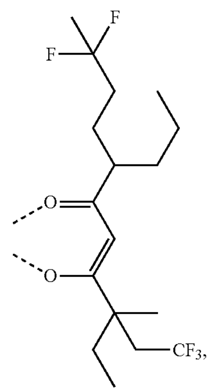
$L_{a949}$
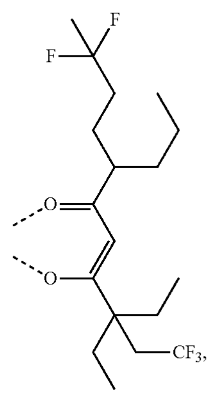
$L_{a950}$
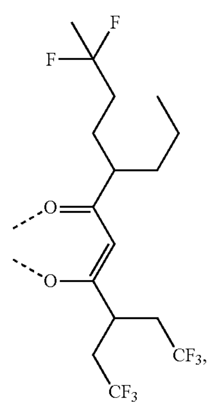
$L_{a951}$
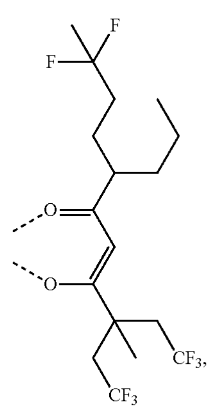

-continued
$L_{a952}$
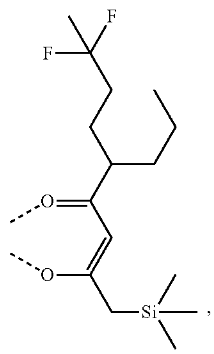
$L_{a953}$
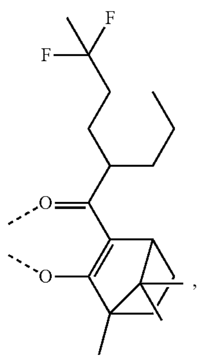
$L_{a954}$
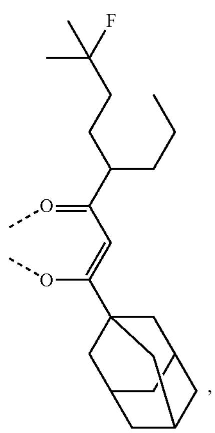
$L_{a955}$
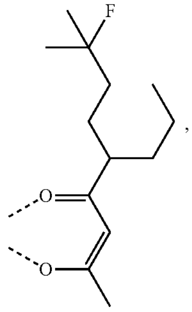
-continued
$L_{a956}$
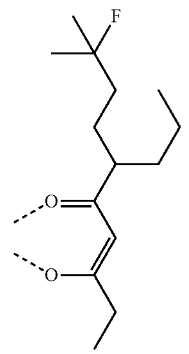
$L_{a957}$
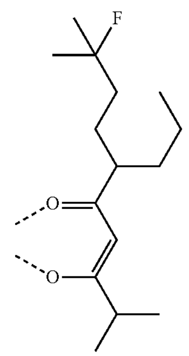
$L_{a958}$
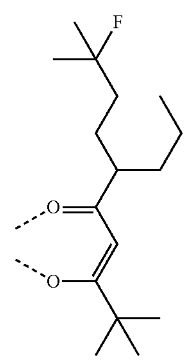
$L_{a959}$
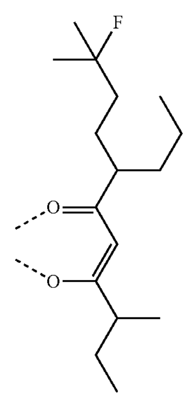

$L_{a960}$
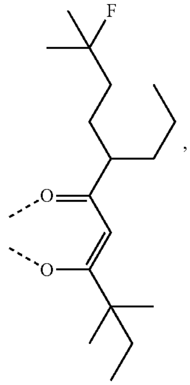
$L_{a961}$
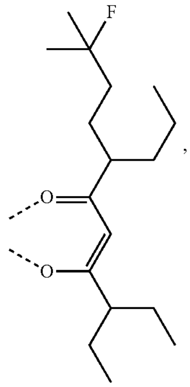
$L_{a962}$
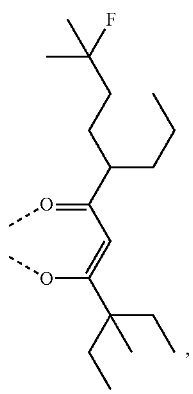
$L_{a963}$
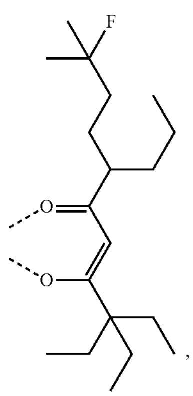
$L_{a964}$
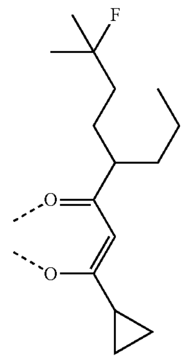
$L_{a965}$
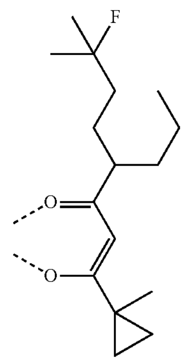
$L_{a966}$
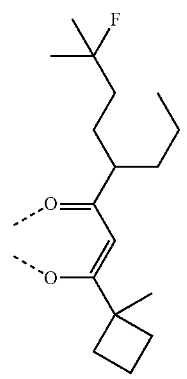
$L_{a967}$
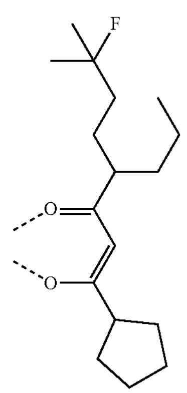

-continued
$L_{a968}$
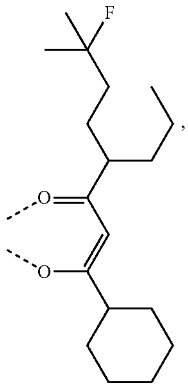
$L_{a969}$
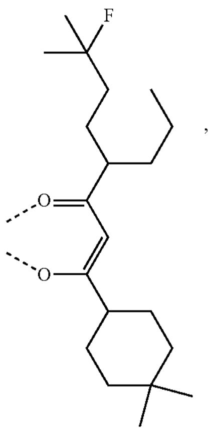
$L_{a970}$
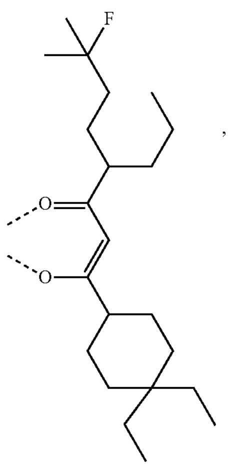
$L_{a971}$
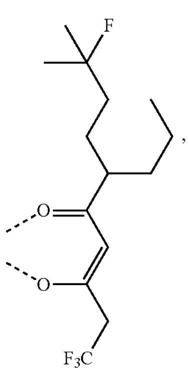
-continued
$L_{a972}$
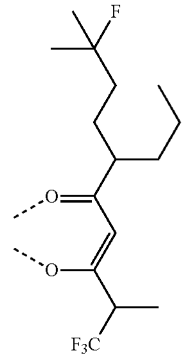
$L_{a973}$
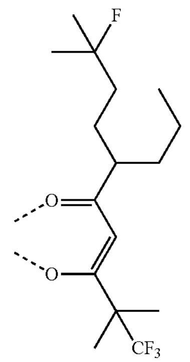
$L_{a974}$
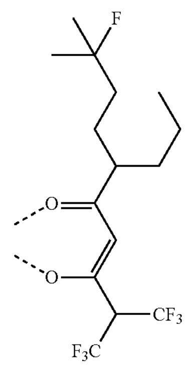
$L_{a975}$
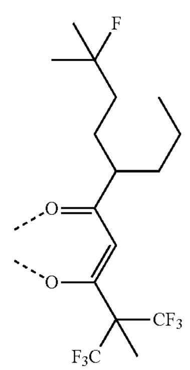

$L_{a976}$
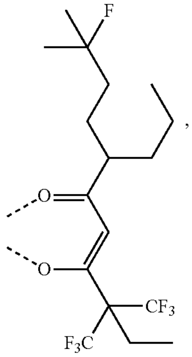
$L_{a977}$
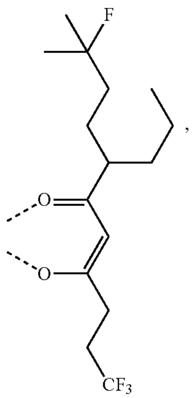
$L_{a978}$
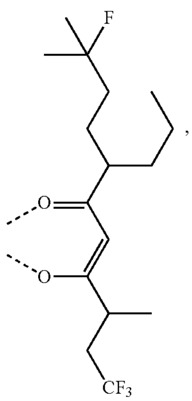
$L_{a979}$
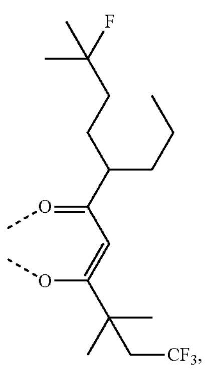
$L_{a980}$
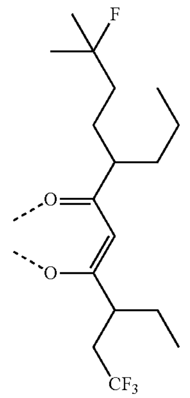
$L_{a981}$
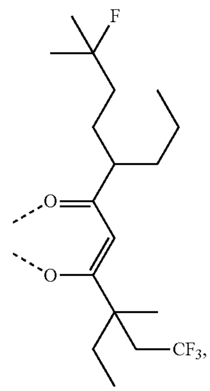
$L_{a982}$
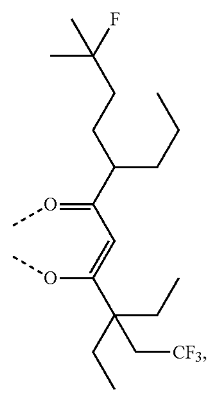
$L_{a983}$
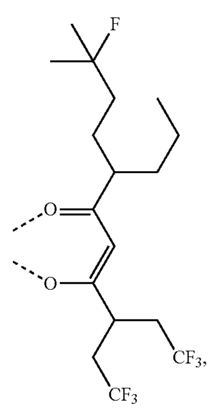

$L_{a984}$
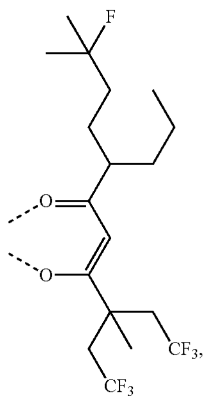
$L_{a985}$
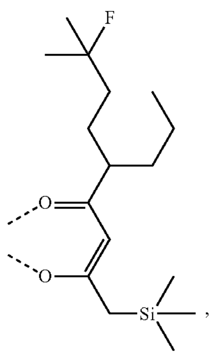
$L_{a986}$
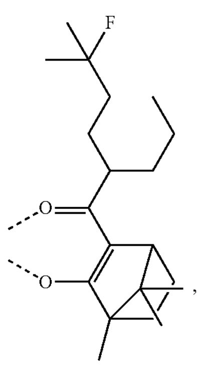
$L_{a987}$
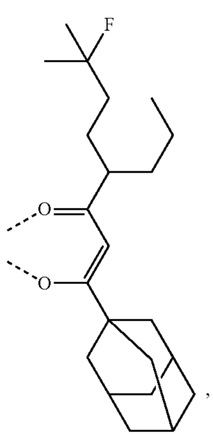
$L_{a988}$
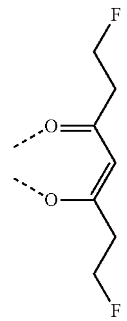
$L_{a989}$
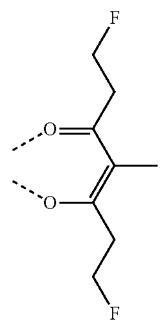
$L_{a990}$
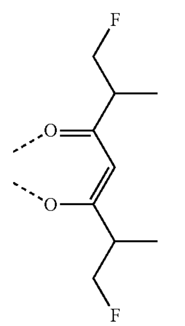
$L_{a991}$
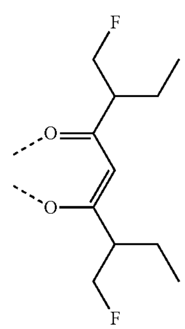
$L_{a992}$
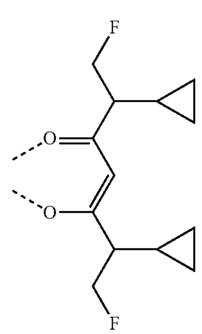

-continued
$L_{a993}$
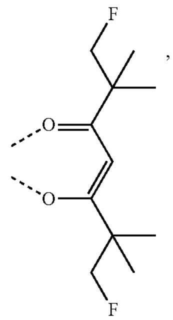
$L_{a994}$
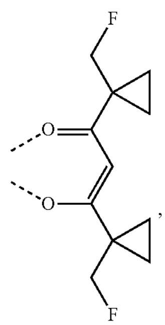
$L_{a995}$
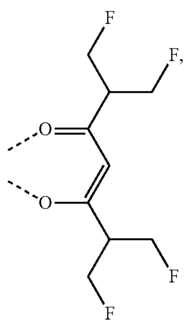
$L_{a996}$
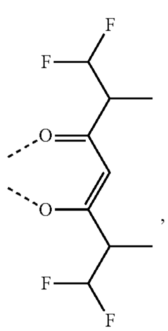
$L_{a997}$
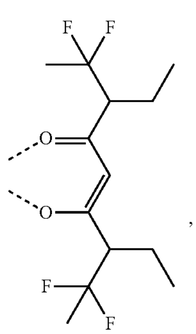
-continued
$L_{a998}$
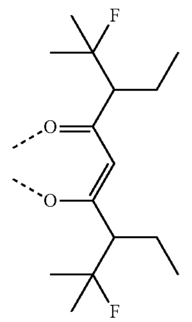
$L_{a999}$
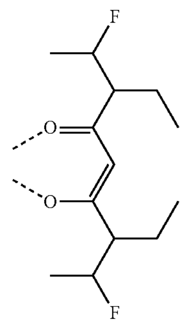
$L_{a1000}$
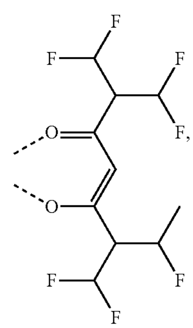
$L_{a1001}$
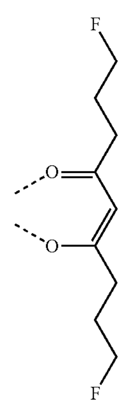

-continued
L$_{a1002}$
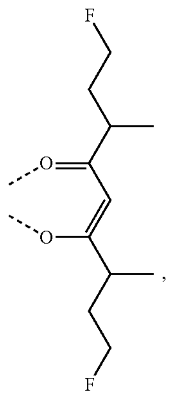
L$_{a1003}$
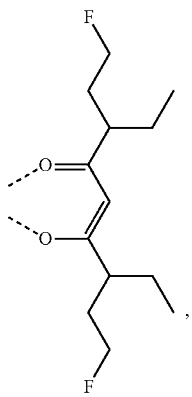
L$_{a1004}$
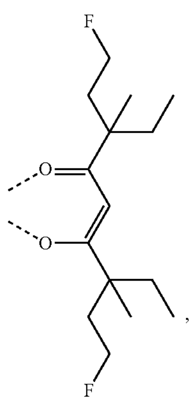
L$_{a1005}$
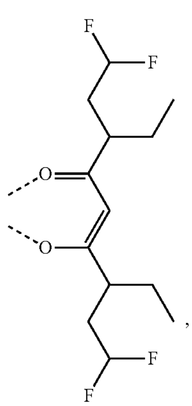
-continued
L$_{a1006}$
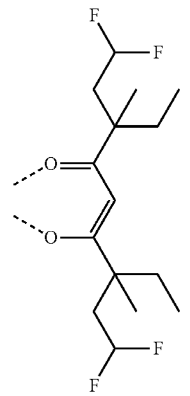
L$_{a1007}$
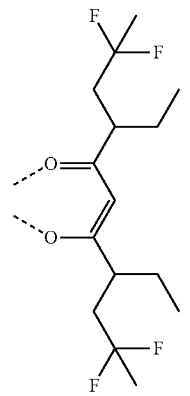
L$_{a1008}$
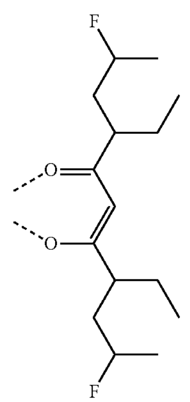
L$_{a1009}$
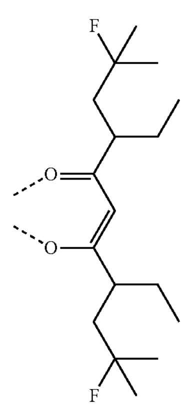

-continued
$L_{a1010}$
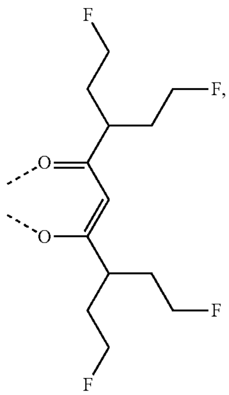
$L_{a1011}$
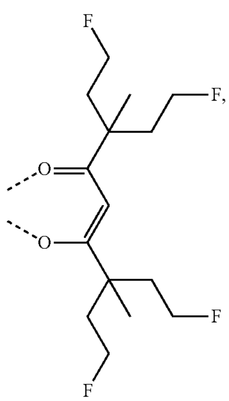
$L_{a1012}$
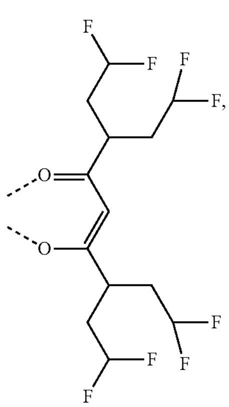
-continued
$L_{a1013}$
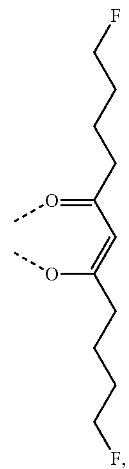
$L_{a1014}$
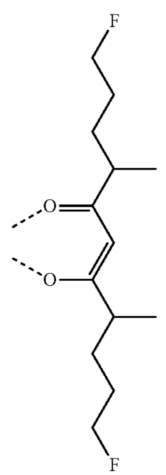
$L_{a1015}$
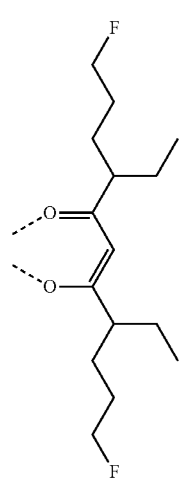

L$_{a1016}$
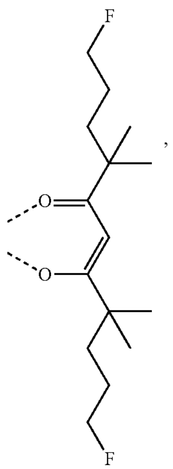
L$_{a1017}$
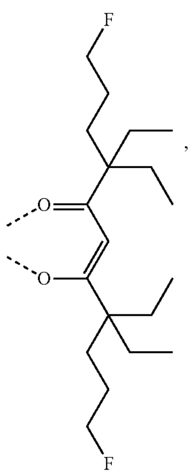
L$_{a1018}$
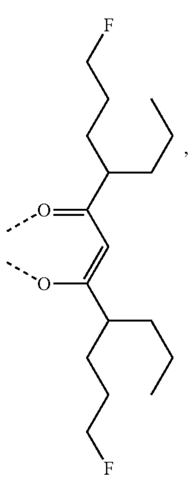
L$_{a1019}$
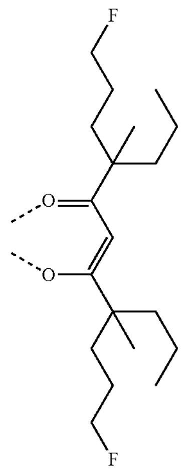
L$_{a1020}$
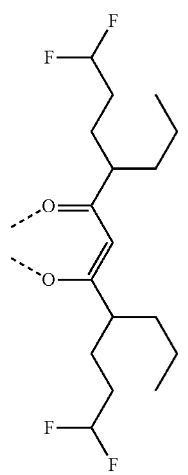
L$_{a1021}$
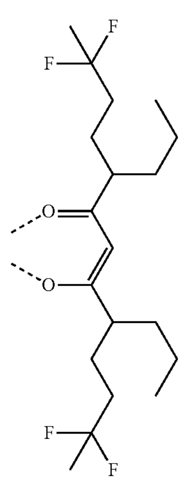

-continued
$L_{a1022}$
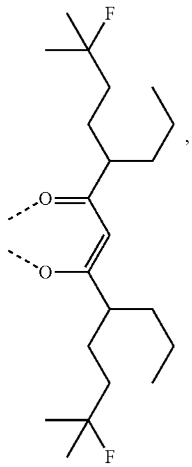
$L_{a1023}$
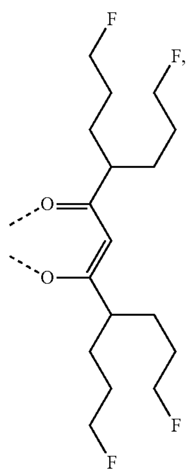
$L_{a1024}$
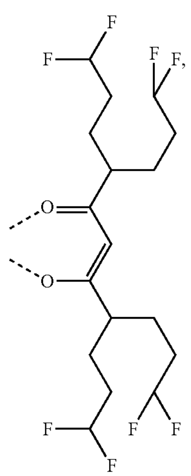
-continued
$L_{a1025}$
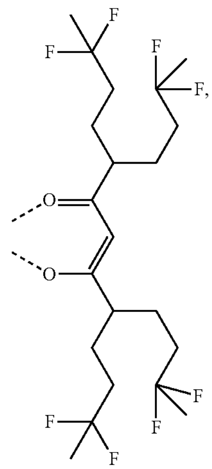
$L_{a1026}$
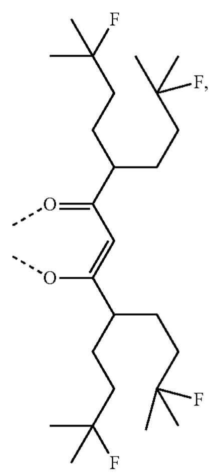
$L_{a1027}$
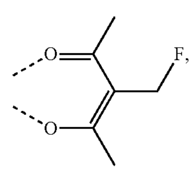
$L_{a1028}$
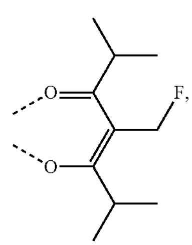
$L_{a1029}$
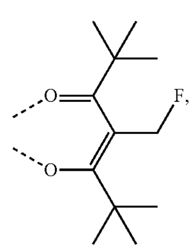

$L_{a1030}$
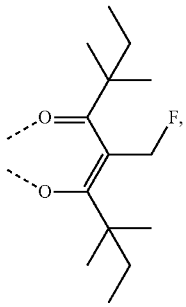
$L_{a1031}$
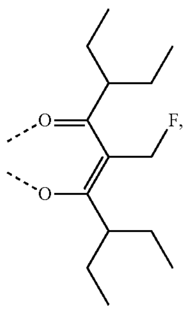
$L_{a1032}$
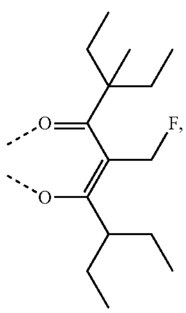
$L_{a1033}$
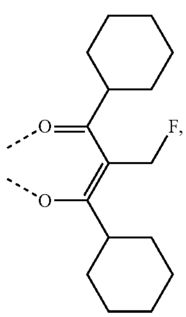
$L_{a1034}$
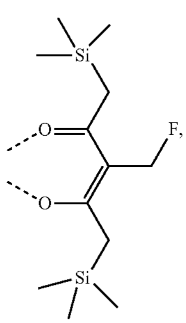
$L_{a1035}$
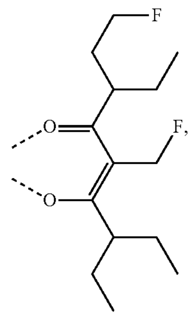
$L_{a1036}$
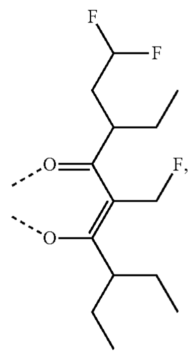
$L_{a1037}$
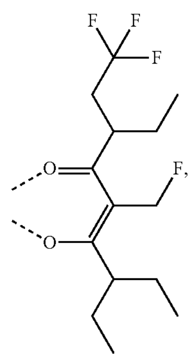
$L_{a1038}$
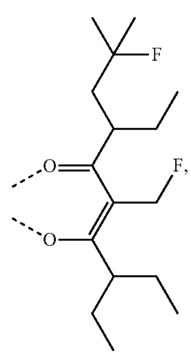

-continued
$L_{a1039}$
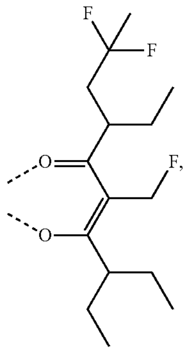
$L_{a1040}$
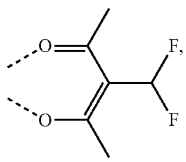
$L_{a1041}$
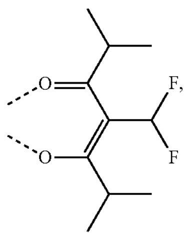
$L_{a1042}$
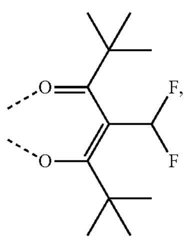
$L_{a1043}$
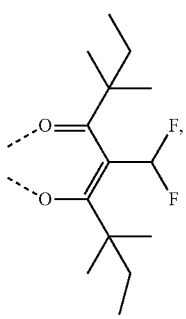
$L_{a1044}$
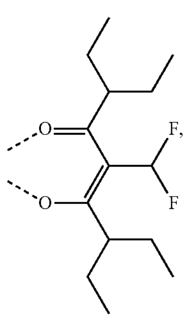
-continued
$L_{a1045}$
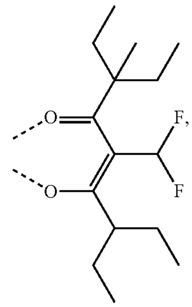
$L_{a1046}$
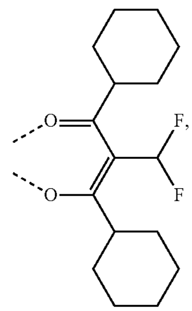
$L_{a1047}$
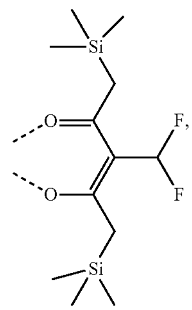
$L_{a1048}$
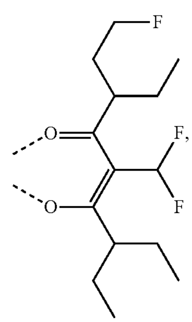
$L_{a1049}$
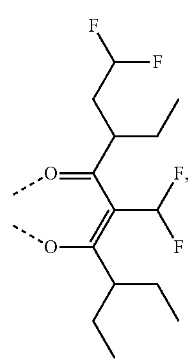

-continued
$L_{a1050}$
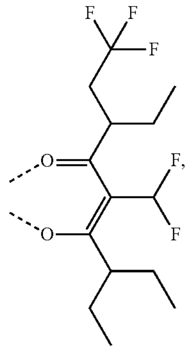
$L_{a1051}$
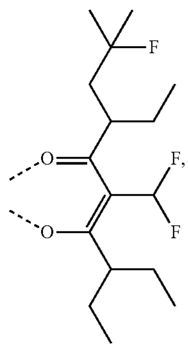
$L_{a1052}$
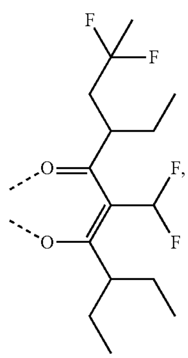
$L_{a1053}$
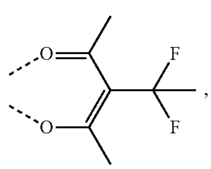
$L_{a1054}$
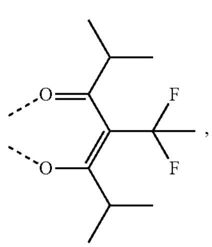
-continued
$L_{a1055}$
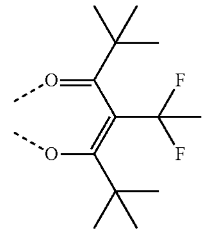
$L_{a1056}$
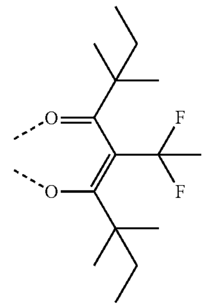
$L_{a1057}$
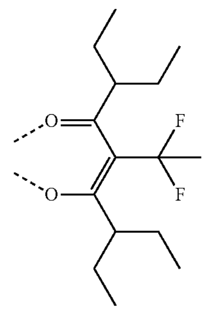
$L_{a1058}$
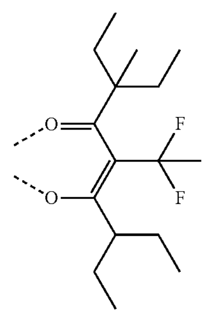
$L_{a1059}$
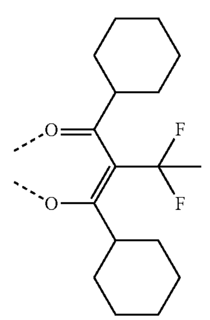

-continued
$L_{a1060}$
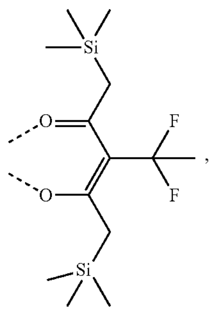
$L_{a1061}$
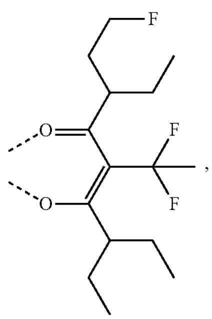
$L_{a1062}$
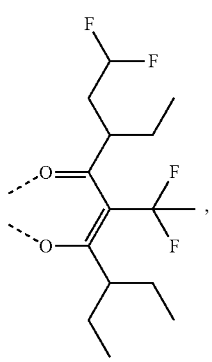
$L_{a1063}$
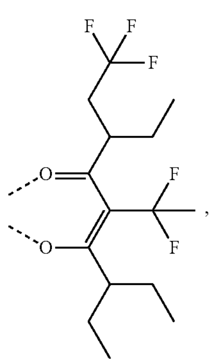
-continued
$L_{a1064}$
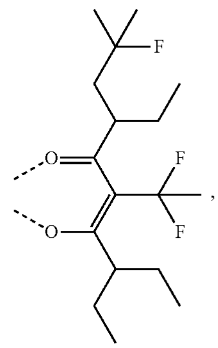
$L_{a1065}$
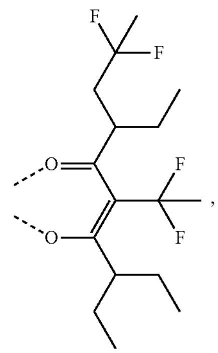
$L_{a1066}$
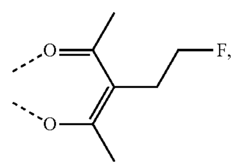
$L_{a1067}$
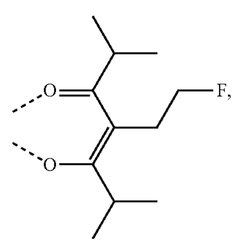
$L_{a1068}$
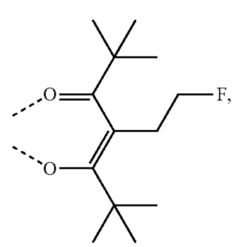

-continued
$L_{a1069}$
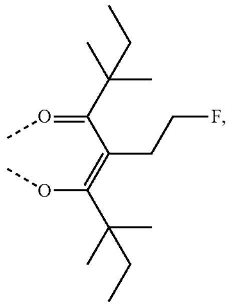
$L_{a1070}$
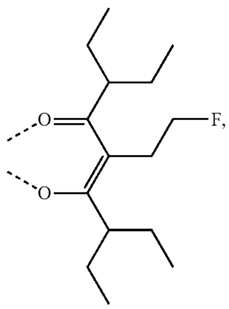
$L_{a1071}$
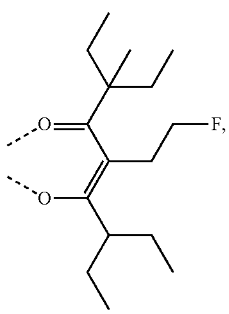
$L_{a1072}$
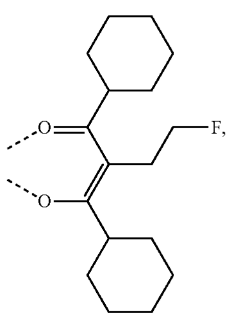
$L_{a1073}$
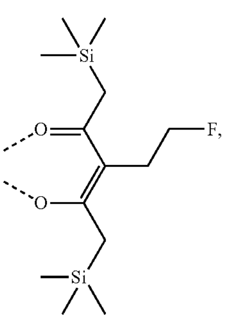
-continued
$L_{a1074}$
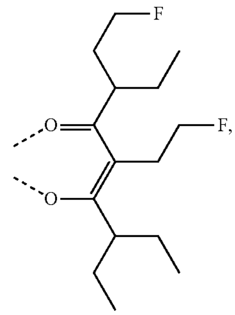
$L_{a1075}$
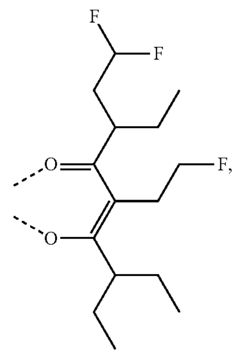
$L_{a1076}$
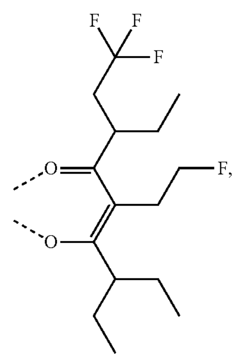
$L_{a1077}$
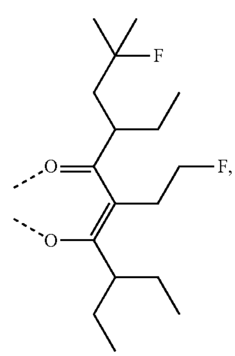

$L_{a1078}$
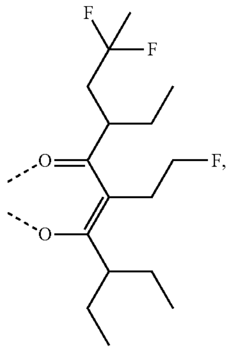
$L_{a1079}$
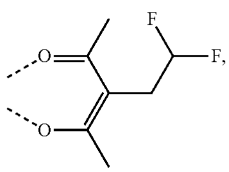
$L_{a1080}$
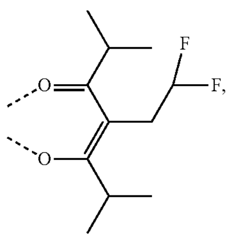
$L_{a1081}$
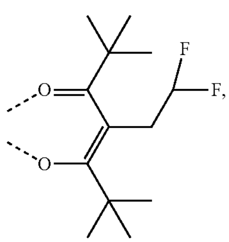
$L_{a1082}$
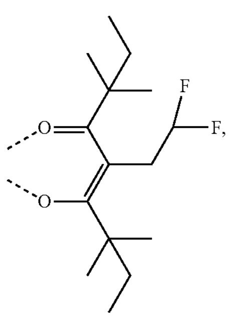
$L_{a1083}$
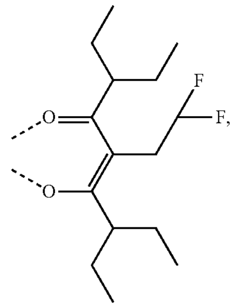
$L_{a1084}$
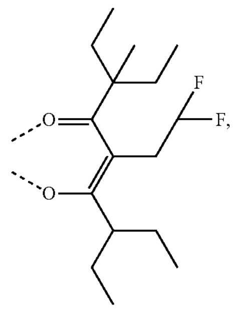
$L_{a1085}$
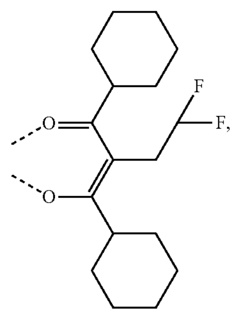
$L_{a1086}$
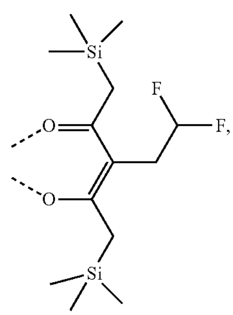
$L_{a1087}$
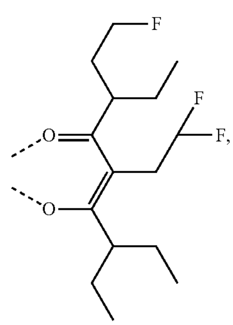

-continued
$L_{a1088}$
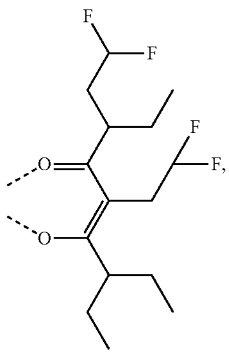
$L_{a1089}$
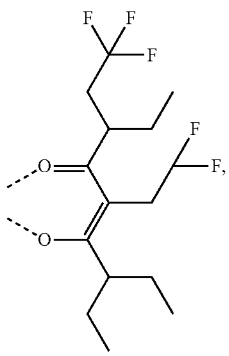
$L_{a1090}$
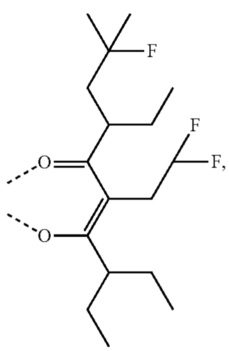
$L_{a1091}$
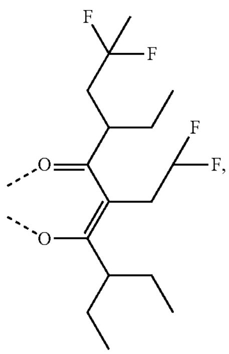
$L_{a1092}$
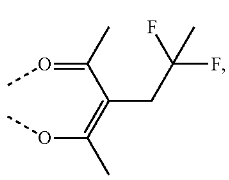
-continued
$L_{a1093}$
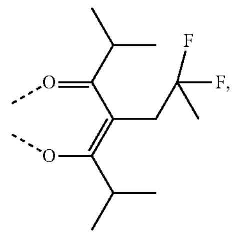
$L_{a1094}$
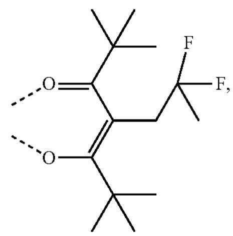
$L_{a1095}$
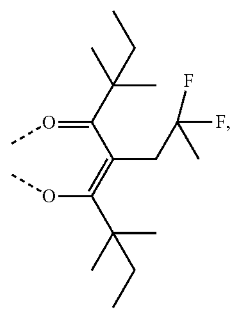
$L_{a1096}$
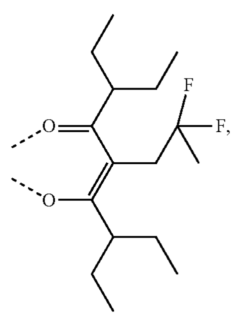
$L_{a1097}$
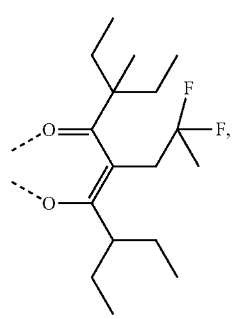

-continued
$L_{a1098}$
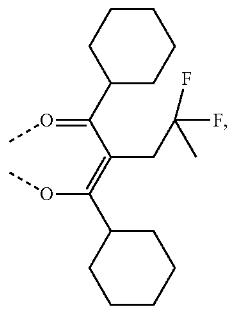
$L_{a1099}$
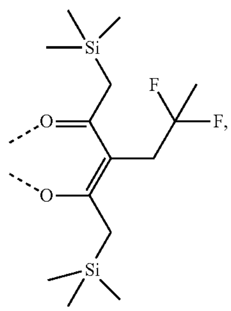
$L_{a1100}$
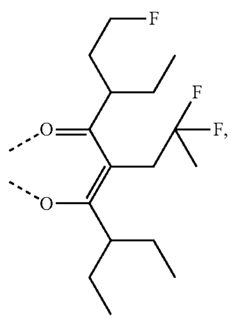
$L_{a1101}$
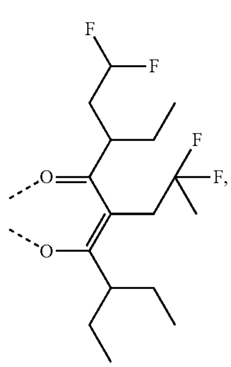
-continued
$L_{a1102}$
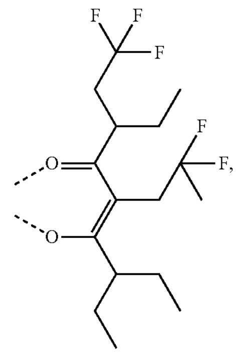
$L_{a1103}$
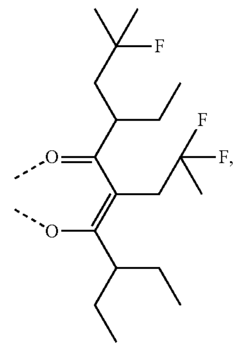
$L_{a1104}$
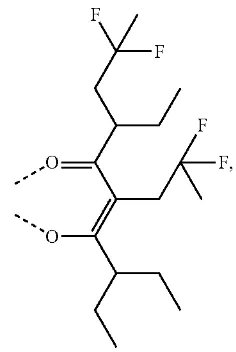
$L_{a1105}$
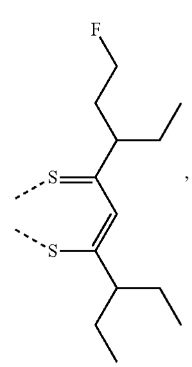
, $L_{a1106}$
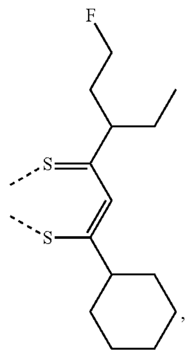
$L_{a1107}$
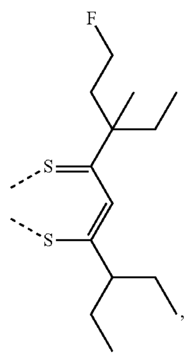
$L_{a1108}$
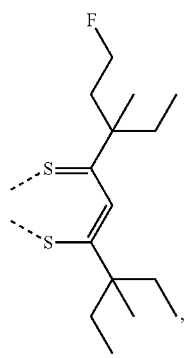
$L_{a1109}$
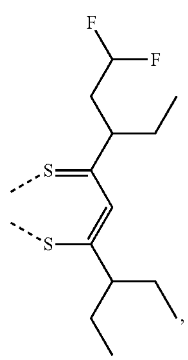
$L_{a1110}$
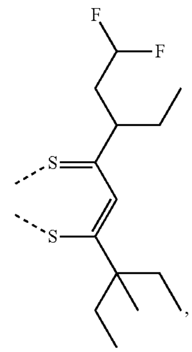
$L_{a1111}$
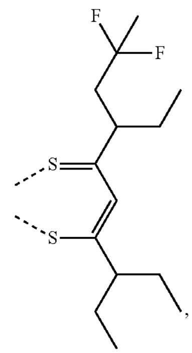
$L_{a1112}$
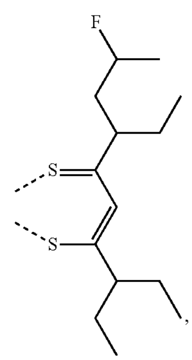
$L_{a1113}$
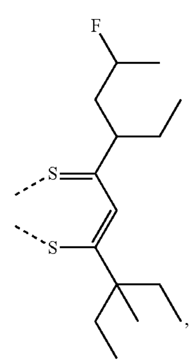

-continued
L$_{a1114}$
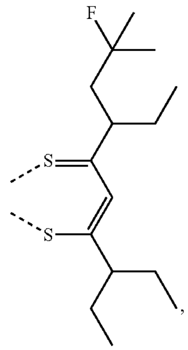
L$_{a1115}$
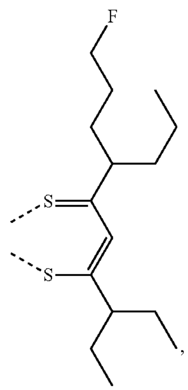
L$_{a1116}$
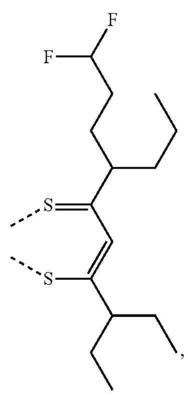
L$_{a1117}$
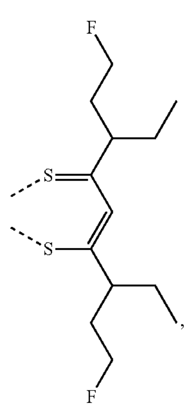
-continued
L$_{a1118}$
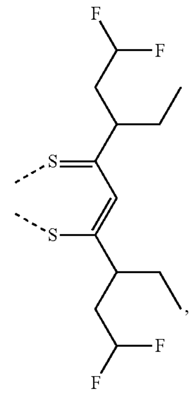
L$_{a1119}$
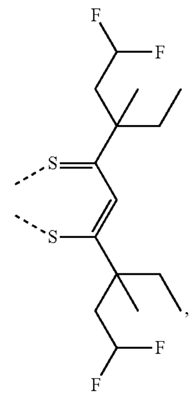
L$_{a1120}$
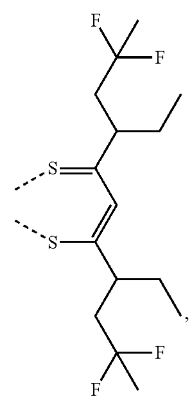
L$_{a1121}$
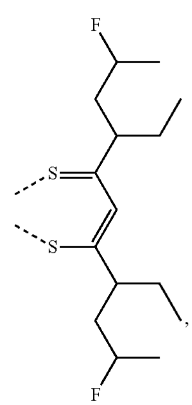

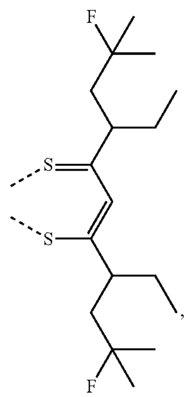
$L_{a1122}$
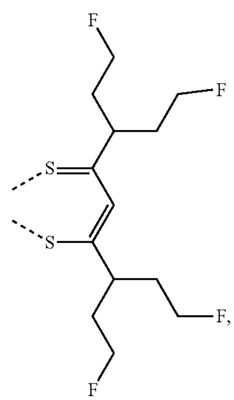
$L_{a1123}$
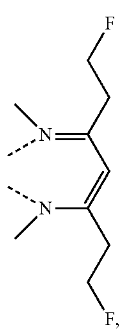
$L_{a1126}$
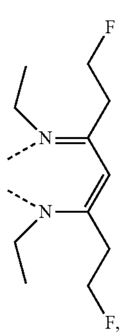
$L_{a1127}$
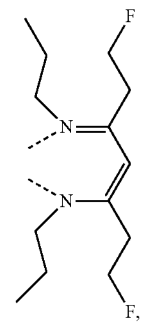
$L_{a1128}$
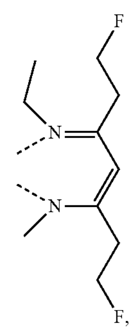
$L_{a1129}$
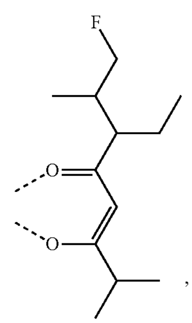
$L_{a1130}$
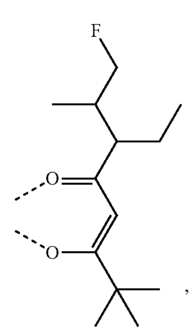
$L_{a1131}$ $L_{a1132}$
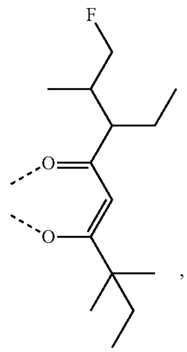
$L_{a1133}$
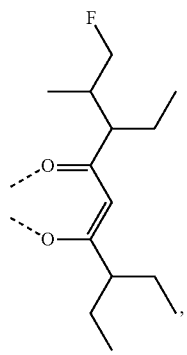
$L_{a1134}$
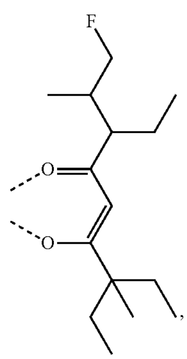
$L_{a1135}$
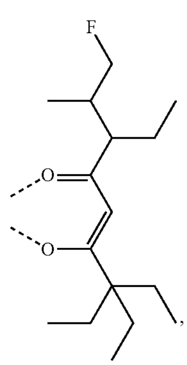
$L_{a1136}$
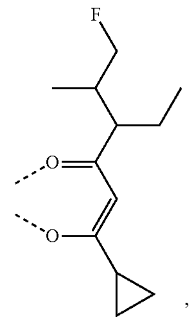
$L_{a1137}$
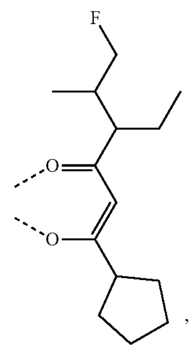
$L_{a1138}$
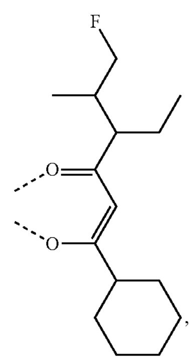
$L_{a1139}$
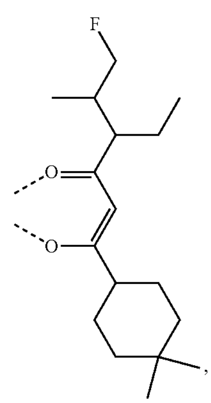

-continued
$L_{a1140}$
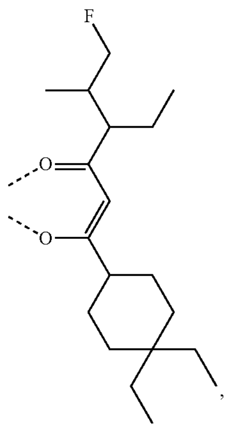
$L_{a1141}$
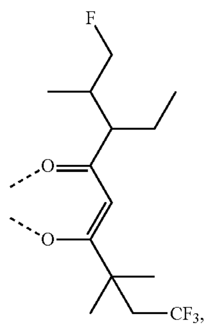
$L_{a1142}$
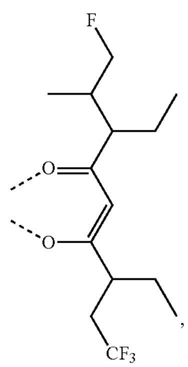
$L_{a1143}$
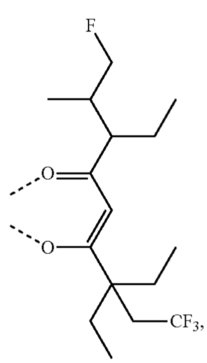
-continued
$L_{a1144}$
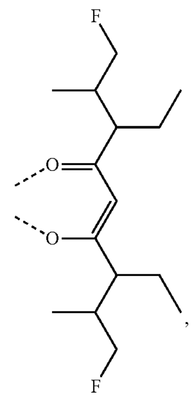
$L_{a1145}$
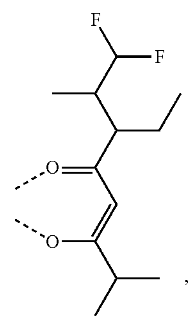
$L_{a1146}$
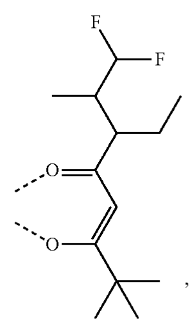
$L_{a1147}$
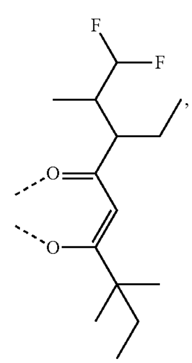

-continued
$L_{a1148}$
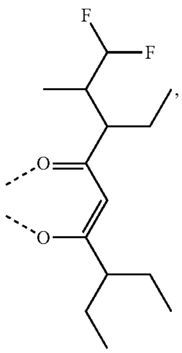
$L_{a1149}$
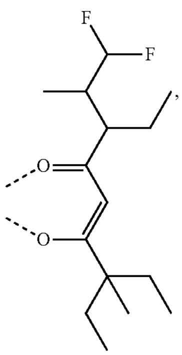
$L_{a1150}$
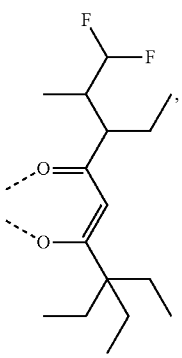
$L_{a1151}$
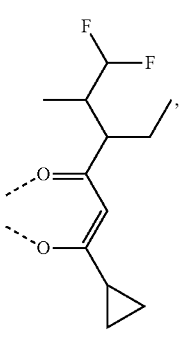
-continued
$L_{a1152}$
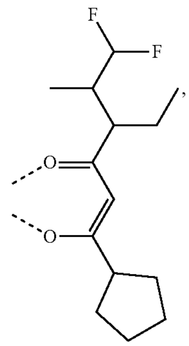
$L_{a1153}$
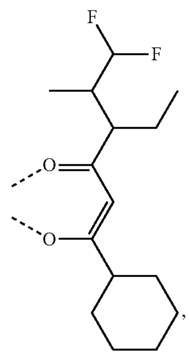
$L_{a1154}$
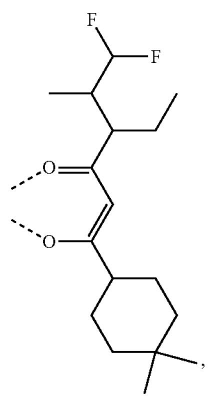
$L_{a1155}$
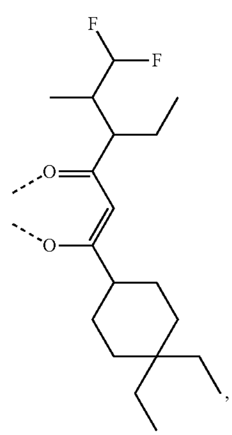

-continued
$L_{a1156}$
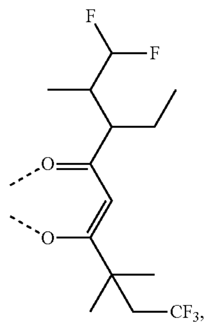
$L_{a1157}$
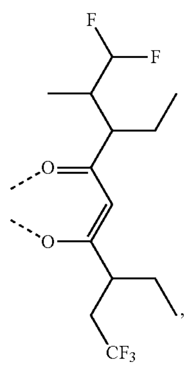
$L_{a1158}$
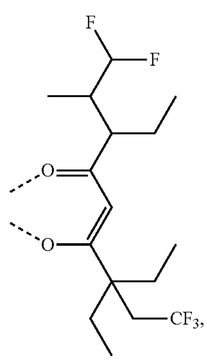
$L_{a1159}$
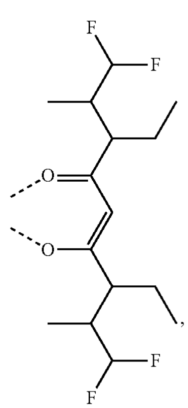
-continued
$L_{a1160}$
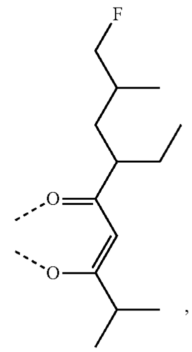
$L_{a1161}$
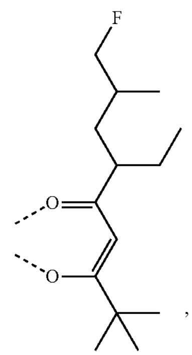
$L_{a1162}$
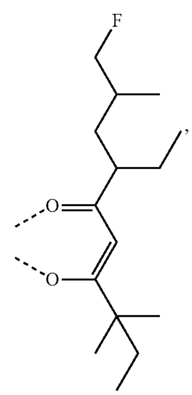
$L_{a1163}$
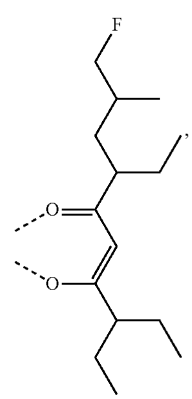

$L_{a1164}$
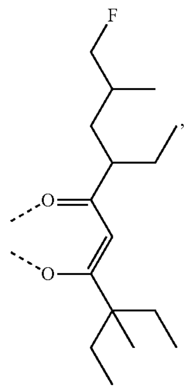
$L_{a1165}$
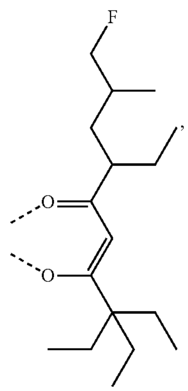
$L_{a1166}$
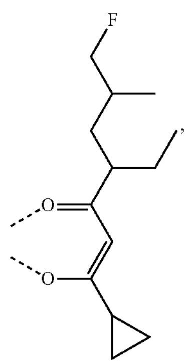
$L_{a1167}$
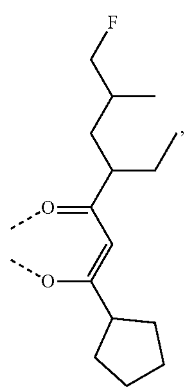
$L_{a1168}$
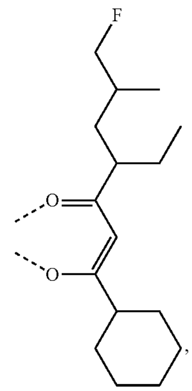
$L_{a1169}$
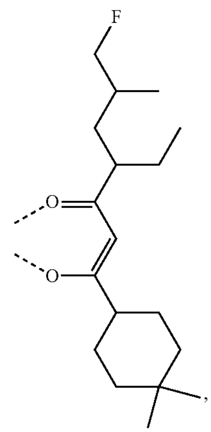
$L_{a1170}$
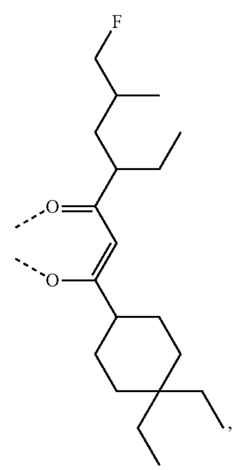
$L_{a1171}$
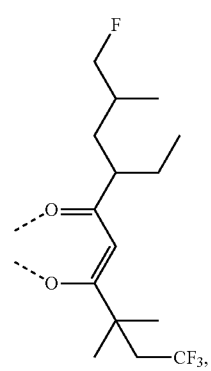

-continued
$L_{a1172}$
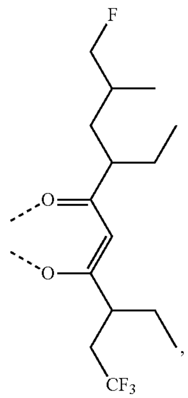
$L_{a1173}$
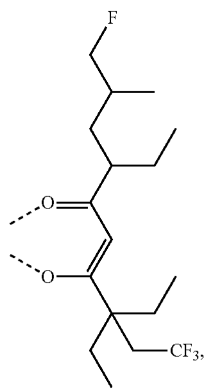
$L_{a1174}$
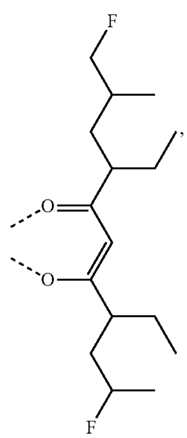
$L_{a1175}$
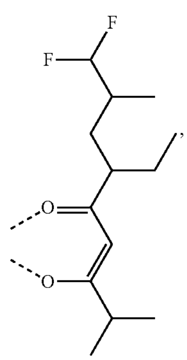
-continued
$L_{a1176}$
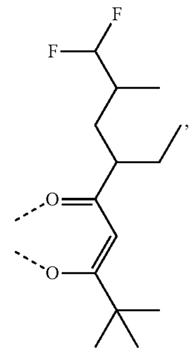
$L_{a1177}$
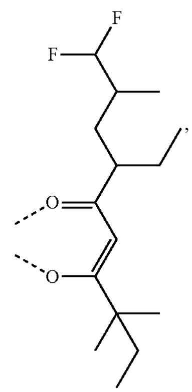
$L_{a1178}$
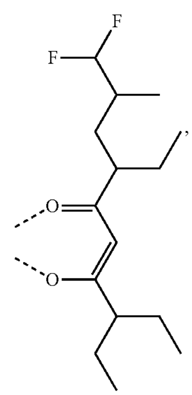
$L_{a1179}$
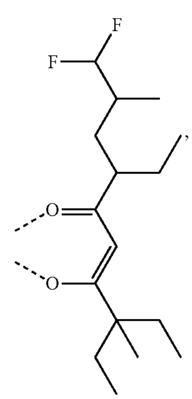

-continued
$L_{a1180}$
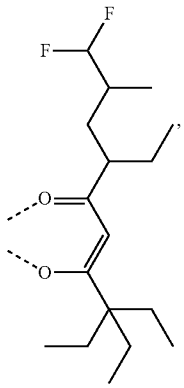
$L_{a1181}$
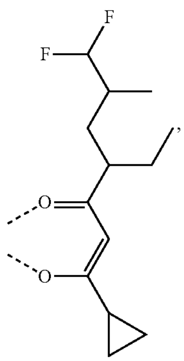
$L_{a1182}$
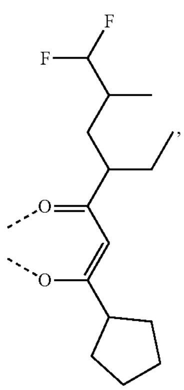
$L_{a1183}$
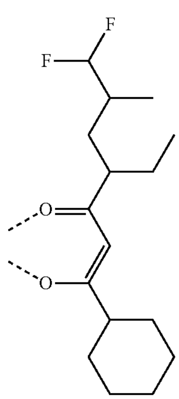
-continued
$L_{a1184}$
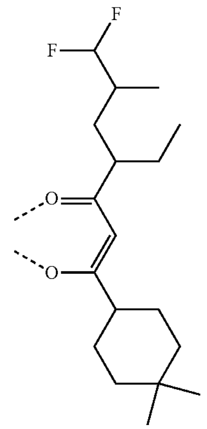
$L_{a1185}$
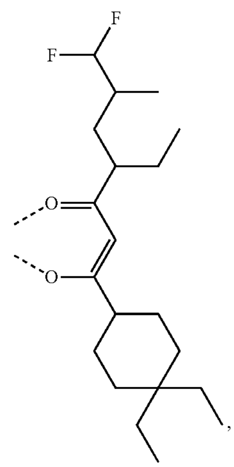
$L_{a1186}$
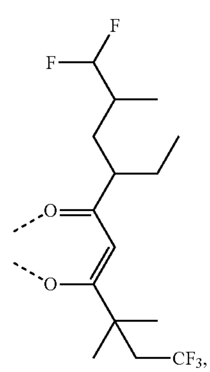

-continued
$L_{a1187}$
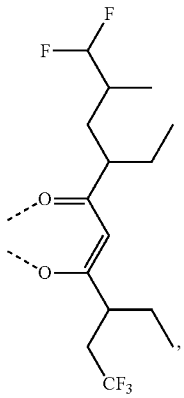
$L_{a1188}$
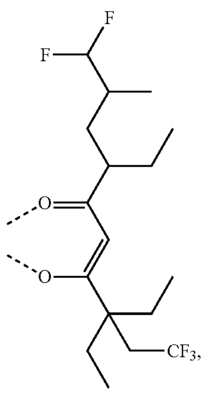
$L_{a1189}$
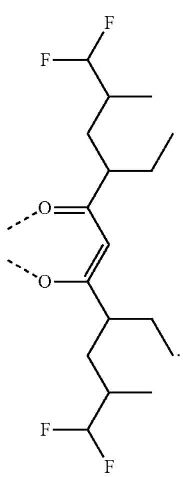
9. The metal complex of claim 8, wherein the ligand $L_b$ is, at each occurrence identically or differently, selected from the group consisting of $L_{b1}$ to $L_{b162}$, $L_{b201}$ to $L_{b210}$, $L_{b215}$ to $L_{b222}$ and deuterides of $L_{b1}$ to $L_{b162}$, $L_{b201}$ to $L_{b210}$, $L_{b215}$ to $L_{b222}$:
$L_{b1}$
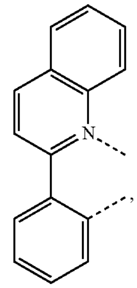
$L_{b2}$
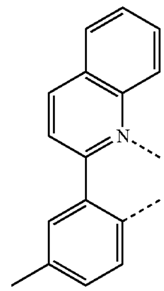
$L_{b3}$
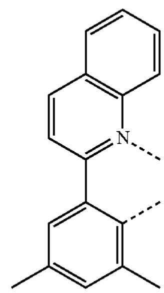
$L_{b4}$
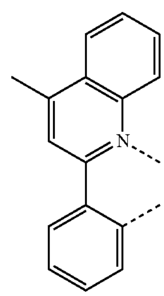
$L_{b5}$
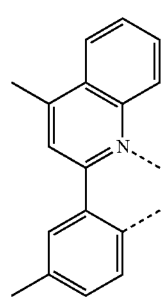

-continued
$L_{b6}$
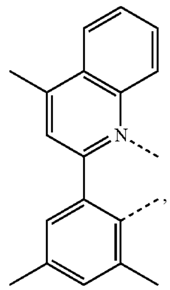
$L_{b7}$
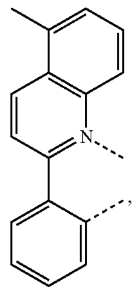
$L_{b8}$
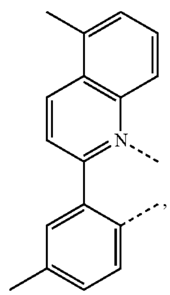
$L_{b9}$
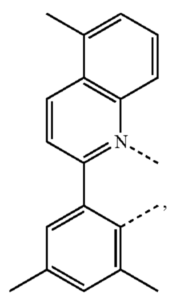
$L_{b10}$
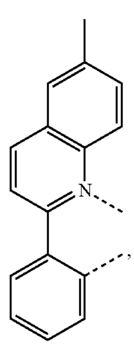
-continued
$L_{b11}$
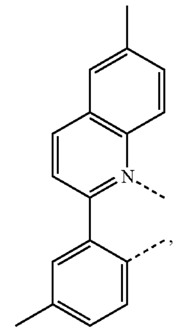
$L_{b12}$
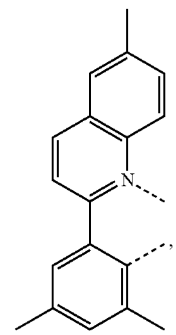
$L_{b13}$
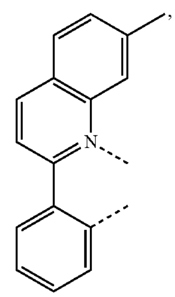
$L_{b14}$
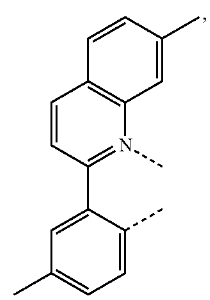
$L_{b15}$
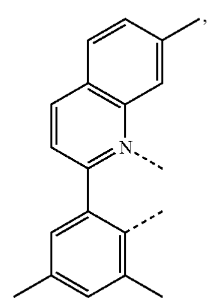

-continued
$L_{b16}$
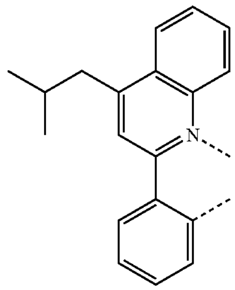
$L_{b17}$
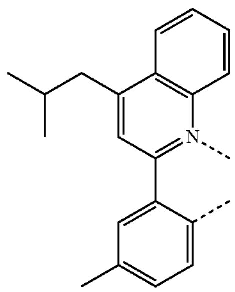
$L_{b18}$
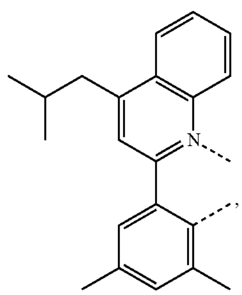
$L_{b19}$
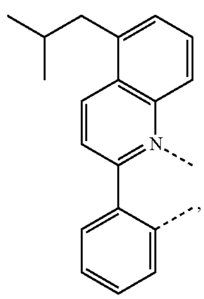
$L_{b20}$
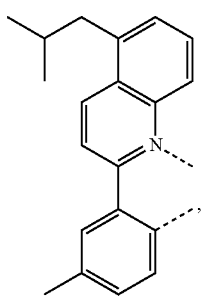
-continued
$L_{b21}$
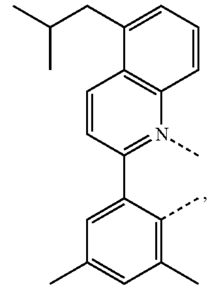
$L_{b22}$
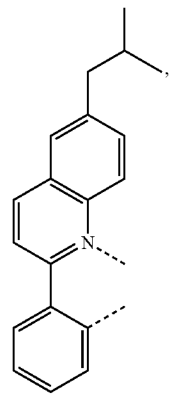
$L_{b23}$
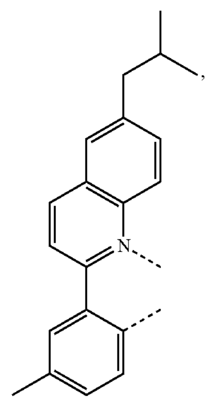
$L_{b24}$
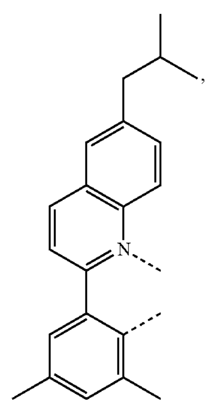

-continued
$L_{b25}$
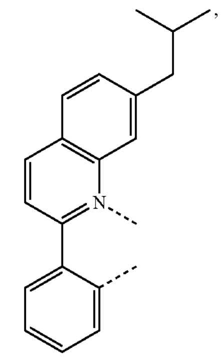
$L_{b26}$
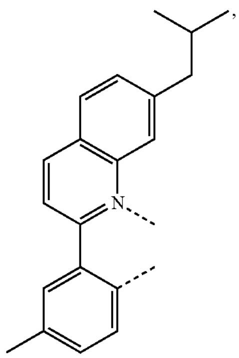
$L_{b27}$
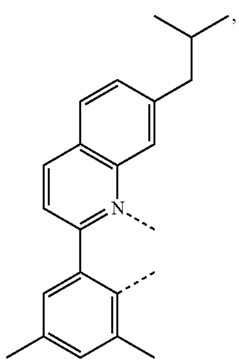
$L_{b28}$
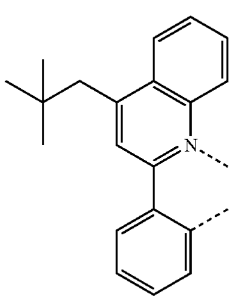
-continued
$L_{b29}$
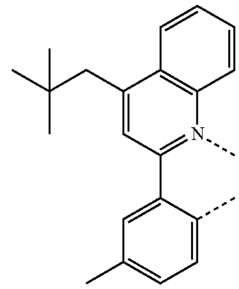
$L_{b30}$
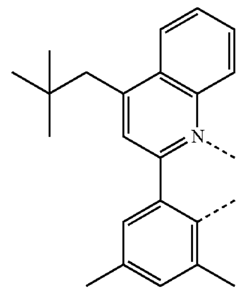
$L_{b31}$
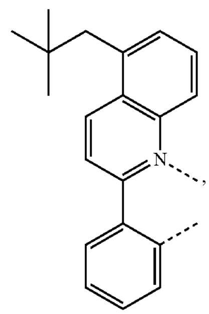
$L_{b32}$
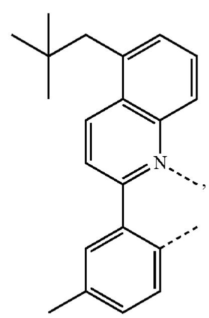
$L_{b33}$
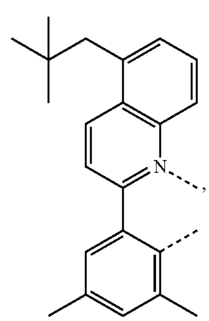

-continued
$L_{b34}$
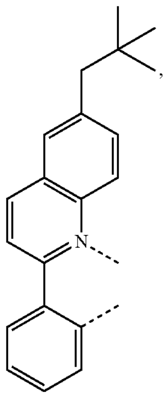
$L_{b35}$
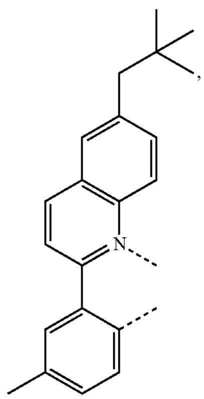
$L_{b36}$
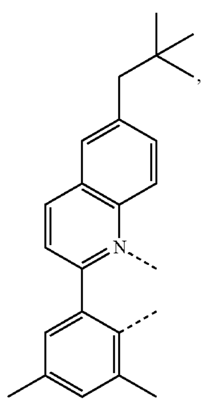
$L_{b37}$
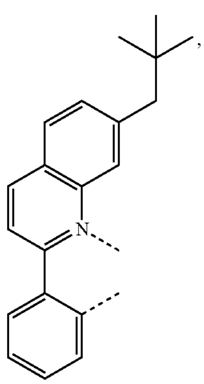
-continued
$L_{b38}$
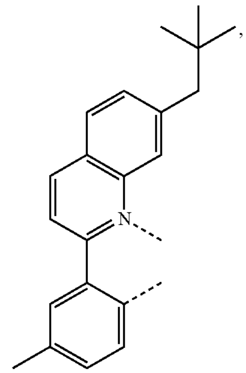
$L_{b39}$
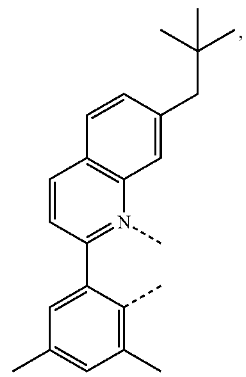
$L_{b40}$
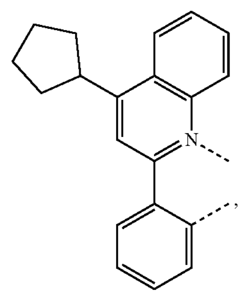
$L_{b41}$
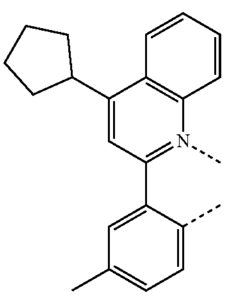
$L_{b42}$
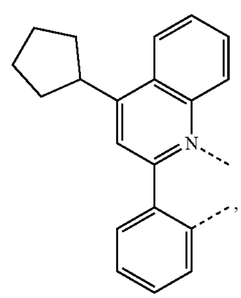

-continued
$L_{b43}$
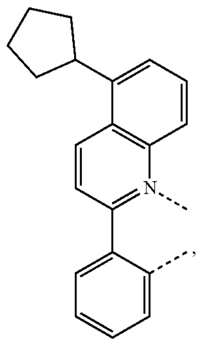
$L_{b44}$
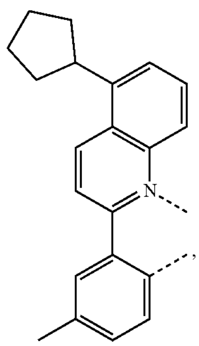
$L_{b45}$
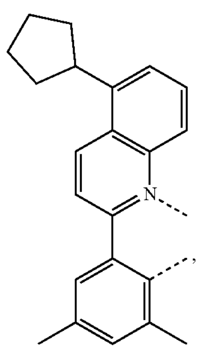
$L_{b46}$
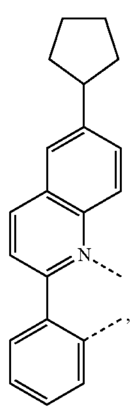
-continued
$L_{b47}$
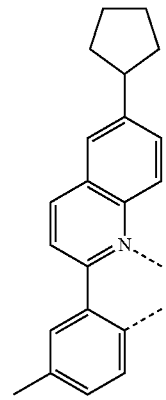
$L_{b48}$
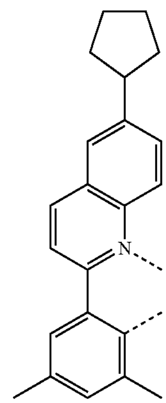
$L_{b49}$
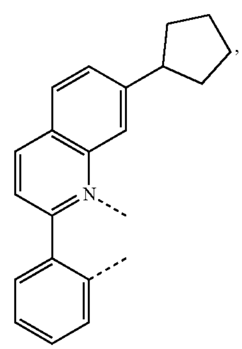
$L_{b50}$
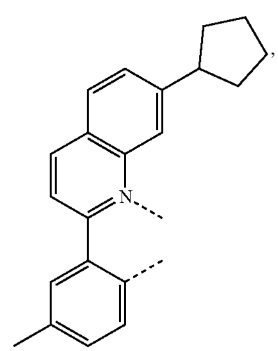

-continued
$L_{b51}$
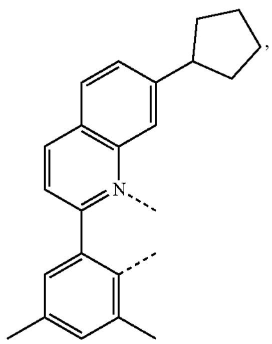
$L_{b52}$
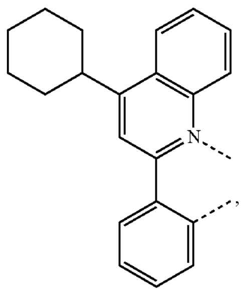
$L_{b53}$
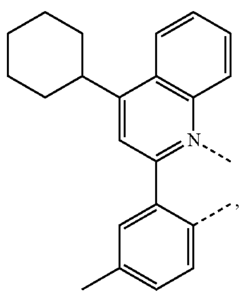
$L_{b54}$
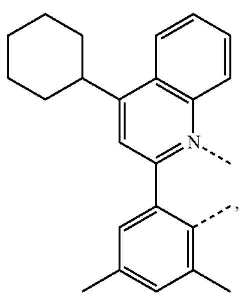
$L_{b55}$
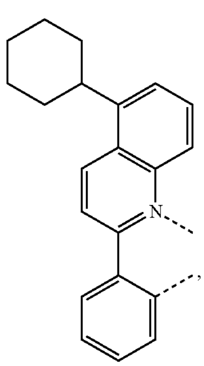
-continued
$L_{b56}$
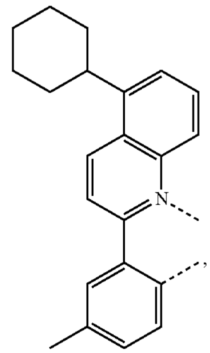
$L_{b57}$
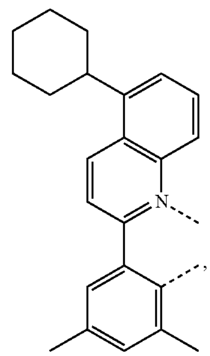
$L_{b58}$
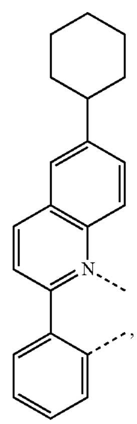
$L_{b59}$
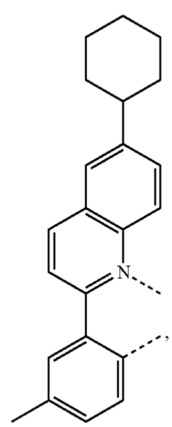

$L_{b60}$
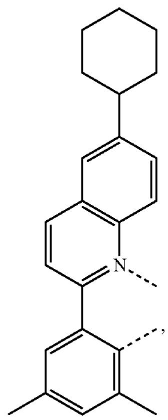
$L_{b61}$
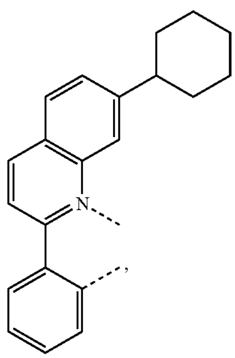
$L_{b62}$
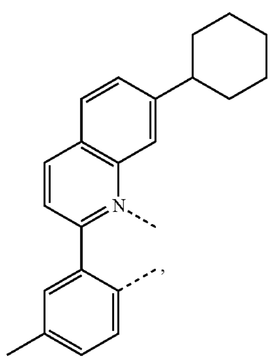
$L_{b63}$
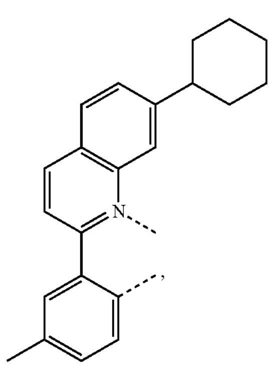
$L_{b64}$
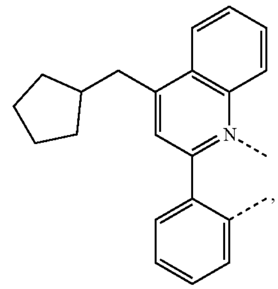
$L_{b65}$
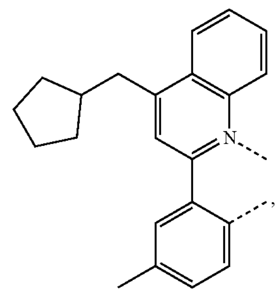
$L_{b66}$
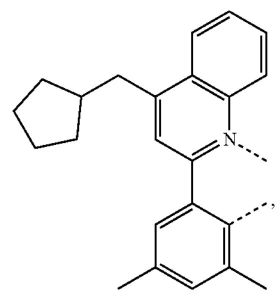
$L_{b67}$
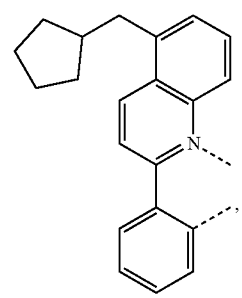
$L_{b68}$
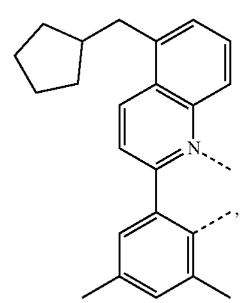

-continued
$L_{b69}$
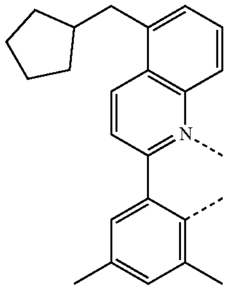
$L_{b70}$
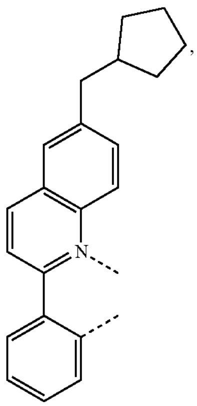
$L_{b71}$
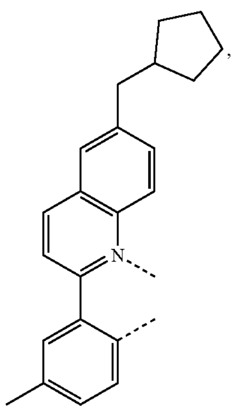
$L_{b72}$
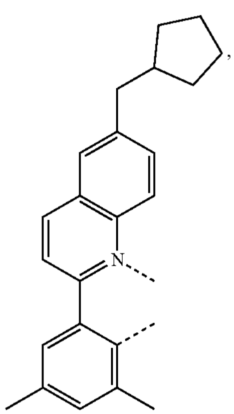
-continued
$L_{b73}$
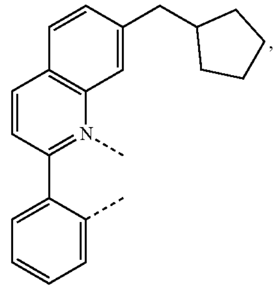
$L_{b74}$
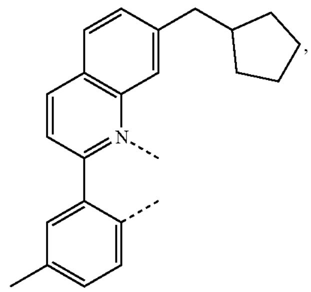
$L_{b75}$
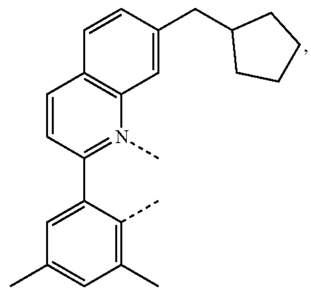
$L_{b76}$
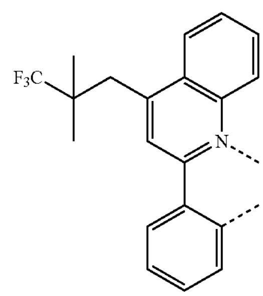
$L_{b77}$
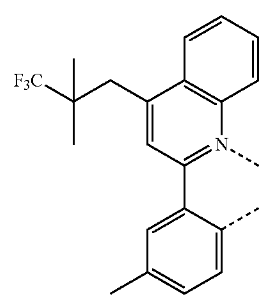

-continued
$L_{b78}$
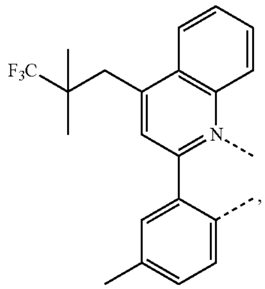
$L_{b79}$
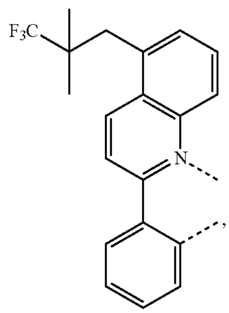
$L_{b80}$
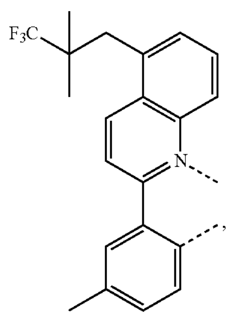
$L_{b81}$
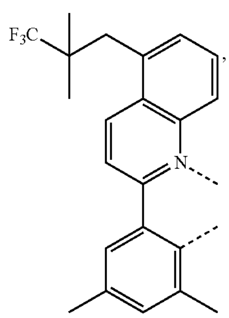
$L_{b82}$
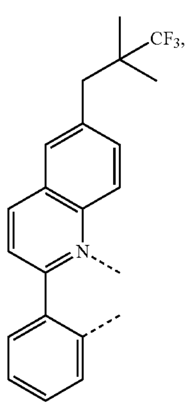
-continued
$L_{b83}$
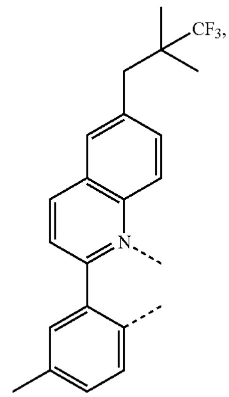
$L_{b84}$
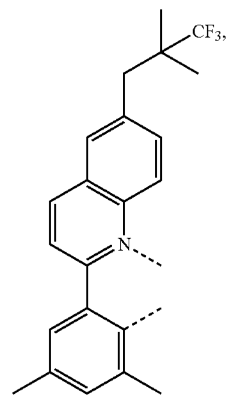
$L_{b85}$
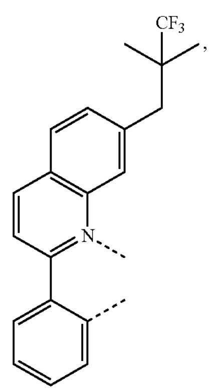
$L_{b85}$
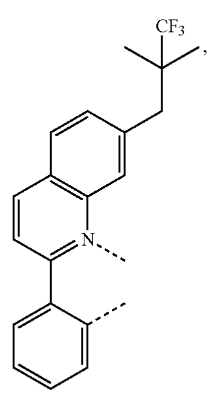

$L_{b86}$
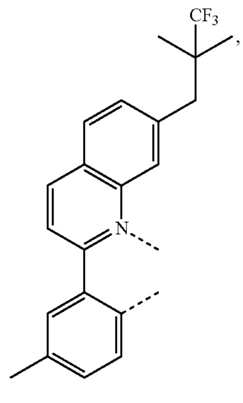
$L_{b87}$
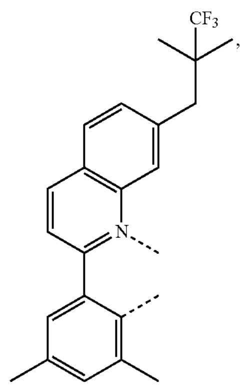
$L_{b88}$
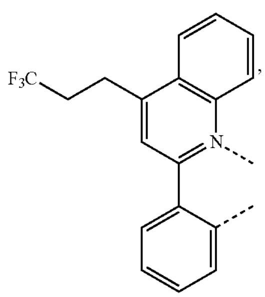
$L_{b89}$
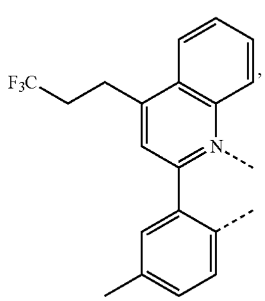
$L_{b90}$
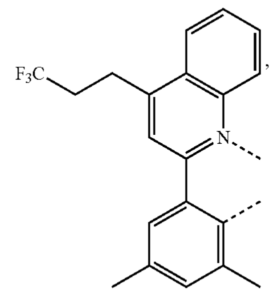
$L_{b91}$
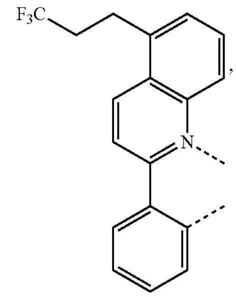
$L_{b92}$
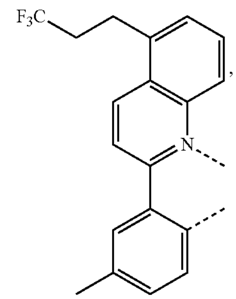
$L_{b93}$
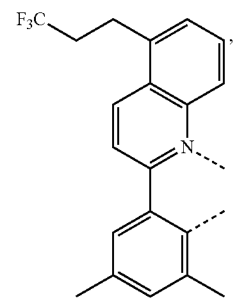
$L_{b94}$
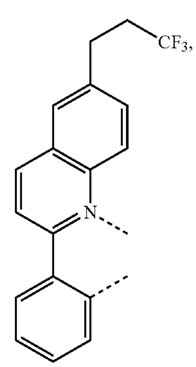

-continued
$L_{b95}$
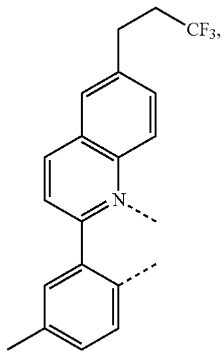
$L_{b96}$
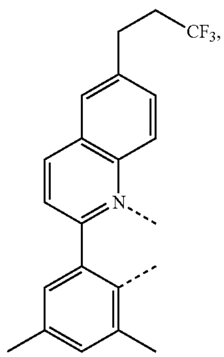
$L_{b97}$
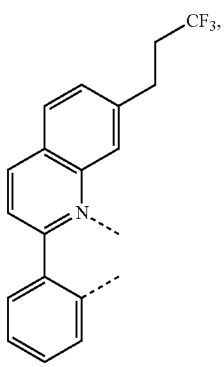
$L_{b98}$
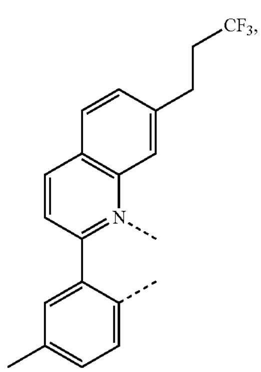
-continued
$L_{b99}$
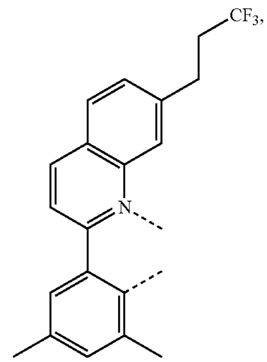
$L_{b100}$
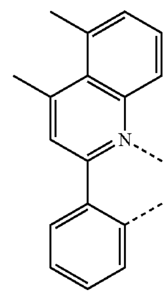
$L_{b101}$
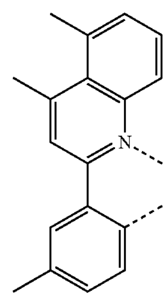
$L_{b102}$
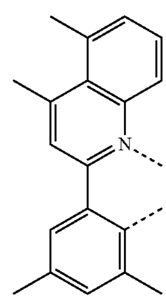
$L_{b103}$
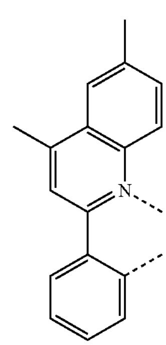

-continued
$L_{b104}$
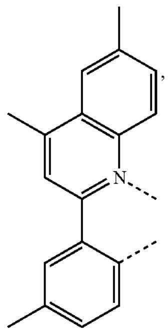
$L_{b105}$
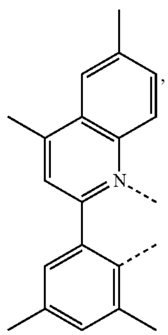
$L_{b106}$
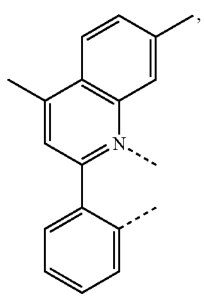
$L_{b107}$
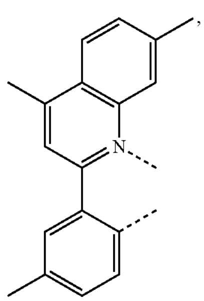
$L_{b108}$
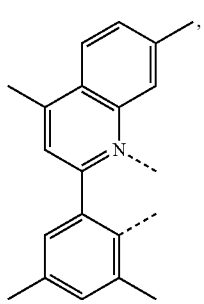
-continued
$L_{b109}$
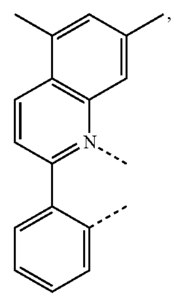
$L_{b110}$
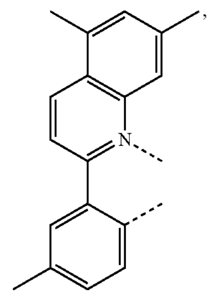
$L_{b111}$
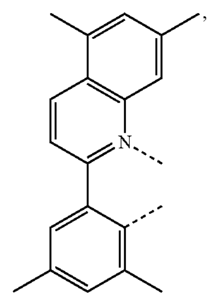
$L_{b112}$
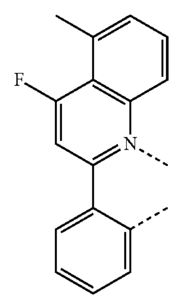
$L_{b113}$
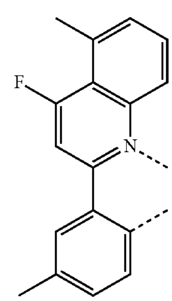

-continued
$L_{b114}$
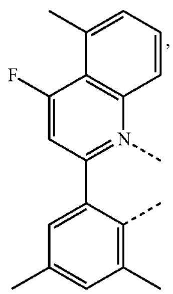
$L_{b115}$
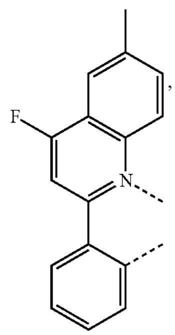
$L_{b116}$
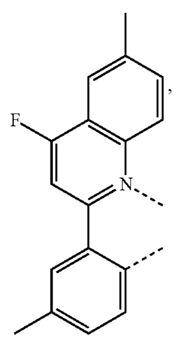
$L_{b117}$
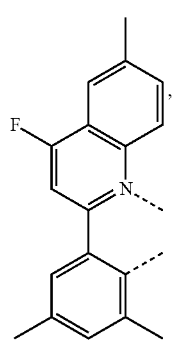
$L_{b118}$
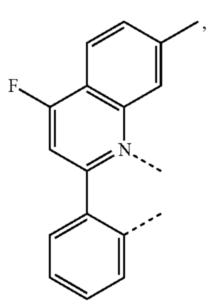
-continued
$L_{b119}$
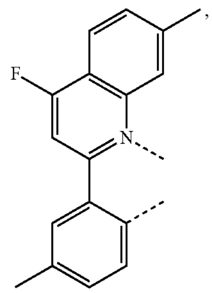
$L_{b120}$
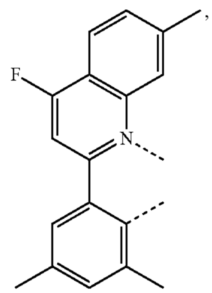
$L_{b121}$
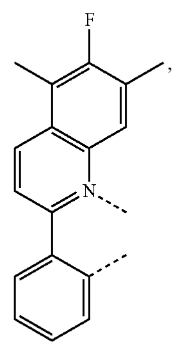
$L_{b122}$
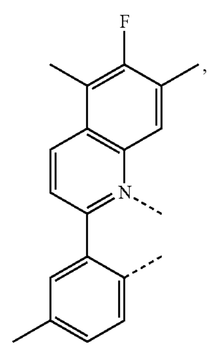
$L_{b123}$
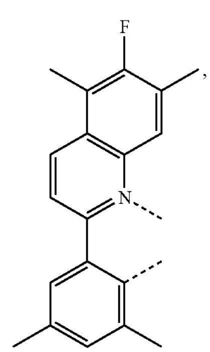

-continued
$L_{b124}$
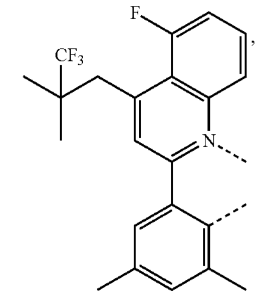
$L_{b125}$
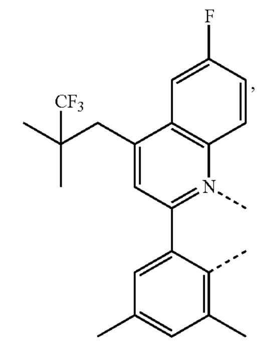
$L_{b126}$
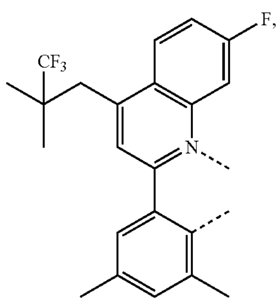
$L_{b127}$
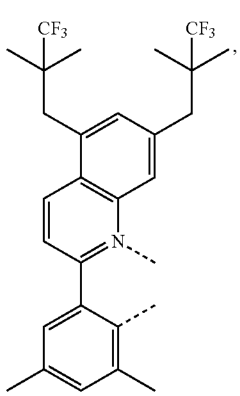
-continued
$L_{b128}$
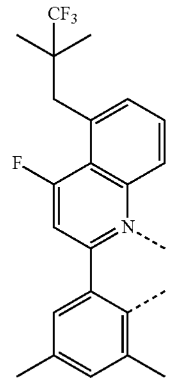
$L_{b129}$
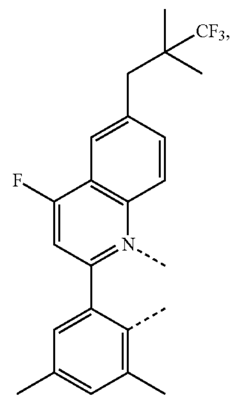
$L_{b130}$
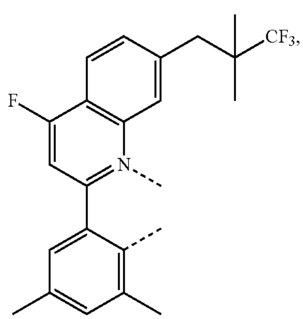
$L_{b131}$
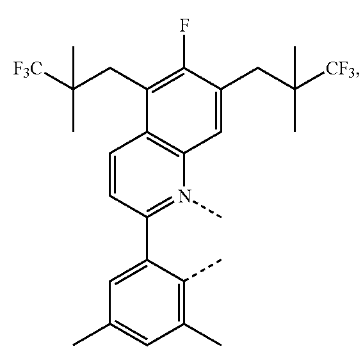

-continued
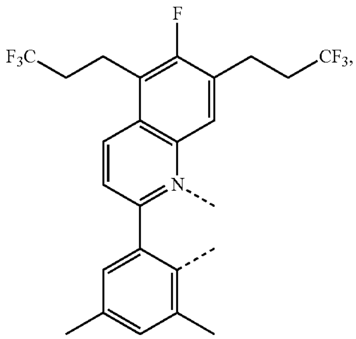
$L_{b132}$
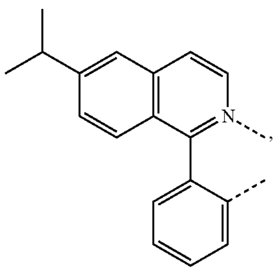
$L_{b133}$
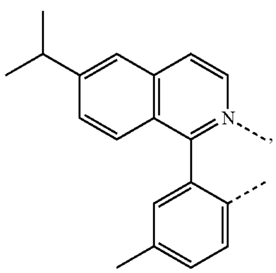
$L_{b134}$
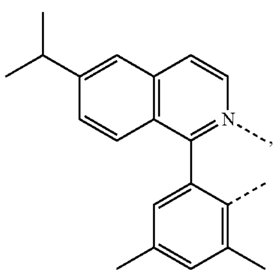
$L_{b135}$
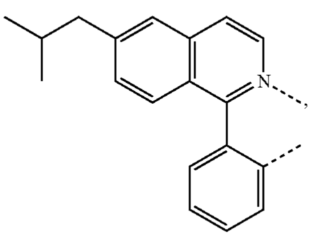
$L_{b136}$
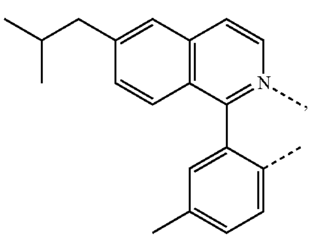
$L_{b137}$
-continued
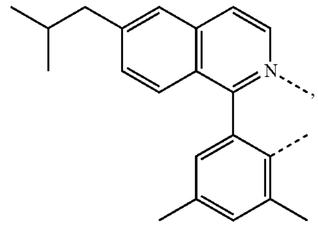
$L_{b138}$
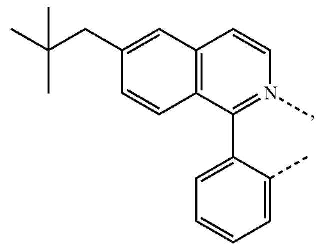
$L_{b139}$
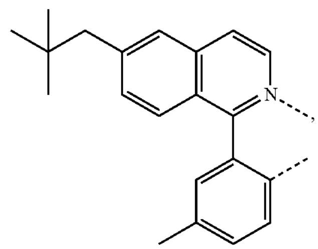
$L_{b140}$
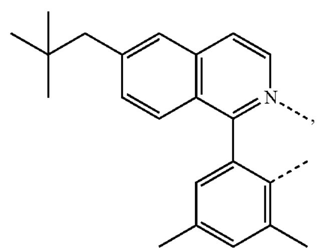
$L_{b141}$
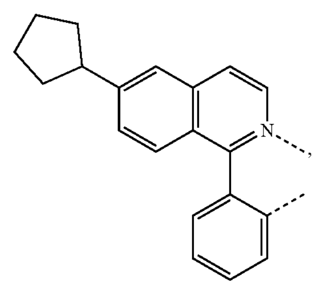
$L_{b142}$
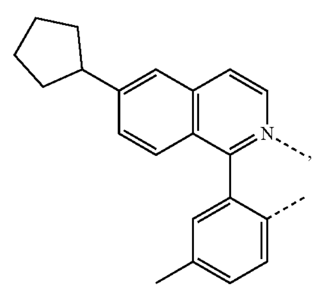
$L_{b143}$

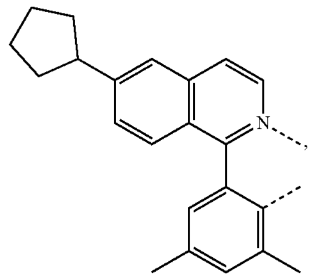
$L_{b144}$
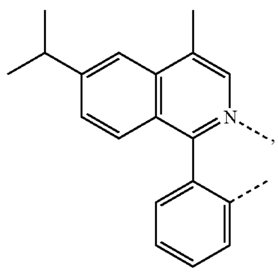
$L_{b145}$
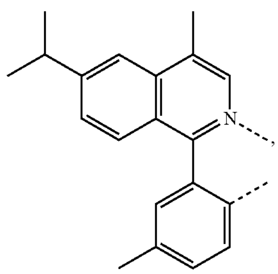
$L_{b146}$
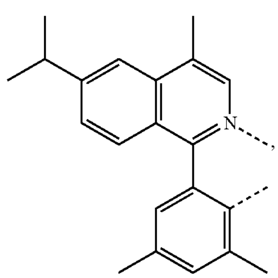
$L_{b147}$
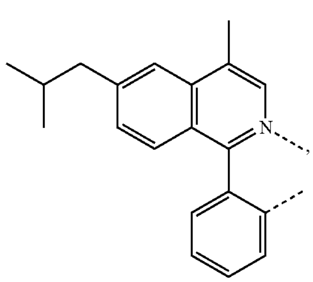
$L_{b148}$
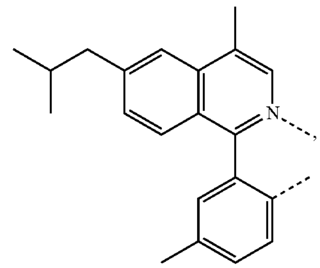
$L_{b149}$
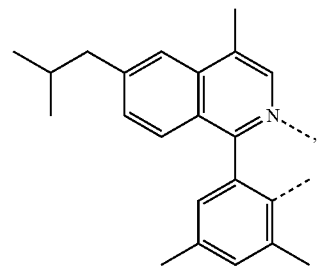
$L_{b150}$
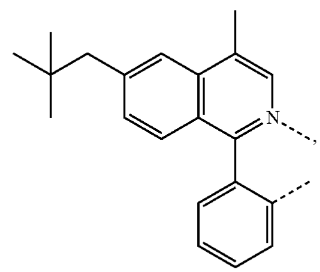
$L_{b151}$
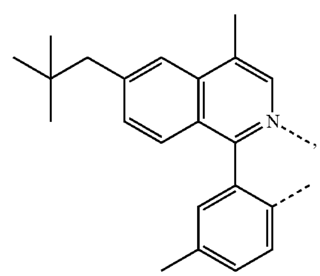
$L_{b152}$
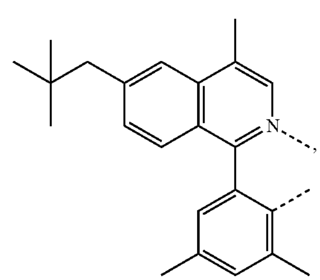
$L_{b153}$ -continued
$L_{b154}$
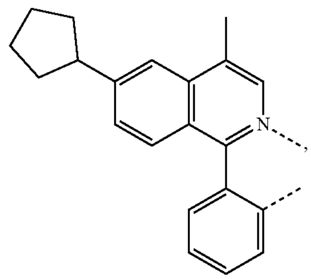
$L_{b155}$
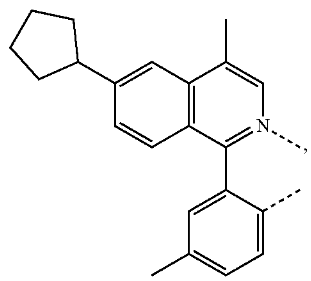
$L_{b156}$
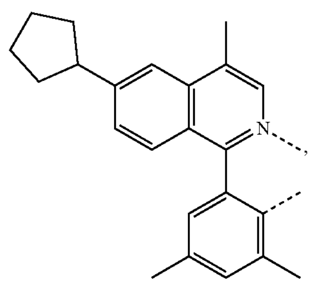
$L_{b157}$
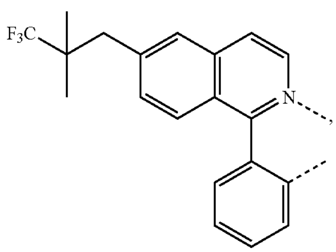
$L_{b158}$
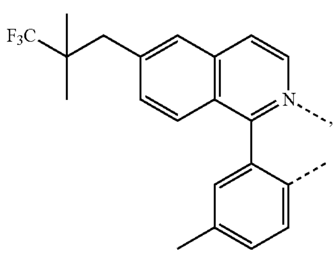
$L_{b159}$
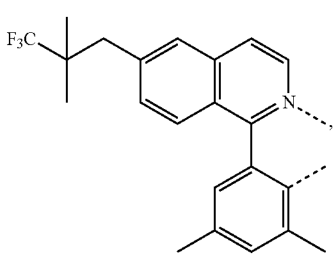
-continued
$L_{b160}$
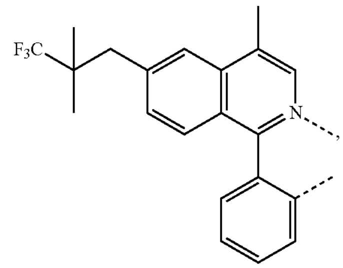
$L_{b161}$
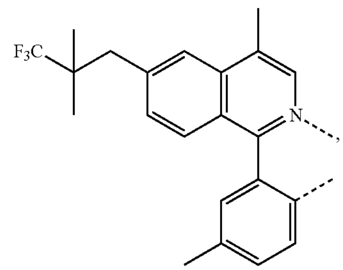
$L_{b162}$
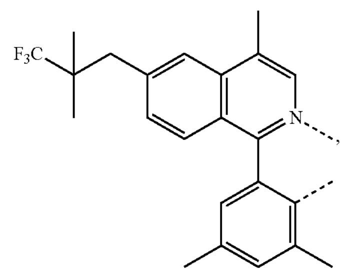
$L_{b201}$
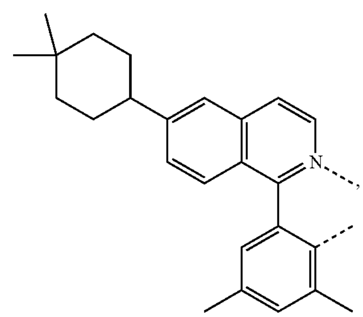
$L_{b202}$
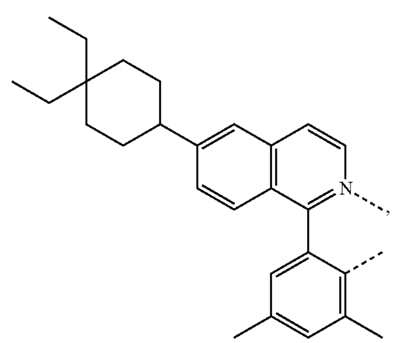

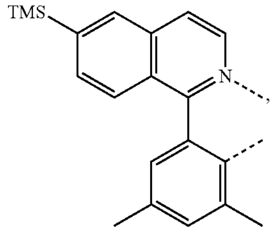
$L_{b203}$
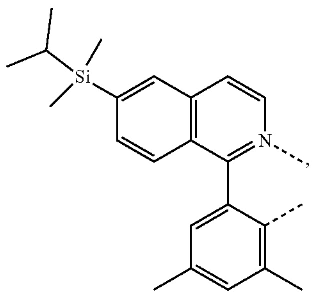
$L_{b204}$
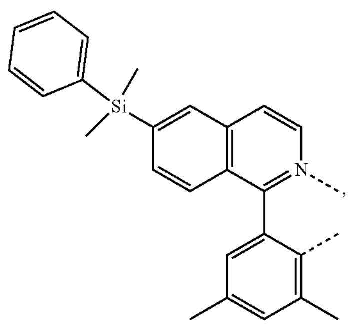
$L_{b205}$
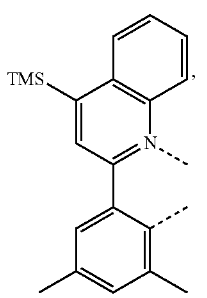
$L_{b206}$
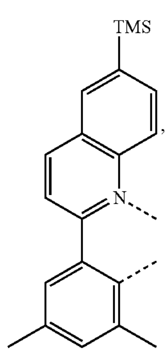
$L_{b207}$
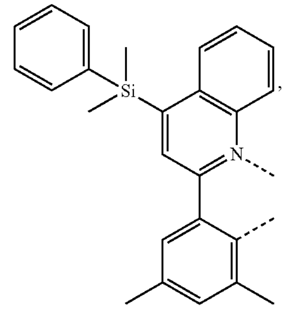
$L_{b208}$
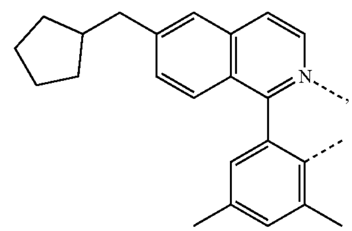
$L_{b209}$
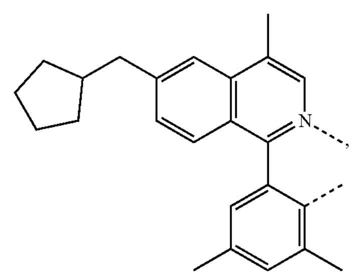
$L_{b210}$
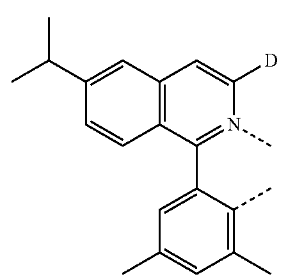
$L_{b215}$
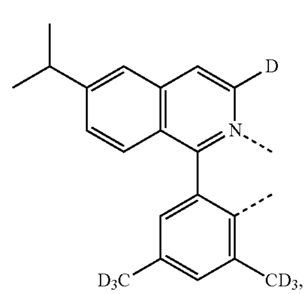
$L_{b216}$ -continued $L_{b217}$

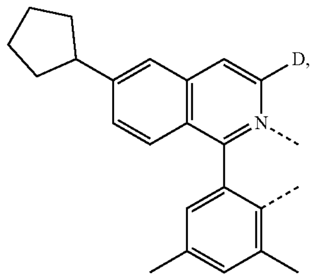

$L_{b218}$

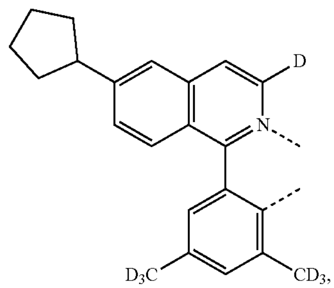

$L_{b219}$

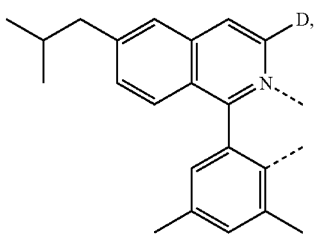

$L_{b220}$

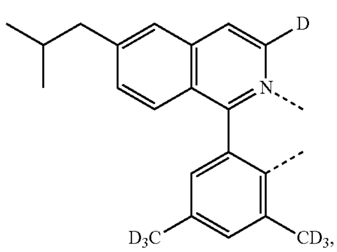

$L_{b221}$

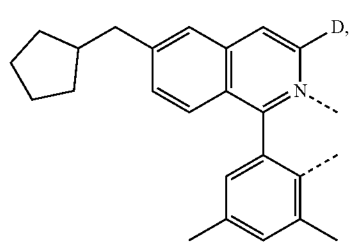

$L_{b222}$

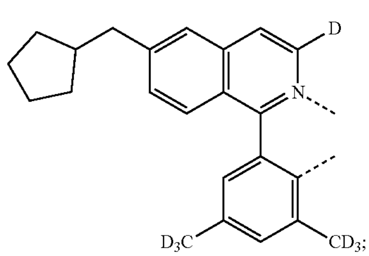

wherein TMS is trimethylsilyl.

10. The metal complex of claim 9, wherein hydrogens in the ligands $L_a$, $L_b$ and $L_c$ can be partially or fully deuterated.

11. The metal complex of claim 9, wherein the metal complex has a structure of $Ir(L_a)(L_b)_2$, wherein $L_a$ is selected from the group consisting of $L_{a1}$ to $L_{a1123}$ and $L_{a1126}$ to $L_{a1189}$, and $L_b$ is, at each occurrence identically or differently, selected from the group consisting of $L_{b1}$ to $L_{b162}$, $L_{b201}$ to $L_{b210}$, $L_{b215}$ to $L_{b222}$ and deuterides of $L_{b1}$ to $L_{b162}$, $L_{b201}$ to $L_{b210}$, $L_{b215}$ to $L_{b222}$.

12. The metal complex of claim 9, wherein the metal complex has a structure of $Ir(L_a)(L_b)_2$, wherein two $L_b$ are identical, and $L_a$ and $L_b$ respectively correspond to structures listed in the following table:

| Compound | $L_a$ | $L_b$ | Compound | $L_a$ | $L_b$ |
|---|---|---|---|---|---|
| 1 | $L_{a103}$ | $L_{b3}$ | 2 | $L_{a103}$ | $L_{b6}$ |
| 3 | $L_{a334}$ | $L_{b3}$ | 4 | $L_{a334}$ | $L_{b6}$ |
| 5 | $L_{a433}$ | $L_{b3}$ | 6 | $L_{a433}$ | $L_{b6}$ |
| 7 | $L_{a499}$ | $L_{b3}$ | 8 | $L_{a499}$ | $L_{b6}$ |
| 9 | $L_{a565}$ | $L_{b3}$ | 10 | $L_{a565}$ | $L_{b6}$ |
| 11 | $L_{a598}$ | $L_{b3}$ | 12 | $L_{a598}$ | $L_{b6}$ |
| 13 | $L_{a631}$ | $L_{b3}$ | 14 | $L_{a631}$ | $L_{b6}$ |
| 15 | $L_{a829}$ | $L_{b3}$ | 16 | $L_{a829}$ | $L_{b6}$ |
| 17 | $L_{a991}$ | $L_{b3}$ | 18 | $L_{a991}$ | $L_{b6}$ |
| 19 | $L_{a1010}$ | $L_{b3}$ | 20 | $L_{a1010}$ | $L_{b6}$ |
| 21 | $L_{a103}$ | $L_{b18}$ | 22 | $L_{a103}$ | $L_{b21}$ |
| 23 | $L_{a334}$ | $L_{b18}$ | 24 | $L_{a334}$ | $L_{b21}$ |
| 25 | $L_{a433}$ | $L_{b18}$ | 26 | $L_{a433}$ | $L_{b21}$ |
| 27 | $L_{a499}$ | $L_{b18}$ | 28 | $L_{a499}$ | $L_{b21}$ |
| 29 | $L_{a565}$ | $L_{b18}$ | 30 | $L_{a565}$ | $L_{b21}$ |
| 31 | $L_{a598}$ | $L_{b18}$ | 32 | $L_{a598}$ | $L_{b21}$ |
| 33 | $L_{a631}$ | $L_{b18}$ | 34 | $L_{a631}$ | $L_{b21}$ |
| 35 | $L_{a829}$ | $L_{b18}$ | 36 | $L_{a829}$ | $L_{b21}$ |
| 37 | $L_{a991}$ | $L_{b18}$ | 38 | $L_{a991}$ | $L_{b21}$ |
| 39 | $L_{a1010}$ | $L_{b18}$ | 40 | $L_{a1010}$ | $L_{b21}$ |
| 41 | $L_{a103}$ | $L_{b24}$ | 42 | $L_{a103}$ | $L_{b27}$ |
| 43 | $L_{a334}$ | $L_{b24}$ | 44 | $L_{a334}$ | $L_{b27}$ |
| 45 | $L_{a433}$ | $L_{b24}$ | 46 | $L_{a433}$ | $L_{b27}$ |
| 47 | $L_{a499}$ | $L_{b24}$ | 48 | $L_{a499}$ | $L_{b27}$ |
| 49 | $L_{a565}$ | $L_{b24}$ | 50 | $L_{a565}$ | $L_{b27}$ |
| 51 | $L_{a598}$ | $L_{b24}$ | 52 | $L_{a598}$ | $L_{b27}$ |
| 53 | $L_{a631}$ | $L_{b24}$ | 54 | $L_{a631}$ | $L_{b27}$ |
| 55 | $L_{a829}$ | $L_{b24}$ | 56 | $L_{a829}$ | $L_{b27}$ |
| 57 | $L_{a991}$ | $L_{b24}$ | 58 | $L_{a991}$ | $L_{b27}$ |
| 59 | $L_{a1010}$ | $L_{b24}$ | 60 | $L_{a1010}$ | $L_{b27}$ |
| 61 | $L_{a103}$ | $L_{b30}$ | 62 | $L_{a103}$ | $L_{b42}$ |
| 63 | $L_{a334}$ | $L_{b30}$ | 64 | $L_{a334}$ | $L_{b42}$ |
| 65 | $L_{a433}$ | $L_{b30}$ | 66 | $L_{a433}$ | $L_{b42}$ |
| 67 | $L_{a499}$ | $L_{b30}$ | 68 | $L_{a499}$ | $L_{b42}$ |
| 69 | $L_{a565}$ | $L_{b30}$ | 70 | $L_{a565}$ | $L_{b42}$ |
| 71 | $L_{a598}$ | $L_{b30}$ | 72 | $L_{a598}$ | $L_{b42}$ |
| 73 | $L_{a631}$ | $L_{b30}$ | 74 | $L_{a631}$ | $L_{b42}$ |
| 75 | $L_{a829}$ | $L_{b30}$ | 76 | $L_{a829}$ | $L_{b42}$ |
| 77 | $L_{a991}$ | $L_{b30}$ | 78 | $L_{a991}$ | $L_{b42}$ |
| 79 | $L_{a1010}$ | $L_{b30}$ | 80 | $L_{a1010}$ | $L_{b42}$ |
| 81 | $L_{a103}$ | $L_{b54}$ | 82 | $L_{a103}$ | $L_{b66}$ |
| 83 | $L_{a334}$ | $L_{b54}$ | 84 | $L_{a334}$ | $L_{b66}$ |
| 85 | $L_{a433}$ | $L_{b54}$ | 86 | $L_{a433}$ | $L_{b66}$ |
| 87 | $L_{a499}$ | $L_{b54}$ | 88 | $L_{a499}$ | $L_{b66}$ |
| 89 | $L_{a565}$ | $L_{b54}$ | 90 | $L_{a565}$ | $L_{b66}$ |
| 91 | $L_{a598}$ | $L_{b54}$ | 92 | $L_{a598}$ | $L_{b66}$ |
| 93 | $L_{a631}$ | $L_{b54}$ | 94 | $L_{a631}$ | $L_{b66}$ |
| 95 | $L_{a829}$ | $L_{b54}$ | 96 | $L_{a829}$ | $L_{b66}$ |
| 97 | $L_{a991}$ | $L_{b54}$ | 98 | $L_{a991}$ | $L_{b66}$ |
| 99 | $L_{a1010}$ | $L_{b54}$ | 100 | $L_{a1010}$ | $L_{b66}$ |
| 101 | $L_{a103}$ | $L_{b135}$ | 102 | $L_{a103}$ | $L_{b138}$ |
| 103 | $L_{a334}$ | $L_{b135}$ | 104 | $L_{a334}$ | $L_{b138}$ |
| 105 | $L_{a433}$ | $L_{b135}$ | 106 | $L_{a433}$ | $L_{b138}$ |
| 107 | $L_{a499}$ | $L_{b135}$ | 108 | $L_{a499}$ | $L_{b138}$ |
| 109 | $L_{a565}$ | $L_{b135}$ | 110 | $L_{a565}$ | $L_{b138}$ |
| 111 | $L_{a598}$ | $L_{b135}$ | 112 | $L_{a598}$ | $L_{b138}$ |
| 113 | $L_{a631}$ | $L_{b135}$ | 114 | $L_{a631}$ | $L_{b138}$ |
| 115 | $L_{a829}$ | $L_{b135}$ | 116 | $L_{a829}$ | $L_{b138}$ |
| 117 | $L_{a991}$ | $L_{b135}$ | 118 | $L_{a991}$ | $L_{b138}$ |
| 119 | $L_{a1010}$ | $L_{b135}$ | 120 | $L_{a1010}$ | $L_{b138}$ |
| 121 | $L_{a103}$ | $L_{b141}$ | 122 | $L_{a103}$ | $L_{b144}$ |

-continued

| Compound | $L_a$ | $L_b$ | Compound | $L_a$ | $L_b$ |
|---|---|---|---|---|---|
| 123 | $L_{a334}$ | $L_{b141}$ | 124 | $L_{a334}$ | $L_{b144}$ |
| 125 | $L_{a433}$ | $L_{b141}$ | 126 | $L_{a433}$ | $L_{b144}$ |
| 127 | $L_{a499}$ | $L_{b141}$ | 128 | $L_{a499}$ | $L_{b144}$ |
| 129 | $L_{a565}$ | $L_{b141}$ | 130 | $L_{a565}$ | $L_{b144}$ |
| 131 | $L_{a598}$ | $L_{b141}$ | 132 | $L_{a598}$ | $L_{b144}$ |
| 133 | $L_{a631}$ | $L_{b141}$ | 134 | $L_{a631}$ | $L_{b144}$ |
| 135 | $L_{a829}$ | $L_{b141}$ | 136 | $L_{a829}$ | $L_{b144}$ |
| 137 | $L_{a991}$ | $L_{b141}$ | 138 | $L_{a991}$ | $L_{b144}$ |
| 139 | $L_{a1010}$ | $L_{b141}$ | 140 | $L_{a1010}$ | $L_{b144}$ |
| | | | 162 | $L_{a103}$ | $L_{b201}$ |
| | | | 164 | $L_{a334}$ | $L_{b201}$ |
| | | | 166 | $L_{a433}$ | $L_{b201}$ |
| | | | 168 | $L_{a499}$ | $L_{b201}$ |
| | | | 170 | $L_{a565}$ | $L_{b201}$ |
| | | | 172 | $L_{a598}$ | $L_{b201}$ |
| | | | 174 | $L_{a631}$ | $L_{b201}$ |
| | | | 176 | $L_{a829}$ | $L_{b201}$ |
| | | | 178 | $L_{a991}$ | $L_{b201}$ |
| | | | 180 | $L_{a1010}$ | $L_{b201}$ |
| 181 | $L_{a103}$ | $L_{b202}$ | 182 | $L_{a103}$ | $L_{b203}$ |
| 183 | $L_{a334}$ | $L_{b202}$ | 184 | $L_{a334}$ | $L_{b203}$ |
| 185 | $L_{a433}$ | $L_{b202}$ | 186 | $L_{a433}$ | $L_{b203}$ |
| 187 | $L_{a499}$ | $L_{b202}$ | 188 | $L_{a499}$ | $L_{b203}$ |
| 189 | $L_{a565}$ | $L_{b202}$ | 190 | $L_{a565}$ | $L_{b203}$ |
| 191 | $L_{a598}$ | $L_{b202}$ | 192 | $L_{a598}$ | $L_{b203}$ |
| 193 | $L_{a631}$ | $L_{b202}$ | 194 | $L_{a631}$ | $L_{b203}$ |
| 195 | $L_{a829}$ | $L_{b202}$ | 196 | $L_{a829}$ | $L_{b203}$ |
| 197 | $L_{a991}$ | $L_{b202}$ | 198 | $L_{a991}$ | $L_{b203}$ |
| 199 | $L_{a1010}$ | $L_{b202}$ | 200 | $L_{a1010}$ | $L_{b203}$ |
| 201 | $L_{a1133}$ | $L_{b3}$ | 202 | $L_{a1133}$ | $L_{b6}$ |
| 203 | $L_{a1133}$ | $L_{b18}$ | 204 | $L_{a1133}$ | $L_{b21}$ |
| 205 | $L_{a1133}$ | $L_{b24}$ | 206 | $L_{a1133}$ | $L_{b27}$ |
| 207 | $L_{a1133}$ | $L_{b30}$ | 208 | $L_{a1133}$ | $L_{b42}$ |
| 209 | $L_{a1133}$ | $L_{b54}$ | 210 | $L_{a1133}$ | $L_{b66}$ |
| 211 | $L_{a1133}$ | $L_{b135}$ | 212 | $L_{a1133}$ | $L_{b138}$ |
| 213 | $L_{a1133}$ | $L_{b141}$ | 214 | $L_{a1133}$ | $L_{b144}$ |
| | | | 218 | $L_{a1133}$ | $L_{b201}$ |
| 219 | $L_{a1133}$ | $L_{b202}$ | 220 | $L_{a1133}$ | $L_{b203}$ |
| 221 | $L_{a1148}$ | $L_{b3}$ | 222 | $L_{a1148}$ | $L_{b6}$ |
| 223 | $L_{a1148}$ | $L_{b18}$ | 224 | $L_{a1148}$ | $L_{b21}$ |
| 225 | $L_{a1148}$ | $L_{b24}$ | 226 | $L_{a1148}$ | $L_{b27}$ |
| 227 | $L_{a1148}$ | $L_{b30}$ | 228 | $L_{a1148}$ | $L_{b42}$ |
| 229 | $L_{a1148}$ | $L_{b54}$ | 230 | $L_{a1148}$ | $L_{b66}$ |
| 231 | $L_{a1148}$ | $L_{b135}$ | 232 | $L_{a1148}$ | $L_{b138}$ |
| 233 | $L_{a1148}$ | $L_{b141}$ | 234 | $L_{a1148}$ | $L_{b144}$ |
| | | | 238 | $L_{a1148}$ | $L_{b201}$ |
| 239 | $L_{a1148}$ | $L_{b202}$ | 240 | $L_{a1148}$ | $L_{b203}$ |
| 241 | $L_{a103}$ | $L_{b209}$ | 242 | $L_{a103}$ | $L_{b215}$ |
| 243 | $L_{a334}$ | $L_{b209}$ | 244 | $L_{a334}$ | $L_{b215}$ |
| 245 | $L_{a433}$ | $L_{b209}$ | 246 | $L_{a433}$ | $L_{b215}$ |
| 247 | $L_{a499}$ | $L_{b209}$ | 248 | $L_{a499}$ | $L_{b215}$ |
| 249 | $L_{a565}$ | $L_{b209}$ | 250 | $L_{a565}$ | $L_{b215}$ |
| 251 | $L_{a598}$ | $L_{b209}$ | 252 | $L_{a598}$ | $L_{b215}$ |
| 253 | $L_{a631}$ | $L_{b209}$ | 254 | $L_{a631}$ | $L_{b215}$ |
| 255 | $L_{a829}$ | $L_{b209}$ | 256 | $L_{a829}$ | $L_{b215}$ |
| 257 | $L_{a991}$ | $L_{b209}$ | 258 | $L_{a991}$ | $L_{b215}$ |
| 259 | $L_{a1010}$ | $L_{b209}$ | 260 | $L_{a1010}$ | $L_{b215}$ |
| 261 | $L_{a103}$ | $L_{b216}$ | 262 | $L_{a103}$ | $L_{b217}$ |
| 263 | $L_{a334}$ | $L_{b216}$ | 264 | $L_{a334}$ | $L_{b217}$ |
| 265 | $L_{a433}$ | $L_{b216}$ | 266 | $L_{a433}$ | $L_{b217}$ |
| 267 | $L_{a499}$ | $L_{b216}$ | 268 | $L_{a499}$ | $L_{b217}$ |
| 269 | $L_{a565}$ | $L_{b216}$ | 270 | $L_{a565}$ | $L_{b217}$ |
| 271 | $L_{a598}$ | $L_{b216}$ | 272 | $L_{a598}$ | $L_{b217}$ |
| 273 | $L_{a631}$ | $L_{b216}$ | 274 | $L_{a631}$ | $L_{b217}$ |
| 275 | $L_{a829}$ | $L_{b216}$ | 276 | $L_{a829}$ | $L_{b217}$ |
| 277 | $L_{a991}$ | $L_{b216}$ | 278 | $L_{a991}$ | $L_{b217}$ |
| 279 | $L_{a1010}$ | $L_{b216}$ | 280 | $L_{a1010}$ | $L_{b217}$ |
| 281 | $L_{a103}$ | $L_{b218}$ | 282 | $L_{a103}$ | $L_{b219}$ |
| 283 | $L_{a334}$ | $L_{b218}$ | 284 | $L_{a334}$ | $L_{b219}$ |
| 285 | $L_{a433}$ | $L_{b218}$ | 286 | $L_{a433}$ | $L_{b219}$ |
| 287 | $L_{a499}$ | $L_{b218}$ | 288 | $L_{a499}$ | $L_{b219}$ |
| 289 | $L_{a565}$ | $L_{b218}$ | 290 | $L_{a565}$ | $L_{b219}$ |
| 291 | $L_{a598}$ | $L_{b218}$ | 292 | $L_{a598}$ | $L_{b219}$ |
| 293 | $L_{a631}$ | $L_{b218}$ | 294 | $L_{a631}$ | $L_{b219}$ |
| 295 | $L_{a829}$ | $L_{b218}$ | 296 | $L_{a829}$ | $L_{b219}$ |
| 297 | $L_{a991}$ | $L_{b218}$ | 298 | $L_{a991}$ | $L_{b219}$ |
| 299 | $L_{a1010}$ | $L_{b218}$ | 300 | $L_{a1010}$ | $L_{b219}$ |

-continued

| Compound | $L_a$ | $L_b$ | Compound | $L_a$ | $L_b$ |
|---|---|---|---|---|---|
| 301 | $L_{a103}$ | $L_{b220}$ | 302 | $L_{a103}$ | $L_{b221}$ |
| 303 | $L_{a334}$ | $L_{b220}$ | 304 | $L_{a334}$ | $L_{b221}$ |
| 305 | $L_{a433}$ | $L_{b220}$ | 306 | $L_{a433}$ | $L_{b221}$ |
| 307 | $L_{a499}$ | $L_{b220}$ | 308 | $L_{a499}$ | $L_{b221}$ |
| 309 | $L_{a565}$ | $L_{b220}$ | 310 | $L_{a565}$ | $L_{b221}$ |
| 311 | $L_{a598}$ | $L_{b220}$ | 312 | $L_{a598}$ | $L_{b221}$ |
| 313 | $L_{a631}$ | $L_{b220}$ | 314 | $L_{a631}$ | $L_{b221}$ |
| 315 | $L_{a829}$ | $L_{b220}$ | 316 | $L_{a829}$ | $L_{b221}$ |
| 317 | $L_{a991}$ | $L_{b220}$ | 318 | $L_{a991}$ | $L_{b221}$ |
| 319 | $L_{a1010}$ | $L_{b220}$ | 320 | $L_{a1010}$ | $L_{b221}$ |
| 321 | $L_{a103}$ | $L_{b222}$ | 322 | $L_{a598}$ | $L_{b222}$ |
| 323 | $L_{a334}$ | $L_{b222}$ | 324 | $L_{a631}$ | $L_{b222}$ |
| 325 | $L_{a433}$ | $L_{b222}$ | 326 | $L_{a829}$ | $L_{b222}$ |
| 327 | $L_{a499}$ | $L_{b222}$ | 328 | $L_{a991}$ | $L_{b222}$ |
| 329 | $L_{a565}$ | $L_{b222}$ | 330 | $L_{a1010}$ | $L_{b222}$. |

13. The metal complex of claim 9, wherein the metal complex has a structure of $Ir(L_a)(L_b)_2$, wherein two $L_b$ are different, and $L_a$ and $L_b$ respectively correspond to structures listed in the following table:

| Compound | $L_a$ | $L_b$ | $L_b$ | Compound | $L_a$ | $L_b$ | $L_b$ |
|---|---|---|---|---|---|---|---|
| 331 | $L_{a433}$ | $L_{b135}$ | $L_{b215}$ | 332 | $L_{a499}$ | $L_{b135}$ | $L_{b215}$ |
| 333 | $L_{a565}$ | $L_{b135}$ | $L_{b215}$ | 334 | $L_{a598}$ | $L_{b135}$ | $L_{b215}$ |
| 335 | $L_{a631}$ | $L_{b135}$ | $L_{b215}$ | 336 | $L_{a433}$ | $L_{b135}$ | $L_{b216}$ |
| 337 | $L_{a499}$ | $L_{b135}$ | $L_{b216}$ | 338 | $L_{a565}$ | $L_{b135}$ | $L_{b216}$ |
| 339 | $L_{a598}$ | $L_{b135}$ | $L_{b216}$ | 340 | $L_{a631}$ | $L_{b135}$ | $L_{b216}$ |
| 341 | $L_{a433}$ | $L_{b144}$ | $L_{b217}$ | 342 | $L_{a499}$ | $L_{b144}$ | $L_{b217}$ |
| 343 | $L_{a565}$ | $L_{b144}$ | $L_{b217}$ | 344 | $L_{a598}$ | $L_{b144}$ | $L_{b217}$ |
| 345 | $L_{a631}$ | $L_{b144}$ | $L_{b217}$ | 346 | $L_{a433}$ | $L_{b144}$ | $L_{b218}$ |
| 347 | $L_{a499}$ | $L_{b144}$ | $L_{b218}$ | 348 | $L_{a565}$ | $L_{b144}$ | $L_{b218}$ |
| 349 | $L_{a598}$ | $L_{b144}$ | $L_{b218}$ | 350 | $L_{a631}$ | $L_{b144}$ | $L_{b218}$ |
| 351 | $L_{a433}$ | $L_{b215}$ | $L_{b216}$ | 352 | $L_{a499}$ | $L_{b215}$ | $L_{b216}$ |
| 353 | $L_{a565}$ | $L_{b215}$ | $L_{b216}$ | 354 | $L_{a598}$ | $L_{b215}$ | $L_{b216}$ |
| 355 | $L_{a631}$ | $L_{b215}$ | $L_{b216}$ | 356 | $L_{a433}$ | $L_{b219}$ | $L_{b220}$ |
| 357 | $L_{a499}$ | $L_{b219}$ | $L_{b220}$ | 358 | $L_{a565}$ | $L_{b219}$ | $L_{b220}$ |
| 359 | $L_{a598}$ | $L_{b219}$ | $L_{b220}$ | 360 | $L_{a631}$ | $L_{b219}$ | $L_{b220}$ |
| 361 | $L_{a433}$ | $L_{b138}$ | $L_{b219}$ | 362 | $L_{a499}$ | $L_{b138}$ | $L_{b219}$ |
| 363 | $L_{a565}$ | $L_{b138}$ | $L_{b219}$ | 364 | $L_{a598}$ | $L_{b138}$ | $L_{b219}$ |
| 365 | $L_{a631}$ | $L_{b138}$ | $L_{b219}$ | 366 | $L_{a433}$ | $L_{b138}$ | $L_{b220}$ |
| 367 | $L_{a499}$ | $L_{b138}$ | $L_{b220}$ | 368 | $L_{a565}$ | $L_{b138}$ | $L_{b220}$ |
| 369 | $L_{a598}$ | $L_{b138}$ | $L_{b220}$ | 370 | $L_{a631}$ | $L_{b138}$ | $L_{b220}$ |
| 371 | $L_{a433}$ | $L_{b209}$ | $L_{b221}$ | 372 | $L_{a499}$ | $L_{b209}$ | $L_{b221}$ |
| 373 | $L_{a565}$ | $L_{b209}$ | $L_{b221}$ | 374 | $L_{a598}$ | $L_{b209}$ | $L_{b221}$ |
| 375 | $L_{a631}$ | $L_{b209}$ | $L_{b221}$ | 376 | $L_{a433}$ | $L_{b209}$ | $L_{b222}$ |
| 377 | $L_{a499}$ | $L_{b209}$ | $L_{b222}$ | 378 | $L_{a565}$ | $L_{b209}$ | $L_{b222}$ |
| 379 | $L_{a598}$ | $L_{b209}$ | $L_{b222}$ | 380 | $L_{a631}$ | $L_{b209}$ | $L_{b222}$ |
| 381 | $L_{a433}$ | $L_{b217}$ | $L_{b218}$ | 382 | $L_{a499}$ | $L_{b217}$ | $L_{b218}$ |
| 383 | $L_{a565}$ | $L_{b217}$ | $L_{b218}$ | 384 | $L_{a598}$ | $L_{b217}$ | $L_{b218}$ |
| 385 | $L_{a631}$ | $L_{b217}$ | $L_{b218}$ | 386 | $L_{a433}$ | $L_{b220}$ | $L_{b221}$ |
| 387 | $L_{a499}$ | $L_{b220}$ | $L_{b221}$ | 388 | $L_{a565}$ | $L_{b220}$ | $L_{b221}$ |
| 389 | $L_{a598}$ | $L_{b220}$ | $L_{b221}$ | 390 | $L_{a631}$ | $L_{b220}$ | $L_{b221}$. |

14. An electroluminescent device, comprising:

an anode, a cathode, and an organic layer disposed between the anode and the cathode, wherein the organic layer comprises the metal complex according to claim 1.

15. The device of claim 14, wherein the organic layer is a light-emitting layer, and the metal complex is a light-emitting material.

16. The device of claim 14, wherein the device emits red light or white light.

17. The device of claim 15, wherein the organic layer further comprises at least one host material, and the host material comprises at least one chemical group selected from the group consisting of benzene, pyridine, pyrimidine, triazine, carbazole, azacarbazole, indolocarbazole, dibenzothiophene, aza-dibenzothiophene, dibenzofuran, azadibenzofuran, dibenzoselenophene, triphenylene, azatriphenylene, fluorene, silafluorene, naphthalene, quinoline, isoquinoline, quinazoline, quinoxaline, phenanthrene, azaphenanthrene, and combinations thereof.

18. A compound formulation, comprising the metal complex of claim 1.

19. The metal complex of claim 1, wherein L is selected from the group consisting of a single bond, methylene, and ethylene.

20. The metal complex of claim 1, wherein R is selected from the group consisting of hydrogen, deuterium, methyl, ethyl, and propyl.

21. The metal complex of claim 1, $R_1$ and $R_3$ are, at each occurrence identically or differently, selected from the group consisting of hydrogen, deuterium, fluorine, methyl, ethyl, propyl, butyl, cyclopropyl, 3-methylbutyl, 3-ethylpentyl, trifluoromethyl, 2,2,2-trifluoroethyl, trimethylsilyl, dimethylisopropylsilyl, and combinations thereof, and adjacent substituents $R_1$ can be optionally joined to form a ring.

* * * * *